US010026803B1

(12) United States Patent
Nakamura

(10) Patent No.: US 10,026,803 B1
(45) Date of Patent: Jul. 17, 2018

(54) SEMICONDUCTOR DEVICE, POWER CONVERSION DEVICE, AND METHOD OF MANUFACTURING SEMICONDUCTOR DEVICE

(71) Applicant: Mitsubishi Electric Corporation, Tokyo (JP)

(72) Inventor: Katsumi Nakamura, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 15/666,096

(22) Filed: Aug. 1, 2017

(30) Foreign Application Priority Data

Dec. 27, 2016 (JP) ................................ 2016-252809

(51) Int. Cl.
*H01L 29/739* (2006.01)
*H01L 29/868* (2006.01)
(Continued)

(52) U.S. Cl.
CPC .... *H01L 29/0615* (2013.01); *H01L 21/26513* (2013.01); *H01L 21/324* (2013.01);
(Continued)

(58) Field of Classification Search
CPC ............... H02M 7/537; H01L 29/0615; H01L 21/26513; H01L 21/324; H01L 29/1004;
(Continued)

(56) References Cited

U.S. PATENT DOCUMENTS 5,783,491 A 7/1998 Nakamura et al.
6,482,681 B1 11/2002 Francis et al.
(Continued)

FOREIGN PATENT DOCUMENTS

JP H07-263692 A 10/1995
JP 2001-085686 A 3/2001
(Continued)

OTHER PUBLICATIONS

Hideki Takahashi et al.; "1200V Reverse Conducting IGBT"; Proc. ISPSD2004; 2004; pp. 133-136; Kitakyushu, Japan.
(Continued)

*Primary Examiner* — Emily P Pham
(74) *Attorney, Agent, or Firm* — Studebaker & Brackett PC

(57) ABSTRACT

The present invention has an object of, in a semiconductor device having a vertical structure, providing stable withstand voltage characteristics, reducing a turn-off loss with reduction in leakage current at a time of turn-off, and improving a controllability of a turn-off operation and a blocking capability at a time of turn-off.
A buffer layer includes a first buffer layer being joined to an active layer and having one peak point of an impurity concentration and a second buffer layer being joined to the first buffer layer and a drift layer, having at least one peak point of an impurity concentration, and having a maximum impurity concentration lower than that of the first buffer layer, and the maximum impurity concentration of the second buffer layer is higher than the impurity concentration of the drift layer and equal to or lower than $1.0\times10^{15}$ $cm^{-3}$.

37 Claims, 86 Drawing Sheets

(51) Int. Cl.

| | |
|---|---|
| ***H01L 29/06*** | (2006.01) |
| ***H01L 29/10*** | (2006.01) |
| ***H01L 29/36*** | (2006.01) |
| ***H01L 21/265*** | (2006.01) |
| ***H01L 21/324*** | (2006.01) |
| *H01L 29/66* | (2006.01) |
| *H02M 7/537* | (2006.01) |

(52) U.S. Cl.
CPC .......... *H01L 29/1004* (2013.01); *H01L 29/36* (2013.01); *H01L 29/7397* (2013.01); *H01L 29/868* (2013.01); *H01L 29/6609* (2013.01); *H01L 29/66348* (2013.01); *H02M 7/537* (2013.01)

(58) Field of Classification Search
CPC ... H01L 29/36; H01L 29/7397; H01L 29/868; H01L 29/6609; H01L 29/66348
See application file for complete search history.

(56) References Cited

U.S. PATENT DOCUMENTS

| | | | | |
|---|---|---|---|---|
| 6,815,767 | B2 | 11/2004 | Nakamura et al. | |
| 6,847,079 | B2 | 1/2005 | Nakamura | |
| 6,953,968 | B2 | 10/2005 | Nakamura et al. | |
| 7,514,750 | B2 | 4/2009 | Mauder et al. | |
| 7,538,412 | B2 | 5/2009 | Schulze et al. | |
| 8,017,974 | B2 | 9/2011 | Hisamoto | |
| 8,507,945 | B2 | 8/2013 | Nakamura | |
| 8,686,469 | B2 | 4/2014 | Nakamura | |
| 8,698,195 | B2 | 4/2014 | Oya et al. | |
| 9,041,051 | B2 | 5/2015 | Chen et al. | |
| 9,214,546 | B2 * | 12/2015 | Hayashi | H01L 27/0255 |
| 9,287,391 | B2 | 3/2016 | Chen et al. | |
| 2015/0235866 | A1 | 8/2015 | Nakamura | |
| 2016/0254375 | A1 | 9/2016 | Nakamura | |
| 2016/0260703 | A1 | 9/2016 | Nakamura | |
| 2017/0154955 | A1 | 6/2017 | Harada et al. | |
| 2017/0352730 | A1 * | 12/2017 | Nakamura | H01L 29/1095 |

FOREIGN PATENT DOCUMENTS

| | | | |
|---|---|---|---|
| JP | 4205128 | B2 | 1/2009 |
| JP | 4785334 | B2 | 10/2011 |
| JP | 5256357 | B2 | 8/2013 |
| JP | 2014-241433 | A | 12/2014 |
| JP | 5634318 | B2 | 12/2014 |
| JP | 5701447 | B2 | 4/2015 |
| JP | 5708803 | B2 | 4/2015 |
| JP | 5908524 | B2 | 4/2016 |
| JP | 2017-098440 | A | 6/2017 |
| NO | 2014/054121 | A1 | 4/2014 |
| WO | 2002/058160 | A1 | 7/2002 |
| WO | 2002/061845 | A1 | 8/2002 |
| WO | 2009/122486 | A1 | 10/2009 |
| WO | 2015/114747 | A1 | 8/2015 |
| WO | 2015/114748 | A1 | 8/2015 |

OTHER PUBLICATIONS

T. Naito et al.; “1200V Reverse Blocking IGBT with Low Loss for Matrix Converter”; Proc. ISP5D2004; 2004; pp. 125-128; Kitakyushu, Japan.
Katsumi Nakamura et al.; “Evaluation of Oscillatory Phenomena in Reverse Operation for High Voltage Diodes”; Proc. ISPSD2009; 2009; pp. 156-159; IEEE.
Katsumi Nakamura et al.; “Advanced RFC Technology with New Cathode Structure of Field Limiting Rings for High Voltage Planar Diode”; Proc. ISPSD2010; 2010; pp. 133-136; Hiroshima, Japan.

* cited by examiner

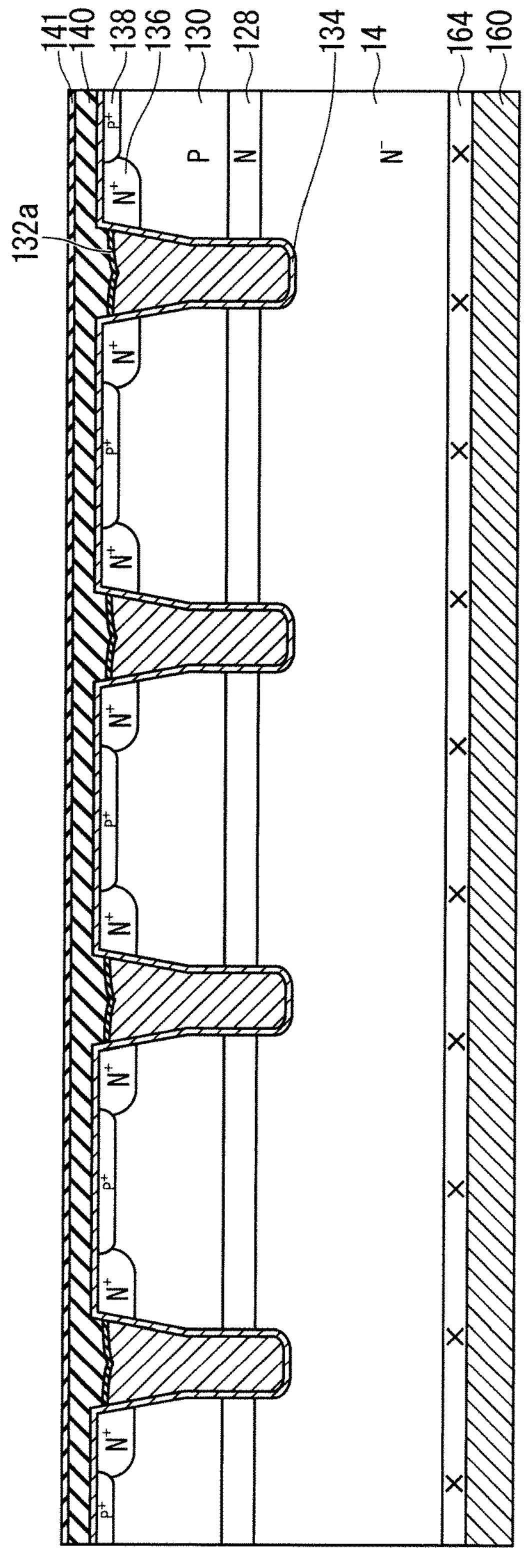
F I G. 13

F I G. 26
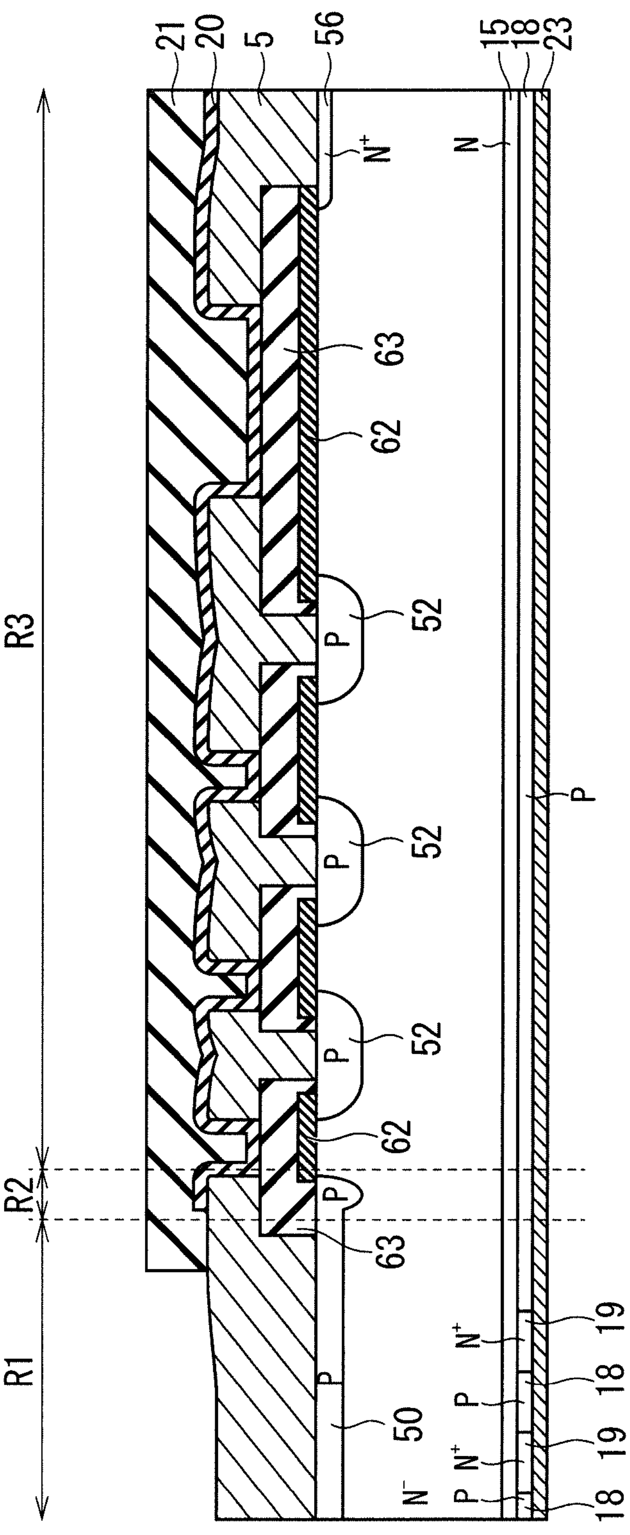

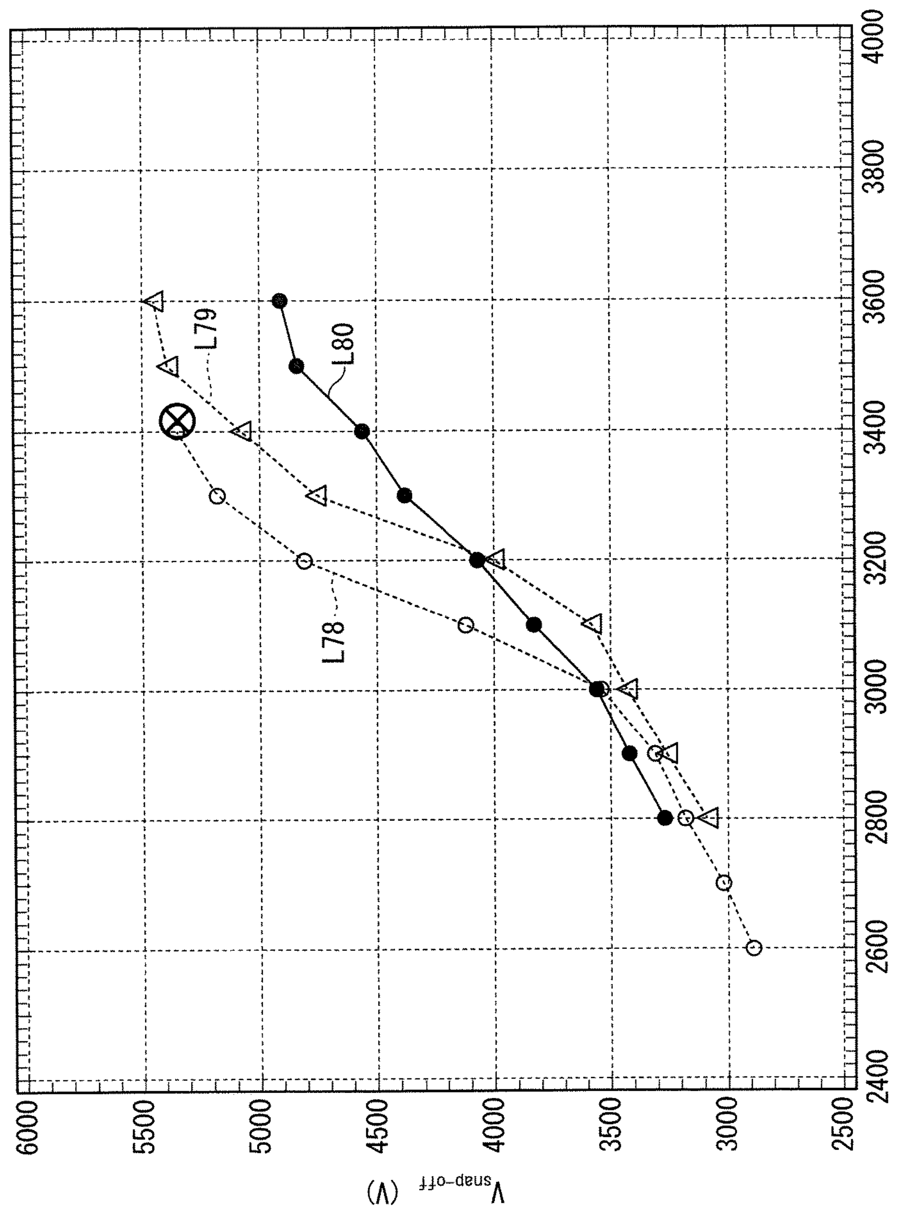
F I G. 6 2

F I G. 6 6
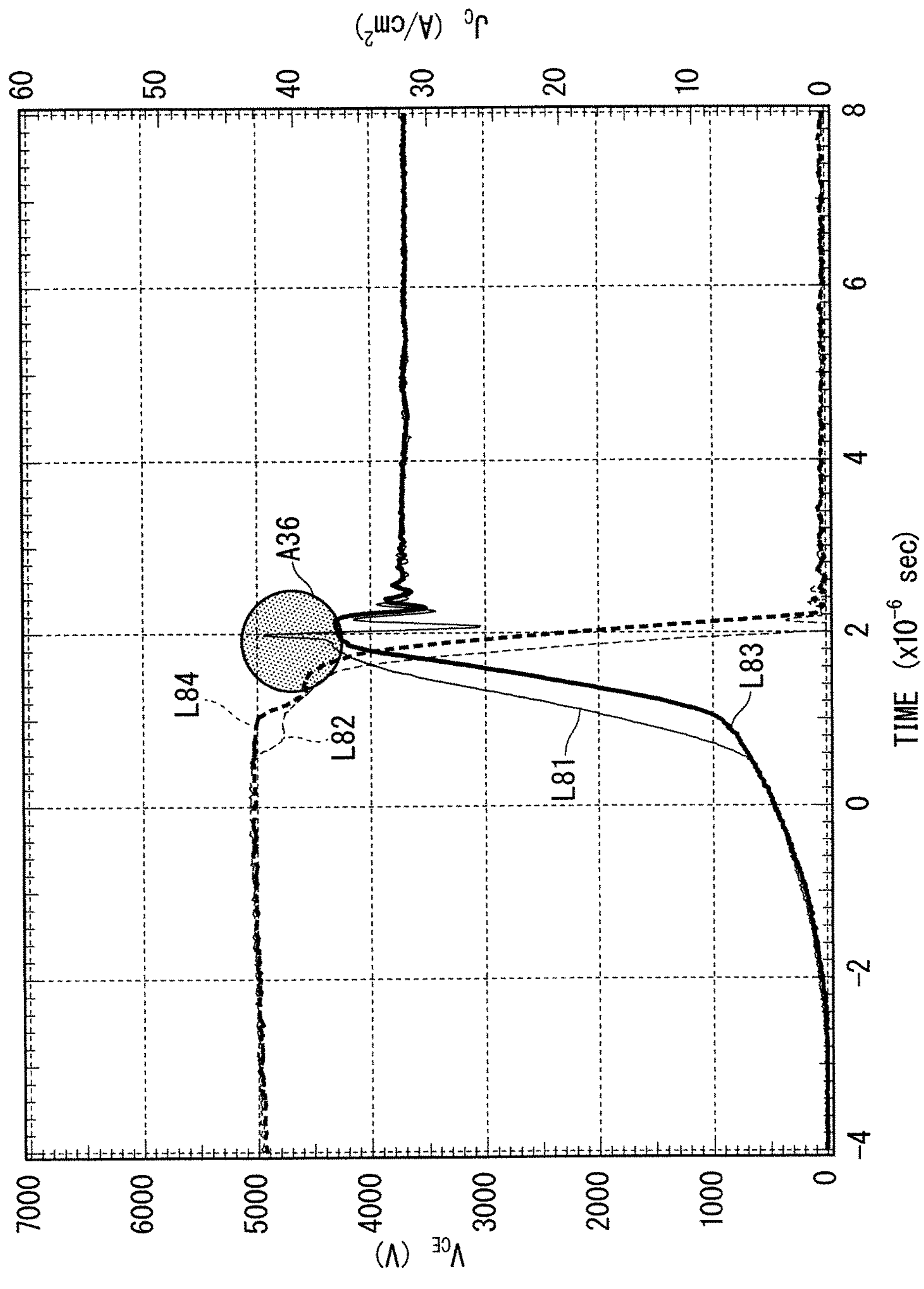

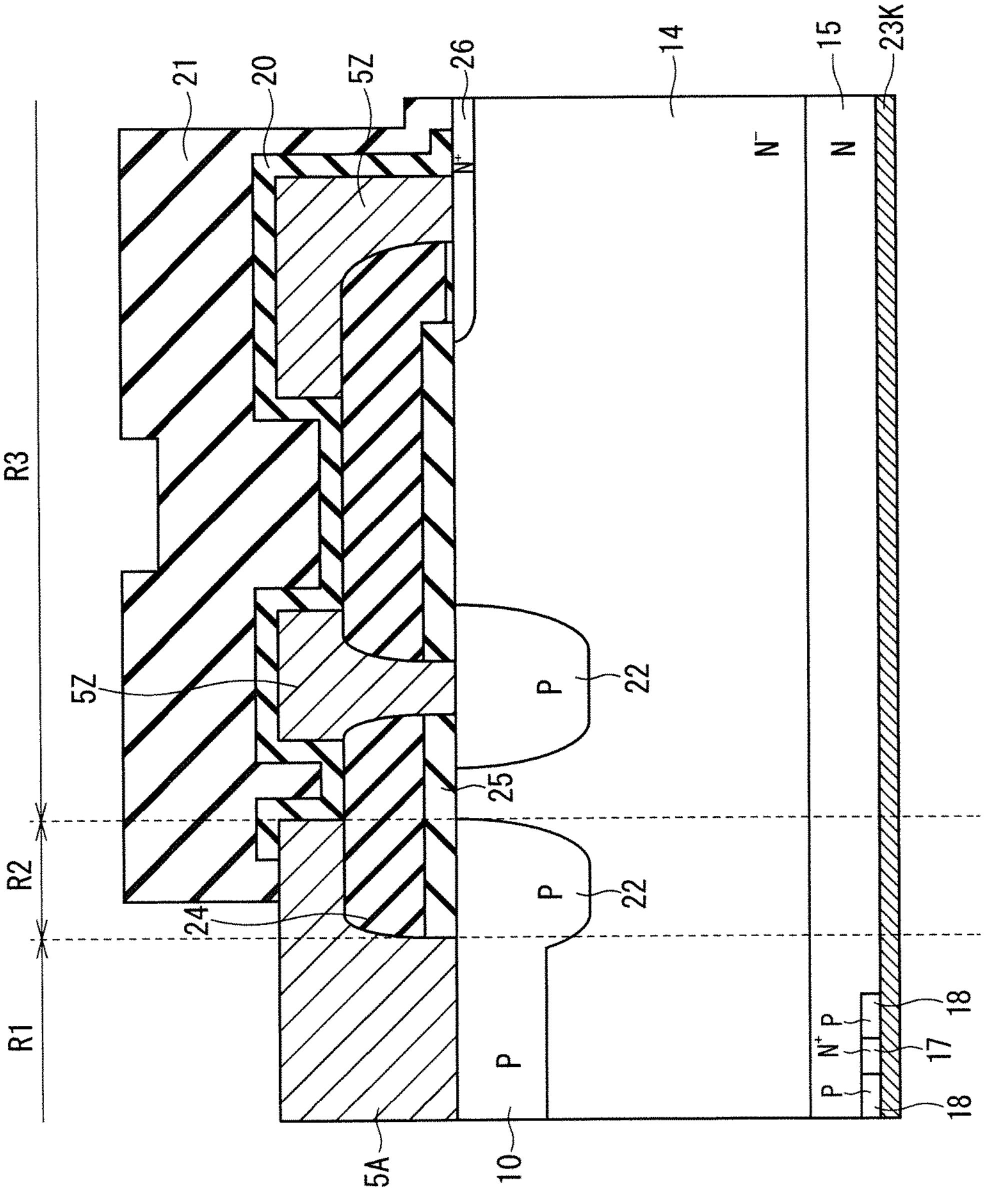
F I G. 76

FIG. 86

| STEP | PROCESS A | PROCESS B | PROCESS C | PROCESS D | PROCESS E |
|---|---|---|---|---|---|
| FORMATION OF PROTECTIVE FILM ON SURFACE OF WAFER | ○ | ○ | ○ | ○ | ○ |
| THICKNESS CONTROL OF WAFER | ○ | ○ | ○ | ○ | ○ |
| SECOND BUFFER LAYER (INTRODUCTION OF PROTONS) | - | ○ | ○ | - | - |
| SECOND BUFFER LAYER (ANNEALING) | - | - | ○ | - | - |
| FIRST BUFFER LAYER (INTRODUCTION OF THE PROTONS, ANNEALING) | ○ | ○ | ○ | ○ | ○ |
| SECOND BUFFER LAYER (INTRODUCTION OF PROTONS) | ○ | - | - | - | - |
| FORMATION OF ACTIVE LAYER | ○ | ○ | ○ | ○ | ○ |
| SECOND BUFFER LAYER (INTRODUCTION OF PROTONS) | - | - | - | ○ | - |
| SECOND BUFFER LAYER (ANNEALING) | ○ | ○ | - | ○ | - |
| FORMATION OF COLLECTOR OR CATHODE ELECTRODE | ○ | ○ | ○ | ○ | ○ |
| SECOND BUFFER LAYER (INTRODUCTION OF PROTONS, ANNEALING) | - | - | - | - | ○ |

SEMICONDUCTOR DEVICE, POWER CONVERSION DEVICE, AND METHOD OF MANUFACTURING SEMICONDUCTOR DEVICE

BACKGROUND OF THE INVENTION

Field of the Invention

The present invention relates to a semiconductor device including a power semiconductor element such as an IGBT and a diode.

Description of the Background Art

Conventional vertical semiconductor devices such as trench-gate IGBTs and PIN diodes have a vertical-structure area. In an IGBT, an area which includes an n-type drift layer, an n-type buffer layer, and a p-type collector layer constitutes the vertical-structure area, and in a diode, an area including an n-type drift layer, an n-type buffer layer, and an $n^+$ cathode layer constitutes the vertical-structure area. International Publication No. 2014/054121 discloses the IGBT having the vertical structure.

The conventional vertical semiconductor device having the vertical-structure area such as IGBTs or diodes adopts, in some cases, wafers manufactured by FZ method instead of wafers manufactured by epitaxial growth as Si wafers from which the semiconductor devices are manufactured. In the vertical-structure area of the wafer of, for example, an IGBT, an n-type buffer layer has a high impurity concentration, and its impurity profile has an impurity with a steep gradient across a junction between the n-type buffer layer and the n-type drift layer.

SUMMARY

Such impurity concentration profiles of buffer layers in the semiconductor devices having the vertical structure have had various problems including poor controllability of a turn-off operation and reduction in blocking capability at a time of turn-off.

The present invention has an object of, in a semiconductor device having a vertical structure, providing stable withstand voltage characteristics, reducing a turn-off loss with reduction in leakage current at a time of turn-off, and improving a controllability of a turn-off operation and a blocking capability at a time of turn-off.

A semiconductor device according to a first aspect of the present invention includes a semiconductor body, a buffer layer of a first conductivity type, an active layer, a first electrode, and a second electrode. The semiconductor body has a first main surface and a second main surface and includes a drift layer of a first conductivity type as a main constituent element. The buffer layer is formed adjacent to the drift layer so as to be located closer to the second main surface with respect to the drift layer in the semiconductor body. The active layer is formed on the second main surface of the semiconductor body and has at least one of the first conductivity type and a second conductivity type. The first electrode is formed on the first main surface of the semiconductor body. The second electrode is formed on the active layer. The buffer layer has a first buffer layer and a second buffer layer. The first buffer layer is joined to the active layer and has one peak point of an impurity concentration. The second buffer layer is joined to the first buffer layer and the drift layer, has at least one peak point of an impurity concentration, and has a maximum impurity concentration lower than that of the first buffer layer. The maximum impurity concentration of the second buffer layer is higher than that of the drift layer, and is equal to or lower than $1.0\times10^{15}$ $cm^{-3}$.

According to the semiconductor device according to the first aspect of the present invention, the second buffer layer has the maximum impurity concentration higher than that of the drift layer, and is equal to or lower than $1.0\times10^{15}$ $cm^{-3}$, so that achieved are stable withstand voltage characteristics, a reduction in turn-off loss with reduction in leakage current at a time of turn-off, and improvements in controllability of a turn-off operation and blocking capability at a time of turn-off.

A semiconductor device according to a second aspect of the present invention includes a semiconductor body, a buffer layer of a first conductivity type, an active layer, a first electrode, and a second electrode. The semiconductor body has a first main surface and a second main surface and includes a drift layer of a first conductivity type as a main constituent element. The buffer layer is formed adjacent to the drift layer so as to be located closer to the second main surface with respect to the drift layer in the semiconductor body. The active layer is formed on the second main surface of the semiconductor body and has at least one of the first conductivity type and a second conductivity type. The first electrode is formed on the first main surface of the semiconductor body. The second electrode is formed on the active layer. The buffer layer has a first buffer layer and a second buffer layer. The first buffer layer is joined to the active layer and has one peak point of an impurity concentration. The second buffer layer is joined to the first buffer layer and the drift layer and has a maximum impurity concentration lower than that of the first buffer layer. The second buffer layer has an energy level, which is a recombination center, in a band gap of a semiconductor constituting the second buffer layer.

In the semiconductor device according to the second aspect of the present invention, the second buffer layer has an energy level, which is a recombination center, in a band gap of a semiconductor constituting the second buffer layer. Achieved thereby are stable withstand voltage characteristics, a reduction in turn-off loss with reduction in leakage current at a time of turn-off, and improvements in controllability of a turn-off operation and blocking capability at a time of turn-off.

These and other objects, features, aspects and advantages of the present invention will become more apparent from the following detailed description of the present invention when taken in conjunction with the accompanying drawings.

BRIEF DESCRIPTION OF THE DRAWINGS

FIG. 13 is a cross-sectional view illustrating a step of manufacturing the IGBT.

FIG. 26 is a cross-sectional view illustrating a step of manufacturing the RFC diode.

FIG. 62 is a view illustrating a relationship between $V_{snap\text{-}off}$ and $V_{CC}$ in the PIN diode.

FIG. 66 is a view illustrating a turn-off operation waveform in a state of inductive load in the IGBT.

FIG. 76 is a cross-sectional view illustrating a fifth aspect in the semiconductor device according to the embodiment 5.

FIG. 86 is a view illustrating processes A to E considered as steps of manufacturing the IGBT, the PIN diode, and the RFC diode described in the embodiments 1 to 5.

DESCRIPTION OF THE PREFERRED EMBODIMENTS

<Principle of Present Invention>

The present invention relates to a vertical-structure area having the following characteristics (a) to (d) in the semiconductor device including a bipolar power semiconductor element such as an IGBT (Insulated Gate Bipolar Transistor) or a diode which are key components of power modules (with withstand voltage (rated voltage) equal to or higher than 600V).

(a) A reduction in turn-off loss or an operation at high temperature is achieved by increasing the voltage blocking capability in an OFF state and reducing a leakage current at a time of holding withstand voltage at high temperature.

(b) A voltage overshoot at the end of the turn-off operations (hereinafter simply referred to as "the snap-off phenomenon") and an oscillation caused by the snap-off phenomenon are suppressed.

(c) The blocking capability in a turn-off operation is improved.

(d) The vertical-structure area can be incorporated into a wafer process technique which is also compatible with an increase in size of a diameter, that is equal to or larger than 6 inches, of a wafer for manufacturing a semiconductor.

"The voltage blocking capability under the OFF state" in the characteristic (a) means the voltage holding capability under a static state with no current flowing. "The blocking capability in the turn-off operation" in the characteristic (c) means the voltage holding capability in a dynamic state with a current flowing.

Although an embodiment described hereinafter cites an IGBT and a diode as a typical example of the power semiconductor element, the present invention can also be applied to a power semiconductor such as an RC (Reverse Conducting)-IGBT, an RB (Reverse Blocking)-IGBT, or a MOSFET (Metal Oxide Semiconductor Field Effect Transistor) and enables thereby an acquisition of an effect on the aforementioned object.

"H. Takahashi et al., "1200 V Reverse Conducting IGBT," Proc. ISPSD2004, pp. 133-136, 2004" describes the RC-IGBT, and "T. Naito et al., "1200 V Reverse Blocking IGBT with Low Loss for Matrix Converter," Proc. ISPSD2004, pp. 125-128, 2004" describes the RB-IGBT.

Moreover, a semiconductor device using Si as a semiconductor material is exemplified hereinafter, the present invention also has an effect on a semiconductor device made of a wide bandgap material such as silicon carbide (SiC) or gallium nitride (GaN). Furthermore, although a semiconductor device of high withstand-voltage class ranging from 1700 to 6500V is exemplified hereinafter, the present invention has an effect on the aforementioned object regardless of the withstand-voltage class.

Figure 1:
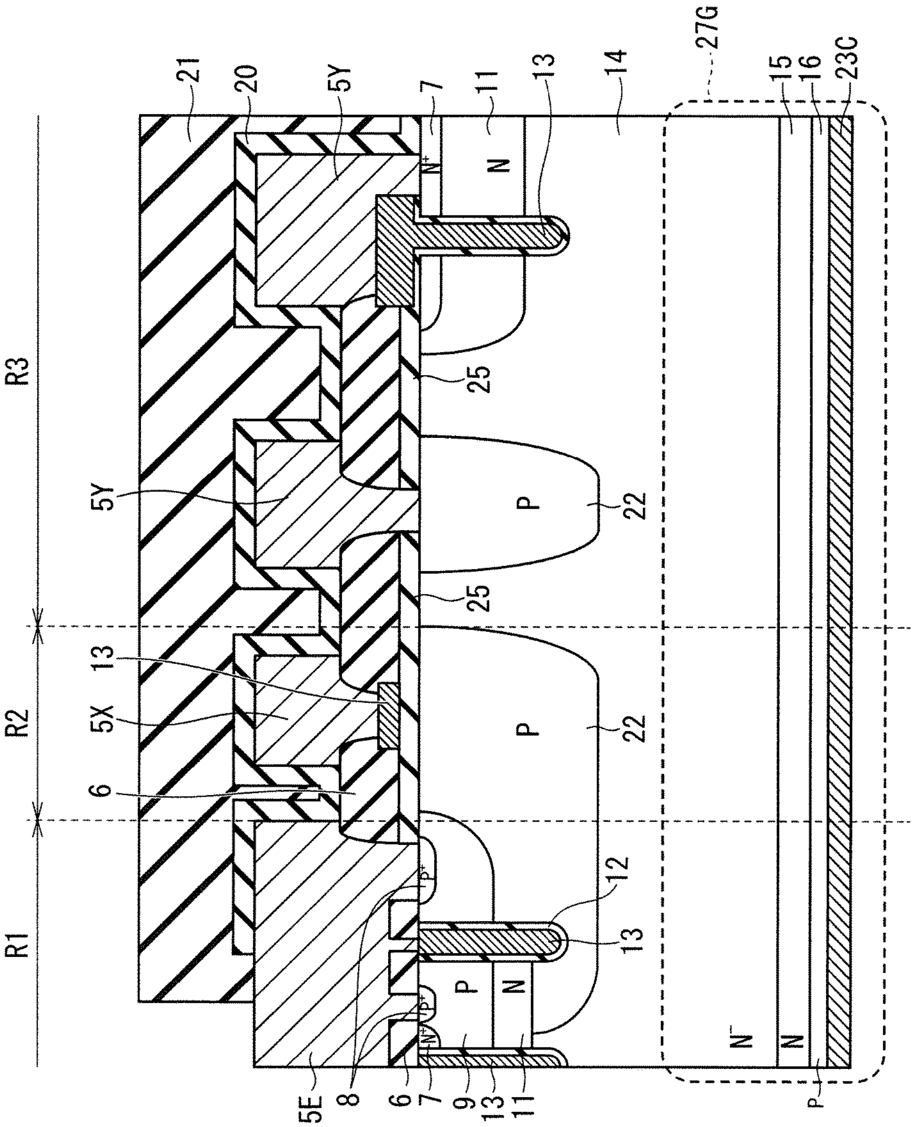
FIG. 1 is a cross-sectional view of a trench-gate IGBT as a basic structure of the present invention.
Figure 2:
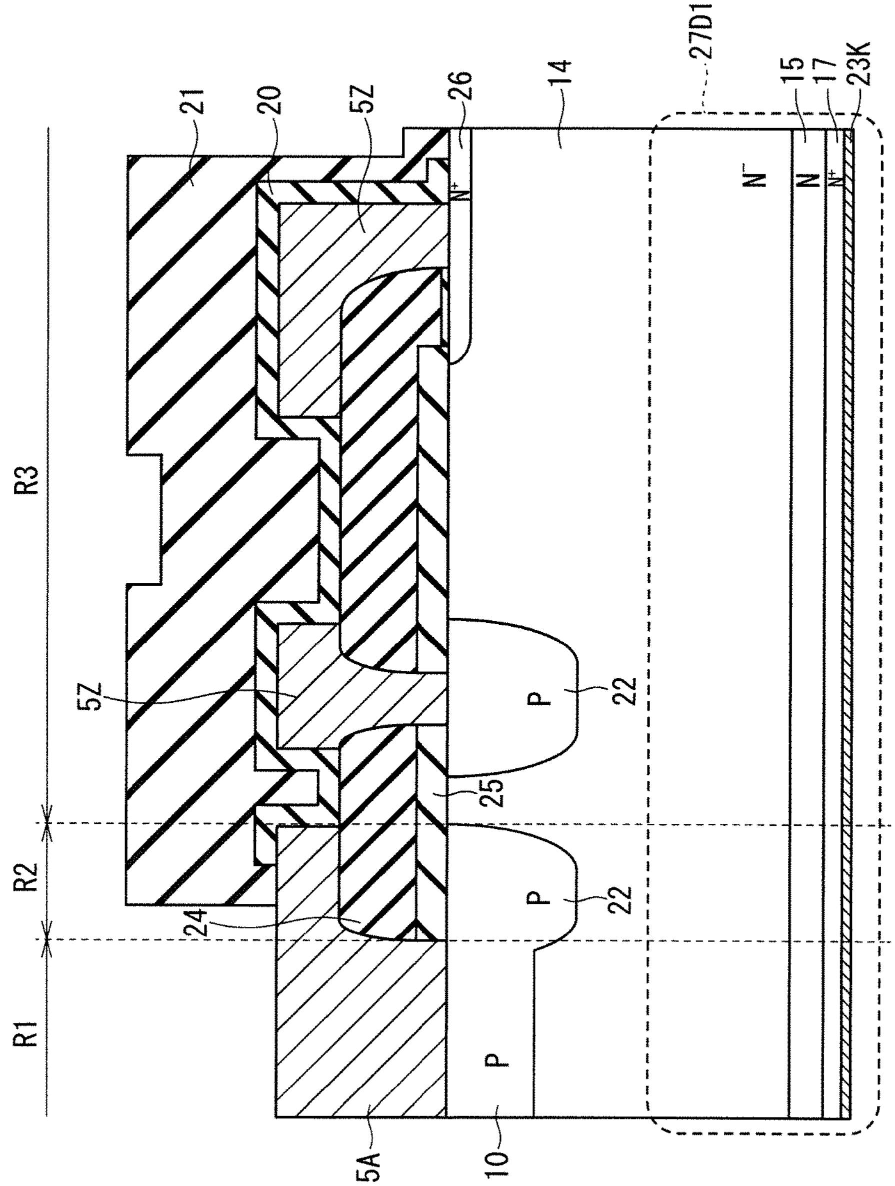
FIG. 2 is a cross-sectional view of a PIN diode as a basic structure of the present invention.
Figure 3:
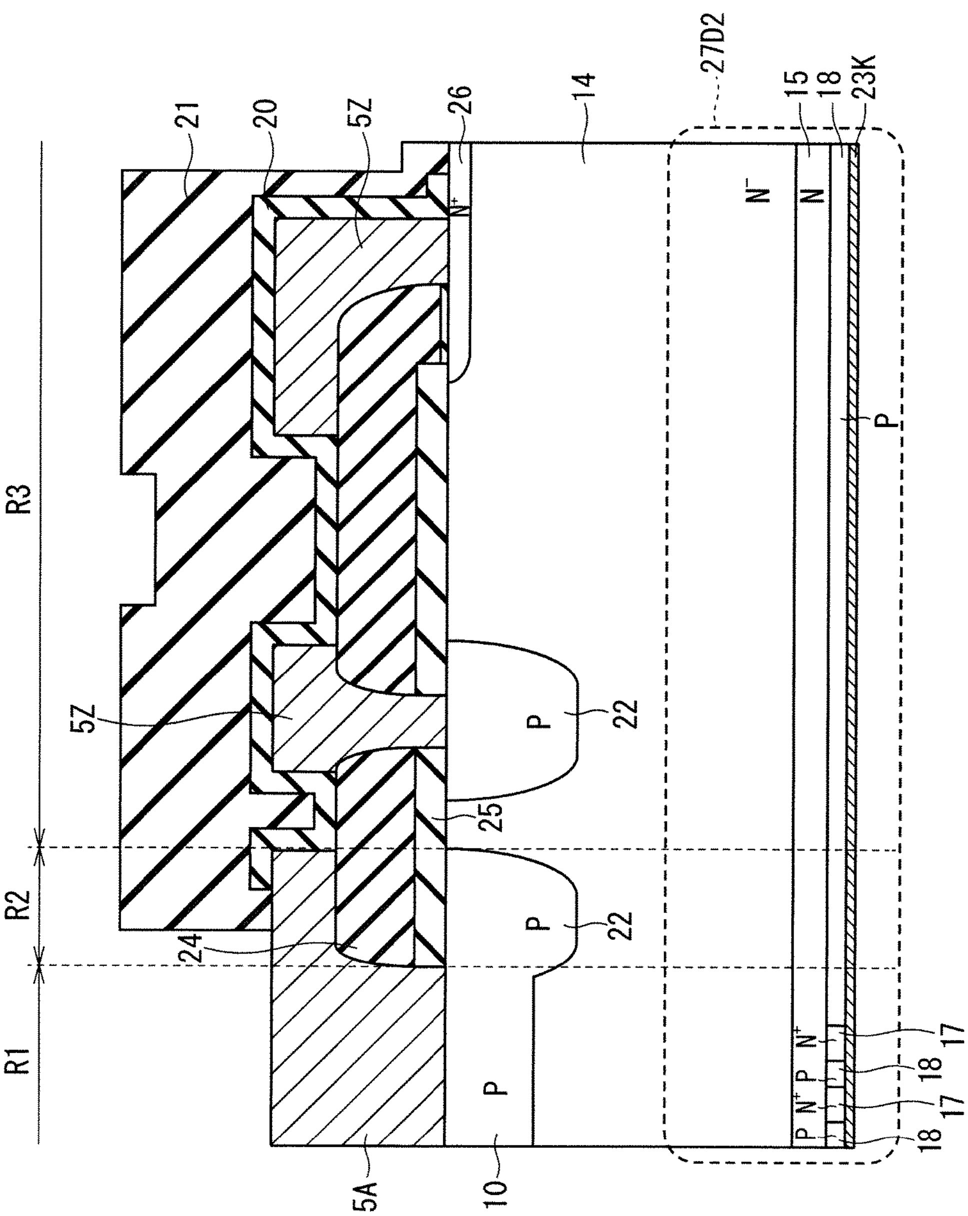
FIG. 3 is a cross-sectional view of a RFC (Relaxed Field of Cathode) diode as a base structure of the present invention.

FIG. 1, FIG. 2, and FIG. 3 are cross-sectional views, each of which illustrates a structure of a semiconductor device having a vertical structure, and the structure illustrated in these drawings forms a base structure of the present invention. FIG. 1 illustrates a trench-gate IGBT, FIG. 2 illustrates a PIN diode, and FIG. 3 illustrates an RFC diode. The RFC diode is a diode formed by connecting a PIN diode and a PNP transistor in parallel. "K. Nakamura et al, Proc. ISPSD2009, pp. 156-158, 2009" and "K. Nakamura et al., Proc. ISPSD2010, pp. 133-136. 2010" describe the RFC diode.

The structure of the trench-gate IGBT is described with reference to FIG. 1. A structure of an active cell area R1 of the trench-gate IGBT is firstly described. An N buffer layer 15 is formed in an undersurface (a second main surface) of an $N^-$ drift layer 14 so as to be adjacent to the $N^-$ drift layer 14. A P collector layer 16 of p-type (a second conductivity type) is formed in an undersurface of the N buffer layer 15 so as to be adjacent to the N buffer layer 15. A collector electrode 23C is formed in an undersurface of the P collector layer 16 so as to be adjacent to the P collector layer 16. The following description may refer to, as "the semiconductor body", a structural part at least including the $N^-$ drift layer 14 which is a drift layer of n-type (first conductivity type) and the N buffer layer 15 which is a buffer layer of n-type. The $N^-$ drift layer 14 forms a main constituent element of the semiconductor body.

An N layer 11 is formed in an upper layer portion of the $N^-$ drift layer 14. A P base layer 9 is formed on a top surface of the N layer 11. Gate electrodes 13 which are made of polysilicon and have a trench structure are formed to vertically penetrate through the P base layer 9 and the N layer 11. The gate electrodes 13 face the $N^-$ drift layer 14, the N layer 11, the P base layer 9, and an $N^+$ emitter layer 7 with a gate insulating film 12 therebetween. The gate electrodes 13, the $N^+$ emitter layer 7, the P base layer 9, and the N layer 11 thereby form an insulated gate transistor-forming area in an IGBT.

The $N^+$ emitter layer 7 of n-type is formed in a surface layer of the P base layer 9 to be in contact with the gate insulating film 12. $P^+$ layers 8 are formed further in the surface layer of the P base layer 9. Interlayer insulating films 6 are formed on the gate electrodes 13. An emitter electrode 5E (a first electrode) is formed on a top surface (a first main surface) of the $N^-$ drift layer 14 to be electrically connected to the $N^+$ emitter layer 7 and the $P^+$ layer 8. The left gate electrode 13 in the two gate electrodes 13 illustrated in the active cell area R1 in FIG. 1 serves as an actual gate electrode, and the right gate electrode 13 is a dummy electrode with an emitter potential, without serving as an actual gate electrode. An object and effect of the dummy electrode are described in Japanese Patent No. 4205128, Japanese Patent No. 4785334, and Japanese Patent No. 5634318, including, in the IGBT, a suppression in saturation current density, a suppression in oscillation in a state of no-load short-circuit by controlling capacitance characteristics, an improvement in short circuit capacity thereby, and a reduction in ON voltage caused by an improvement in carrier concentration in an emitter side, for example.

Next, a structure of an interface area R2 of the trench-gate IGBT is described. A P area 22 is formed in the upper layer portion of the $N^-$ drift layer 14. The P area 22 extends toward the active cell area R1, and is formed deeper than the gate electrode 13 which is the dummy electrode. The P area 22 functions as a guard ring.

An insulating film 25 is formed on the upper surface of the $N^-$ drift layer 14, and a part of the gate electrode 13 which is also referred to as a surface gate electrode part and the interlayer insulating film 6 which surrounds the surface gate electrode part are formed on the insulating film 25. An electrode 5X functioning as a gate electrode is formed on the surface gate electrode part surrounded by the interlayer insulating films 6. The electrode 5X is formed simultaneously with the emitter electrode 5E in the active cell area R1 independently of the emitter electrode 5E.

Next, an edge termination area R3 of the trench-gate IGBT is described. The P area 22 is selectively formed in the upper layer portion of the $N^-$ drift layer 14. The P area 22 functions as a field ring. Moreover, a configuration except for the P base layer 9 in the insulated gate transistor structure of the active cell area R1 is formed.

The P area 22 is provided as an area which performs a withstand voltage holding function in each of the interface area R2 and the edge termination area R3. The $N^+$ emitter layer 7 and the N layer 11 in the insulated gate transistor structure of the edge termination area R3 are provided to prevent a depletion layer which extends from a p-n junction between the P area 22 and the $N^-$ drift layer 14 from further extending.

A laminated structure of the insulating films 25 and the interlayer insulating films 6 is selectively formed on the upper surface of the $N^-$ drift layer 14. An electrode 5Y electrically connected to the P area 22 and the gate electrode 13 is formed to serve as a floating electrode. The electrode 5Y is formed simultaneously with the emitter electrode 5E in the active cell area R1 independently of the emitter electrode 5E and the electrode 5X.

Subsequently, a passivation film 20 is formed on the emitter electrode 5E and the electrodes 5X and 5Y across the active cell area R1, the interface area R2, and the edge termination area R3, and a passivation film 21 is formed on the passivation film 20 and a part of the emitter electrode 5E in the active cell region R1.

Moreover, a vertical-structure area 27G is formed between the active cell area R1, the interface area R2, and the edge termination area R3 for an IGBT in common. The vertical-structure area 27G has a laminated structure of the $N^-$ drift layer 14 and the N buffer layer 15 which form a semiconductor body, the P collector layer 16, and the collector electrode 23C.

The structure of the PIN diode is described with reference to FIG. 2. The structure of the active cell area R1 of the PIN diode is firstly described. The N buffer layer 15 is formed in the undersurface which is the second surface of the $N^-$ drift layer 14. The $N^+$ cathode layer 17 which is an active layer is formed in the undersurface of the N buffer layer 15. A cathode electrode 23K is formed as a second electrode in an undersurface of the $N^+$ cathode layer 17.

A P anode layer 10 is formed as a first electrode area in the upper layer portion of the $N^-$ drift layer 14. The P anode layer 10, the $N^-$ drift layer 14, the N buffer layer 15, and the $N^+$ cathode layer 17 form a PIN diode structure. Subsequently, an anode electrode 5A is formed as a first electrode on a first main surface which is a top surface of the P anode layer 10.

Next, the structure of the interface area R2 of the PIN diode is described. The P area 22 is formed in the upper layer portion of the $N^-$ drift layer 14. This P area 22 extends toward the active cell area R1, and is combined with the P anode layer 10. At this time, the P area 22 is formed deeper than the P anode layer 10. This P area 22 functions as a guard ring.

The insulating films 25 is formed on the upper surface of the $N^-$ drift layer 14, the interlayer insulating film 24 is formed on the insulating film 25, and an electrode 5A is formed on a part of the interlayer insulating film 24.

Next, the structure of the edge termination area R3 is described using FIG. 2. The P area 22 is selectively formed in the upper layer portion of the $N^-$ drift layer 14. The P area 22 functions as a field limiting ring. Moreover, an $N^+$ layer 26 is selectively formed in the surface layer of the $N^-$ drift layer 14 independently of the P area 22. The $N^+$ layer 26 is provided to prevent a depletion layer which extends from a junction between the P area 22 and the $N^-$ drift layer 14 from further extending. As a number of P areas increases, the withstand-voltage class of the PIN diode gets higher.

A laminated structure of the insulating films 25 and the interlayer insulating films 24 is selectively formed on the upper surface of the $N^-$ drift layer 14, and an electrode 5Z is formed to be electrically connected to the P area 22 and the $N^+$ layer 26. The electrode 5Z is formed simultaneously with the anode electrode 5A in the active cell area R1 independently of the anode electrode 5A.

Subsequently, the passivation film 20 is formed on the anode electrode 5A and the electrode 5Z across the interface area R2 and the edge termination area R3, and the passivation film 21 is formed on the passivation film 20 and a part of the anode electrode 5A in the interface area R2.

Moreover, a vertical-structure area 27D1 is formed between the active cell area R1, the interface area R2, and the edge termination area R3 for a diode in common. The vertical-structure area 27D1 has a laminated structure of the $N^-$ drift layer 14 and the N buffer layer 15 which form a semiconductor body, the $N^+$ cathode layer 17, and the cathode electrode 23K.

Next, the structure of the RFC diode is described using FIG. 3. The RFC diode has the configuration similar to the PIN diode except for the configuration that a part of the $N^+$ cathode layer 17 which is the active layer is replaced with the P cathode layer 18 in the active cell area R1 of the PIN diode illustrated in FIG. 2. That is to say, the active layer of the RFC diode is configured to include the $N^+$ cathode layer 17 which is a first partial active layer and the P cathode layer 18 which is a second partial active layer.

The RFC diode enables an acquisition of a characteristic effect in the diode performance, compared with the PIN diode, such as an electrical field relaxation phenomenon in which an electrical field intensity at a side of cathode is reduced, as described in Japanese Patent No. 5256357 and Japanese Patent Application Laid-Open No. 2014-241433. As described in Japanese Patent No. 5256357 or Japanese Patent Application Laid-Open No. 2014-241433 (U.S. Pat. No. 8,686,469), an implantation of a hole from the P cathode layer 18 is enhanced later in the recovery operation, so that the electrical field intensity at the side of cathode is reduced, the snap-off phenomenon at the end of the recovery operation and the subsequent oscillation phenomenon are suppressed, and the characteristic effect can be acquired in the diode performance such as an enhancement in ruggedness at the time of the recovery operation.

From a standpoint of securing the aforementioned effect, the $N^+$ cathode layer 17 and the P cathode layer 18 are disposed to satisfy a relationship described in Japanese Patent No. 5256357 or Japanese Patent Application Laid-Open No. 2014-241433 (U.S. Pat. No. 8,686,469). The RFC diode has a diode structure in which the PIN diode and the PNP transistor are connected in parallel when expressed by an equivalent circuit. The $N^-$ drift layer 14 is a variable resistance area.

Figure 4:
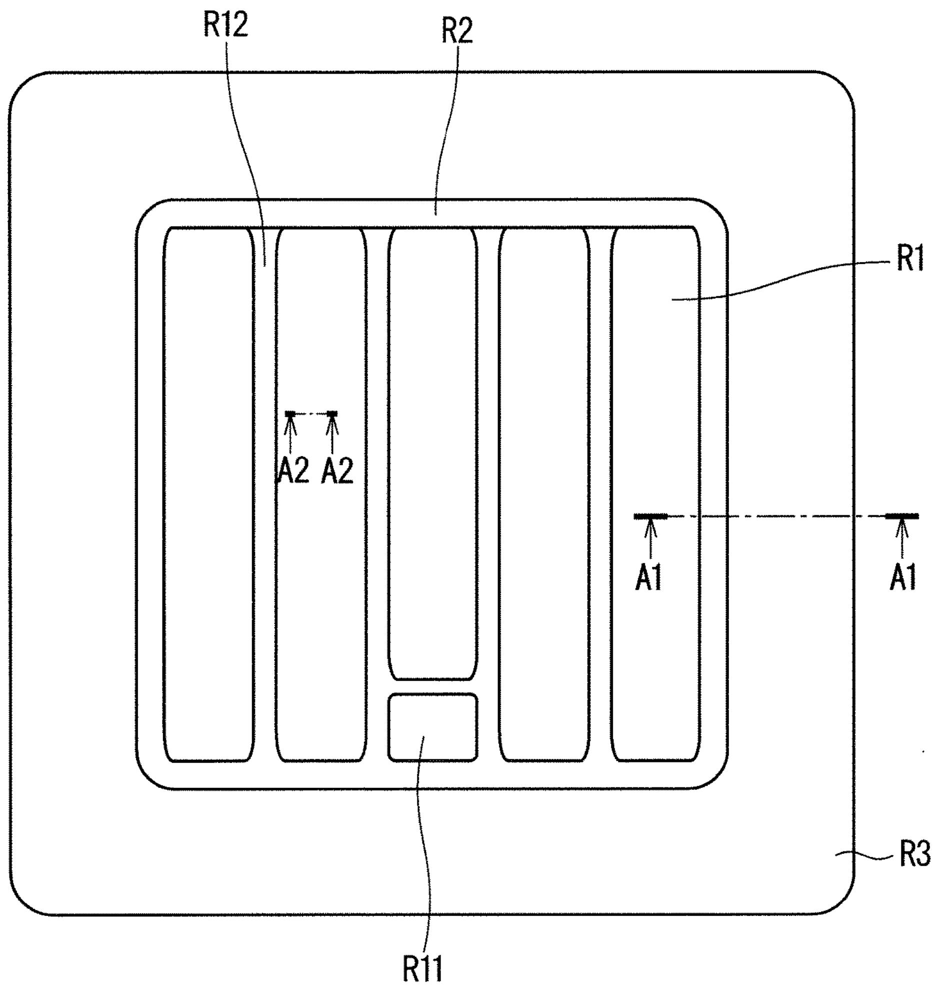
FIG. 4 is a plan view of a vertical semiconductor device illustrated in FIGS. 1 to 3.

FIG. 4 is an explanatory drawing schematically illustrating a planar structure of a vertical semiconductor device such as an IGBT or a diode. As illustrated in FIG. 4, the plurality of active cell areas R1 are formed at a center, a surface gate wiring portion R12 is formed between the two active cell areas R1, and a gate pad portion R11 is formed in a part of the areas.

The interface area R2 is formed to surround the active cell areas R1, the gate pad portion R11, and the surface gate wiring portion R12, and the edge termination area R3 is formed to further surround the interface area R2. The structures illustrated in FIG. 1, FIG. 2, and FIG. 3 correspond to a cross section A1-A1 in FIG. 4.

The aforementioned active cell areas R1 are element forming areas for guaranteeing the base performance of a power semiconductor chip. A peripheral area made up of the interface area R2 and the edge termination area R3 is formed to hold the withstand voltage including reliability. The interface area R2 is an area for guaranteeing the ruggedness of a power semiconductor in a joint area of the active cell areas R1 and the edge termination area R3 when the power semiconductor performs a dynamic operation and for supporting the intrinsic performance (of the semiconductor elements) in the active cell areas R1. The edge termination area R3 is an area, in a static state, for holding withstand voltage, providing stable withstand voltage characteristics, guaranteeing the reliability, and suppressing failure in ruggedness in a dynamic operation to support the intrinsic performance in the active cell areas R1.

A vertical-structure area 27 (the vertical-structure area 27G, the vertical-structure area 27D1, and a vertical-structure area 27D2) is an area for guaranteeing a performance on a total loss, holding a withstand voltage in a static state, providing stable withstand voltage characteristics and stable leakage characteristics at high temperature and guaranteeing reliability, and guaranteeing controllability and ruggedness in a dynamic operation to support the base performance of a power semiconductor. The total loss indicates a loss in which a loss in an ON state and a loss in a turn-on state and turn-off state are added.

<Method of Manufacturing the IGBT>

FIG. 5 to FIG. 17 are cross-sectional views illustrating a method of manufacturing the IGBT (part 1). These drawings illustrate a method of manufacturing the IGBT in the active cell area R1.

Figure 5:
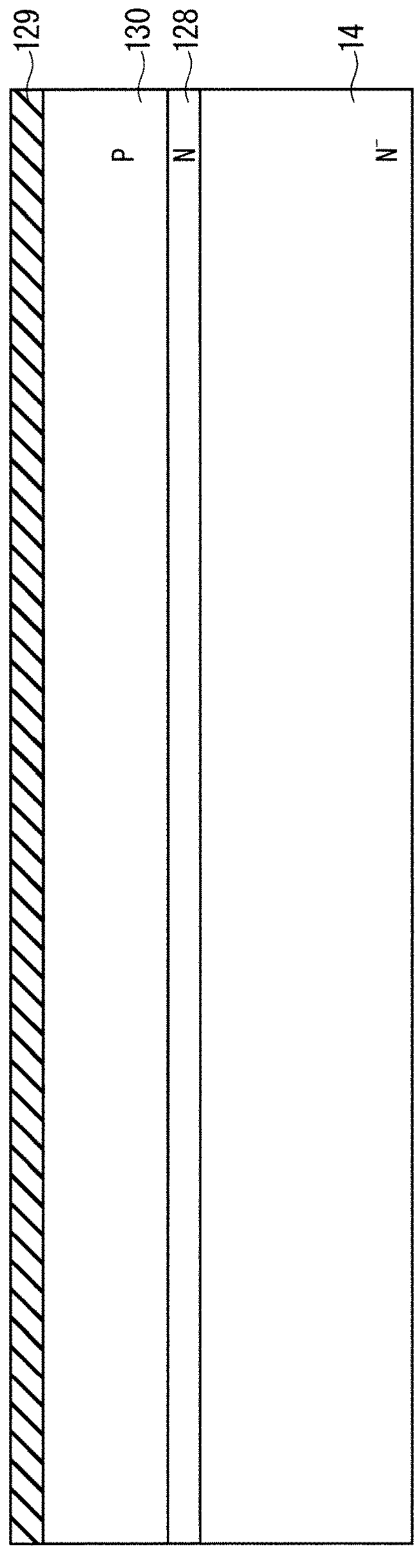
FIG. 5 is a cross-sectional view illustrating a step of manufacturing the IGBT.

A silicon wafer (a silicon wafer or a processed silicon wafer will be hereinafter referred to as a "semiconductor body") formed by the FZ method is prepared. As illustrated in FIG. 5, an N layer 128 and a P base layer 130 are formed in the upper layer portion of the semiconductor body with the $N^-$ drift layer 14. Specifically, the N layer 128 and the P base layer 130 are formed by performing an ion implantation and annealing on the $N^-$ drift layer 14. A $SiO_2$ film 129 is formed on the P base layer 130.

Figure 6:
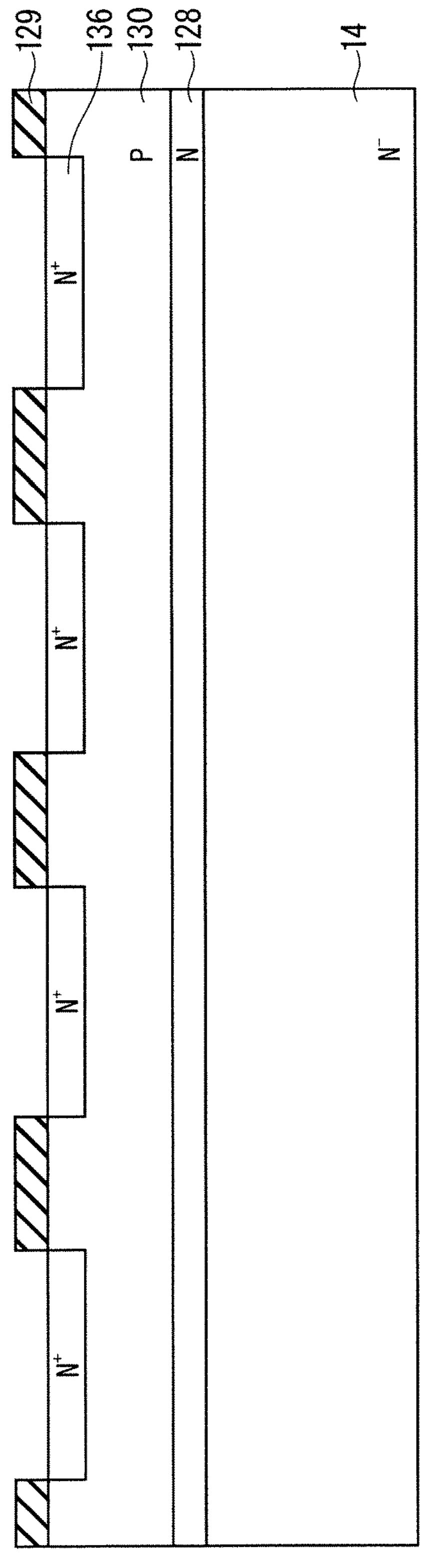
FIG. 6 is a cross-sectional view illustrating a step of manufacturing the IGBT.

Next, as shown in FIG. 6, an ion implantation and annealing are performed on the semiconductor body to selectively form a plurality of $N^+$ emitter layers 136 in the surface of the P base layer 130.

Figure 7:
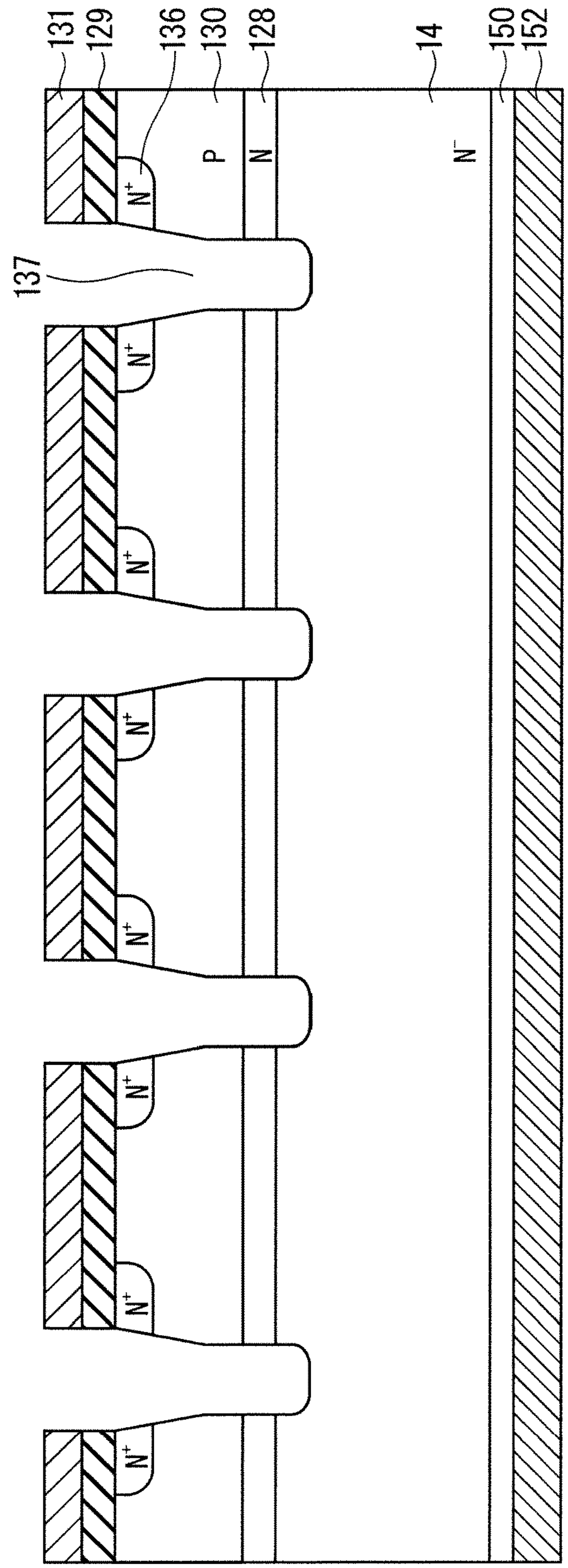
FIG. 7 is a cross-sectional view illustrating a step of manufacturing the IGBT.

Next, as illustrated in FIG. 7, an oxide film 131 is formed on the upper surface of the semiconductor body and is patterned using a photograving technique. Then, a reactive ion etching using plasma is performed on portions exposed through openings in the oxide film 131 to form trenches 137. Subsequently, a chemical dry etching and a sacrificial oxidation treatment are performed to remove crystal defects and plasma damaged layers in portions around the trenches 137, to round bottom portions of the trenches 137, and to flatten inner walls of the trenches 137. Japanese Patent Application Laid-Open No. 7-263692, for example, discloses the chemical dry etching and the sacrificial oxidation treatment. Moreover, WO 2009-122486, for example, discloses an appropriate depth of the trenches 137.

Figure 8:
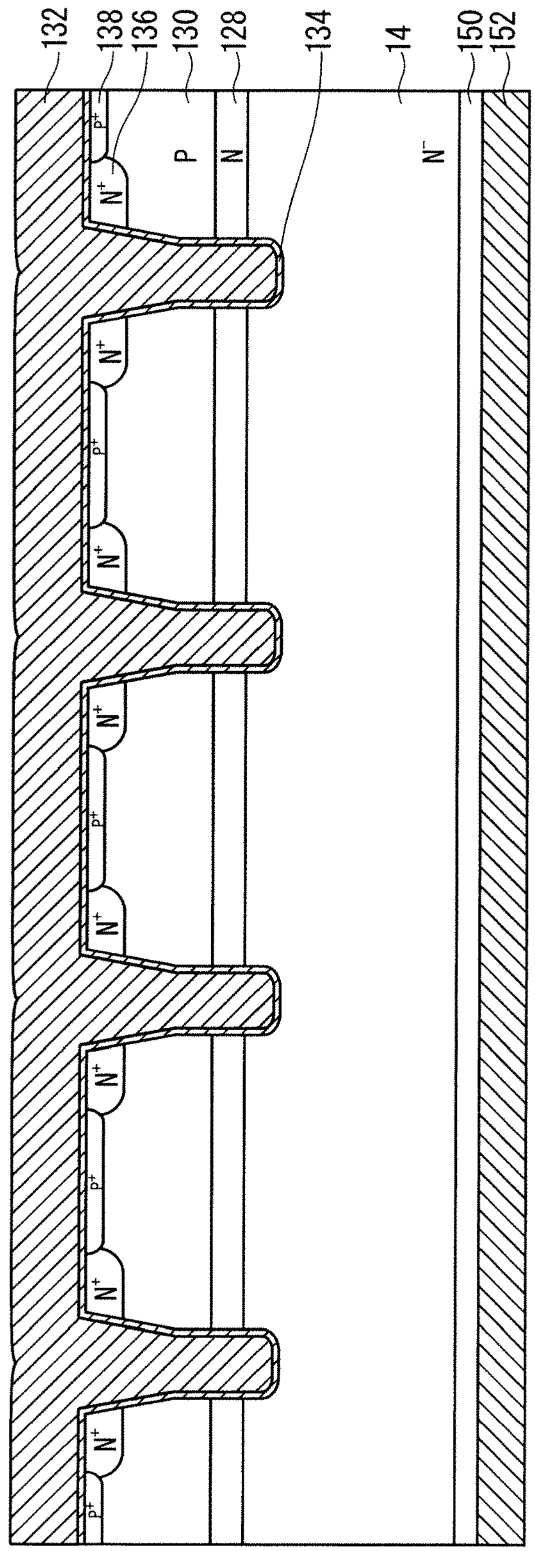
FIG. 8 is a cross-sectional view illustrating a step of manufacturing the IGBT.

Subsequently, a gate oxide film 134 is formed on the trench inner walls by thermal oxidation or chemical vapor deposition (CVD) (see, for example, Japanese Patent Application Laid-Open No. 2001-085686) as illustrated in FIG. 8. Then, a polysilicon layer 132 doped with phosphorus is formed in the trenches 137 including the gate oxide film 134 to fill the trenches 137. An oxide film 150 is formed on the undersurface of the semiconductor body simultaneously with the formation of the gate oxide film 134, and a polysilicon layer 152 doped with phosphorus is formed on the oxide film 150 simultaneously with the formation of the polysilicon layer 132.

Figure 9:
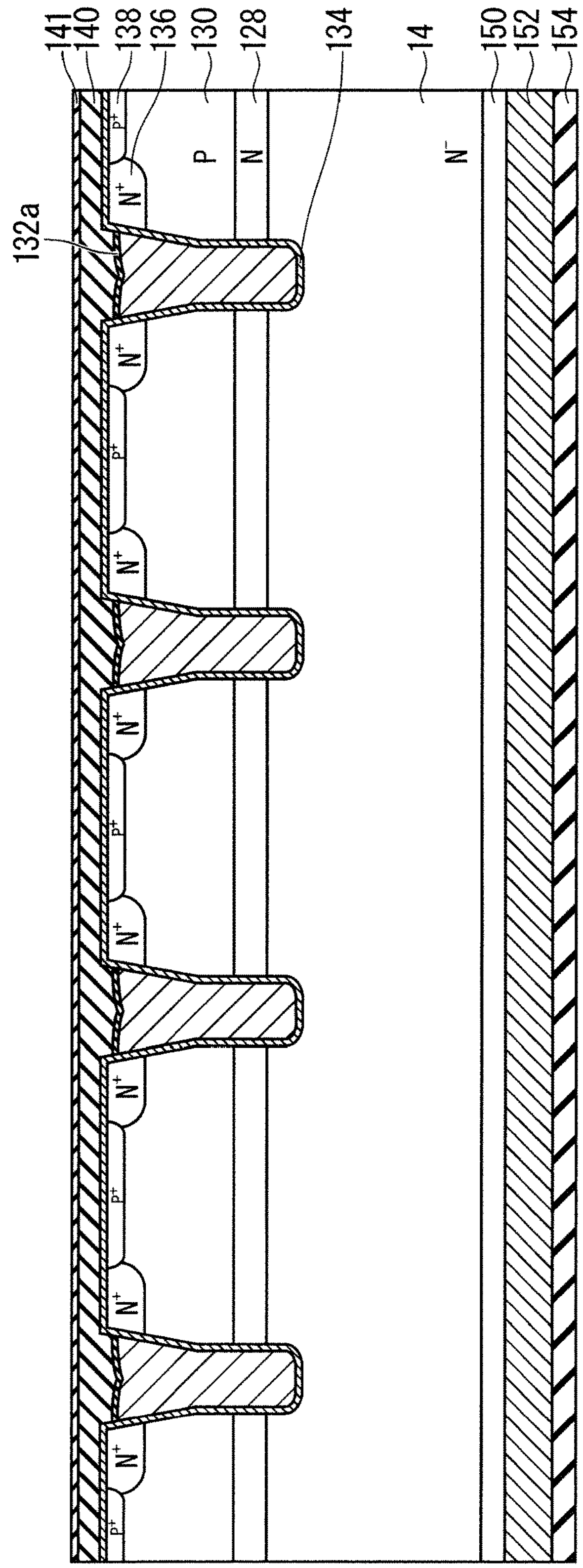
FIG. 9 is a cross-sectional view illustrating a step of manufacturing the IGBT.

Next, a portion of the polysilicon layer 132 protruding outside the trenches 137 is etched as illustrated in FIG. 9. After the etching, the polysilicon layer 132 exposed on the upper surface of the semiconductor body and the polysilicon layer 132 embedded in and exposed on the trenches 137 are oxidized or deposited by thermal oxidation or CVD to form an oxide film 132*a*. Then, $P^+$ layers 138 are formed in the upper surface of the semiconductor body. Subsequently, an oxide film 140 doped with boron or phosphorus and a TEOS film 141 are formed on the upper surface of the semiconductor body by CVD. A TEOS film or a silicate glass may be formed as the oxide film 140. A TEOS film 154 is formed on the undersurface of the semiconductor body simultaneously with the formation of the oxide film 140 and the TEOS film 141.

Figure 10:
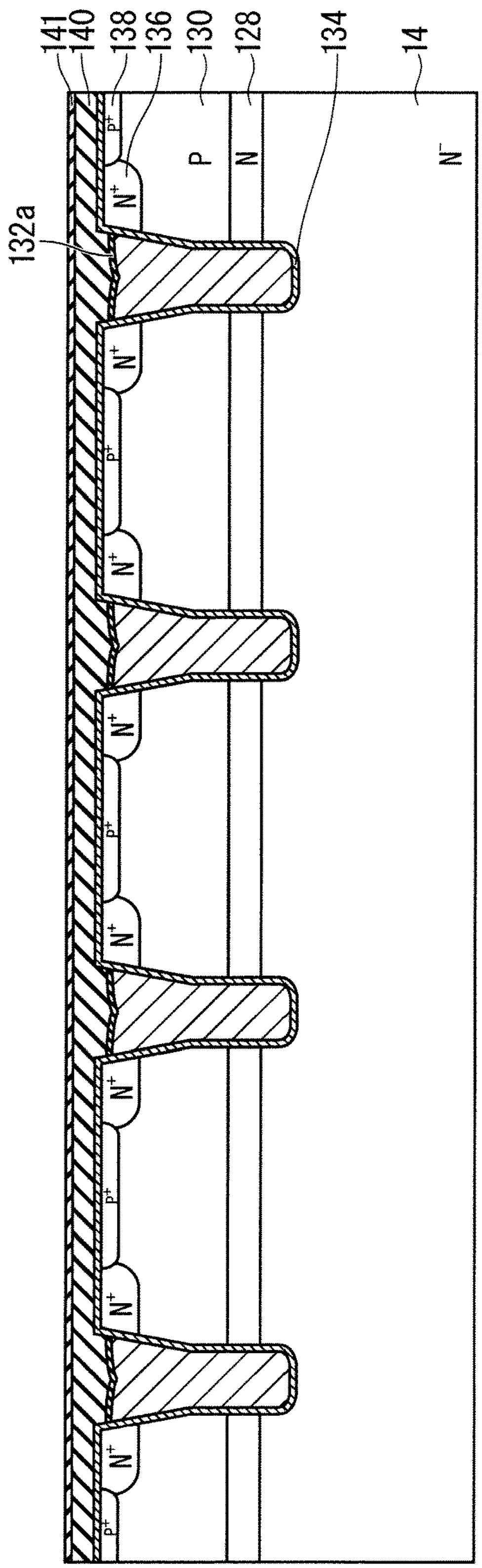
FIG. 10 is a cross-sectional view illustrating a step of manufacturing the IGBT.

Next, as illustrated in FIG. 10, the TEOS film 154, the polysilicon layer 152, and the oxide film 150 on the undersurface of the semiconductor body are etched by using a solution containing fluoric acid or a mixture acid (e.g., a mixture solution of fluoric acid, nitric acid, and acetic acid) so as to expose the N− drift layer 14.

Figure 11:
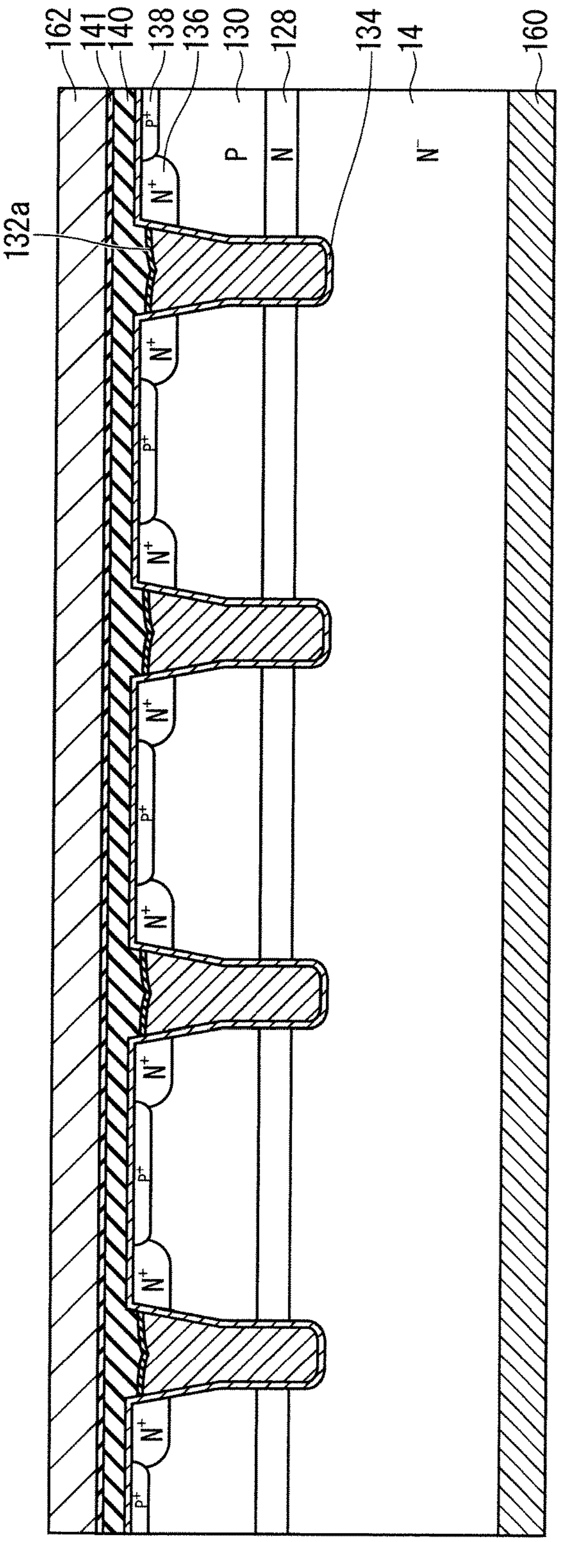
FIG. 11 is a cross-sectional view illustrating a step of manufacturing the IGBT.

Subsequently, as shown in FIG. 11, a polysilicon layer 160 doped with impurities (polysilicon doped with impurities will be hereinafter referred to as "doped polysilicon") is formed to be in contact with the $N^-$ drift layer 14 exposed at the undersurface of the semiconductor body. At this time, a doped polysilicon layer 162 which is unwanted is also formed on the upper surface of the semiconductor body. The doped polysilicon layers 160 and 162 are formed by low-pressure CVD (LPCVD). The impurities to be doped into the doped polysilicon layers 160 and 162 include phosphorus, arsenic, and antimony, for example, to cause the doped polysilicon layers 160 and 162 to become $N^+$ layers. The impurity concentrations of the doped polysilicon layers 160 and 162 are set to be equal to or higher than $1\times10^{19}$ ($cm^{-3}$). Moreover, film thicknesses of the doped polysilicon layers 160 and 162 are set to be equal to or larger than 500 (nm).

Figure 12:
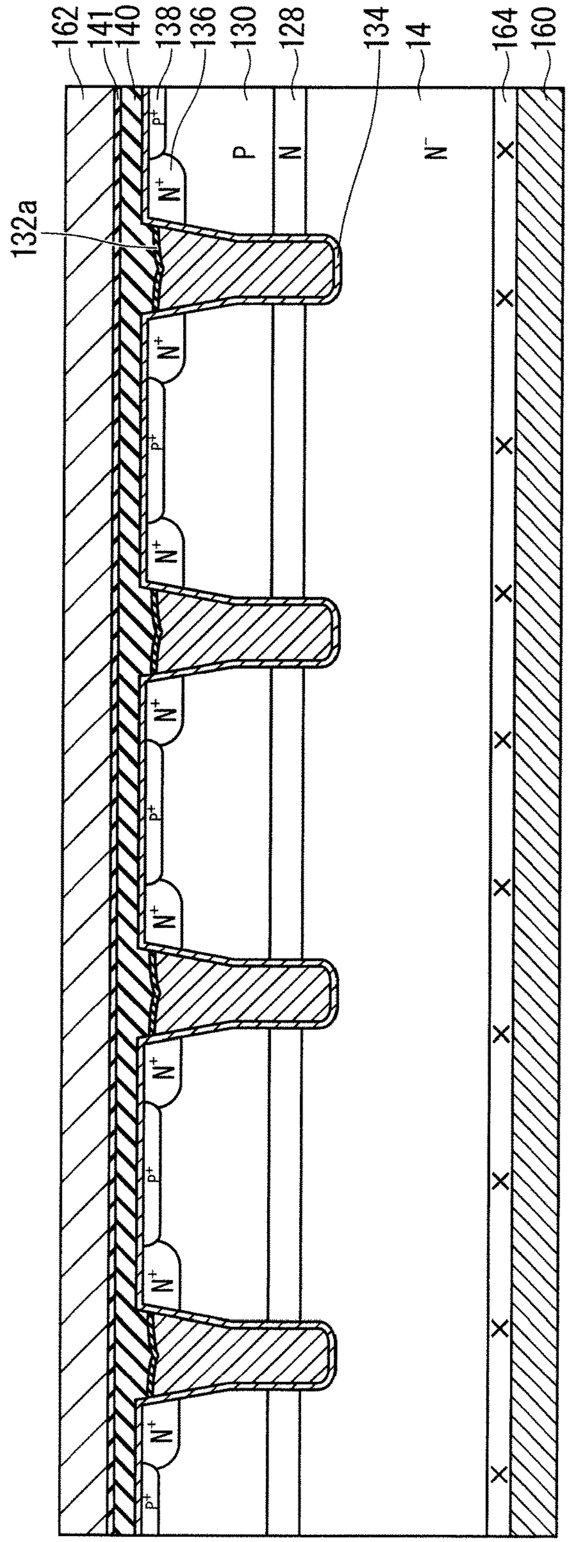
FIG. 12 is a cross-sectional view illustrating a step of manufacturing the IGBT.

Next, as shown in FIG. 12, the semiconductor body is heated in a nitrogen atmosphere at a temperature ranging from approximately 900 to 1000° C. so as to diffuse the impurities in the doped polysilicon layer 160 to the undersurface of the $N^-$ drift layer 14. With this diffusion, a gettering layer 164 having crystal defects and high-concentration impurities is formed on the undersurface of the $N^-$ drift layer 14. As described above, the gettering layer forming step is a step of forming the gettering layer 164 on the undersurface of the $N^-$ drift layer 14 exposed on the undersurface of the semiconductor body. The impurity concentration of the surface of the gettering layer 164 ranges, for example, from $1.0\times10^{19}$ to $1.0\times10^{22}$ ($cm^{-3}$).

After the gettering layer forming step, the temperature of the semiconductor body is reduced at an arbitrary temperature reducing rate to a temperature approximately ranging from 600 to 700° C., and then the temperature is maintained for four hours or longer. This step is referred to as the annealing step. In the annealing step, the semiconductor body is heated to diffuse metal impurities, contaminant atoms, and damage which have been introduced into the $N^-$ drift layer 14 in the manufacturing steps, and the diffused materials are captured by the gettering layer 164.

Next, as shown in FIG. 13, the doped polysilicon layer 162 on the upper surface of the semiconductor body is selectively removed by using a solution of fluoric acid or a mixture acid (e.g., a mixture solution of fluoric acid, nitric acid, and acetic acid). For example, WO 2014-054121 discloses the gettering processes illustrated in FIG. 11 to FIG. 13.

Figure 14:
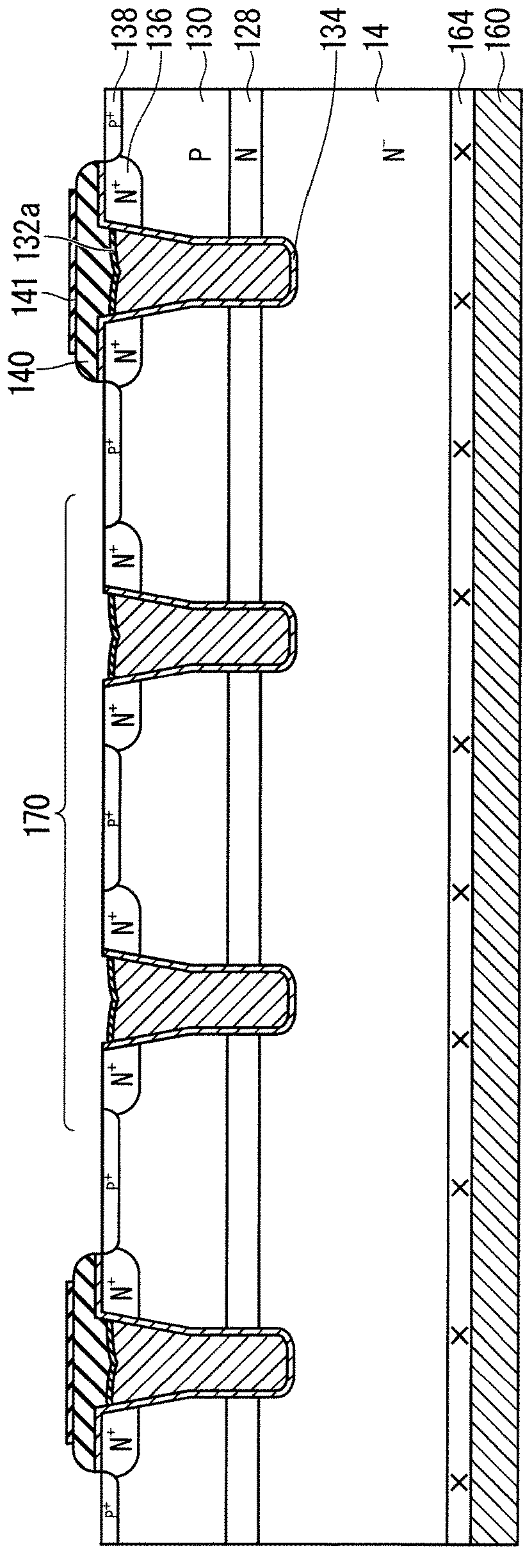
FIG. 14 is a cross-sectional view illustrating a step of manufacturing the IGBT.

Then, as illustrated in FIG. 14, the oxide film 140 and the TEO film 141 on the upper surface of the semiconductor body are partially etched to expose a portion thereof outside, and a trench exposed portion 170 having contact holes is thereby formed. The portion other than the trench exposed portion 170 functions as a MOS transistor portion in the IGBT.

An object to be achieved by partially forming the trench exposed portion 170 in an area where the trenches 137 filled with the polysilicon layer 132, as shown in FIG. 14, is to reduce an effective gate width and adjust a capacitance by setting part of the polysilicon layer 132 to an emitter potential. This enables a reduction in saturated current density, a suppression of an oscillation at the time of short circuit caused by controlling capacitance, an improvement in short-circuit ruggedness (see WO 2002-058160 and WO 2002-061845 for detailed information), and a reduction in ON voltage caused by improving the carrier concentration at an emitter in an ON state.

Figure 15:
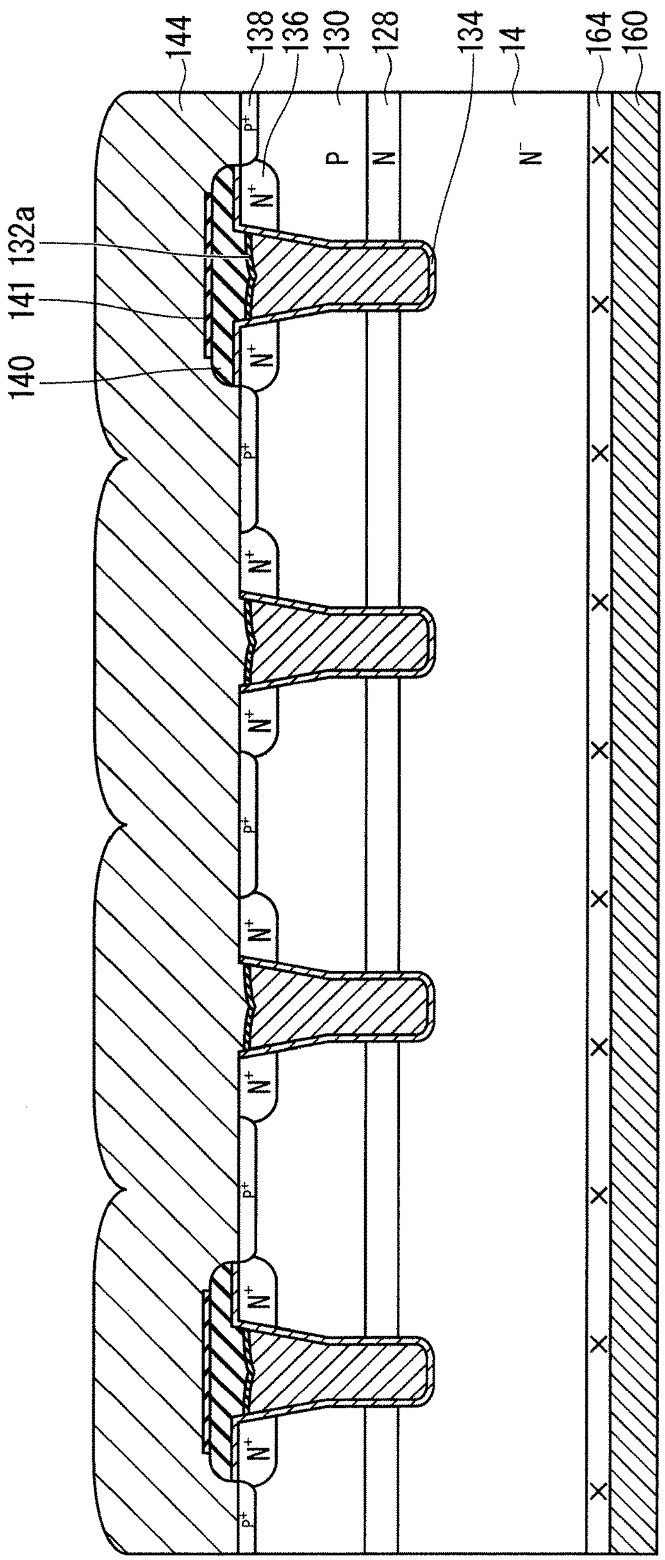
FIG. 15 is a cross-sectional view illustrating a step of manufacturing the IGBT.

Next, a silicide layer and a barrier metal layer are formed on the upper surface of the semiconductor body by sputtering and annealing. A high-melting-point metal material such as Ti, Pt, Co, or W is used as a metal at the time of the sputtering. Next, as shown in FIG. 15, a metal wiring layer 144 having approximately 1 to 3% of Si added thereto is formed by sputtering on the upper surface of the semiconductor body. Examples of the material of the metal wiring layer 144 include AlSi, AlSiCu, and AlCu. The metal wiring layer 144 is electrically connected to the trench exposed portion 170.

Figure 16:
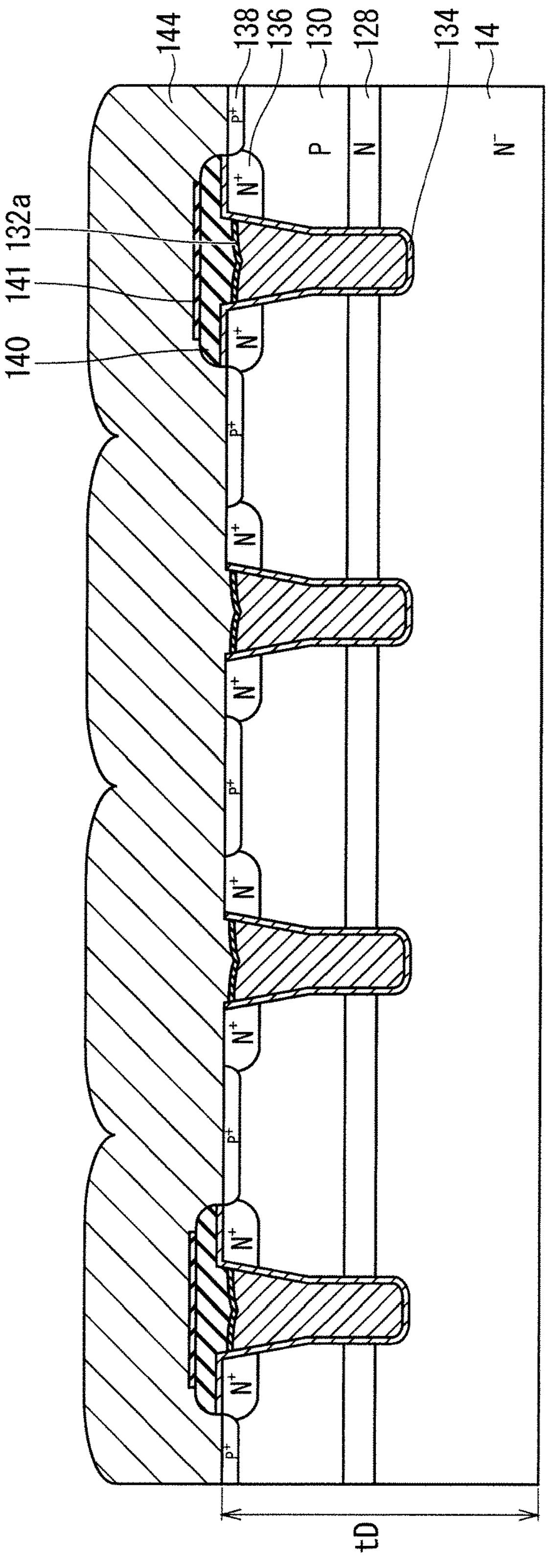
FIG. 16 is a cross-sectional view illustrating a step of manufacturing the IGBT.

Next, as shown in FIG. 16, the gettering layer 164 and the doped polysilicon layer 160 formed on the undersurface of the semiconductor body are removed by polishing and etching. The step of removing, for example, the gettering layer 164 is referred to as a removal step. In the removal step, a portion of the $N^-$ drift layer 14 being in contact with the gettering layer 164 may be removed in a desired thickness. Accordingly, a thickness tD of the semiconductor body (the $N^-$ drift layer 14) is compatible with the withstand-voltage class of the semiconductor device.

Figure 17:
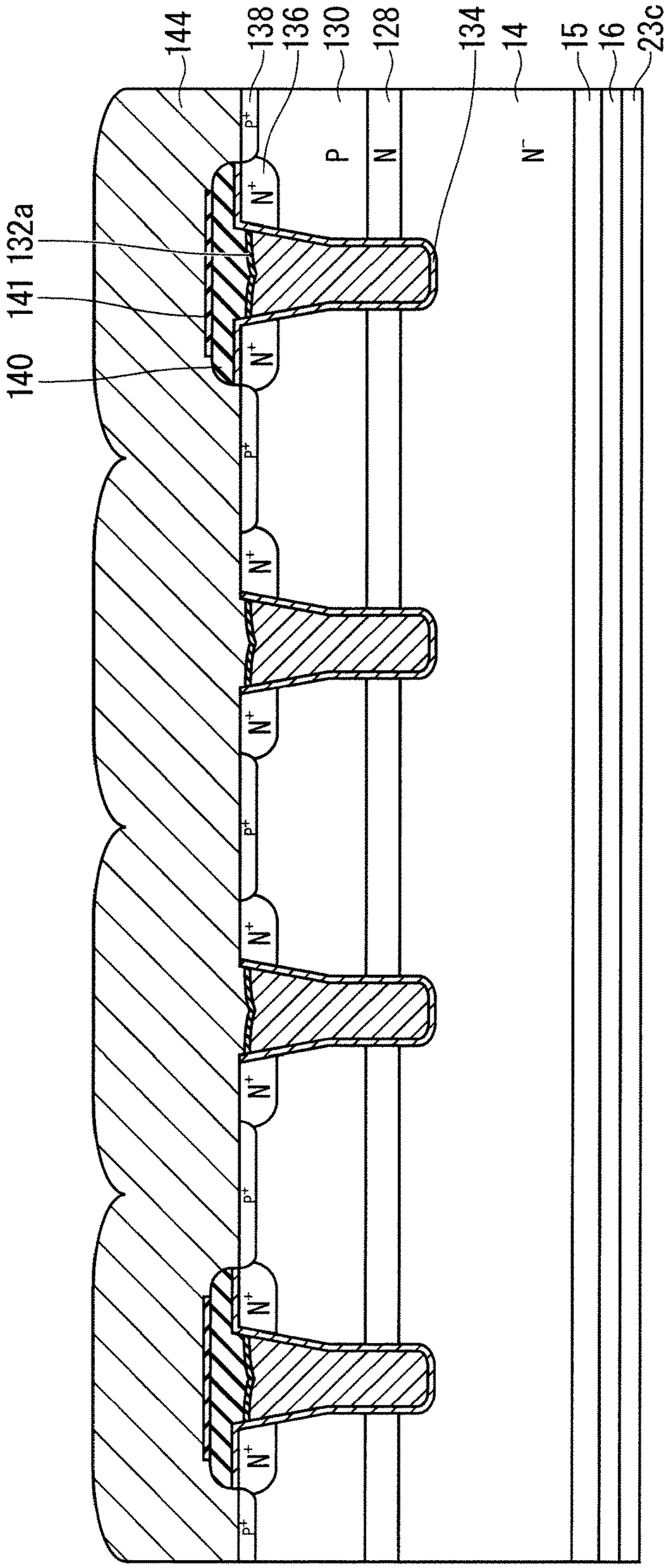
FIG. 17 is a cross-sectional view illustrating a step of manufacturing the IGBT.

Subsequently, the N buffer layer 15 is formed in the undersurface of the semiconductor body as illustrated in FIG. 17. The N buffer layer 15 is formed by implanting impurities and thermal processing such as introducing phosphorus, selenium, and sulfur, or protons (hydrogen) into Si from the undersurface of the semiconductor body and annealing. Subsequently, the p-type P collector layer 16 is formed on the undersurface of the N buffer layer 15. Furthermore, the collector electrode 23C is formed on the undersurface of the P collector layer 16. The collector electrode 23C is a portion to be soldered to the semiconductor body in a module, for example, when the semiconductor device is mounted on a module. Thus, it is preferred to form the collector electrode 23C by stacking a plurality of metals to obtain a low contact resistance.

In the relationship between FIG. 17 and FIG. 1, the polysilicon layers 132 correspond to the gate electrodes 13, the gate oxide film 134 corresponds to the gate insulating film 12, the N layer 128 corresponds to the N layer 11, the P base layer 130 corresponds to the P base layer 9, the $N^+$ emitter layers 136 correspond to the $N^+$ emitter layers 7, the $P^+$ layers 138 corresponds to the $P^+$ layers 8, and the metal wiring layer 144 corresponds to the emitter electrode 5E.

<Method of Manufacturing the Diode>

FIG. 18 to FIG. 26 are cross-sectional views illustrating a method of manufacturing the RFC diode illustrated in FIG. 3.

Figure 18:
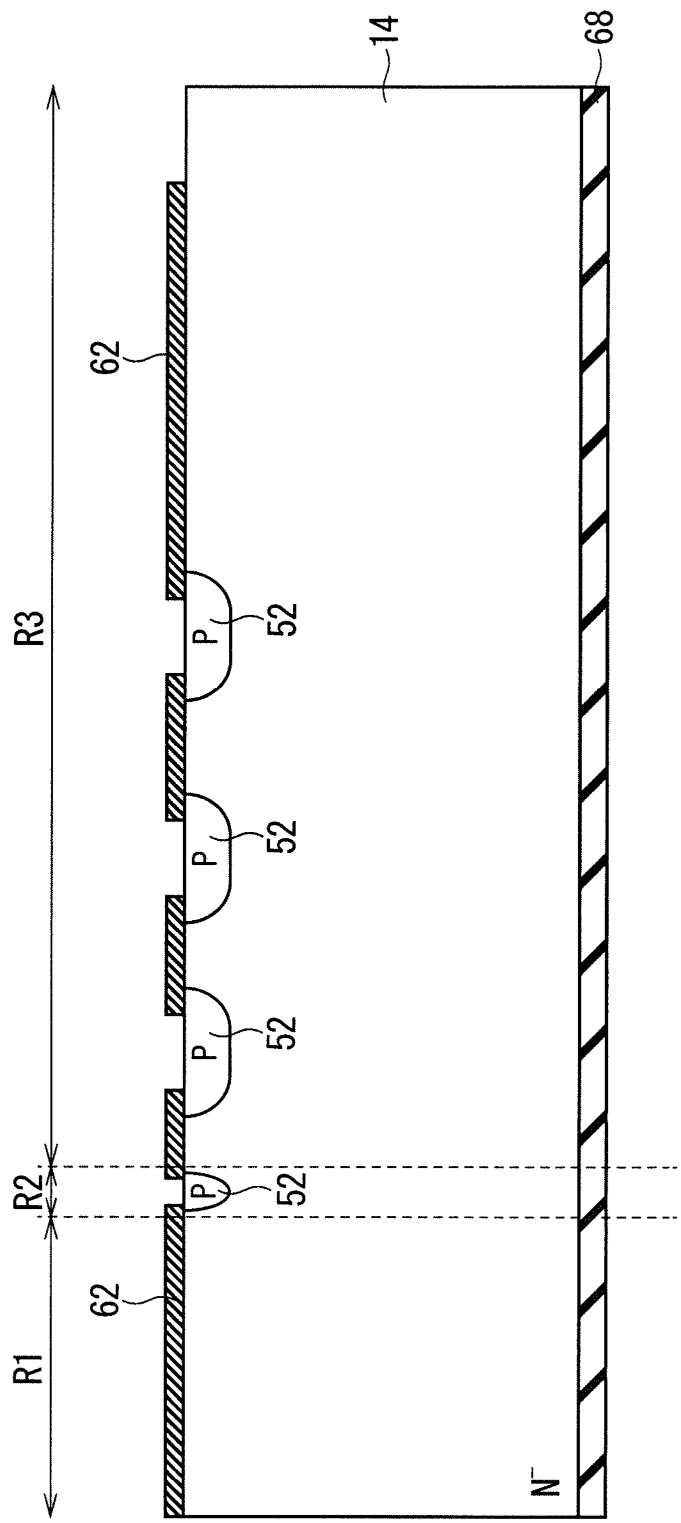
FIG. 18 is a cross-sectional view illustrating a step of manufacturing the RFC diode.

FIG. 18 illustrates the active cell area R1, and the interface area R2 and the edge termination area R3 formed to surround the active cell area R1. Firstly, a semiconductor body only including the $N^-$ drift layer 14 is prepared. Then, a plurality of P layers 52 are selectively formed on the surface of the $N^-$ drift layer 14 within the interface area R2 and the edge termination area R3. The P layers 52 are formed by implanting ions using, as a mask, oxide films 62 preliminarily formed and then annealing the semiconductor body. An oxide film 68 is also formed on the undersurface of the semiconductor body at the time of forming the oxide films 62.

Figure 19:
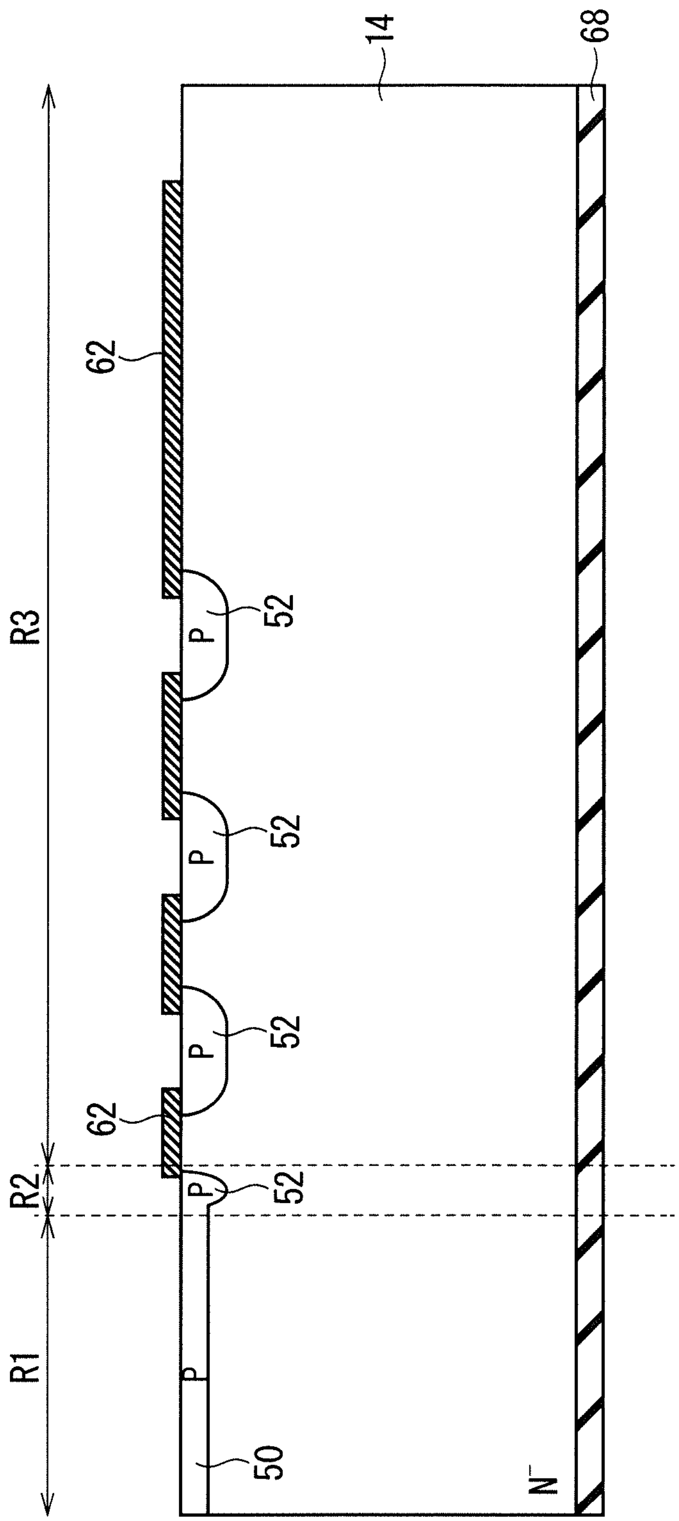
FIG. 19 is a cross-sectional view illustrating a step of manufacturing the RFC diode.

Next, as illustrated in FIG. 19, a P layer 50 is formed on the surface of the N− drift layer 14 within the active cell area R1 by implanting ions and annealing.

Figure 20:
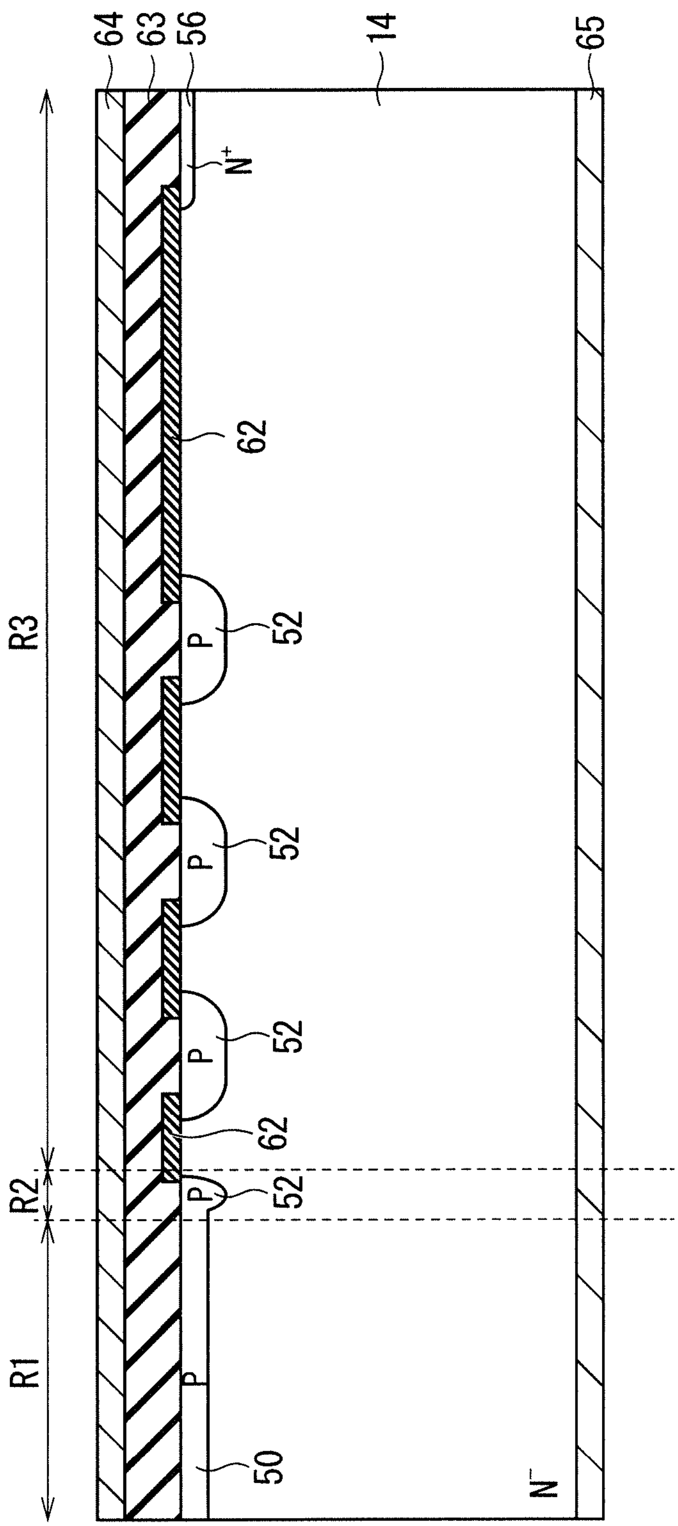
FIG. 20 is a cross-sectional view illustrating a step of manufacturing the RFC diode.

Subsequently, an $N^+$ layer 56 is formed at the end of the edge termination area R3 in the upper surface of the semiconductor body as illustrated in FIG. 20. Next, a TEOS layer 63 is formed on the upper surface of the semiconductor body. Subsequently, the undersurface of the semiconductor body is exposed. Then, a doped polysilicon layer 65 doped with impurities is formed to be in contact with the $N^-$ drift layer 14 which is exposed on the undersurface of the semiconductor body. At this time, a doped polysilicon layer 64 is formed also on the upper surface of the semiconductor body.

Figure 21:
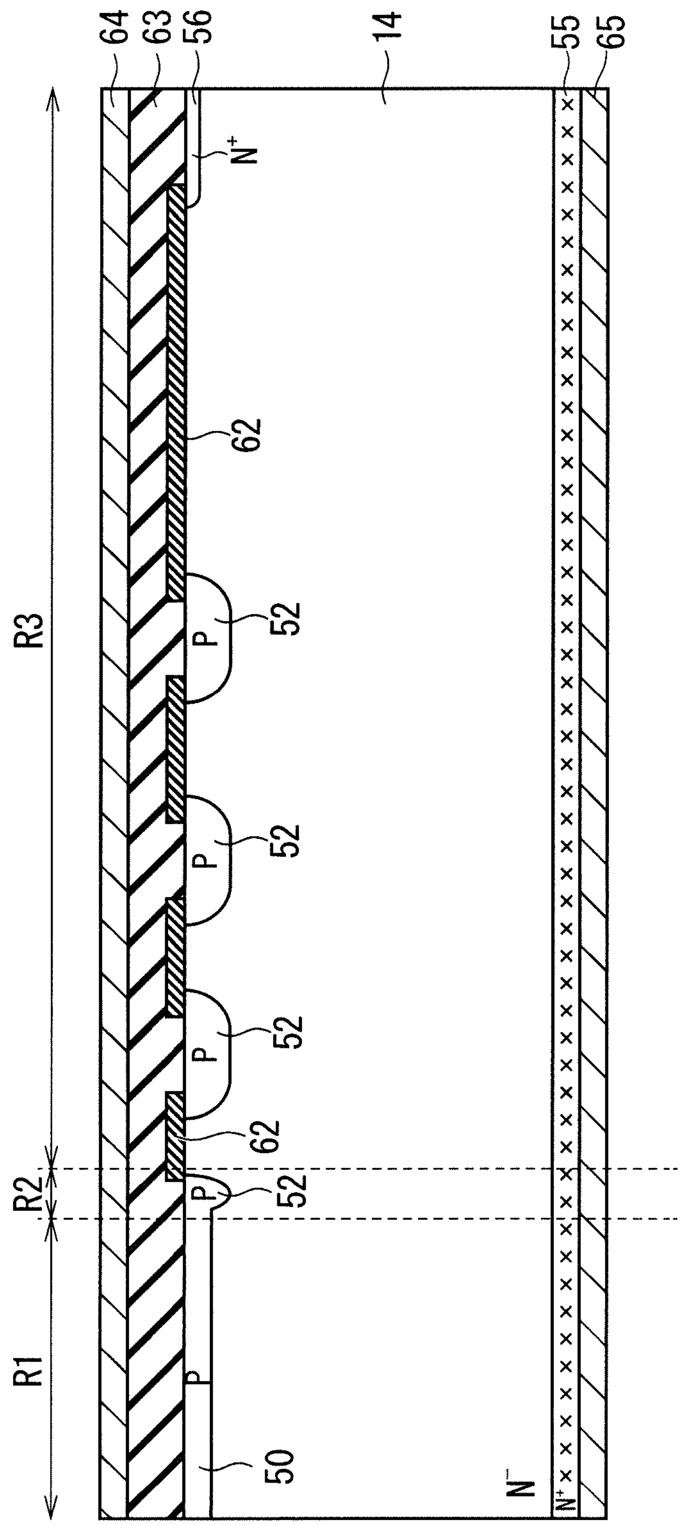
FIG. 21 is a cross-sectional view illustrating a step of manufacturing the RFC diode.

Next, as illustrated in FIG. 21, the semiconductor body is heated to diffuse the impurities in the doped polysilicon layer 65 to the undersurface of the $N^-$ drift layer 14 to form a gettering layer 55 having crystal defects and impurities. This step is similar to the step of forming the gettering layer 164 in the method of manufacturing the IGBT illustrated in FIG. 12. Subsequently, the annealing step is performed to capture by the gettering layer 55 metal impurities, contaminant atoms, and damage in the $N^-$ drift layer 14.

Figure 22:
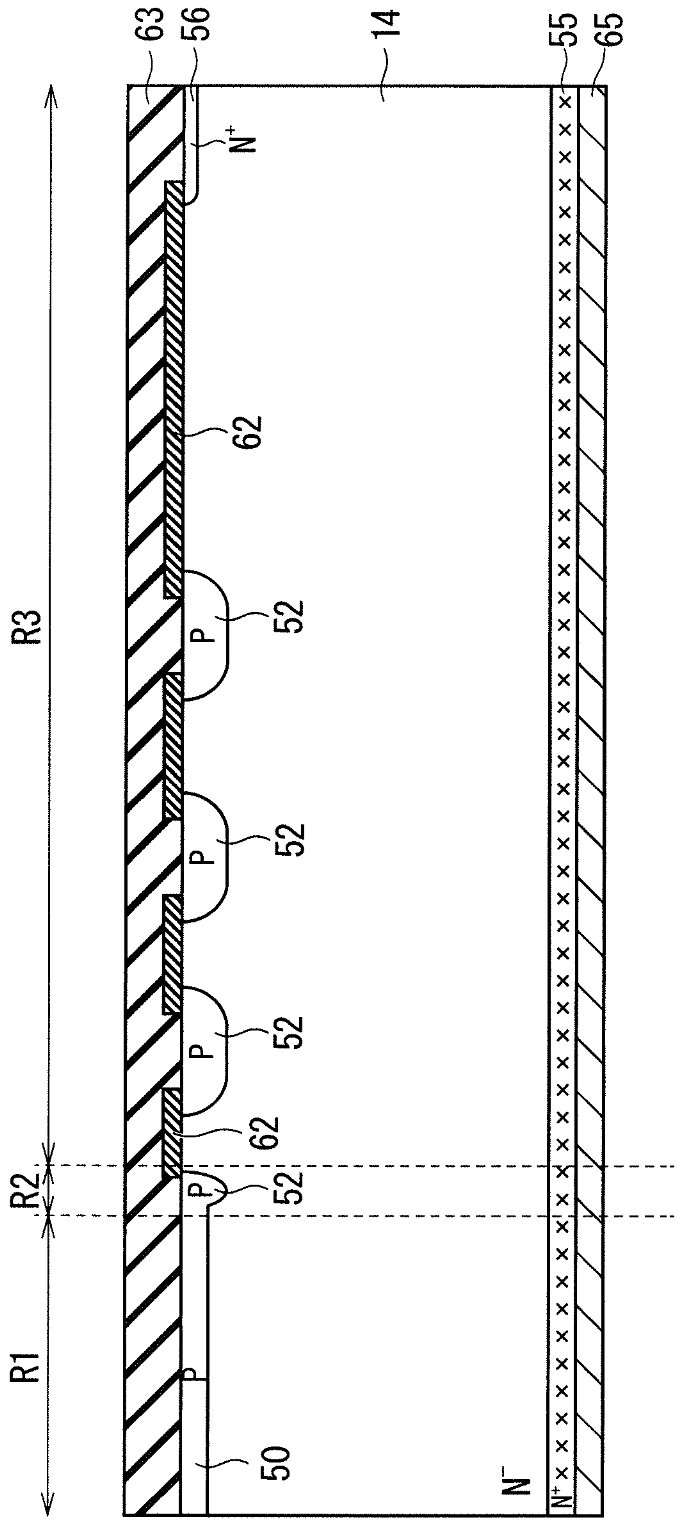
FIG. 22 is a cross-sectional view illustrating a step of manufacturing the RFC diode.

Then, as shown in FIG. 22, the doped polysilicon layer 64 formed on the upper surface of the semiconductor body is selectively removed by using a solution of fluoric acid or a mixture acid (e.g., a mixture solution of fluoric acid, nitric acid, and acetic acid). This gettering process is the same as the gettering process in the aforementioned IGBT.

Figure 23:
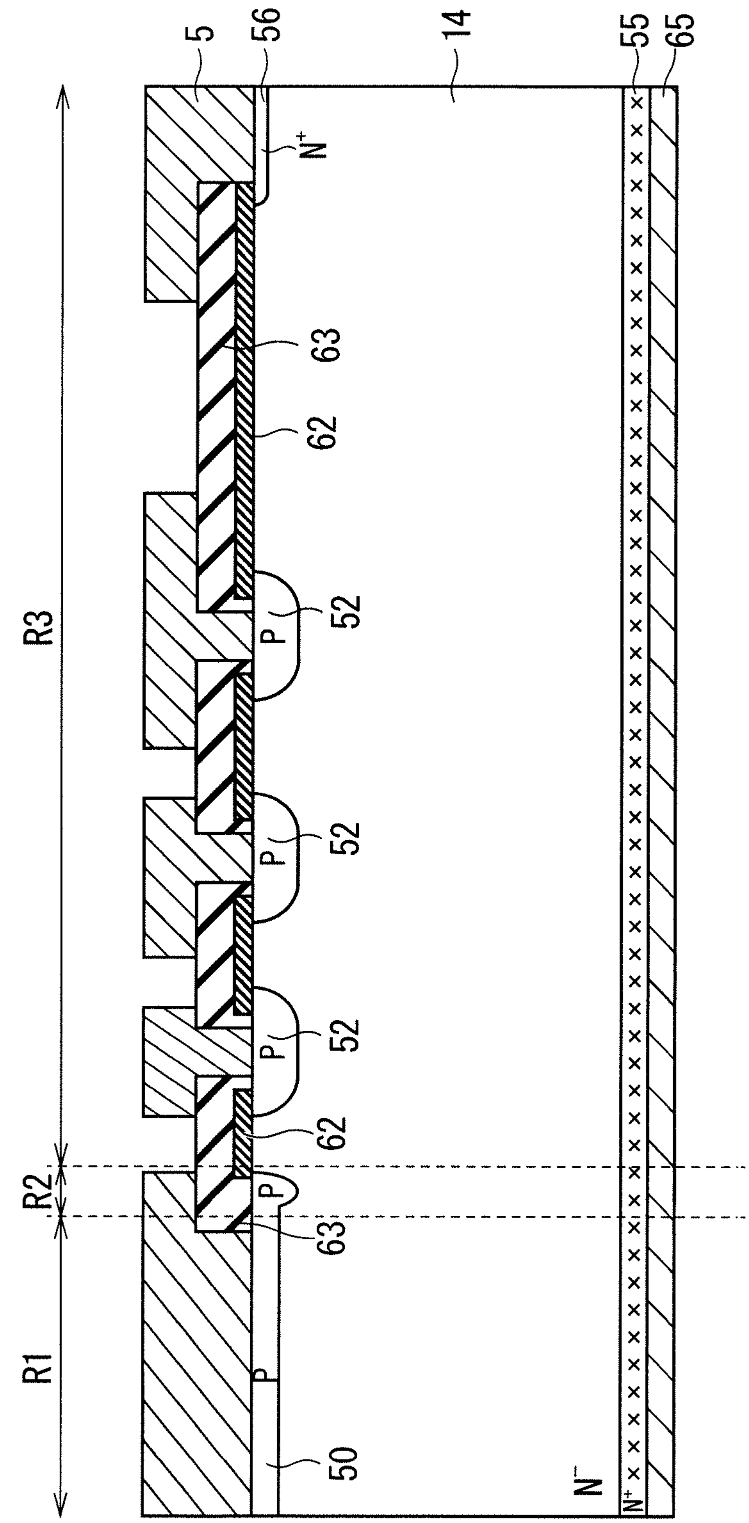
FIG. 23 is a cross-sectional view illustrating a step of manufacturing the RFC diode.

Next, as illustrated in FIG. 23, contact holes are formed to expose the P layers 52, the P layer 50, and the $N^+$ layer 56 on the upper surface of the semiconductor body. That is to say, the TEOS layer 63 is processed as illustrated in FIG. 23. Then, an aluminum wiring 5 for the anode electrode 5A having approximately 1 to 3% of Si added thereto is formed by sputtering.

Figure 24:
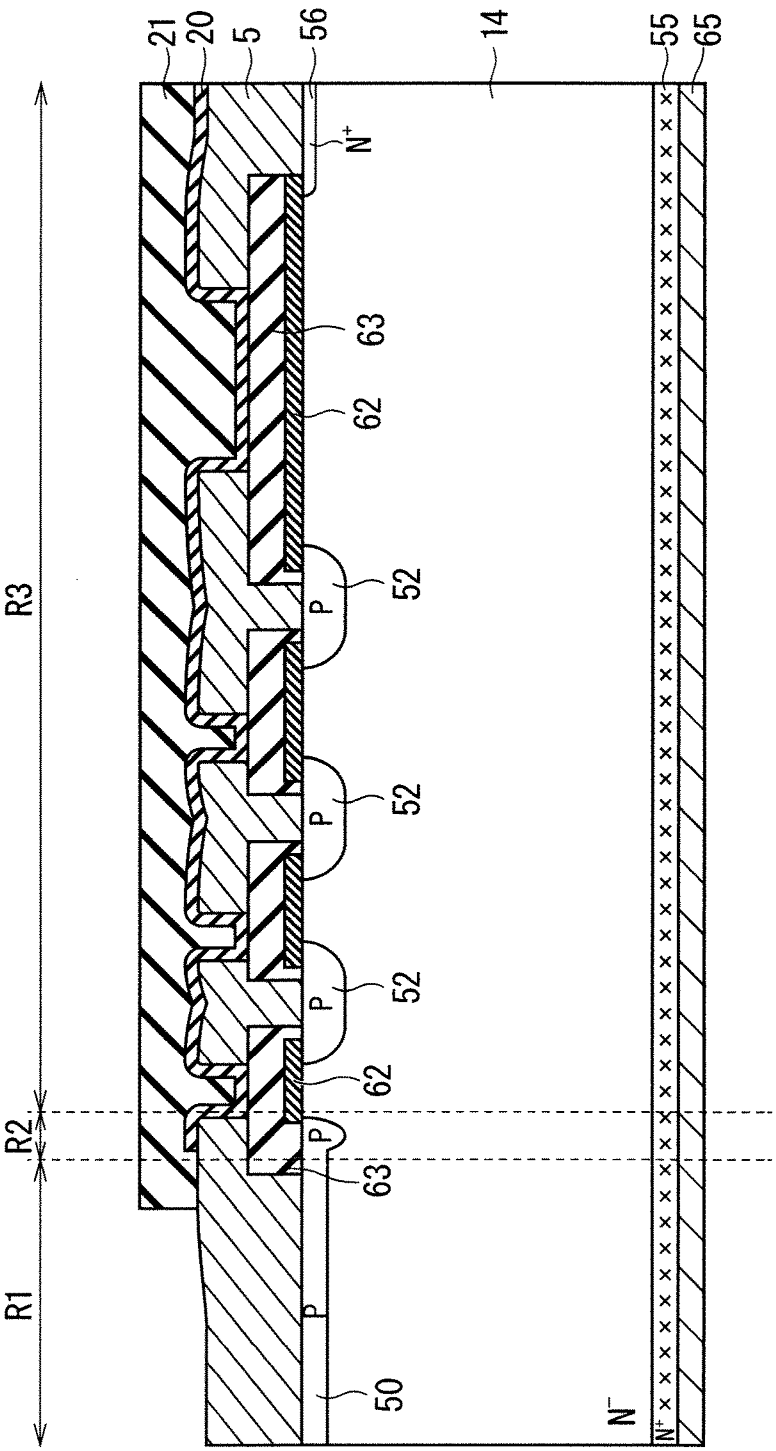
FIG. 24 is a cross-sectional view illustrating a step of manufacturing the RFC diode.

Subsequently, a passivation film 21 is formed on the upper surface of the semiconductor body as illustrated in FIG. 24.

Figure 25:
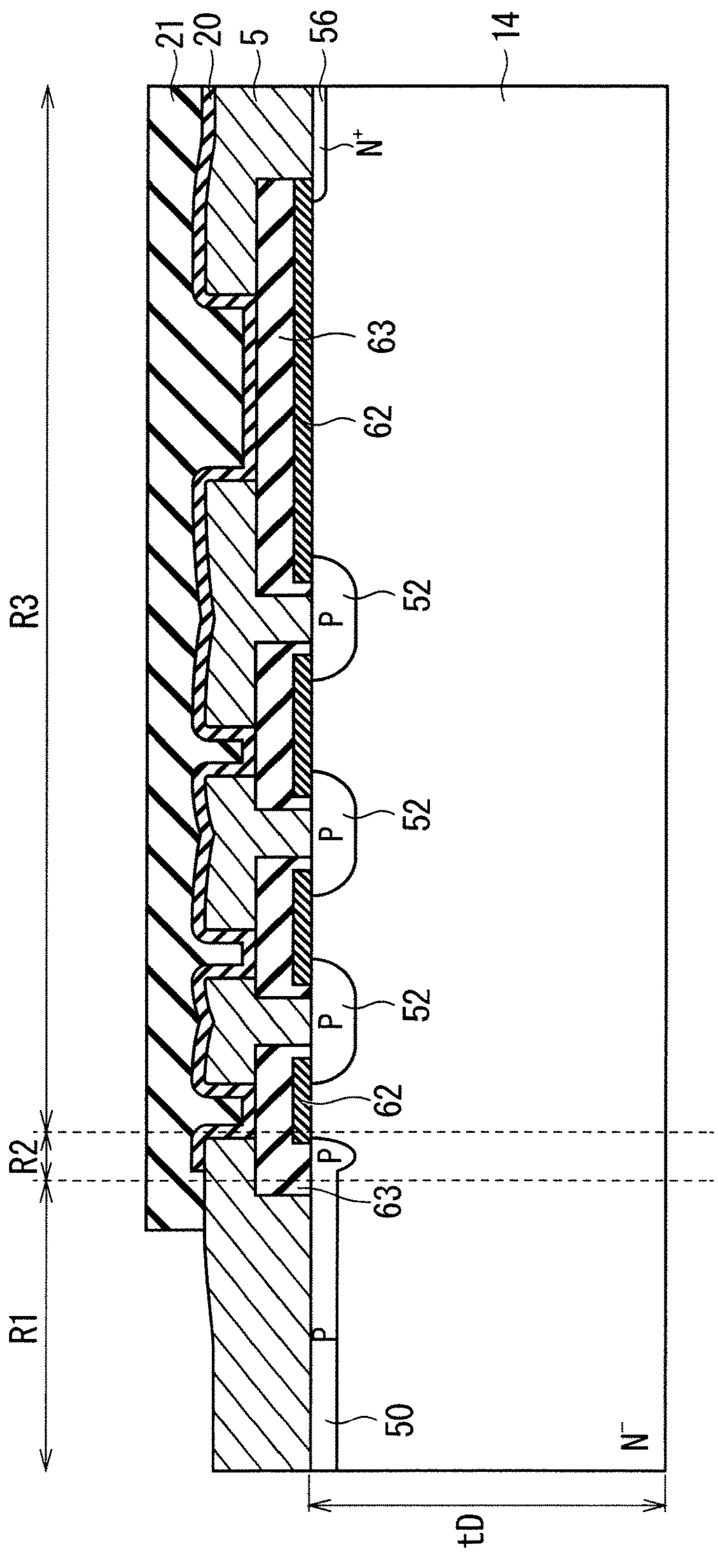
FIG. 25 is a cross-sectional view illustrating a step of manufacturing the RFC diode.

Next, as illustrated in FIG. 25, the gettering layer 55 and the doped polysilicon layer 65 formed on the undersurface of the semiconductor body are removed by polishing or etching. Thereby, the thickness tD of the semiconductor body (the $N^-$ drift layer 14) is compatible with the withstand-voltage class of the semiconductor device.

Then, the N buffer layer 15 is formed in the undersurface of the $N^-$ drift layer 14 as illustrated in FIG. 26. Subsequently, the P cathode layer 18 is formed on the undersurface of the N buffer layer 15. Then, the $N^+$ cathode layers 17 are partially formed in the P cathode layer 18 within the active cell area R1. The N buffer layer 15, the $N^+$ cathode layers 17, and P cathode layer 18 are diffusion layers formed by implanting ions and annealing. Finally, the cathode electrode 23K is formed on the undersurface of the semiconductor body.

In the relationship between FIG. 26 and FIG. 3, the P layer 50 corresponds to the P anode layer 10, the P layers 52 correspond to the P areas 22, the $N^+$ layer 56 corresponds to the $N^+$ layer 26, and the aluminum wiring 5 corresponds to the anode electrode 5A.

Figure 28:
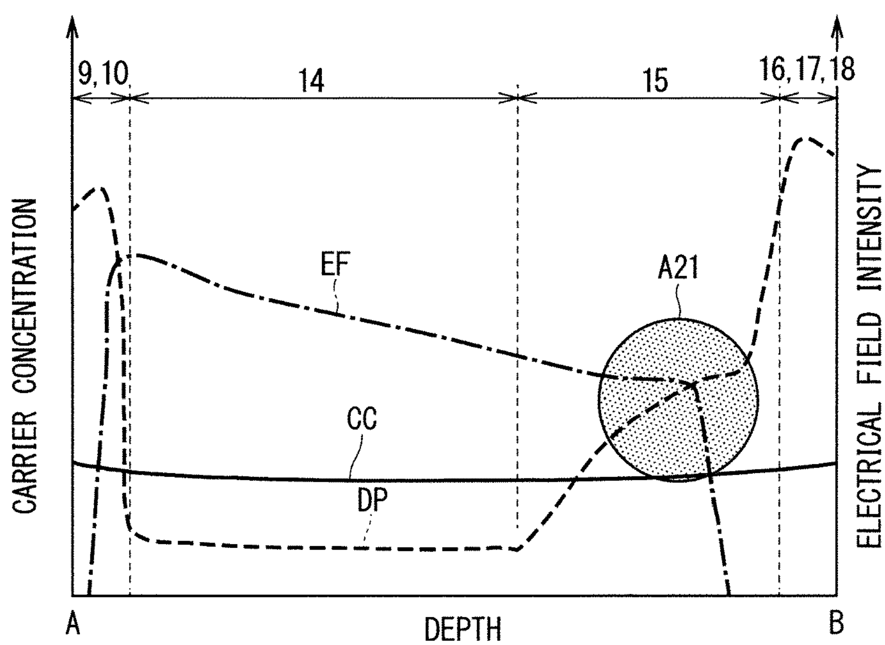
FIG. 28 is an explanatory drawing illustrating a concept of the vertical-structure area proposed by the present invention.

A substrate concentration (Cd) of a Si wafer used for the IGBT or the diode is determined in accordance with the withstand-voltage class of the semiconductor element to be manufactured. For example, $Cd=1.0\times10^{12}$ to $5.0\times10^{14}\ cm^{-3}$. The Si wafer is made by the FZ method. Then, a thickness of the device is accurately adjusted in accordance with the withstand-voltage class in the wafer process illustrated in FIG. 16 or FIG. 25, and the vertical-structure area 27 is formed in the wafer process illustrated in FIG. 17 or FIG. 26. The wafer process, in which the vertical-structure area is formed in the wafer process using the FZ wafer as described above, is becoming mainstream on a background described hereinafter.

a) The wafer in which the $N^-$ drift layer 14 is manufactured as the wafer by the epitaxial method has a demerit that the cost of the Si wafer significantly increases by reason of a dependence on the thickness of Si formed by the epitaxial method. In contrast, an appropriate value of only the concentration of the $N^-$ drift layer 14 is set for each withstand-voltage class using the FZ method, and the Si wafer of the $N^-$ drift layer 14 having the same thickness regardless of the withstand-voltage class is used at a start of wafer process, whereby the wafer of low unit cost can be adopted and the cost of the wafer can be reduced.

b) The thickness in the device is set to have a value required for the withstand-voltage class in a final stage of the wafer process illustrated in FIG. 17 or FIG. 28 for a purpose of utilizing the wafer manufactured by the aforementioned FZ method, and the vertical structure is formed, whereby the wafer process which enables a substantial minimization of converting the process device can be adopted. This enables the wafer process of manufacturing the Si wafer having the large diameter to be also compatible with the wafers having the various thicknesses ranging from 40 μm to 700 μm.

c) The background b) enables a manufacture of, as well as the IGBT and the diode, a MOS transistor structure formed on a surface of a wafer, various diffusion layers, and a device structure such as a wiring structure using a latest process device without change.

The impurity concentration of n drift layer and the thickness in device are device parameters which have influence on not only the withstand voltage characteristics of the IGBT and diode but also the total loss and the controllability and ruggedness in the dynamic operation, and thus need to be highly accurate.

In the wafer process illustrated in FIG. 5 to FIG. 17 or FIG. 18 to FIG. 26, the vertical-structure area is formed after the step of forming the aluminum wiring illustrated in FIG. 15 or FIG. 23 or the step of forming the passivation film illustrated in FIG. 24. Accordingly, in a case of IGBT, for example, a MOS transistor structure is formed on a surface on which a vertical-structure area is not formed, thereby having an aluminum wiring or a passivation film on the surface. Thus, when the diffusion layer constituting the vertical-structure area (the N buffer layer 15, the P collector layer 16, the $N^+$ cathode layer 17, and the P cathode layer 18) is formed, required is a consideration that the surface on which the vertical-structure area is not formed needs to have a temperature lower than 660° C., which is a melting point of aluminum being a metal used for the aluminum wiring, so that the annealing is performed using a laser which has a wavelength having a temperature gradient in a depth direction of the device, or the annealing is performed at low temperature of 660° C. or less.

Figure 33:
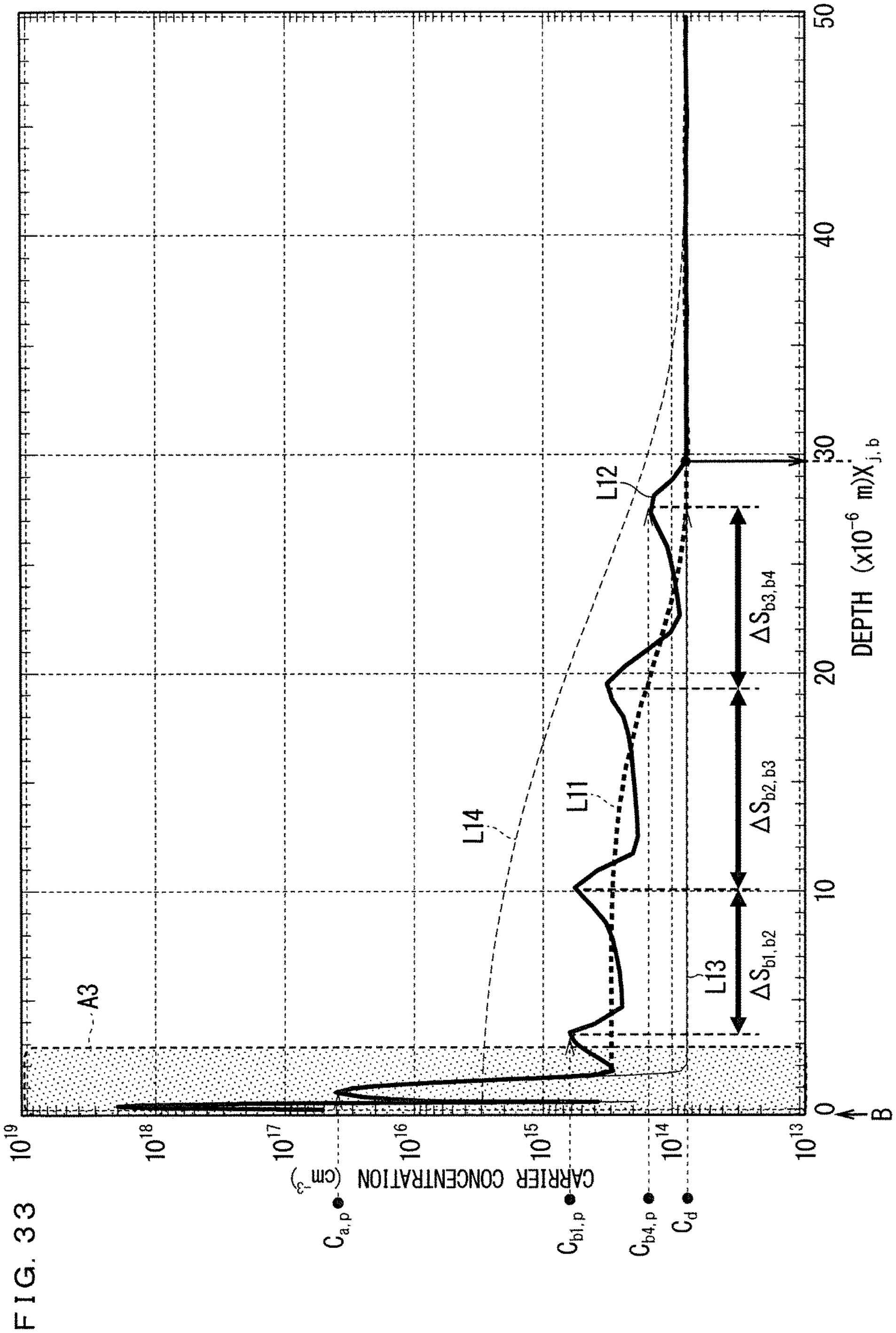
FIG. 33 is a view illustrating an impurity profile of a vertical-structure area illustrated in FIG. 30 to FIG. 32.
Figure 34:
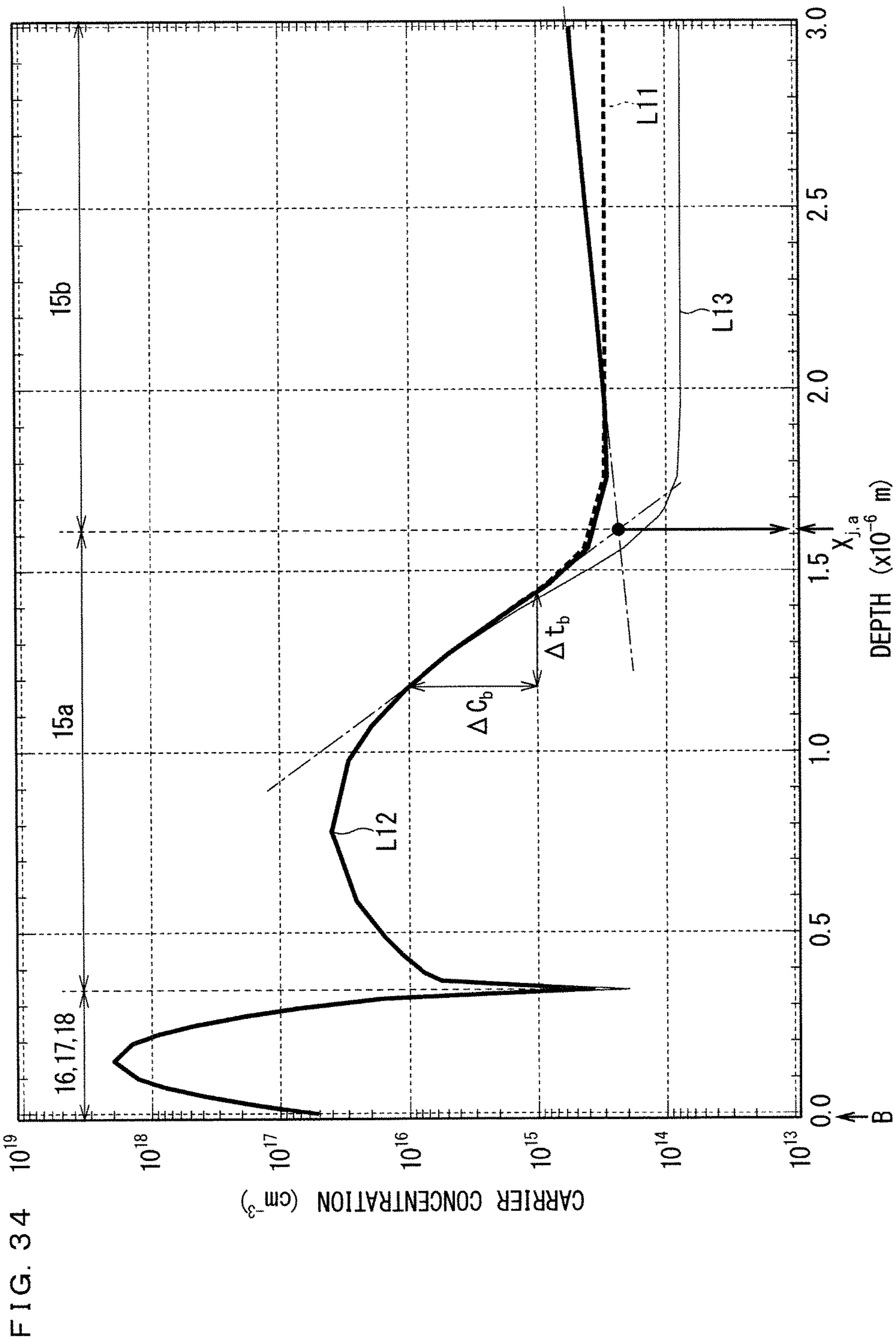
FIG. 34 is an enlarged view of an area A3 in FIG. 33.

As a result, the impurity profile of the N buffer layer 15 in the IGBT or the diode manufactured in the aforementioned wafer process is distinctive in that it has a shallow junction depth, that is, a junction depth $X_{j,a}$ ranging from approximately 1.5 to 2.0 μm, and also has a steep concentration gradient (δa=4.52 decade $cm^{-3}$/μm) across the junction between the $N^-$ drift layer 14 and the N buffer layer 15, as the impurity profile of a conventional structure 1 illustrated in FIG. 33 and FIG. 34. In addition, the N buffer layer 15 has a feature in the process of forming the n layer that the diffusion in the depth direction and a horizontal direction hardly occurs by reason that an N layer profile reproduces a profile in a depth direction at the time of implanting ions for introducing the impurity and the aforementioned annealing technique is used. A technique of forming an n-type diffusion layer having a deep and shallow concentration gradient includes annealing performed at high temperature for a long time. However, this technique cannot be applied in the step in which the metal having the low melting-point is used as described above, so that it is applied early in the wafer process illustrated in FIG. 5 or FIG. 18. In the above case, the wafer is processed to have a desired thickness (40 to 700 μm) before or after the step of performing the annealing at high temperature for a long time. Accordingly, each process device needs to be converted to be able to process the wafer with the desired thickness in the subsequent processes, and a huge cost is thereby generated, so that it is unrealistic to apply this technique. Furthermore, the annealing performed at high temperature for a long time is a process technique which does not match the increase in size of the diameter of the Si wafer. The IGBT or the diode having such an N buffer layer 15 has three significant performance problems described below.

(1) In a high-temperature state, the turn-off loss increases due to the increase in leakage current at the time of holding the withstand voltage, and in addition, a loss of control occurs due to a thermal runaway caused by a heat generation in the device itself, so that the operation under high temperature cannot be guaranteed.

(2) When each of the IGBT and diode performs the dynamic operation such as the turn-off operation, a carrier plasma layer in the vicinity of the junction between the $N^-$ drift layer 14 and the N buffer layer 15 is depleted due to the relationship between a carrier plasma state inside of the device and the electrical field intensity distribution. The electrical field intensity thereby increases in the junction between the $N^-$ drift layer 14 and the N buffer layer 15. Furthermore, the voltage overshoot at the end of turn-off operations (hereinafter simply referred to as "snap-off phenomenon") and an oscillation triggered by the snap-off phenomenon occur. The snap-off phenomenon causes the voltage to be higher than the withstand voltage which can be held and thereby causes the device to break down. The result causes the IGBT and diode to have a poor controllability of a turn-off operation and a reduction in blocking capability at the time of turn-off. Moreover, the snap-off phenomenon and the subsequent oscillation may cause an inverter system including the power module with the IGBT or the diode to malfunction due to a noise generation. The carrier plasma layer means an intermediate layer in which electrons and holes have almost the same concentration, and a carrier density exceeds $10^{16}$ $cm^{-3}$ that is higher than a doping carrier concentration $C_d$ of the $N^-$ drift layer 14 by two to three orders of magnitude.

(3) In accordance with the feature at the time of forming the aforementioned N buffer layer 15, the IGBT or the diode may be sensitive to a withstand voltage defect phenomenon due to a partial un-formation of the N buffer layer 15 caused by a scratch or a foreign material on a formation surface of the N buffer layer 15 generated during the wafer process at the time of forming the vertical-structure area illustrated in FIG. 16, FIG. 17, FIG. 25, and FIG. 26. This causes an increase in level of defectiveness of the IGBT or the diode chip.

Conventionally, methods for optimizing a parameter of the $N^-$ drift layer 14 have been selected as a means for solving the aforementioned problems, such as thickening the $N^-$ drift layer 14 so that the depletion layer is not in contact with the N buffer layer 15 in a turn-off operation, and increasing the impurity concentration of the $N^-$ drift layer 14 to reduce variations thereof.

However, thickening the $N^-$ drift layer 14 increases the ON voltage of both the IGBT and the diode, and causes a reaction of increase in total loss. On the other hand, reducing variations in impurity concentration of the $N^-$ drift layer 14 impose limitations on the technique for manufacturing Si wafers and on the Si wafers to be adopted, thus increasing costs of the Si wafers. As described above, the conventional IGBT and diode have technical problems that are dilemmas in improving the device performance.

Figure 42:
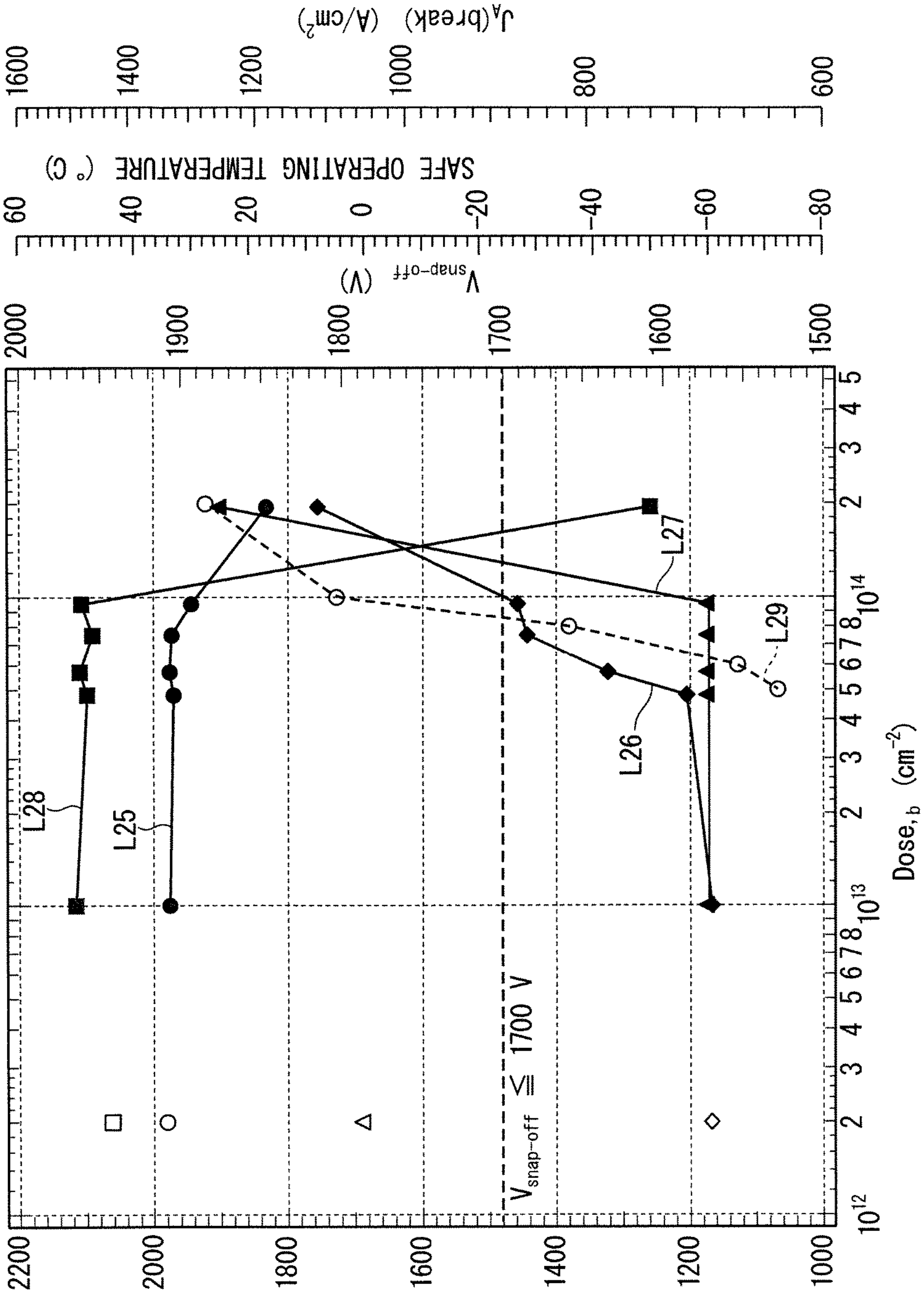
FIG. 42 is a view illustrating a relationship between a diode performance and a structure parameter of the second buffer layer in the RFC diode having the N buffer layer of the second structure.

As a solution of the aforementioned problem (2), U.S. Pat. No. 6,482,681, U.S. Pat. No. 7,514,750, and U.S. Pat. No. 7,538,412 propose a formation of N buffer layer 15 made up of a plurality of layers using protons (H+). However, in these techniques, a concentration of protons needs to be increased to hold the withstand voltage which is a basic characteristic of the power semiconductor in consideration of thinning the $N^-$ drift layer 14 which is a trend for reducing the total loss of the IGBT or the diode. However, since the increase in concentration of the protons is associated with an increase in crystal defect at a time of introducing the protons or an increase in defect density which causes a recombination center of the carrier due to the crystal defect, it has demerits of causing the increase in turn-off loss of the IGBT and the diode and a reduction in ruggedness of the IGBT or the diode as illustrated in FIG. 42 described hereinafter. The power semiconductor is required to have the base performance of having the voltage holding capacity while reducing the total loss and guaranteeing the ruggedness. When the turn-off loss increases, an amount of heat generation of IGBT or diode itself increases, and this causes a problem in a high temperature operation or a thermal design of the power module itself provided with a power semiconductor. That is to say, the aforementioned technique does not satisfy a need of the power semiconductor in which the latest $N^-$ drift layer 14 tends to be thinned.

As described above, the conventional techniques on the latest IGBT and diode, in which the thickness of the $N^-$ drift layer 14 has been reduced to improve the performance, that is to say, to reduce the ON voltage, have difficulties in improving the controllability of the turn-off operation and the blocking capability at the time of turn-off and providing stable withstand voltage characteristics as the base performance of the power semiconductor, while controlling the internal state of the device in the dynamic operation. Accordingly, required is the N buffer layer structure which solves the aforementioned problem, using the wafer manufactured by the FZ method, by the wafer process which is also compatible with the increase in size of the diameter of the Si wafer. Moreover, also required is an insensitivity to the withstand voltage defect phenomenon of the IGBT or the diode due to the partial un-formation of the N buffer layer 15 caused by a bad influence during the wafer process.

The present invention is to solve a dilemma in the device performance of the conventional IGBT or diode using the aforementioned FZ wafer, thereby reducing the ON voltage, providing stable withstand voltage characteristics, reducing turn-off loss with a reduction in leakage current at the time of turn-off, improving the controllability of the turn-off operation, and significantly improving the blocking capability at the time of turn-off.

Figure 27:
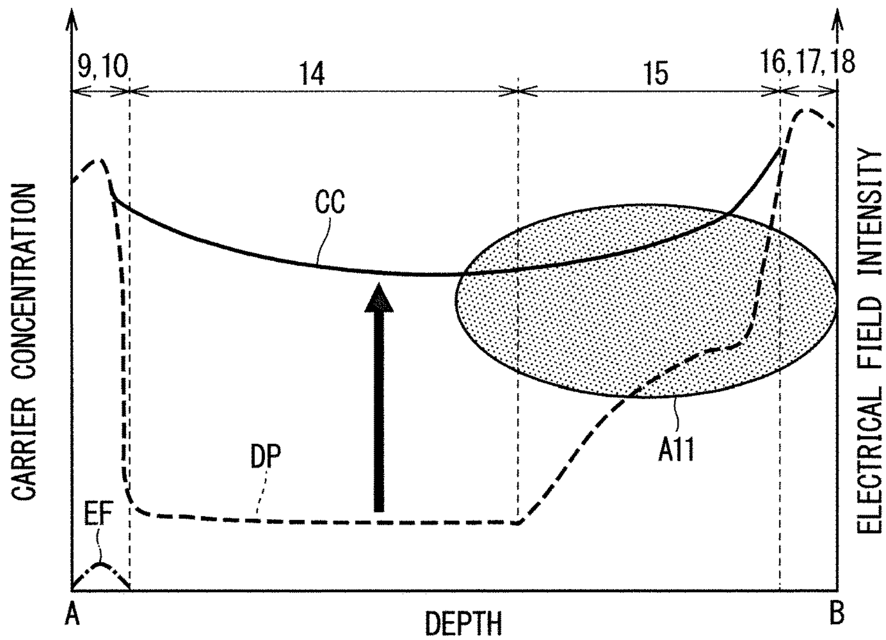
FIG. 27 is an explanatory drawing illustrating a concept of a vertical-structure area proposed by the present invention.
Figure 29:
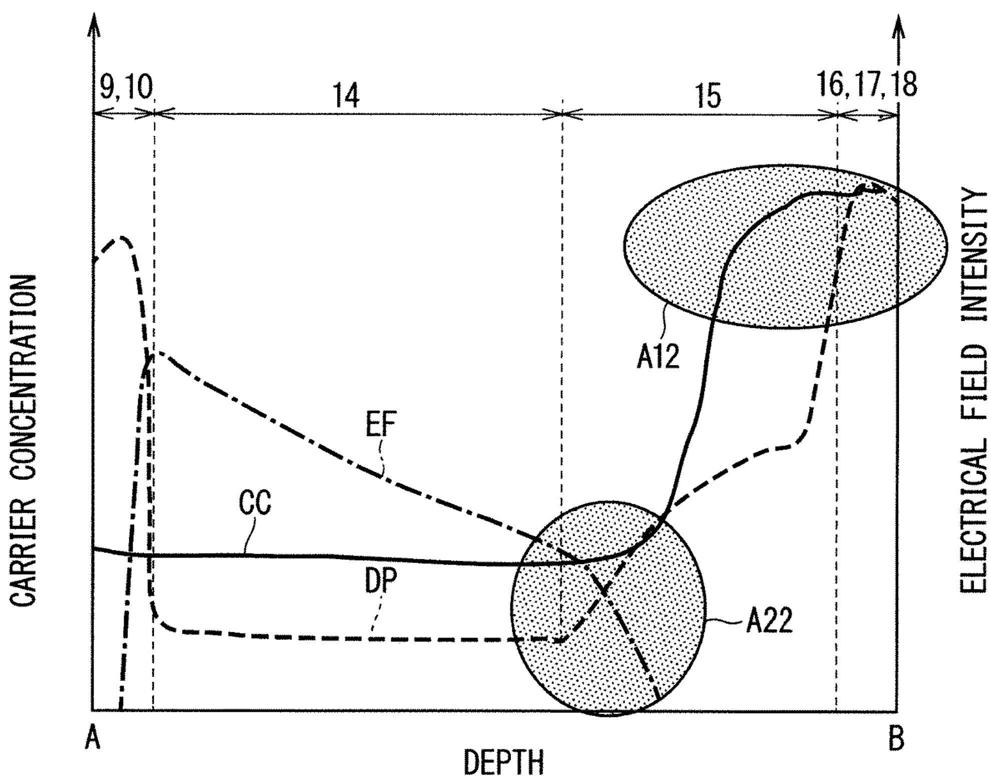
FIG. 29 is an explanatory drawing illustrating a concept of the vertical-structure area proposed by the present invention.

FIG. 27 to FIG. 29 are explanatory drawings illustrating a concept of the vertical-structure area proposed by the present invention. FIG. 27 illustrates a carrier concentration CC, an impurity profile (doping profile) DP, and an electrical field intensity EF under an ON state, and FIG. 28 and FIG. 29 illustrate the carrier concentration CC, the impurity profile DP, and the electrical field intensity EF under a blocking voltage state and a dynamic state, respectively. In FIG. 27 to FIG. 29, numbers illustrated along a horizontal axis represent constituent elements of the IGBT or the diode, such as the P anode layer 10, illustrated in FIG. 1 to FIG. 3.

The aforementioned technical problems caused by the problems of the vertical-structure area on the conventional IGBT and diode will be solved by achieving the structure which is the object of the vertical-structure area 27, particularly, of the N buffer layer 15 described below. A concept described below is commonly applicable to the IGBT structure illustrated in FIG. 1 and the diode structure illustrated in FIG. 2 and FIG. 3.

The concept of the structure of the N buffer layers 15 constituting the vertical-structure area 27 proposed by the present invention will be described in (1) to (3) described below.

(1) With regard to a depletion phenomenon of the carrier plasma layer in the vicinity of the junction between the $N^-$ drift layer 14 and the N buffer layer 15 in a turn-off operation, as illustrated in an area A12 of FIG. 29, the concentration of the N buffer layer 15 is reduced so that a conductivity modulation phenomenon also occurs inside the N buffer layer 15 under an ON state of the device and the carrier plasma layer thereby remains. Since the concentration of the carrier plasma layer is equal to or higher than $10^{16}$ $cm^{-3}$, the impurity concentration of the N buffer layer 15 is reduced to be equal to or lower than the concentration of the carrier plasma layer, that is, an order of $10^{15}$ $cm^{-3}$. As described above, the impurity concentration of the N buffer layer 15 is reduced to an extent that the carrier plasma layer remains in the N buffer layer 15.

(2) The concentration gradient in the vicinity of the junction between the $N^-$ drift layer 14 and the N buffer layer 15 is shallowed. Accordingly, as illustrated in an area A21 of FIG. 28, the electrical field intensity is stopped inside the N buffer layer 15 in a static state, and as illustrated in an area A22 of FIG. 29, the depletion layer smoothly extends inside the N buffer layer 15 in a dynamic operation.

(3) The N buffer layer 15 is caused to have a concentration gradient, a low impurity concentration, and an increased thickness, whereby a current amplification factor ($\alpha_{pnp}$) of a PNP bipolar transistor included in an IGBT or an RFC diode so as to achieve the reduction in turn-off loss caused by a reduction in leakage current at the time of turn-off.

Thus, the present invention aims at optimizing the impurity concentration and the depth of the N buffer layer 15 in the vertical-structure area 27, considering the N buffer layer 15 as an important layer for controlling a carrier plasma state inside of the device during a device operation while guaranteeing the stable withstand voltage characteristics and the withstand voltage characteristics such as the reduction in turn-off loss.

Embodiment 1

Figure 30:
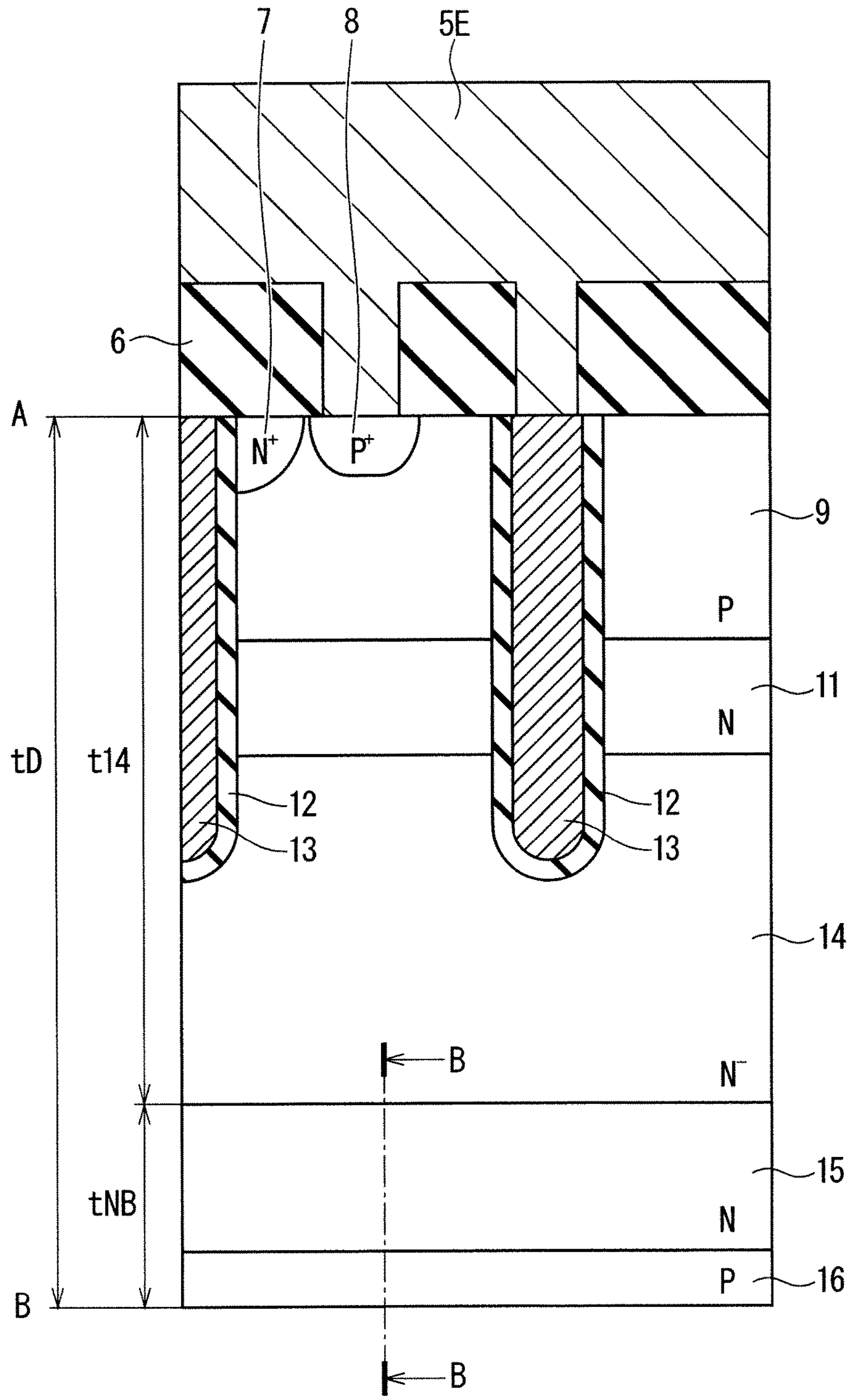
FIG. 30 is a cross-sectional view of an active cell area of the trench-gate IGBT.
Figure 31:
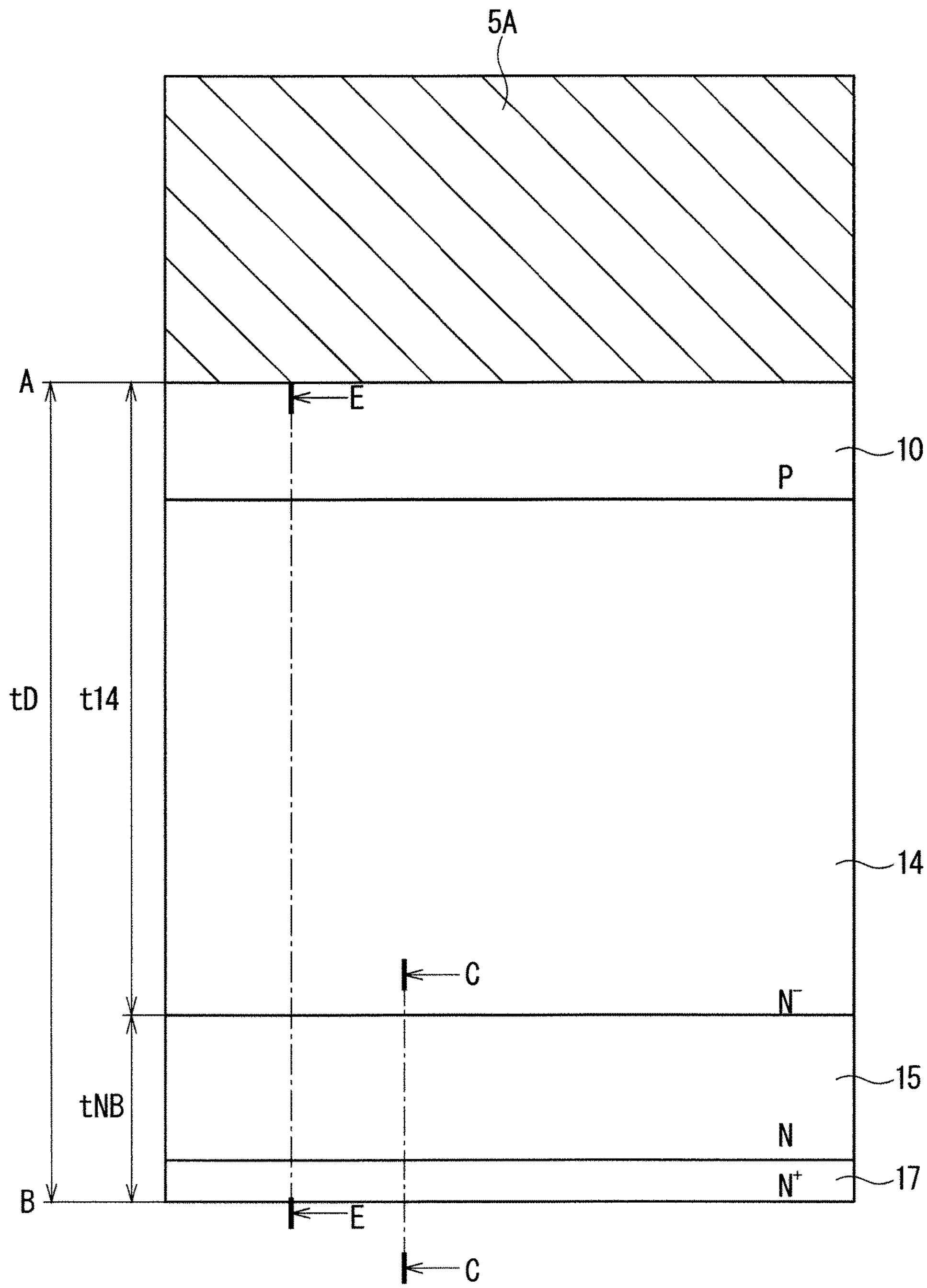
FIG. 31 is a cross-sectional view of an active cell area of the PIN diode.
Figure 32:
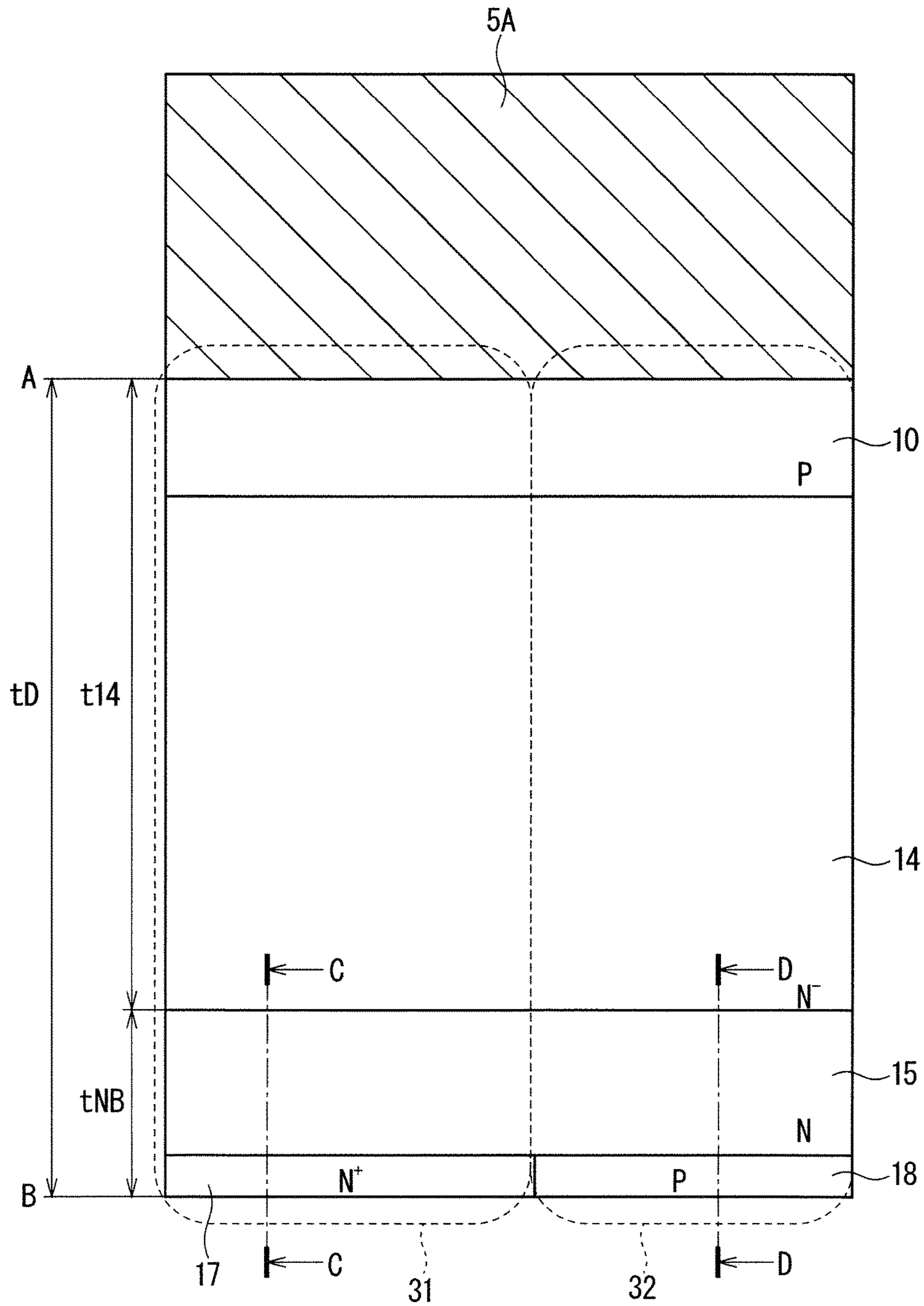
FIG. 32 is a cross-sectional view of an active cell area of the RFC diode.

FIG. 30 to FIG. 32 are cross-sectional views of the IGBT, PIN diode, and the RFC diode, each of which is the semiconductor device according to the embodiment 1 of the present invention. Each of FIG. 30 to FIG. 32 is the cross-sectional view along a cross section A2-A2 in the active cell area R1 illustrated in FIG. 4, and illustrates the configuration of the IGBT, the PIN diode, and the RFC diode in the active cell area R1 illustrated in FIG. 1 to FIG. 3. A cross section E-E in FIG. 31 corresponds to the horizontal axis of the depth in FIG. 27 to FIG. 29 described in the principle of present invention. The $N^-$ drift layers 14 illustrated in FIG. 30 to FIG. 32 are formed with an impurity concentration ranging from $1.0\times10^{12}$ to $5.0\times10^{14}$ $cm^{-3}$ by using the FZ wafers prepared in the FZ (Floating Zone) method. In the IGBT illustrated in FIG. 30, the junction between the P base layer 9 and the N layer 11 is a main junction. In the PIN diode illustrated in FIG. 31 and the RFC diode illustrated in FIG. 32, the junction between the P anode layer 10 and the $N^-$ drift layer 14 is the main junction.

The following description exemplifies a parameter of each diffusion layer, taking the RFC diode as a typical example.

P anode layer 10: A surface impurity concentration is set equal to or higher than $1.0\times10^{16}$ $cm^{-3}$, a peak impurity concentration is set to $2.0\times10^{16}$ to $1.0\times10^{18}$ $cm^{-3}$, and a depth is set to 2.0 to 10.0 μm.

$N^+$ cathode layer 17: A surface impurity concentration is set to $1.0\times10^{18}$ to $1.0\times10^{21}$ $cm^{-3}$, and a depth is set to 0.3 to 0.8 μm.

P cathode layer 18: A surface impurity concentration is set to $1.0\times10^{16}$ to $1.0\times10^{20}$ $cm^{-3}$, and a depth is set to 0.3 to 0.8 μm.

The present invention includes two types of structure regarding the N buffer layer 15 illustrated in FIG. 30 to FIG. 32, that is to say, a first structure and a second structure. The N buffer layer 15 having the first structure is made up of a laminated structure of a first buffer layer 15*a* and a second buffer layer 15*b*. The first buffer layer 15*a* is joined to the P collector layer 16, the $N^+$ cathode layer 17, or the P cathode layer 18, and the second buffer layer 15*b* is joined to the $N^-$ drift layer 14. In the first structure, each of the first buffer layer 15*a* and the second buffer layer 15*b* has one peak of the impurity concentration.

In the N buffer layer 15 having the second structure, the second buffer layer 15*b* having the first structure is made up as a laminated structure of a first sub-buffer layer 15*b*1 to $n^{th}$ sub-buffer layer 15*bn*. The first sub-buffer layer 15*b*1 is joined to the first buffer layer 15*a*, and the $n^{th}$ sub-buffer layer 15*bn* is joined to the $N^-$ drift layer 14. Each of the sub-buffer layers 15*b*1 to 15*bn* has one peak of the impurity concentration. That is to say, the N buffer layer 15 having the second structure includes the first buffer layer 15*a* joined to the P collector layer 16, the $N^+$ cathode layer 17, or the P cathode layer 18 and the second buffer layer 15*b* laminated on the first buffer layer 15*a* to be joined to the $N^-$ drift layer 14. The second buffer layer 15*b* includes the first sub-buffer layer 15*b*1, the second sub-buffer layer 15*b*2, . . . and the $n^{th}$ sub-buffer layer 15*bn* laminated in this order from a side of the first buffer layer 15*a* to a side of the $N^-$ drift layer 14. Each sub-buffer layer has one concentration peak. The parameters of the first buffer layer 15*a* and second buffer layer 15*b* in the first structure and the second structure are as follows.

A peak impurity concentration $C_{a,p}$ of the first buffer layer 15*a* is set to $1.0\times10^{16}$ to $5.0\times10^{16}$ $cm^{-3}$, and a depth $X_{j,a}$ is set to 1.2 to 5.0 μm.

A maximum peak impurity concentration $(C_{b,p})$ max, which is a maximum value of the peak impurity concentration $C_{b,p}$ of the second buffer layer 15*b* having the first structure and each peak impurity concentration of the sub-buffer layers 15*b*1 to 15*bn* of the second buffer layer 15*b* having the second structure, is set higher than the impurity concentration $C_d$ of the $N^-$ drift layer 14 and equal to or lower than $1.0\times10^{15}$ $cm^{-3}$. A depth $X_{j,b}$ of the second buffer layer 15*b* is set to 4.0 to 50 μm. Each of the peak impurity concentration $C_{b,p}$ of the second buffer layer 15*b* having the first structure and the maximum peak impurity concentration $(C_{b,p})$ max of the second buffer layer 15*b* having the second structure is the maximum impurity concentration of the second buffer layer 15*b*.

FIG. 33 illustrates the impurity profile of the first structure and second structure, and FIG. 34 is an enlarged view of an area A3 in FIG. 33. Each horizontal axis in FIG. 33 and FIG. 34 illustrates a depth and corresponds to a cross section B-B in FIG. 30 and a cross section C-C in FIG. 31 and FIG. 32. "0" of the horizontal axis in FIG. 33 and FIG. 34 corresponds to "B" in FIG. 30, FIG. 31, and FIG. 32. That is to say, the undersurface of the P collector layer 16 in the IGBT illustrated in FIG. 30, the undersurface of the $N^+$ cathode layer 17 in the PIN diode illustrated in FIG. 31, and the undersurface of the $N^+$ cathode layer 17 or P cathode layer 18 in the RFC diode illustrated in FIG. 32 correspond to "0" of the horizontal axis in FIG. 33 and FIG. 34.

In FIG. 33 and FIG. 34, an impurity profile of the first structure is illustrated by a thick dotted line L11, and an impurity profile of the second structure is illustrated by a thick solid line L12. Moreover, in FIG. 33 and FIG. 34, impurity profiles of conventional structures 1 and 2, which have the conventional vertical-structure area without having the feature of the present invention, are illustrated by a thin solid line L13 and a thin dotted line L 14, respectively, for comparison.

The depth and the impurity profile of the first buffer layer 15*a* are common in the first structure and the second structure. FIG. 33 illustrates the impurity profile of the second structure including the first buffer layer 15*a* and the first sub-buffer layers 15*b*1 to fourth sub-buffer layer 15*b*4. In FIG. 33 and FIG. 34, a sign is provided to the peak of each impurity profile, and the peak to which a sign "15*b*1" is provided in the impurity profile of the second structure, for example, indicates the peak of the first sub-buffer layer 15*b*1 in the second structure.

The first structure is firstly described with reference to FIG. 33 and FIG. 34. The N buffer layer 15 having the first structure is made up of the first buffer layer 15*a* and the second buffer layer 15*b* formed of a single layer. In the profile of the impurity concentration $C_b$ of the second buffer layer 15*b* (the impurity profile), the peak impurity concentration $C_{b,p}$ is located at a position closer to the junction $X_{j,a}$ between the first buffer layer 15*a* and the second buffer layer 15*b* than a center of the second buffer layer 15*b*. The impurity profile of the second buffer layer 15*b* has a low concentration, and also has a concentration gradient $\delta_b$ which has a shallow gradient in a depth direction toward the junction between the second buffer layer 15*b* and the $N^-$ drift layer 14. A peak position at a time of introducing an ion species into Si in an ion implantation and an irradiation technique, for example, for forming the second buffer layer 15*b* is set deeper than the junction $X_{j,a}$ between the first buffer layer 15*a* and the second buffer layer 15*b* so as to form the peak impurity concentration $C_{b,p}$ in the position closer to the junction $X_{j,a}$ between the first buffer layer 15*a* and the second buffer layer 15*b* than the center of the second buffer layer 15*b*.

A concentration inclination amount at the side of the main junction in the vicinity of the junction between the second buffer layer 15*b* and the $N^-$ drift layer 14, that is to say, the concentration gradient $\delta_b$ (decade $cm^{-3}$/μm) is expressed by the following equation (1).

$$\delta_b = \Delta\log_{10}\frac{C_b}{\Delta t_b} \tag{1}$$

$\Delta \log_{10}C_b$ represents a variation of the impurity concentration $C_b$ of the second buffer layer 15*b* illustrated in FIG. 33, and log represents a common logarithm whose base is 10, and $\Delta t_b$ represents a variation of a depth $t_b$ of the second buffer layer 15*b*.

The depth $X_{j,a}$ of the junction between the first buffer layer 15*a* and the second buffer layer 15*b* is defined as follows. As shown in FIG. 34, a point where a tangent of an inclination of the impurity profile of the first buffer layer 15*a* and a tangent of an inclination of the impurity profile of the second buffer layer 15*b* cross each other, that is to say, a point at which the gradient of the impurity profile changes from a negative to a positive is defined as the depth $X_{j,a}$ of the junction. Similarly, the depth $X_{j,b}$ of the junction between the second buffer layer 15*b* and the $N^-$ drift layer 14 is also defined as a point where a tangent of an inclination of the impurity profile of the second buffer layer 15*b* and a tangent of an inclination of the impurity profile of the $N^-$ drift layer 14 cross each other illustrated in FIG. 33.

In the first structure, the first buffer layer 15*a* and the second buffer layer 15*b* satisfy a relationship expressed by the following inequalities (2) to (4).

$$C_{a,p} > C_{b,p} \tag{2}$$

$$X_{j,a} < X_{j,b} \tag{3}$$

$$\delta_a > \delta_b \tag{4}$$

$\delta_a$=9.60 (decade $cm^{-3}$/μm) and $\delta_b$=0.03 to 0.06 (decade $cm^{-3}$/μm). The value of $\delta_b$ indicates a range of a structure in which various structure parameters of the N buffer layer 15 of the present invention described hereinafter is set to a prescribed range to satisfy conditions a) to e) described below.

Next, the second structure is described with reference to FIG. 33 and FIG. 34. In the N buffer layer 15 in the second structure, the second buffer layer 15*b* is made up as a laminated structure of a plurality of sub-buffer layers. FIG. 33 illustrates the impurity profile in a case where the second buffer layer 15*b* is made up of four-layered sub-buffer layers. The impurity profile of the first buffer layer 15*a* is similar to that of the first buffer layer 15*a* in the first structure.

The peak impurity concentrations $C_{b1,p}$, $C_{b2,p}$, . . . , $C_{bn,p}$ of each sub-buffer layer in the second buffer layer 15*b* are set to be gradually reduced from the junction $X_{j,a}$ between the second buffer layer 15*b* and the first buffer layer 15*a* toward the junction $X_{j,b}$, between the second buffer layer 15*b* and the $N^-$ drift layer 14, that is to say, set to be reduced with a decreasing distance from the main junction, in a depth direction from the second main surface toward the first main surface. Similarly, the concentration gradients $\delta_{b1}$, $\delta_{b2}$, . . . , $\delta_{bn}$ thereof are also set to be gradually reduced from the junction $X_{j,a}$ between the second buffer layer 15*b* and the first buffer layer 15*a* toward the junction $X_{j,b}$ between the second buffer layer 15*b* and the $N^-$ drift layer 14, that is to say, set to be reduced with a decreasing distance from the main junction, in the depth direction from the second main surface toward the first main surface. Distances $\Delta S_{n,n-1}$ between the peak points in the adjacent two sub-buffers are equal to each other in the second buffer layer 15*b*. For example, when the distance between the peak points of the impurity concentration in FIG. 33 is defined as $S_{b1,b2}$ between the first sub-buffer layer 15*b*1 and the second sub-buffer layer 15*b*2, defined as $S_{b2,b3}$ between the second sub-buffer layer 15*b*2 and the third sub-buffer layer 15*b*3, and defined as $S_{b3,b4}$ between the third sub-buffer layer 15*b*3 and the fourth sub-buffer layer 15*b*4, $\Delta S_{b1,b2} \approx \Delta S_{b2,b3} \approx \Delta S_{b3,b4}$. The term "the distances between the peak points are equal to each other" described herein includes not only a case where the distances are exactly equal but also a case where the distances are equal to each other within a range of half-value width of each sub-buffer layer (2 μm).

Each impurity concentration of the sub-buffer layers 15*b*1 to 15*bn* constituting the second buffer layer 15*b* is set higher than the impurity concentration $C_d$ of the $N^-$ drift layer 14 over all areas including the junction between the adjacent two sub-buffer layers.

In the second structure, the first buffer layer 15*a* and the second buffer layer 15*b* satisfy a relationship expressed by the following inequality (5).

$$X_{j,a} < X_{j,b} \tag{5}$$

The first buffer layer 15*a* and the first sub-buffer layer 15*b*1 satisfy a relationship expressed by the following inequalities (6) and (7).

$$C_{a,p} > C_{b1,p} \tag{6}$$

$$\delta_a > \delta_{b1} \tag{7}$$

Herein, $\delta_a$=9.60 (decade $cm^{-3}$/μm), and $\delta_{b1}$=0.50 to 1.00 (decade $cm^{-3}$/μm).

Each of the sub-buffer layers 15*b*1 to 15*bn* of the second buffer layer 15*b* satisfy a relationship expressed by the following inequalities (8) to (11).

$$C_{b1,p} \geq C_{b2,p} \ldots \geq C_{bn,p} \tag{8}$$

$$\delta_{b1} \geq \delta_{b2} \ldots \geq \delta_{bn} \tag{9}$$

$$\Delta S_{b1,b2} \approx \Delta S_{b2,b3} \ldots \approx \Delta S_{b(n-1),bn} \tag{10}$$

$$\Delta S_{a,b1} < \Delta S_{b1,b2} \tag{11}$$

Herein, in the concentration gradient $\delta_{bn}$ in the vicinity of the junction between the $n^{th}$ sub-buffer layer 15*bn* and the $N^-$ drift layer 14 (also referred to as the concentration gradient at the side of the main junction), $\delta_{bn}$=0.14 to 0.50 (decade $cm^{-3}$/μm) when the various structure parameters of the N buffer layer 15 of the present invention described hereinafter are set to the prescribed range and the conditions a) to e) described hereinafter are satisfied.

Moreover, in a concentration gradient $\delta'_b$ obtained by a linear approximation connecting the peak impurity concentrations in each of the sub-buffer layers 15*b*1 to 15*bn,* $\delta'_b$=0.01 to 0.03 (decade $cm^{-3}$/μm) when the various structure parameters of the N buffer layer 15 of the present invention described hereinafter are set to the prescribed range and the conditions a) to e) described hereinafter are satisfied.

Figure 35:
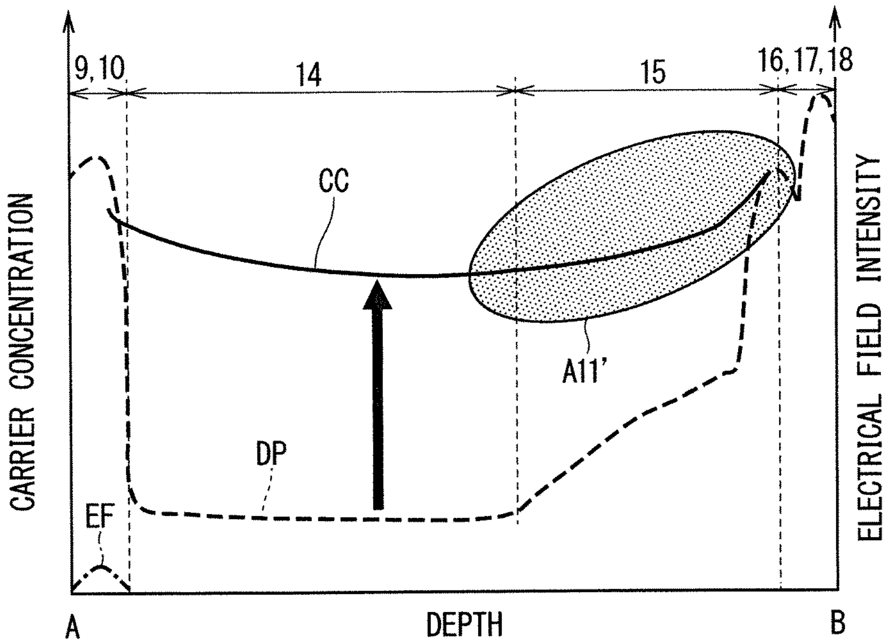
FIG. 35 is an explanatory drawing illustrating a function as a target of the vertical-structure area proposed by the present invention.
Figure 36:
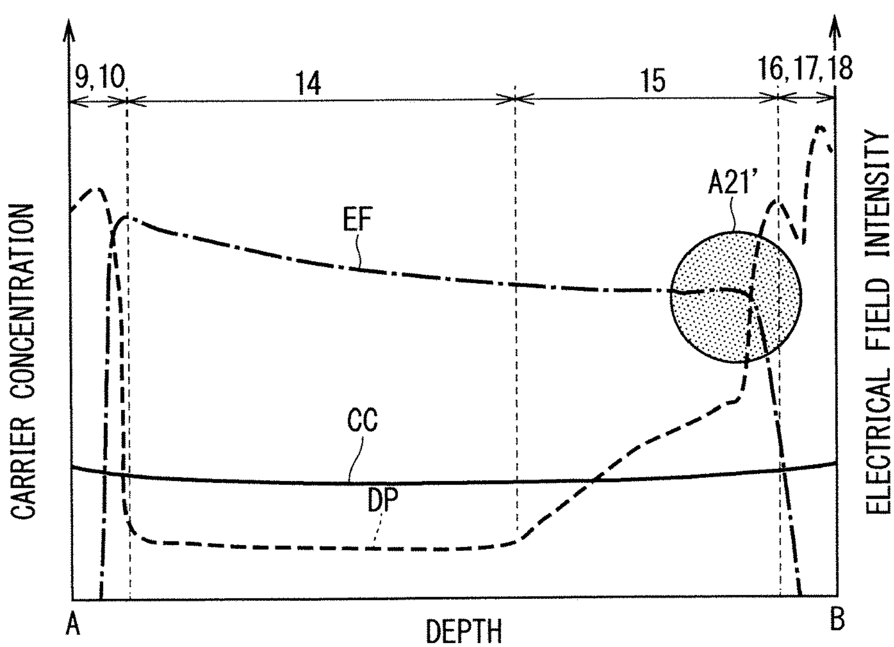
FIG. 36 is an explanatory drawing illustrating a function as a target of the vertical-structure area proposed by the present invention.
Figure 37:
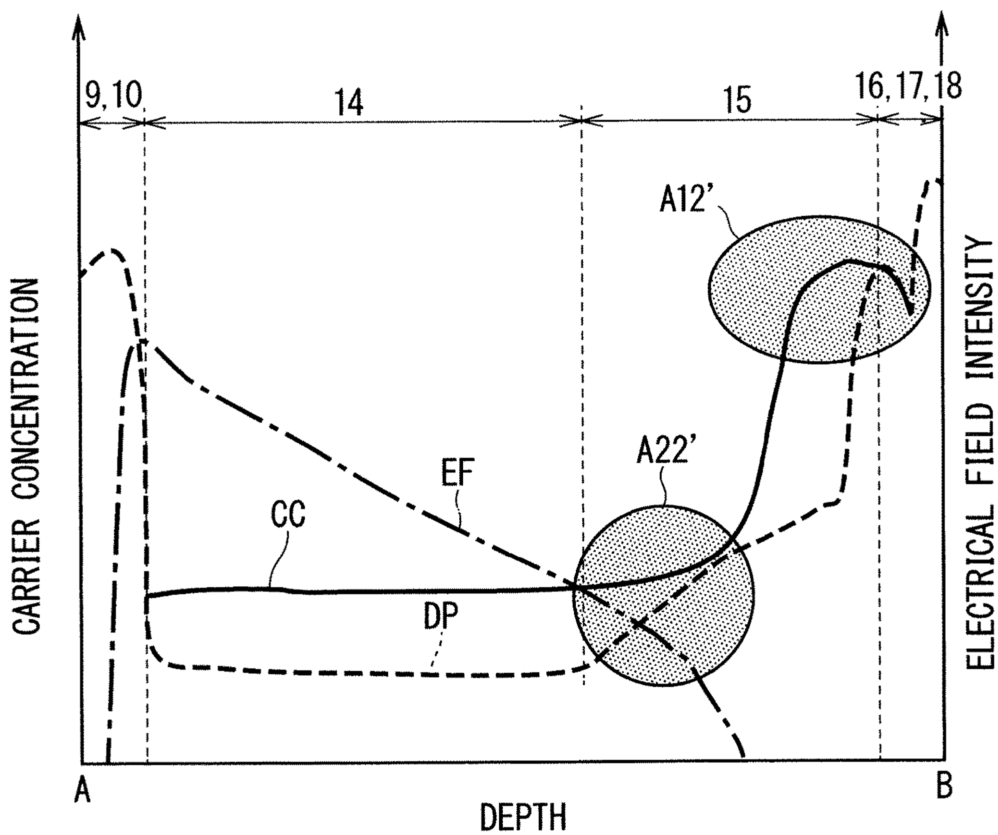
FIG. 37 is an explanatory drawing illustrating a function as a target of the vertical-structure area proposed by the present invention.

In accordance with the aforementioned relationships, the functions of the first buffer layer 15*a* and the second buffer layer 15*b* constituting the N buffer layer 15 of the present invention are as illustrated in FIG. 35 to FIG. 37, in view of the function of the N buffer layer 15, which is targeted, illustrated in FIG. 27 to FIG. 29. FIG. 35 illustrates the carrier concentration CC, the impurity profile (doping profile) DP, and the electrical field intensity EF under the ON state, and FIG. 36 and FIG. 37 illustrate the carrier concentration CC, the impurity profile DP, and the electrical field intensity EF under the blocking voltage state and the dynamic state, respectively. In FIG. 35 to FIG. 37, numbers illustrated along a horizontal axis represent constituent elements of the IGBT or the diode, such as the P anode layer 10, illustrated in FIG. 30 to FIG. 32.

As illustrated in an area A21' of FIG. 36, the first buffer layer 15*a* has a function of preventing the depletion layer from extending from the main junction in the static state. Accordingly, the stable withstand voltage characteristics can be obtained, and the reduction in turn-off loss with the reduction in leakage current at the time of turn-off can be achieved.

The impurity concentration of the second buffer layer 15*b* gets higher than the doping profile at the time of forming the second buffer layer 15*b* by the carrier plasma layer generated by a conductivity modulation phenomenon in the ON state, that is to say, in the state where the rated principal current flows (an area A11' in FIG. 35). As a result, the second buffer layer 15*b* has a function of further suppressing an extension speed of the depletion layer extending from the main junction in the dynamic state compared with an extension speed in the $N^-$ drift layer 14 and causing the carrier plasma layer generated in the ON state to remain, thereby controlling the electrical field intensity (an area A22' in FIG. 37). Accordingly, achieved are the suppression of the snap-off phenomenon at the end of the turn-off operation and the oscillation phenomenon caused by the snap-off phenomenon, an improvement in controllability of a switching operation, and the improvement in ruggedness in the dynamic state.

Figure 38:
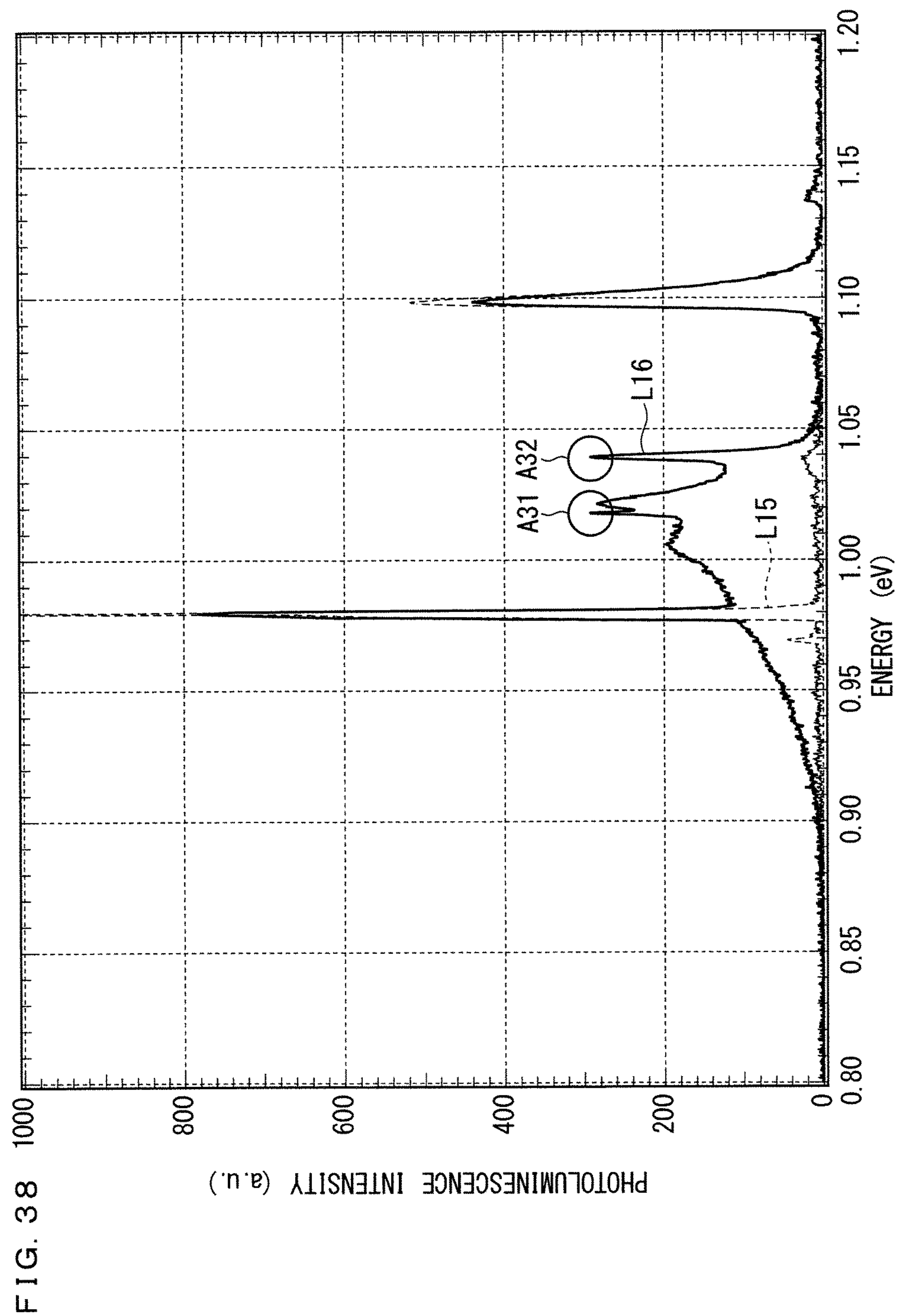
FIG. 38 is a view illustrating an evaluation result of crystallinity of a first structure or a second structure in accordance with a photoluminescence method.

FIG. 38 illustrates an evaluation result of crystallinity of Si in the first buffer layer 15*a* and the second buffer layer 15*b* having the first structure or second structure of the present invention in accordance with a photoluminescence (PL) method. This evaluation result clarifies a defect level generated in the energy level within the band gap of Si. In FIG. 38, a horizontal axis indicates an energy (eV), and a vertical axis indicates a photoluminescence intensity (a. u.) at a temperature 30K.

Figure 53:
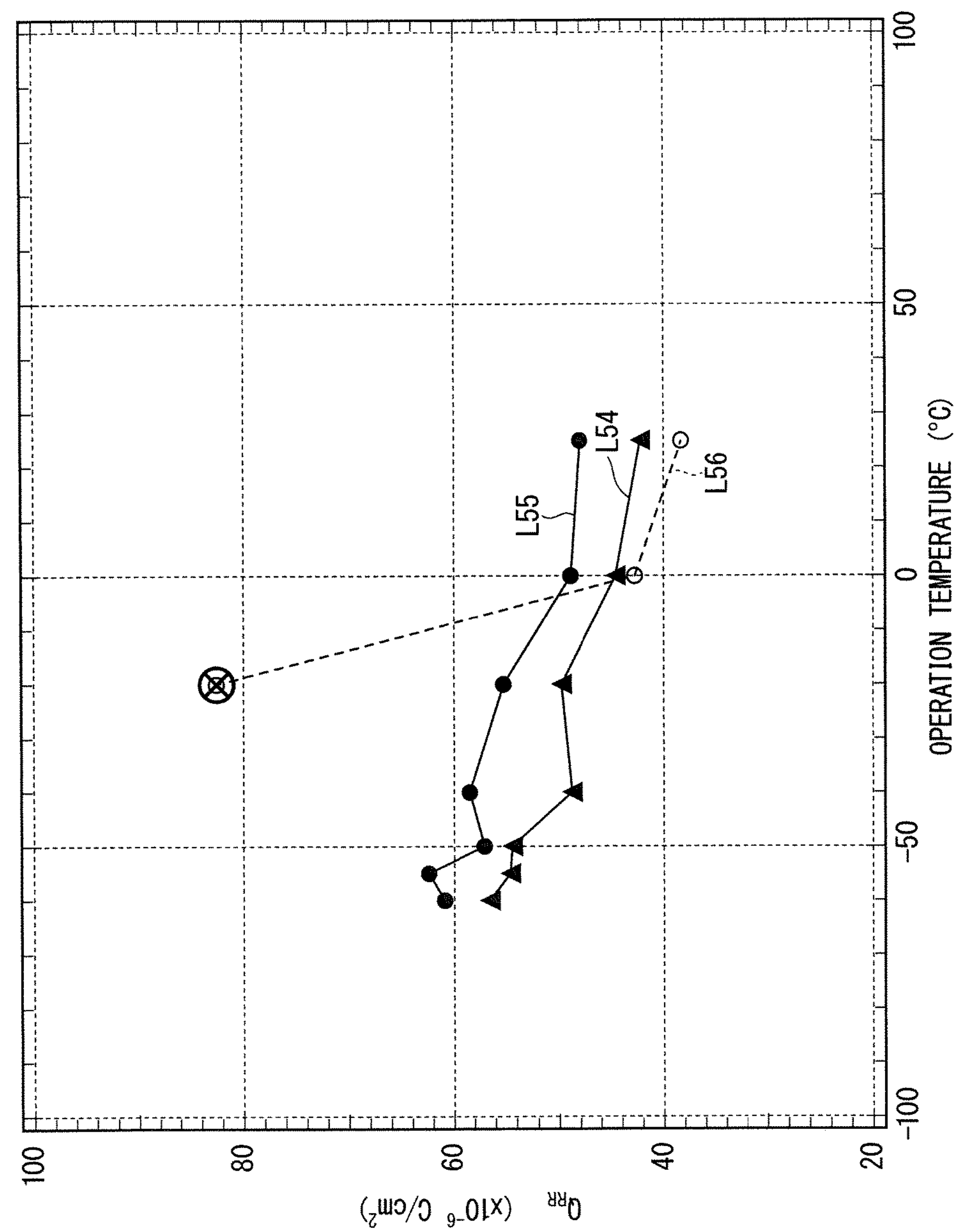
FIG. 53 is a view illustrating an N buffer layer dependence regarding a relationship between $Q_{RR}$ and an operation temperature in the snappy recovery operation of the RFC diode.
Figure 54:
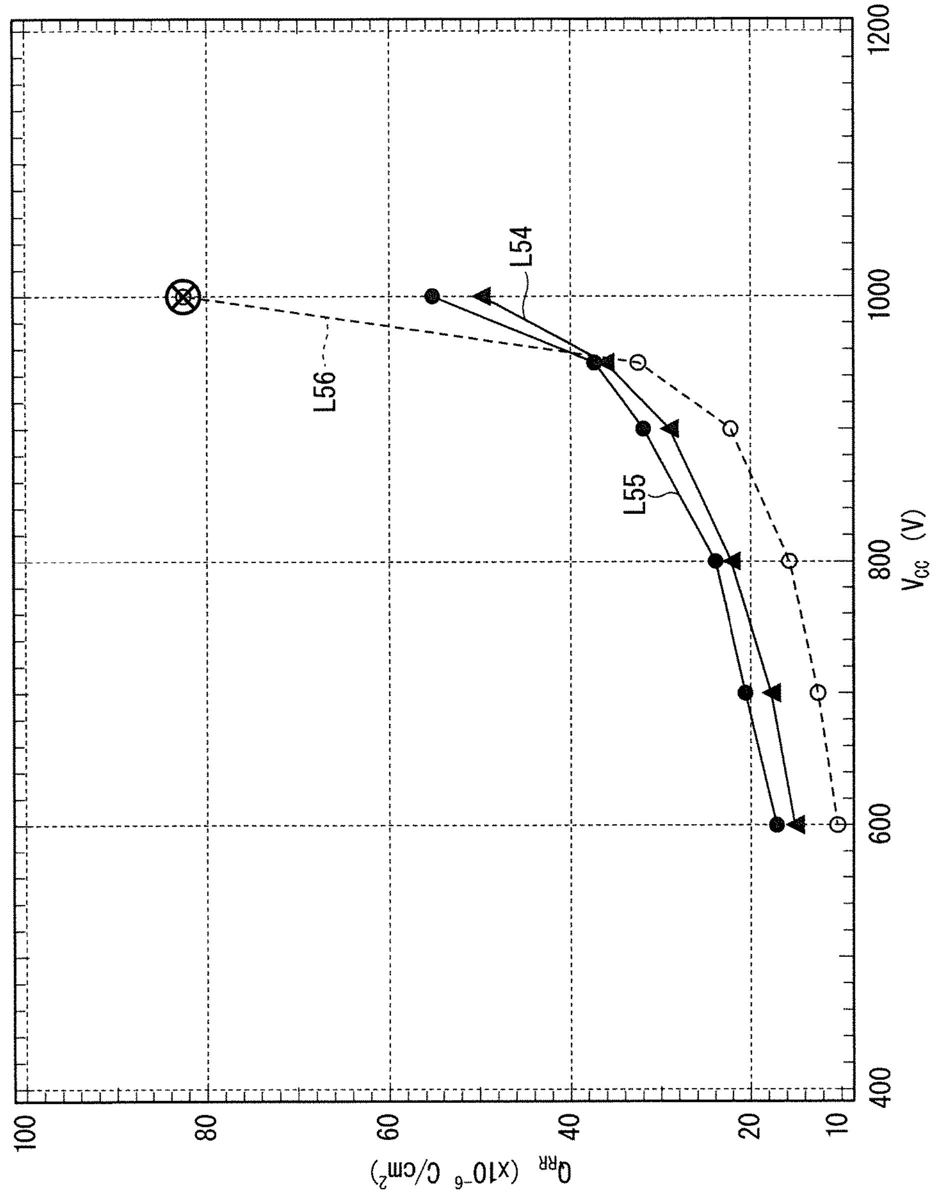
FIG. 54 is a view illustrating an N buffer layer dependence regarding a relationship between $Q_{RR}$ and $V_{cc}$ in the snappy recovery operation of the RFC diode.

In FIG. 38, an evaluation result of the first buffer layer 15*a* is indicated by a dotted line L15, and an evaluation result of the second buffer layer 15*b* is indicated by a solid line L16. It can be considered that the evaluation result of the first buffer layer 15*a* is similar to the evaluation result of the conventional structures 1 and 2 which have the conventional vertical-structure area without having the feature of the present invention. Both of the first buffer layer 15*a* and the second buffer layer 15*b* have a peak derived from an irradiated laser light in 0.98 eV and have a peak caused by a band-edge luminescence in 1.1 eV. The second buffer layer 15*b* further has two peaks indicated by areas A31 and A32 in FIG. 38 between the aforementioned two peaks. These peaks indicate that the energy level, which is a recombination center of the carrier (particularly, the hole) is included in the band gap of Si which is the semiconductor constituting the second buffer layer. These levels capture the carrier (herein, the hole) generated in the dynamic operation of the diode as illustrated in FIGS. 49, 53, and 54 described hereinafter. As a result, the second buffer layer 15*b* contributes to a characteristic behavior of suppressing the operation of the PNP transistor area 32 in the RFC diode in FIG. 32, reducing $Q_{RR}$ in the recovery operation of the diode illustrated in FIG. 41 described hereinafter, and expanding an SOA (Safe Operation Area) in a snappy recovery mode in the diode. The relationship between the impurity concentration regarding the first structure and second structure of the present invention and the device performance of the IGBT and diode is described hereinafter using FIGS. 42 to 44, 48, 49, 59, 60, 62, 63, 69, and 71, for example. This relationship can also be considered as the result indicating the relationship with the defect density of the recombination center of the second buffer layer 15*b*.

Figure 39:
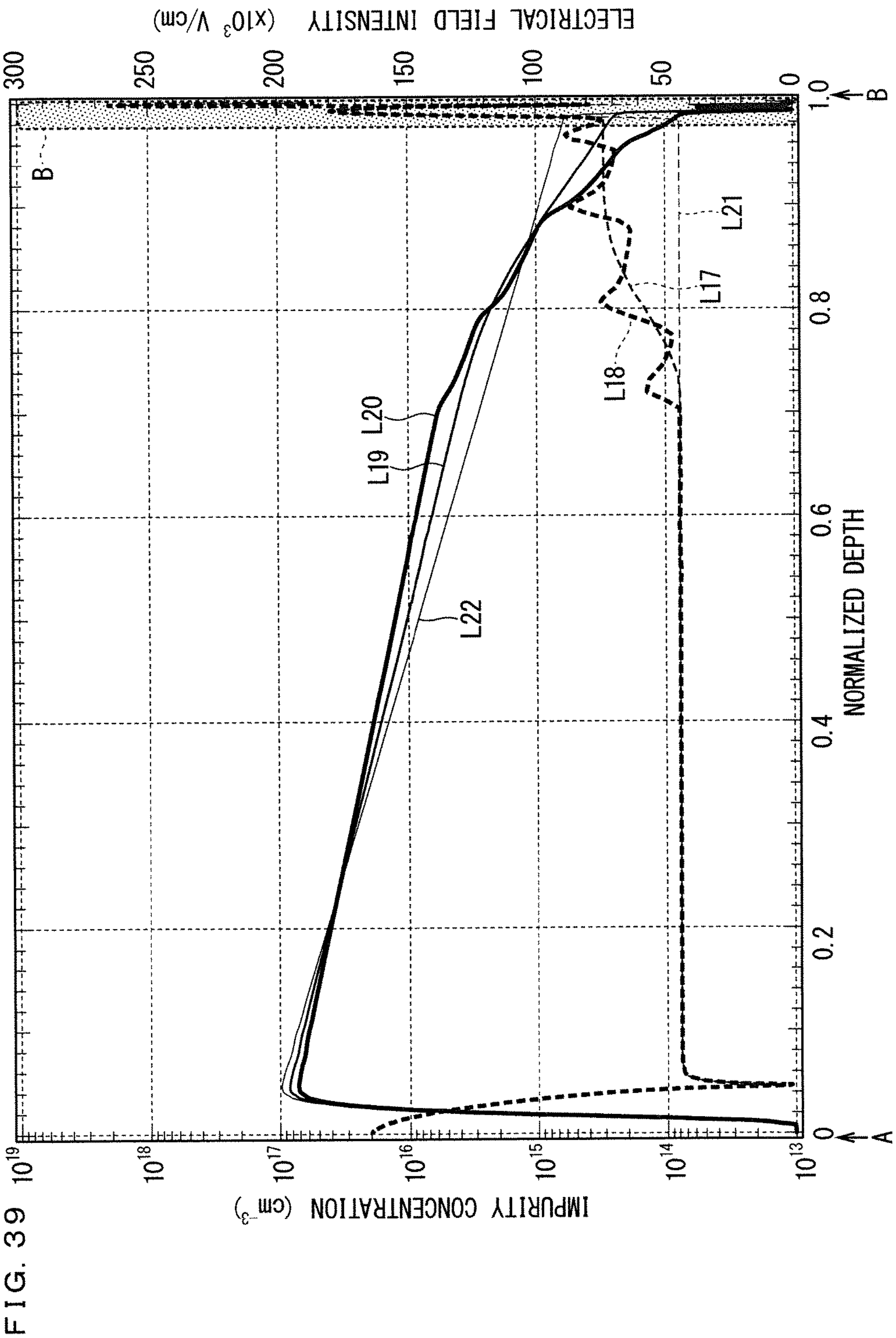
FIG. 39 is a view illustrating a simulation result of an electrical field intensity distribution of the RFC diode having an N buffer layer of a first structure and a second structure at a time of holding voltage in a static state.
Figure 40:
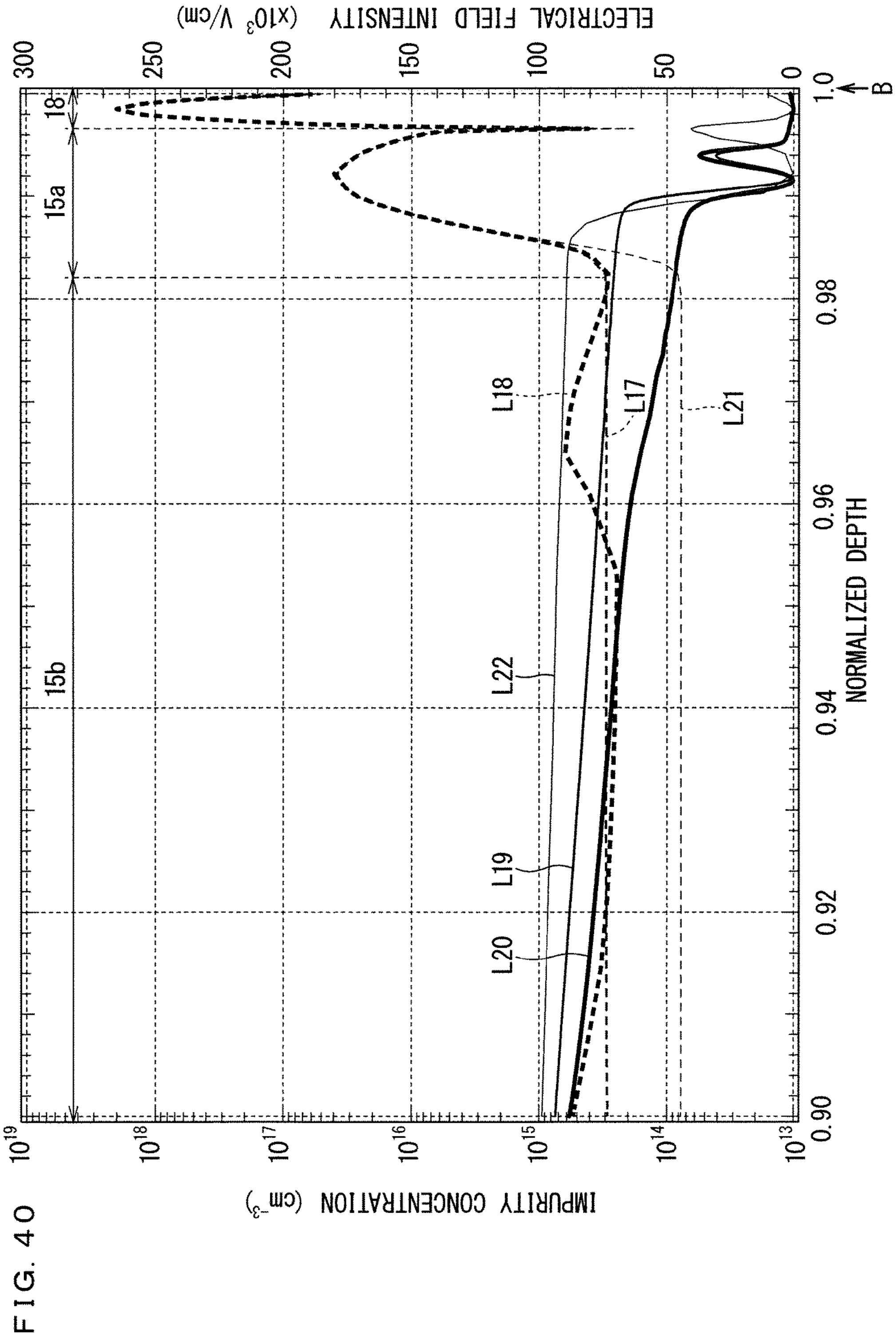
FIG. 40 is an enlarged view of an area A4 in FIG. 39.

FIG. 39 illustrates a simulation result of the electrical field intensity distribution of the RFC diode having the N buffer layer 15 of the present invention at the time of holding the voltage in the static state. A horizontal axis in FIG. 39 indicates a normalized depth ranging from 0 to 1, and 0 corresponds to a mark A in FIG. 32, that is to say, the upper surface of the P anode layer 10, and 1 corresponds to a mark B in FIG. 32, that is to say, the undersurface of the $N^+$ cathode layer 17 or P cathode layer 18. The vertical axis in FIG. 39 indicates the impurity concentration ($cm^{-3}$) and the electrical field intensity ($\times 10^3$V/cm). Since the device of withstand voltage 1200V class is used in a simulation, the voltage of 1420V is held at a temperature of 25° C. in the static state. In FIG. 39, a dotted line L17 having a moderate thickness indicates the impurity profile of the first structure, and a thick dotted line L18 indicates the impurity profile of the second structure. A solid line L19 having a moderate thickness indicates the electrical field intensity of the first structure, and a thick solid line L20 indicates the electrical field intensity of the second structure. A thin dotted line L21 indicates the impurity profile of the conventional structure 1, and a thin solid line L22 indicates the electrical field intensity of the conventional structure 1 for comparison. FIG. 40 is an enlarged view of an area B in FIG. 39.

FIG. 40 shows that the depletion layer stops within the first buffer layer 15*a* in the conventional structure 1, the first structure, and the second structure when the device holds the voltage. In the first structure and the second structure, the gradient of the electrical field intensity is larger in the second buffer layer 15*b* than the $N^-$ drift layer 14, so that it is deemed that the degree of extension of the depletion layer decreases in the second buffer layer 15*b*.

The first buffer layer 15*a* and the second buffer layer 15*b* having the aforementioned relationship and function are formed after the step of accurately forming the thickness of the device during the wafer process (FIG. 16 or FIG. 25). Herein, the thickness of the device is equal to a distance tD from A to B illustrated in FIG. 30 to FIG. 32. Important in the first buffer layer 15*a* and the second buffer layer 15*b* are the order of forming the layers and the setting of the peak position of an acceleration energy at the time of introducing the second buffer layer 15*b*. That is to say, a first ion is implanted from the second main surface of the semiconductor body and the first ion is activated by the annealing to form the first buffer layer, and subsequently, a second ion is implanted from the second main surface of the semiconductor body and the second ion is activated by the annealing to form the second buffer layer. A method of forming them is described in detail hereinafter.

The annealing temperature at the time of forming the first buffer layer 15*a* is higher than the annealing temperature at the time of forming the second buffer layer 15*b*, so that when the first buffer layer 15*a* is formed prior to the second buffer layer 15*b*, the impurity profile after the activation of the second buffer layer 15*b* and a type of crystal defect introduced to form the second buffer layer 15*b* are negatively influenced, and the carrier (herein, the hole) in a device ON state is negatively influenced. Accordingly, the second buffer layer 15*b* is formed after the first buffer layer 15*a*. The annealing is performed after introducing the ion into Si, subsequent to the formation of the first buffer layer 15*a*, to form the P collector layer 16, $N^+$ cathode layer, or the P cathode layer 18 or after forming the collector electrode 23C or the cathode electrode 23K, whereby the second buffer layer 15*b* having the aforementioned characteristics can be formed.

The peak position of the concentration of the ion species introduced into Si for forming the second buffer layer 15*b* is set as follows. In the first structure, a distance from the peak position to the junction $X_{j,a}$ between the first buffer layer 15*a* and the second buffer layer 15*b* is set shorter than a distance from the peak position to the center of the second buffer layer 15*b*. This prevents the first buffer layer 15*a* and the second buffer layer 15*b* from interfering with each other, thereby enabling the formation of the second buffer layer 15*b* which accurately satisfies the desired relationship between the first buffer layer 15*a* and the second buffer layer 15*b*. In the second structure, distances between the adjacent peak positions in each of sub-buffer layers 15*b*1 to 15*bn* constituting the second buffer layer 15*b* ($\Delta S_{b1,b2}$, $\Delta S_{b2,b3}$, . . . , $\Delta S_{b(n-1),bn}$) is set equal to each other. The term "the distances between the peak points are equal to each other" described herein includes not only a case where the distances are exactly equal but also a case where the distances are equal to each other within a range of half-value width of each sub-buffer layer (2 μm).

Phosphorus is used as the ion species in the first buffer layer 15*a*, and selenium, sulfur, phosphorus, protons (H+), or helium are used as the ion species in the second buffer layer 15*b*. These ion species are introduced into Si with high acceleration energy to form the first buffer layer 15*a* and the second buffer layer 15*b*. When the protons or helium is used, a diffusion-layer forming process technique is used to form an N layer by the annealing at a temperature ranging from 350 to 450° C. using the protons or helium as donors. The protons or helium can be introduced into Si with an irradiation technique using a cyclotron, besides through the ion implantation.

When the protons are introduced into Si, voids occurring in introducing the protons are combined with hydrogen atoms and oxygen atoms to yield a complex defect. Since this complex defect contains hydrogen, it becomes an electron source (donor). When the density of the complex defect increases by the annealing, the donor concentration also increases, and the donor concentration further increases by a mechanism of enhancing a thermal donor phenomenon caused by the ion implantation or the irradiation process. As a result, a layer serving as a donor which has the higher impurity concentration than the $N^-$ drift layer 14 is formed, thus contributing to the device operation as the second buffer layer 15*b*. However, the complex defect formed by introducing the protons also includes a defect which becomes a lifetime killer reducing a lifetime of the carrier, so that it is necessary to cause the second buffer layer 15*b* to serve as the donor after forming the first buffer layer 15*a* as described hereinafter, thus important are a position for performing the ion implantation step of forming the second buffer layer during the manufacturing step and the annealing condition to cause the second buffer layer 15*b* to serve as the donor.

Different methods of annealing are used for activating the first buffer layer 15*a* and the second buffer layer 15*b*, respectively. The annealing temperature at this time is higher in the first buffer layer 15*a* than in the second buffer layer 15*b*. Thus, an activation rate $R_b$ of the second buffer layer 15*b* is smaller than an activation rate $R_a$ of the first buffer layer 15*a*, and each diffusion layer is formed in a condition of $R_b/R_a=0.01$. An activation rate R (%) is expressed by (a dose amount calculated from the impurity profile after the activation/a dose amount of ionic atoms contained in the actual diffusion layer area)×100.

Herein, the dose amount calculated from the impurity profile after the activation indicates a dose amount calculated from a relationship between the impurity concentration and depth of the diffusion layer by Spreading Resistance Analysis. The dose amount of ionic atoms contained in the actual diffusion layer area indicates a dose amount calculated by analyzing a mass of ions in a depth direction by SIMS (Secondary Ion Mass Spectrometry) method.

Figure 41:
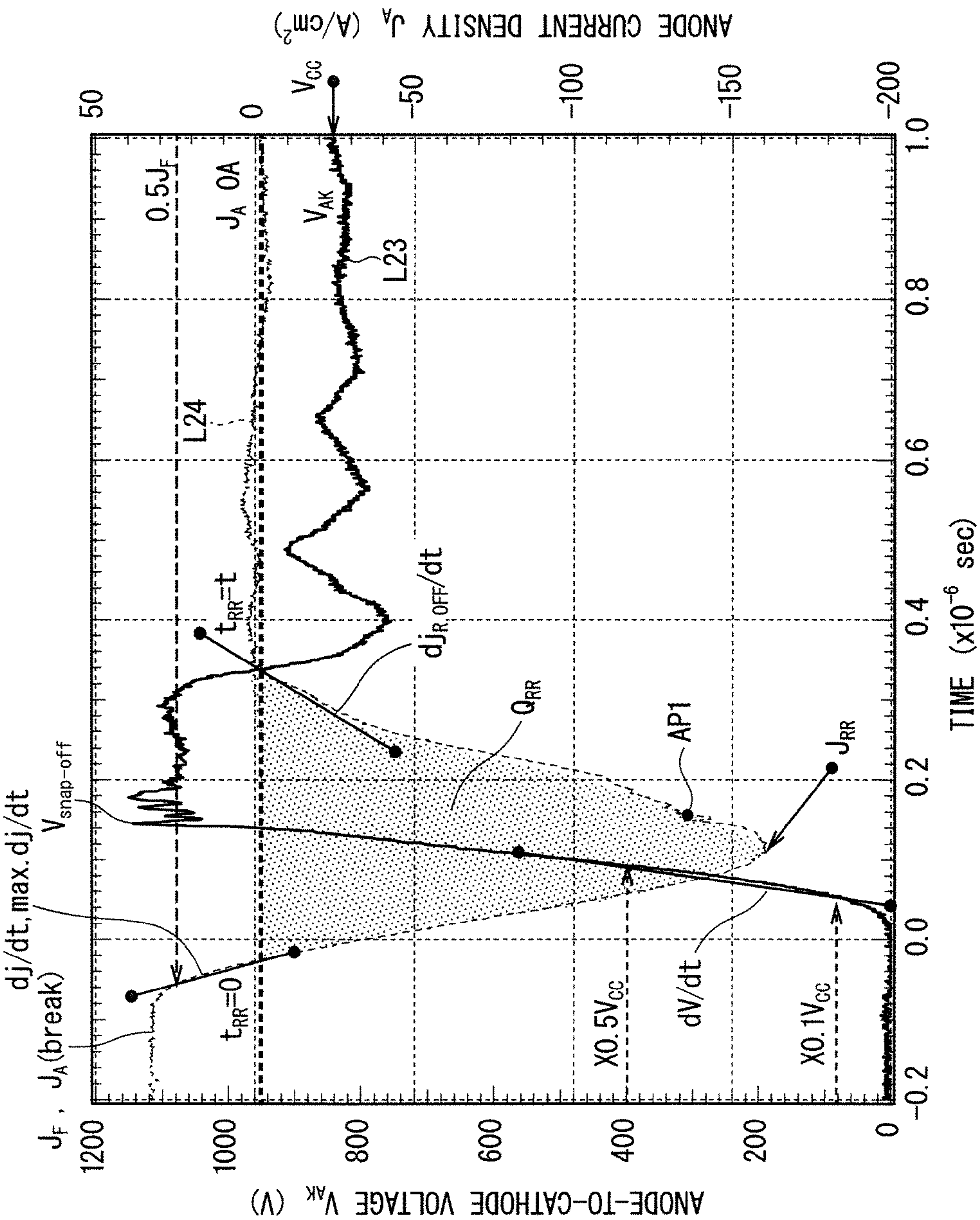
FIG. 41 is a view illustrating a recovery waveform of the diode and a performance parameter extracted from the recovery waveform.

FIG. 41 illustrates a recovery waveform of the diode and a performance parameter extracted from the recovery waveform. In FIG. 41, a horizontal axis indicates a time ($\times10^{-6}$ seconds), and a vertical axis indicates an anode-to-cathode voltage $V_{AK}$ (V) and an anode current density $J_A$ (A/cm$^2$). A solid line L23 in FIG. 41 indicates the anode-to-cathode voltage $V_{AK}$ and a dotted line L24 indicates the anode current density $J_A$. A snap-off voltage $V_{snap\text{-}off}$ is a maximum value of $V_{AK}$ in the snappy recovery operation. A power supply voltage $V_{CC}$ corresponds to $V_{AK}$ at the time of $1.0\times10^{-6}$ seconds. The sign of dV/dt indicates a waveform gradient of $V_{AK}$ which is 10 to 50% of $V_{CC}$. The sign of $J_F$ indicates a maximum value of $J_A$ at a time of forward bias early in the recovery operation. The sign of $J_A$ (break) indicates a maximum blocking current density in the recovery operation. The sing of $J_{RR}$ indicates a maximum reverse recovery current density in the recovery operation. The sign of dj/dt indicates a waveform gradient of $J_A$ which is 0 to 50% of $J_F$. The sign of max. dj/dt indicates a maximum blocking dj/dt in the recovery operation. The sign of $dj_{R,OFF}$/dt indicates a waveform gradient of $J_A$ at the end of a tail current area. The sign of $Q_{RR}$ indicates an accumulated charge amount in the recovery operation and is obtained by integrating $J_A$ within a range of 0A or smaller.

Figure 43:
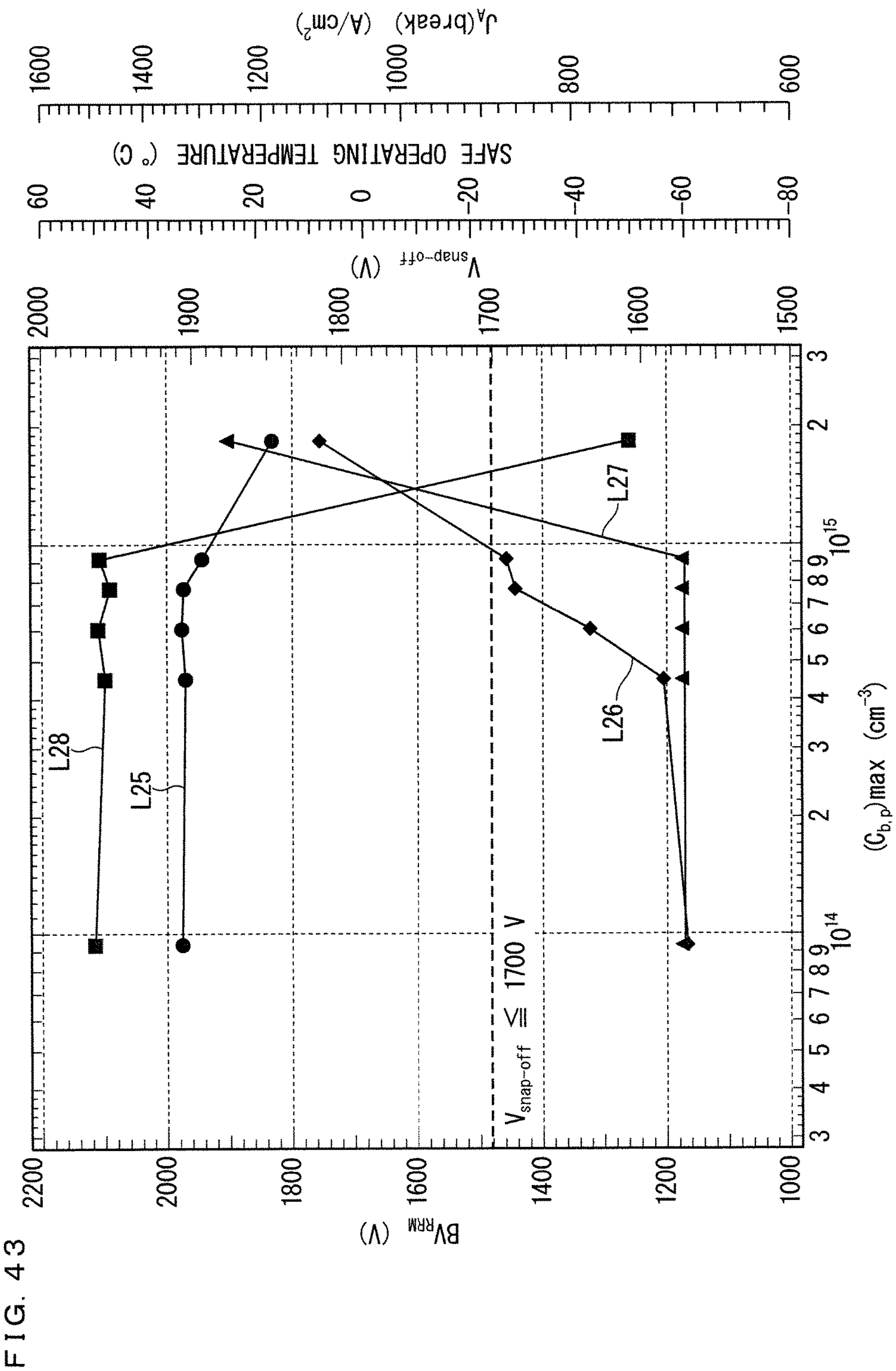
FIG. 43 is a view illustrating a relationship between the diode performance and the structure parameter of the second buffer layer in the RFC diode having the N buffer layer of the second structure.
Figure 44:
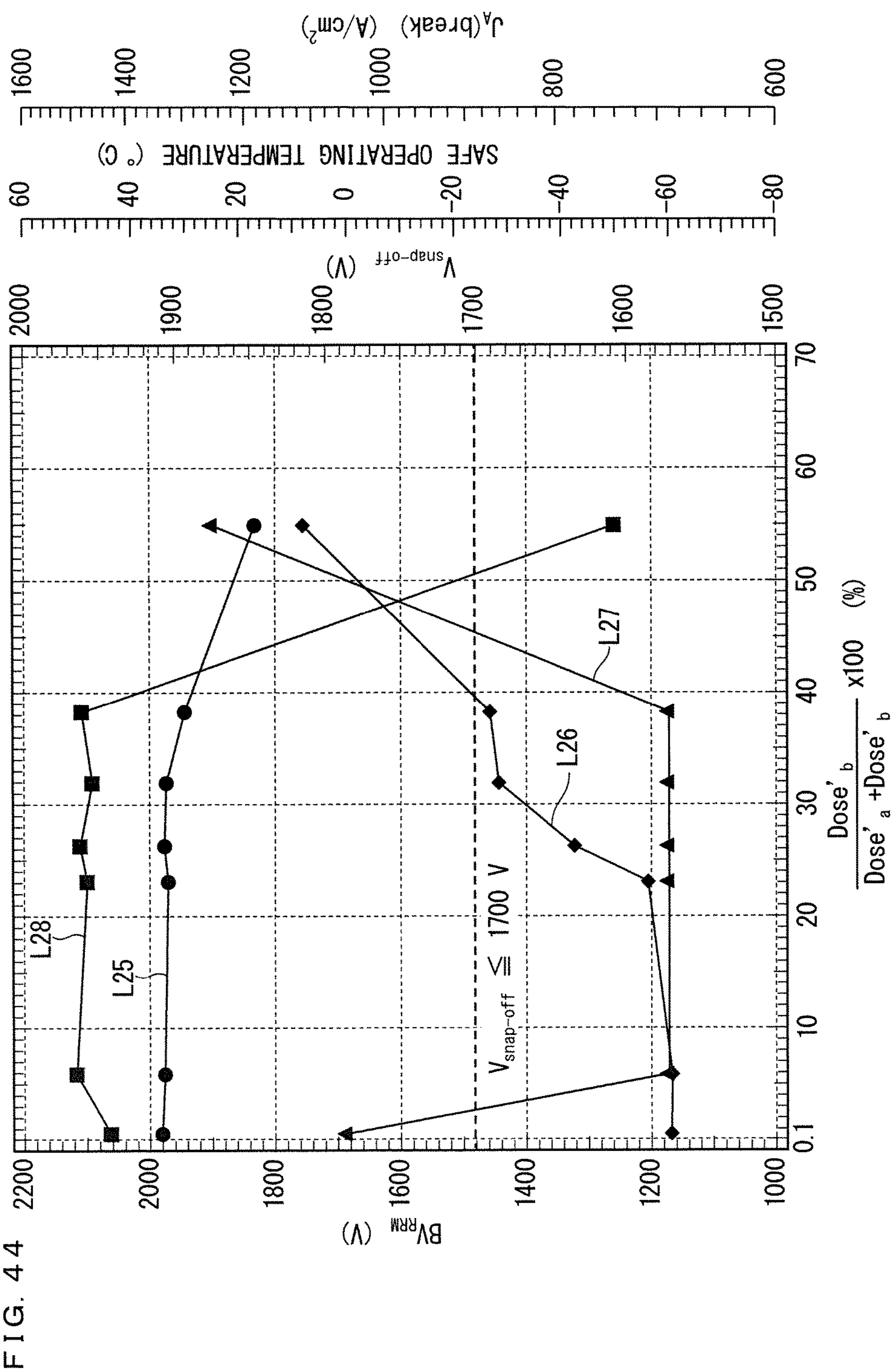
FIG. 44 is a view illustrating a relationship between the diode performance and the structure parameter of the second buffer layer in the RFC diode having the N buffer layer of the second structure.

FIG. 42 and the subsequent drawings illustrate a relationship between the parameter and the diode performance of the second buffer layer 15*b* of the N buffer layer 15 of the present invention, using the aforementioned performance parameter illustrated in FIG. 41. FIG. 42 to FIG. 44 includes a vertical axis, which indicates a diode performance of withstand voltage 1700V class including a withstand voltage $BV_{RRM}$, a snap-off voltage $V_{snap\text{-}off}$, a safe operating temperature in a snappy recovery operation, and a maximum blocking current density $J_A$ (break) in a recovery operation, and a vertical axis which indicates a structure parameter of the second buffer layer 15*b* so as to illustrate the relationship between them. As the structure parameter of the second buffer layer 15*b*, FIG. 42 illustrates a total dose amount $Dose_{,b}$ (cm$^{-2}$) of the second buffer layer 15*b*, FIG. 43 illustrates a maximum peak impurity concentration $(C_{b,p})$ max of the second buffer layer 15*b*, and FIG. 44 illustrates a ratio of the total dose amount ($Dose'_b$) after activating the second buffer layer 15*b* to a total dose amount after activating the N buffer layer 15. The total dose amount ($Dose'_b$) after activating the N buffer layer 15 is expressed by a sum of the total dose amounts after activating the first buffer layer 15*a* and the second buffer layer 15*b* (Dose'a+Dose'b).

FIG. 42 to FIG. 44 illustrate characteristics of the RFC diode in FIG. 32 including the second structure. In FIG. 42 to FIG. 44, with regard to the second structure, $BV_{RRM}$ is plotted with black circles, $V_{snap\text{-}off}$ is plotted with black rhombuses, a safe operating temperature is plotted with black triangles, and $J_A$ (break) is plotted with black squares, and each plotted point is connected by solid lines L25 to L28. In FIG. 42, $BV_{RRM}$ having a structure in which the first buffer layer 15*a* is omitted from the second structure is plotted with white circles for reference, and each plotted point is connected by a dotted line L29. Moreover, in FIG. 42, with regard to the conventional structure 1, $BV_{RRM}$ is plotted with white circles, $V_{snap\text{-}off}$ is plotted with white rhombuses, a safe operating temperature is plotted with white triangles, and $J_A$ (break) is plotted with white squares for comparison.

The performance parameter indicated by a right axis in FIG. 42 to FIG. 44 is a performance parameter which is a barometer for ruggedness of the diode. In the aforementioned parameters, $V_{snap\text{-}off}$ is a performance parameter whose target value is equal to or smaller than a rated voltage. Since the diode of withstand voltage 1700V class is applied this time, the rated voltage is set to 1700V, and the target value of $V_{snap\text{-}off}$ is 1700V or smaller. The safe operating temperature indicates a safe operating temperature in a snappy recovery operation, and it is indicated that a range of the safe operating temperature increases with a decrease in the value of the temperature. It is indicated that as $J_A$ (break) becomes larger, the blocking can be performed at higher current density, and thus the ruggedness increases.

According to FIG. 42, in the second structure which does not include the first buffer layer 15*a*, $Dose_b$ needs to be equal to or higher than $2.0\times10^{14}$ cm$^{-2}$ to increase $BV_{RRM}$. In contrast, in the second structure which includes the first buffer layer 15*a*, $BV_{RRM}$ is not dependent on $Dose_b$, however, when $Dose_b$ is higher than $1.0\times10^{14}$ cm$^{-2}$, the safe operating temperature increases, and also indicated is a behavior of a reduction in ruggedness that $J_A$(break) decreases. The above results shows that in the structure which does not include the first buffer layer 15*a*, the ruggedness cannot be guaranteed while guaranteeing the voltage-holding capacity, so that the N buffer layer 15 made up of the first buffer layer 15*a* and the second buffer layer 15*b* is effective in terms of satisfying the various diode performances.

Furthermore, also in the second structure, $Dose_b$ needs to be equal to or lower than $1.0\times10^{14}$ cm$^{-2}$ to set $V_{snap\text{-}off}$ to 1700V or smaller and guarantee the wide range of the safe operating temperature and the large $J_A$ (break) (guarantee the ruggedness). Since the second buffer layer 15*b* needs to have the higher concentration than the impurity concentration $C_d$ of the $N^-$ drift layer 14, $Dose_b$ needs to be higher than the dose amount of the $n^-$ drift layer 14 ($=C_d \times tD$). Thus, $Dose_b$ needs to satisfy the following inequality (12) to guarantee the various diode performances and expand the range of the safe operating temperature of the diode. As described above, according to the second structure in which $Dose_b$ is set, the various diode performances can be guaranteed compared with the conventional structure 1, and moreover, the effect of significantly expanding the range of the safe operating temperature of the diode from 0° C. to −60° C. can be obtained.

$$C_d \times t_{14} < Dose_b \leq 1.0\times10^{14}\ \text{cm}^{-2} \quad (12)$$

According to FIG. 43, when $(C_{b,p})$ max is larger than $1.0\times10^{15}$ cm$^{-3}$, $V_{snap\text{-}off}$ is equal to or higher than 1700V, and the range of the safe operating temperature is narrowed, so that $(C_{b,p})$ max needs to be equal to or smaller than $1.0\times10^{15}$ cm$^{-3}$. Since the second buffer layer 15*b* needs to have the higher concentration than the impurity concentration $C_d$ of the $N^-$ drift layer 14, $(C_{b,p})$ max needs to be higher than $C_d$. Accordingly, $(C_{b,p})$ max needs to satisfy the following inequality (13).

$$C_d < (C_{b,p})\max \leq 1.0\times10^{15}\ \text{cm}^{-3} \quad (13)$$

According to FIG. 44, since $Dose'_b/(Dose'_a+Dose'_b)$ has the diode performance close to the conventional structure 1 when it is equal to or lower than 5%, the range of the safe operating temperature is narrowed. When $Dose'_a/(Dose'_a+Dose'_b)$ is equal to or higher than 40%, $Dose'_b$ is equal to or higher than $1.0\times10^{14}$ cm$^{-2}$, so that $V_{snap\text{-}off}$ becomes 1700V or higher, and the range of the safe operating temperature is narrowed. Accordingly, $Dose'_b/(Dose'_a+Dose'_b)$ needs to satisfy the following inequality (14).

$$5\% \leqq \frac{Dose'_b}{(Dose'_a + Dose'_b)} \leqq 40\% \quad (14)$$

Figure 45:
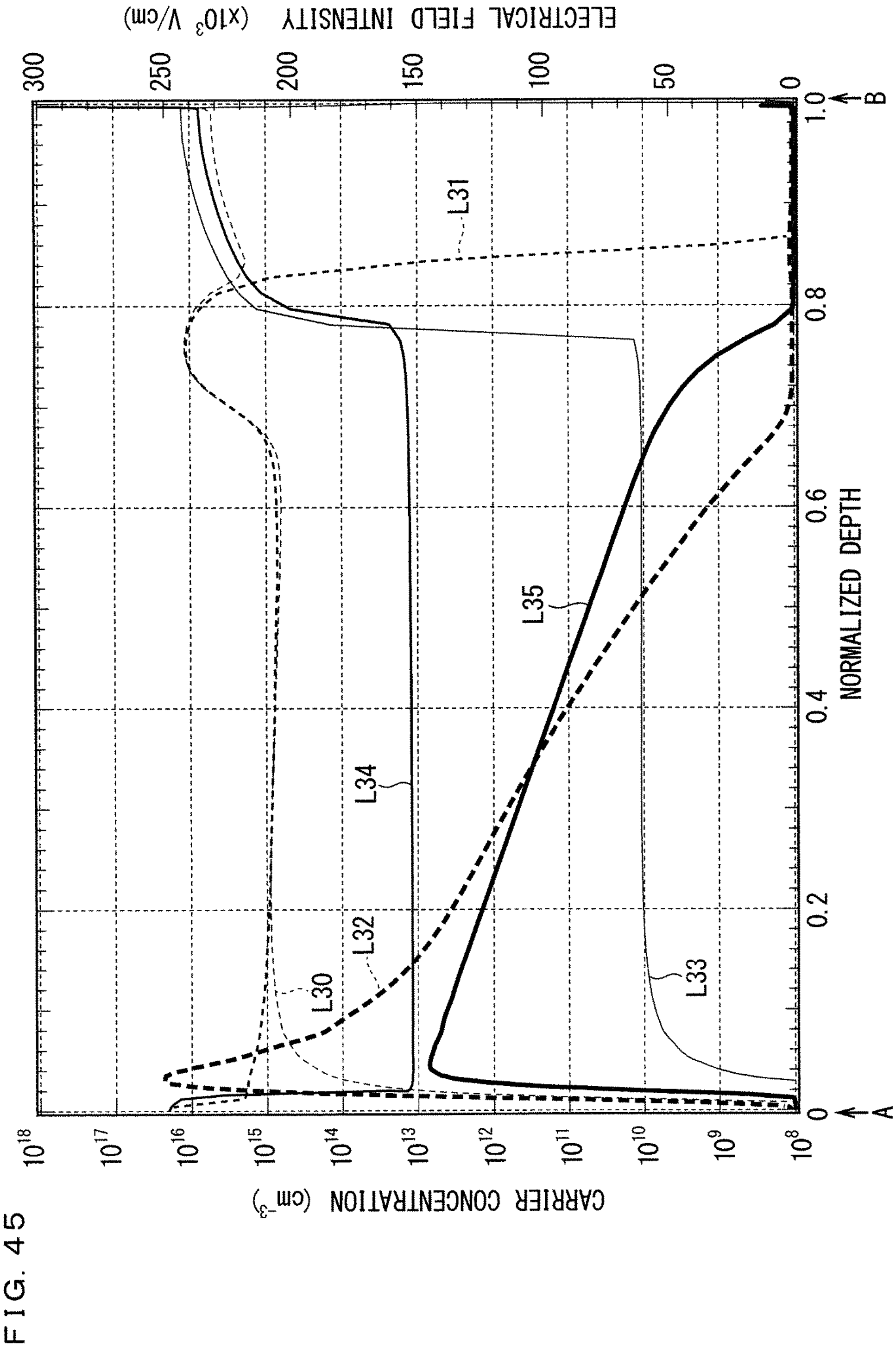
FIG. 45 is a view illustrating a simulation result of an inner state of the device in an analysis point AP1 illustrated in FIG. 41 at a time of $(C_{b,p})$ max$\leq 1.0\times10^{15}$ cm$^{-3}$ in the RFC diode having the N buffer layer of the second structure.
Figure 46:
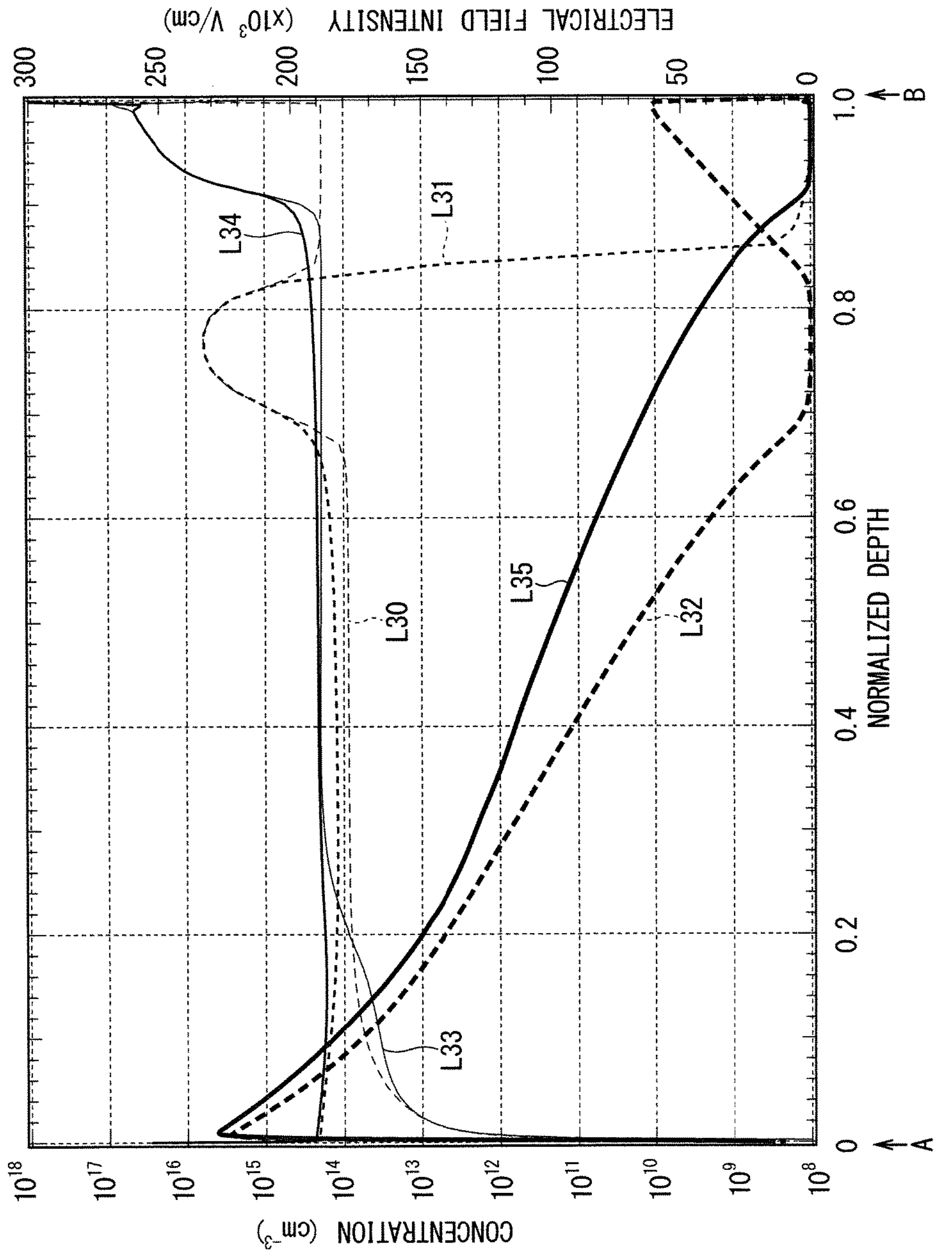
FIG. 46 is a view illustrating a simulation result of an inner state of the device in the analysis point AP1 illustrated in FIG. 41 at a time of $(C_{b,p})$ max$>1.0\times10^{15}$ cm$^{-3}$ in the RFC diode having the N buffer layer of the second structure.

FIGS. 45 and 46 illustrate a simulation result of an inner state of the device in the analysis point AP1 illustrated in FIG. 41 to describe a mechanism regarding a characteristic behavior of the second structure such as illustrated in FIGS. 42 to 44. The analysis point AP1 illustrated in FIG. 41 is set by reference to a point at which the device is broken at a time of setting to $(C_{b,p})$ max$>1.0\times10^{15}$ cm$^{-3}$ in the RFC diode in FIG. 32 having the second structure. The device used in the simulation in FIGS. 45 and 46 is the RFC diode illustrated in FIG. 32. In the device used in the simulation in FIG. 45, the maximum impurity concentration $(C_{b,p})$ max of the second buffer layer 15*b* is set to $(C_{b,p})$ max$\leq1.0\times10^{15}$ cm$^{-3}$, and in the device used in the simulation in FIG. 46, the maximum impurity concentration $(C_{b,p})$ max of the second buffer layer 15*b* is set to $(C_{b,p})$ max$>1.0\times10^{15}$ cm$^{-3}$.

Each horizontal axis in FIGS. 45 and 46 indicates a normalized depth. 0 in the horizontal axis corresponds to the mark A in FIG. 32, that is to say, the uppermost surface of the P anode layer 10, and 1 in the horizontal axis corresponds to the mark B in FIG. 32, that is to say, the surface of the P cathode layer 18. The vertical axis indicates the carrier concentration (cm$^{-3}$) and the electrical field intensity ($\times10^3$ V/cm). In FIGS. 45 and 46, characteristics in the PIN diode area 31 are indicated by dotted lines, and in the characteristics, an electron concentration is indicated by a thin dotted line L30, a positive hole concentration is indicated by a dotted line L 31 having a moderate thickness, and the electrical field intensity is indicated by a thick dotted line L32. Characteristics in the PNP transistor area 32 are illustrated by solid lines, and in the characteristics, an electron concentration is indicated by a thin solid line L33, a positive hole concentration is indicated by a solid line L34 having a moderate thickness, and the electrical field intensity is indicated by a thick solid line L35.

In the RFC diode illustrated in FIG. 42 to FIG. 44 in which the parameter of the second buffer layer 15*b* is appropriately set, as illustrated in FIG. 45, both the PIN diode area 31 and the PNP transistor area 32 indicate an electrical strength distribution having a shape close to triangle and trapezoid which becomes maximum in the vicinity of the junction while controlling the carrier plasma layer remaining in the side of the cathode. In such an inner state of the diode, it is considered that the diode performs a stable operation, and there is no negative influence on the ruggedness. However, when the parameter of the second buffer layer 15*b* is set to $(C_{b,p})$ max$>1.0\times10^{15}$ cm$^{-3}$ as illustrated in FIG. 46, the remaining carrier plasma layer is locally distributed in the vicinity of the junction between the $n^{th}$ sub-buffer layer 15*bn* in the second buffer layer 15*b* and the $N^-$ drift layer 14 in the PIN diode area 31 constituting the RFC diode. Thus, the electrical field intensity increases toward the $N^+$ cathode layer 17, and unbalance of the electrical field intensity occurs.

The unbalance of the electrical field intensity occurring during the operation of the diode leads to the reduction in ruggedness. That is to say, FIG. 43 illustrates the behavior that the ruggedness dramatically decreases when the maximum impurity concentration $(C_{b,p})$ max of the second buffer layer is equal to or higher than $1.0\times10^{15}$ cm$^{-3}$. It is considered that this behavior is triggered by the unbalance of the electrical field intensity occurring in the diode during the recovery operation of the diode as illustrated in FIG. 46.

Similarly, it is also considered that the inner state of the diode in the area where the structure parameter of the horizontal axis illustrated in FIGS. 42 to 44 is high is similar to the inner state illustrated in FIG. 46, thereby leading to the reduction in ruggedness. Compared to the cathode areas in FIG. 45 and FIG. 46, when the maximum impurity concentration $(C_{b,p})$ max of the second buffer layer 15*b* satisfies $(C_{b,p})$ max$>1.0\times10^{15}$ cm$^{-3}$, the area of the carrier plasma layer remaining in the second buffer layer 15*b* is narrowed at the time of dynamic operation, in an area A12' in FIG. 37, which is one of the functions, which are targeted, of the N buffer layer 15, and both the PIN diode are 31 and the PNP transistor area 32 are depleted in the second buffer layer 15*b*. That is to say, when the concentration of the second buffer layer 15*b* increases to satisfy the inequality of $(C_{b,p})$ max$>1.0\times10^{15}$ cm$^{-3}$ or $Dose_b>1.0\times10^{14}$ cm$^{-2}$, the area of the carrier plasma layer remaining in the second buffer layer 15*b* is narrowed and depleted at the time of the dynamic operation, and as a result, the ruggedness of the diode decreases. This behavior also occurs in a case where the value of $Dose_b/(Dose_a+Dose_b)$, which is one of the structure parameters of the second buffer layer 15*b*, is larger than 40%.

The structure parameter of the second buffer layer 15*b* also includes $(C_{b,p})$ max$/C_d$ and $(C_{b,p})$ max$/C_{a,p}$ besides the structure parameters described above. $(C_{b,p})$ max$/C_d$ expresses a relationship between the maximum peak impurity concentration $(C_{b,p})$ max of the second buffer layer 15*b* and the impurity concentration $C_d$ of the $N^-$ drift layer 14. Secondly, $(C_{b,p})$ max$/C_{a,p}$ is a parameter expressing a relationship between the maximum peak impurity concentration $(C_{b,p})$ max of the second buffer layer 15b and the peak impurity concentration $C_{a,p}$ of the first buffer layer 15a.

The impurity concentration $C_d$ of the $N^-$ drift layer 14 ranges from $1.0\times10^{12}$ to $5.0\times10^{14}$ $cm^{-3}$, and the peak impurity concentration $C_{a,p}$ of the first buffer layer 15a ranges from $1.0\times10^{16}$ to $5.0\times10^{16}$ $cm^{-3}$. Thus, according to the inequality (13), the aforementioned parameter needs to satisfy the following inequalities (15) and (16).

$$2.0 \leqq \frac{(C_{b,p})\max}{C_d} \leqq 1.0\times10^3 \quad (15)$$

$$2.0\times10^{-5} < \frac{(C_{b,p})\max}{C_{a,p}} \leqq 0.1 \quad (16)$$

However, in view of the range covered by an actual measured data illustrated in FIG. 43, it is appropriate to set $(C_{b,p})$ max/$C_{a,p}$ to satisfy a condition of an inequality (17) so as to guarantee the various performances and the wide range of the safe operating temperature of the diode.

$$2.0\times10^{-3} \leqq \frac{(C_{b,p})\max}{C_{a,p}} \leqq 0.1 \quad (17)$$

Figure 47:
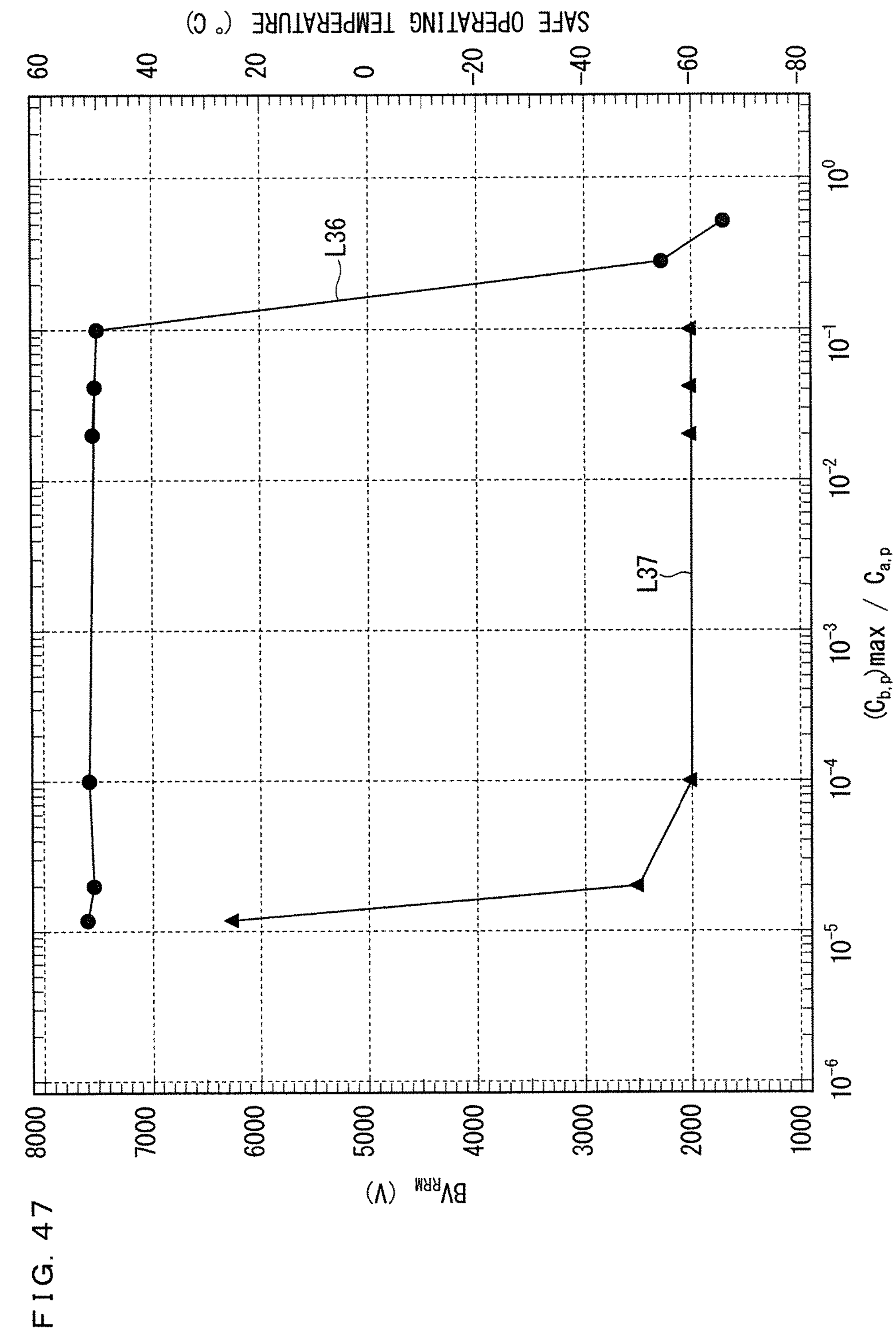
FIG. 47 is a view illustrating a relationship between the diode performance and the structure parameter of the second buffer layer in the RFC diode having the N buffer layer of the second structure.

FIG. 47 is a graph indicating a relationship in the RFC diode of withstand voltage 6500V class having the second structure between, as a vertical axis, the withstand voltage $BV_{RRM}$ and the diode performance of the safe operating temperature at the time of snappy recovery operation and, as a horizontal axis, $(C_{b,p})$ max/$C_{a,p}$ which is the structure parameter of the second buffer layer 15b. In FIG. 47, $BV_{RRM}$ is plotted with black circles and each black circle is connected by a solid line L36, and the safe operating temperature is plotted with black triangles and each black triangle is connected by a solid line L37. There is no data of safe operating temperature within the range of $(C_{b,p})$ max/$C_{a,p}$>0.1, because $BV_{RRM}$ can only hold the voltage lower than $V_{CC}$ at the time of evaluating the recovery operation, so that the evaluation cannot be performed. With regard to the horizontal axis in FIG. 47, the influence of the first buffer layer 15a in the N buffer layer 15 decreases as $(C_{b,p})$ max/$C_{a,p}$ becomes larger, and the influence is controlled by the second buffer layer 15b, so that B $V_{RRM}$ extremely decreases. In contrast, the influence of the second buffer layer 15b in the N buffer layer 15 decreases as $(C_{b,p})$ max/$C_{a,p}$ becomes smaller, and the influence is controlled by the first buffer layer 15a, so that the range of the safe operating temperature is narrowed. As a result of FIG. 47, $(C_{b,p})$ max/$C_{a,p}$ which is the structure parameter of the second buffer layer 15b is set within the range to satisfy an inequality (17), whereby an effective effect satisfying the various diode performances can be obtained.

Figure 48:
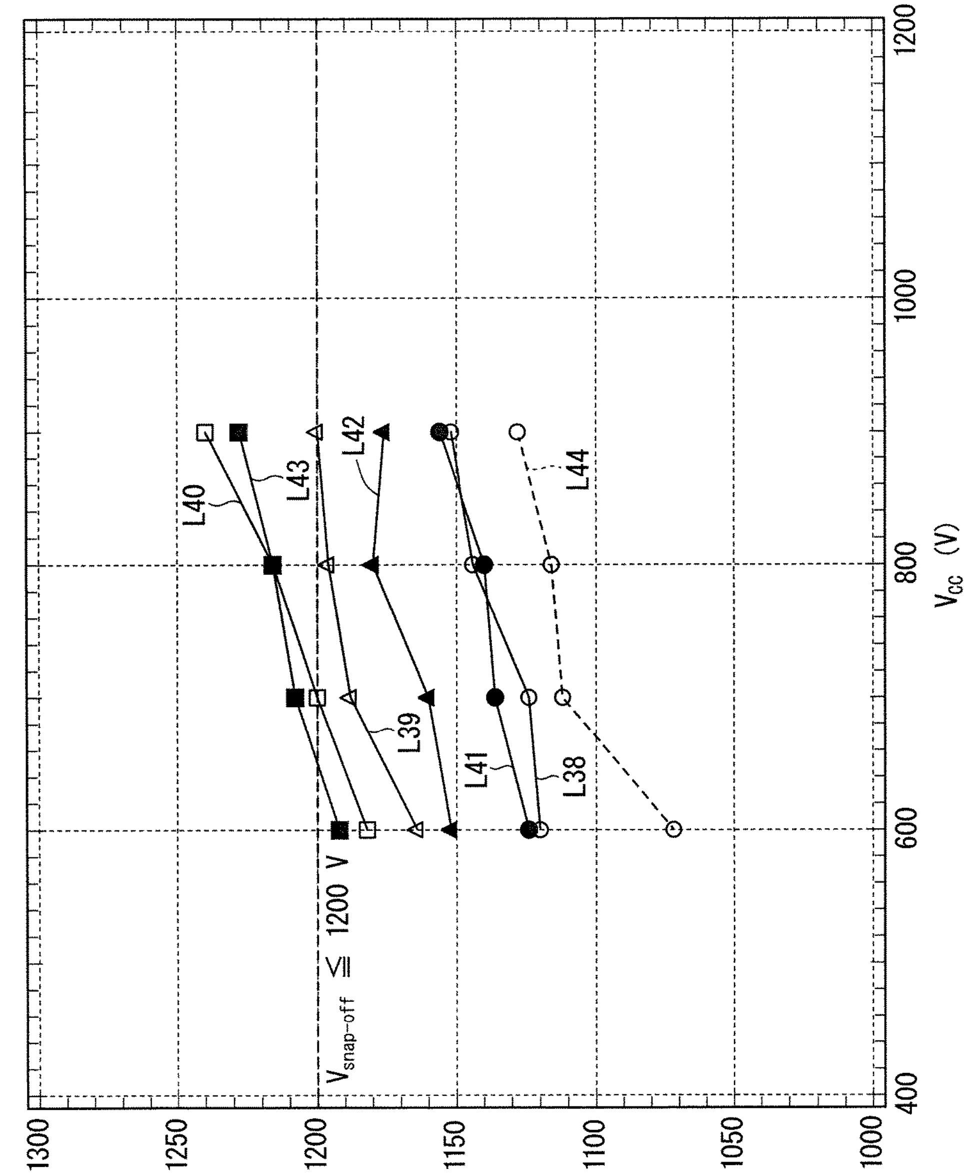
FIG. 48 is a view illustrating a relationship between the diode performance and the structure parameter of the second buffer layer in the RFC diode having the N buffer layer of the first structure and the second structure.
Figure 49:
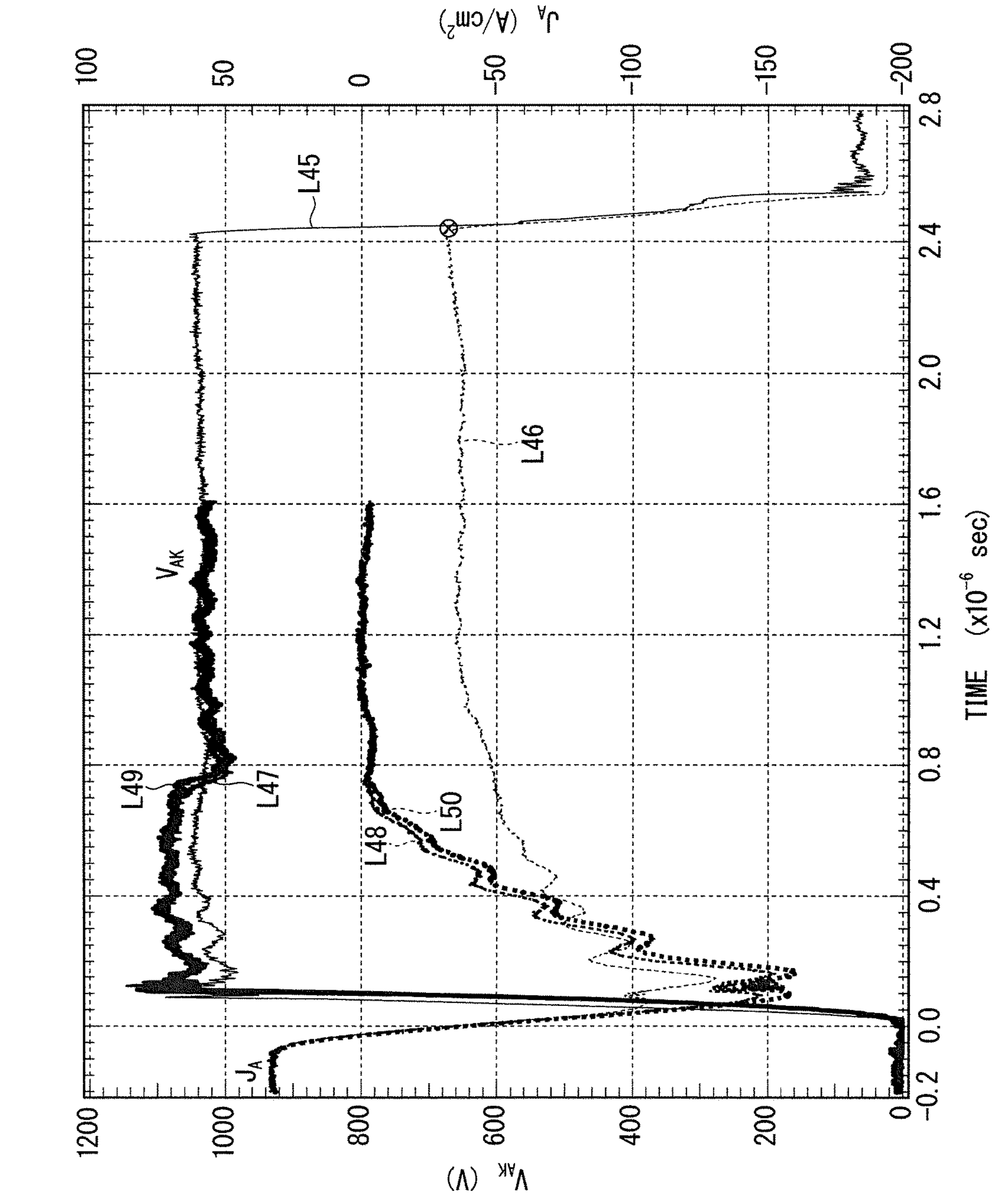
FIG. 49 is a view illustrating a recovery waveform under a snappy recovery condition in the RFC diode.

FIG. 48 illustrates a relationship between $V_{snap\text{-}off}$ and $V_{CC}$ at the time of snappy recovery operation, applying $Dose_b$ as a parameter. The RFC diode of withstand voltage 1200V class is used as the evaluation device, and the evaluation is performed on each of the conventional structure 1, the first structure, and the second structure. The evaluation result of the conventional structure 1 is plotted with white circles, and each plotted point is connected by a dotted line L44. The evaluation result of the first structure is plotted with white circles in a case where $Dose_b$=$5.0\times10^{13}$ $cm^{-2}$ is satisfied, white triangles in a case where $Dose_b$=$1.0\times10^{14}$ $cm^{-2}$ is satisfied, and white squares in a case where $Dose_b$=$2.0\times10^{14}$ $cm^{-2}$ is satisfied, and each plotted point is connected by solid lines L38 to L40. The evaluation result of the second structure is plotted with black circles in a case where $Dose_b$=$5.0\times10^{13}$ $cm^{-2}$ is satisfied, black triangles in a case where $Dose_b$=$1.0\times10^{14}$ $cm^{-2}$ is satisfied, and black squares in a case where $Dose_b$=$2.0\times10^{14}$ $cm^{-2}$ is satisfied, and each plotted point is connected by solid lines L41 to L43.

The diode performance is deemed to be better as $V_{snap\text{-}off}$ becomes smaller, and $V_{snap\text{-}off}$ needs to be made smaller than the rated voltage of the evaluation diode. FIG. 48 shows that the value of $V_{snap\text{-}off}$ is higher in the first structure and the second structure than in the conventional structure 1, and $Dose_b \leqq 1.0\times10^{14}$ $cm^{-2}$ is necessary to satisfy $V_{snap\text{-}off} \leqq 1200V$.

FIG. 49 illustrates a recovery waveform under snappy recovery condition at a temperature of −20° C. or less in the RFC diode of withstand voltage 1200V class. The other switching conditions are $V_{CC}$=1000V, $J_F$=0.1 $J_A$, dj/dt=1000 A/cm² μs, dV/dt=12500V/μs, and Ls=2.0 μH. A horizontal axis in FIG. 49 indicates a time (×$10^{-6}$ seconds), and a vertical axis indicates an anode-to-cathode voltage $V_{AK}$ (V) and an anode current density $J_A$ (A/cm²). $V_{AK}$ in the conventional structure 1 is illustrated by a thin solid line L45, and $J_A$ is illustrated by a thin dotted-line L46. $V_{AK}$ in the first structure 1 is illustrated by a solid line L47 having a moderate thickness, and $J_A$ is illustrated by a dotted-line L48 having a moderate thickness. $V_{AK}$ in the second structure is illustrated by a thick solid line L49, and $J_A$ is illustrated by a thick dotted-line L50.

FIG. 49 shows, differing from FIG. 61 described hereinafter, that the snap-off phenomenon and the subsequent oscillation phenomenon do not occur at the time of snappy recovery operation. This is an effect of the RFC diode. A cross mark in the waveform of the conventional structure 1 in FIG. 49 indicates a point at which the device has been broken. According to FIG. 49, in the conventional structure 1, an enormous tail current occurs in the last half of recovery operation at a temperature of −20° C. and the device is broken. In contrast, in the first structure and the second structure, the tail current in the last half of recovery operation decreases and is blocked without the breakdown of the device. The mechanism of the behavior of the conventional structure 1 described above is caused by the characteristic behavior of the diode in the recovery operation. The parameter of the diode performance functioning as a barometer for determining whether the enormous tail current occurs at the time of the recovery operation of the diode is the value of $Q_{RR}$ in FIG. 41.

The aforementioned result shows that the snappy recovery operation at the temperature of −20° C. cannot be guaranteed in the conventional structure 1, but can be guaranteed in the first structure and the second structure. That is to say, the first structure and the second structure have the effect of suppressing the operation of the PNP transistor area 32 in the recovery operation while suppressing the snap-off phenomenon at the end of the recovery operation, which is a characteristic of the RFC diode, and the subsequent oscillation phenomenon, whereby the balanced operation is achieved.

Figure 50:
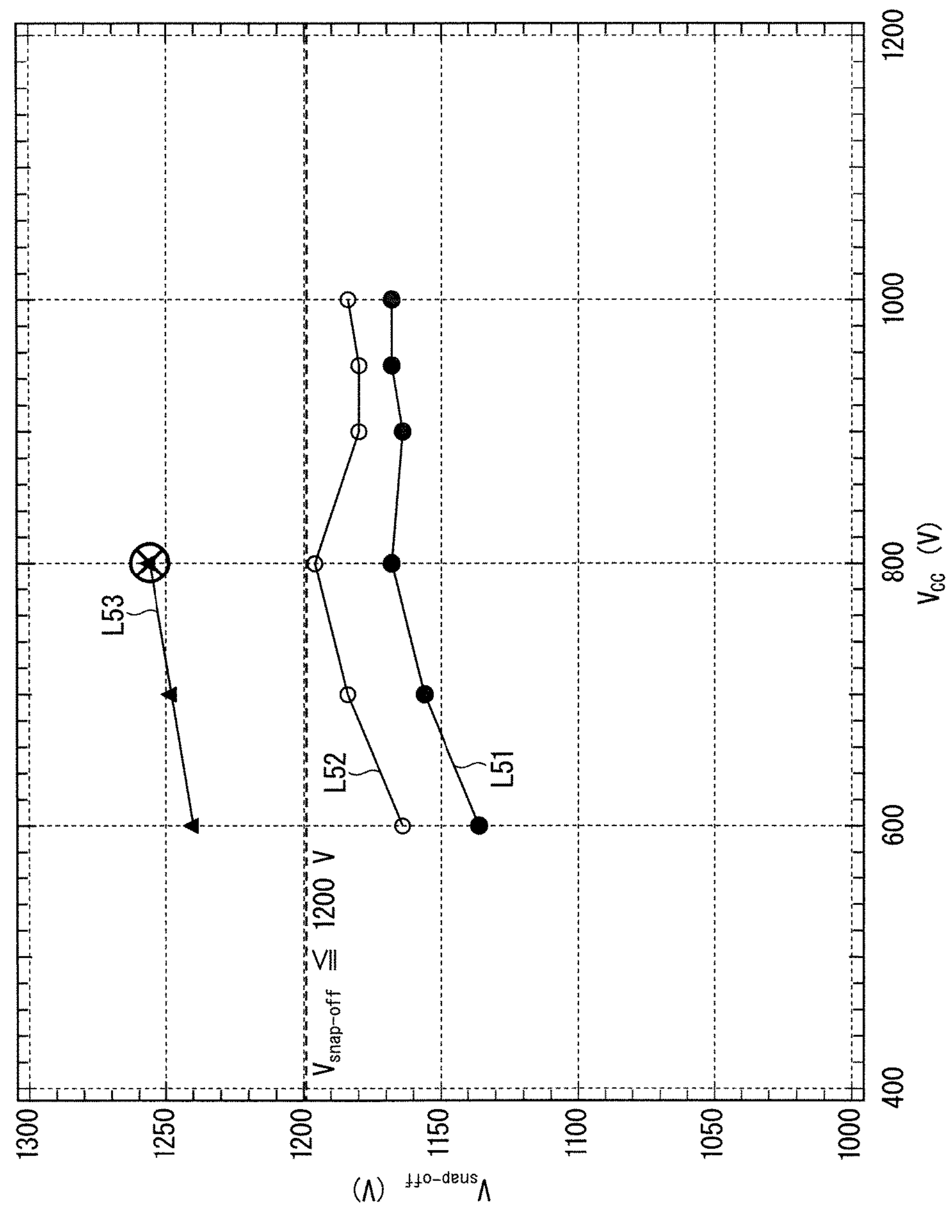
FIG. 50 is a view illustrating a relationship between $V_{snap-off}$ and $V_{CC}$ at a time of snappy recovery operation using the impurity profile of the second buffer layer of the second structure as a parameter.

FIG. 50 illustrates a relationship between $V_{snap\text{-}off}$ and $V_{CC}$ at the time of snappy recovery operation using the impurity profile of the second buffer layer 15b having the second structure as a parameter. In FIG. 50, a horizontal axis indicates $V_{CC}$(V), and a vertical axis indicates $V_{snap\text{-}off}$(V). The RFC diode of withstand voltage 1200V class is used as the evaluation device. A cross mark in FIG. 50 indicates a point at which the device has been broken. In FIG. 50, characteristics in a state of $\delta_{bn}<\delta_{b(n-1)}$ and $C_{bn,p}<C_{b(n-1),p}$ are plotted with black circles, characteristics in a state of $\delta_{bn}=\delta_{b(n-1)}$ and $C_{bn,p}=C_{b(n-1),p}$ are plotted with white circles, characteristics in a state of $\delta_{bn}>\delta_{b(n-1)}$ and $C_{bn,p}>C_{b(n-1),p}$ are plotted with black triangles, and each plotted point is connected by solid lines L51 to L53. The concentration profile of $\delta_{bn}<\delta_{b(n-1)}$ and $C_{bn,p}<C_{b(n-1),p}$ is the concentration profile of the second structure illustrated in FIG. 33. The concentration profile of $\delta_{bn}=\delta b(n-1)$ and $C_{bn,p}=C_{b(n-1),p}$ is a flat concentration profile. The concentration profile satisfying $\delta_{bn}>\delta_{b(n-1)}$ and $C_{bn,p}>C_{b(n-1),p}$ is the concentration profile whose concentration decreases from a side of $N^-$ drift layer 14 of the second buffer layer 15*b* toward a side of the first buffer layer 15*a*. FIG. 50 shows that when the concentration profile of the second buffer layer 15*b* having the second structure satisfies the following condition a), the device is not broken by the snappy recovery operation and $V_{snap\text{-}off}\leq 1200$V is satisfied.

a) $\delta_{bn}<\delta_{b(n-1)}$ and $C_{bn,p}<C_{b(n-1),p}$

Figure 51:
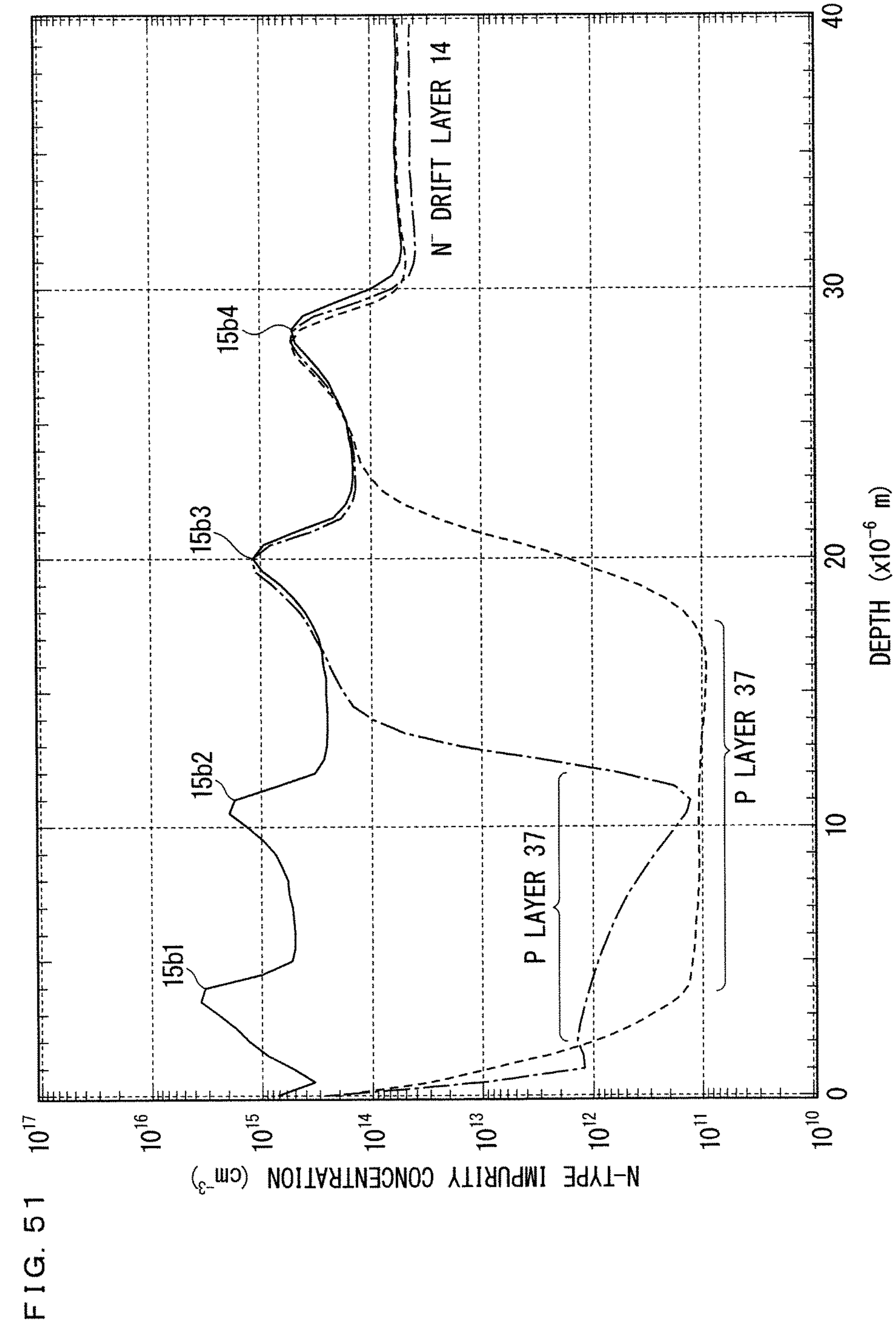
FIG. 51 is a view illustrating an impurity profile after annealing the second buffer layer of the second structure.

FIG. 51 illustrates the impurity profile after annealing the second buffer layer 15*b* having the second structure. In FIG. 51, a horizontal axis indicates a depth ($\times10^{-6}$ μm), and a vertical axis indicates an n-type impurity concentration ($cm^{-3}$). An impurity profile in a case where there is one condition of acceleration energy at a time of introducing the protons (H+) into Si is indicated by a dotted line, an impurity profile in a case where there are two conditions of acceleration energy is indicated by an alternate long and short dash line, and an ideal impurity profile is indicated by a solid line. A sign provided to a peak of a solid line L56 indicates each of sub-buffer layers 15*b*1 to 15*b*4 of the second buffer layer 15*b*.

FIG. 51 shows that in the case where there is one or two condition of acceleration energy, a donor layer is not formed in an area through which the protons (H+) have passed, and the n-type impurity concentration decreases. This area in which the n-type impurity concentration decreases is referred to as a P layer 37. The P layer 37 has a low concentration equal to or lower than the impurity concentration $C_d$ of the $N^-$ drift layer 14 and is high in crystal defect, thereby becoming the lifetime killer which reduces the lifetime of the carrier. When the N buffer layer 15 includes such a P layer 37, the N buffer layer 15 cannot form the remaining carrier plasma layer in the side of the collector in the IGBT or in the side of the cathode in the diode. Moreover, since the area which causes the reduction in lifetime is locally included, the suppression in snap-off phenomenon and surge voltage in the turn-off operation and the reduction in leakage current in the turn-off operation cannot be achieved. The P layer 37 has a negative influence, on the device performance, that the ON voltage increases and the variation of the characteristics of the device increases. Thus, the second buffer layer 15*b* needs to be formed in the N buffer layer 15 without forming the P layer 37 having the low concentration equal to or lower than the impurity concentration $N_d$ of the $N^-$ drift layer 14. As described above, in the second buffer layer 15*b*, the complex defect formed at the time of introducing the protons (H+) into Si is combined with hydrogen, and the donor layer is thereby formed by the mechanism of enhancing the thermal donor phenomenon. Accordingly, at the time of introducing the protons (H+) into Si, the acceleration energy needs to be changed so that the distances between the peak positions of the impurity concentration ($\Delta S_{b1,b2}$, $\Delta S_{b2,b3}$, . . . , $\Delta S_{b(n-1),bn}$) is set equal to each other or an implantation angle needs to be changed while keeping the acceleration energy constant, in order to prevent the formation of P layer 37 in the area through which the protons pass, which is caused by supplying hydrogen to be combined with the complex defect. The term "the distances between the peak points are equal to each other" described herein includes not only the case where the distances are exactly equal but also the case where the distances are equal to each other within the range of half-value width of each sub-buffer layer (2 μm).

The first buffer layer 15*a* and the first sub-buffer layer 15*b*1, which is in contact with the first buffer layer 15*a* in the second buffer layer 15*b*, have a small difference of the depth which becomes the peak concentration of each of them. This feature is based on standpoints of stabilizing each other's impurity profile and suppressing the formation of the P layer 37, which is high in crystal defect, in the area through which the protons (H+) at the time of forming the first sub-buffer layer 15*b*1. The distance between the peak positions of the impurity concentration in the first buffer layer 15*a* and the first sub-buffer layer 15*b*1 ($\Delta S_{a,b1}$) needs to be smaller than the distance between the peak positions of the impurity concentration in each of the adjacent sub-buffers 15*b*1 to 15*bn* in the second buffer layer 15*b* ($\Delta S_{b1,b2}$, $\Delta S_{b2,b3}$, . . . , $\Delta S_{b(n-1),bn}$).

The impurity profile after activating the sub-buffer layers 15*b*1 to 15*bn* constituting the second buffer layer 15*b* has a feature of trailing in a direction from the first main surface toward the second main surface, that is to say, in a direction of the P collector layer 16 in the case of the IGBT and in a direction of the $N^+$ cathode layer 17 or the P cathode layer 18 in the case of the diode. Since such an impurity profile is formed, the extension speed of the depletion layer extending from the main junction toward the P collector layer 16 and the $N^+$ cathode layer 17 or the P cathode layer 18 in the device operation can be decreased in each of the sub-buffer layers 15*b*1 to 15*bn*. Accordingly, the extension of the depletion layer as well as the remaining carrier plasma layer is controlled in the dynamic operation of the device, the controllability of the electrical field intensity in the dynamic operation is enhanced as illustrated in FIG. 45, and the controllability of the turn-off operation and the enhancement in ruggedness are achieved. The N buffer layer 15 needs to satisfy the following conditions b) to d) to achieve them.

b) $\Delta S_{b1,b2}=\Delta S_{b2,b3}\ldots=\Delta S_{b(n-1),bn}$ is satisfied in each of the sub-buffer layers 15*b*1 to 15*bn* constituting the second buffer layer 15*b*.

c) $\Delta S_{a,b1}<\Delta S_{b1,b2}$ is satisfied between the first buffer layer 15*a* and the second buffer layer 15*b*.

d) According to FIG. 33 and FIG. 50, the impurity profile of each of the sub-buffer layers 15*b*1 to 15*bn* constituting the second buffer layer 15*b* is the impurity profile trailing in the direction of the P collector layer 16 in the case of the IGBT and in the direction of the $N^+$ cathode layer 17 or the P cathode layer 18 in the case of the diode.

e) The condition d) is applied to the impurity profile of two or more sub-buffer layers 15*b*2 to 15*bn* located at a side of the main junction of at least the second sub-buffer layer 15*b*2 or the subsequent second sub-buffer layer.

According to FIG. 50 and FIG. 51, the second structure of the present invention needs to satisfy the conditions a) to e) described above in addition to the structure parameter of the second buffer layer 15*b* to satisfy the various performances of the diode illustrated in FIGS. 42 to 44 and 47.

As described above, the first structure and the second structure which are the N buffer layer 15 of the present invention having the feature of the impurity profile illustrated in FIG. 33 achieves the balanced diode which satisfies the various performances by setting the structure parameter of the second buffer layer 15*b* illustrated in FIGS. 42 to 44 and 47 and additionally satisfying the conditions a) to e) described above in the second structure. Moreover, the first structure and the second structure indicate the effect of expanding the range of the safe operating temperature due to the action of suppressing the enormous tail current in the snappy recovery operation of the diode compared with the conventional structure 1.

Embodiment 2

Described in the embodiment 2 is a result of the diode performance at a time of applying the various structure parameters and the conditions a) to e) described in the embodiment 1 to the N buffer layer 15 of the RFC diode illustrated in FIG. 32 (FIG. 52 to FIG. 60).

Figure 52:
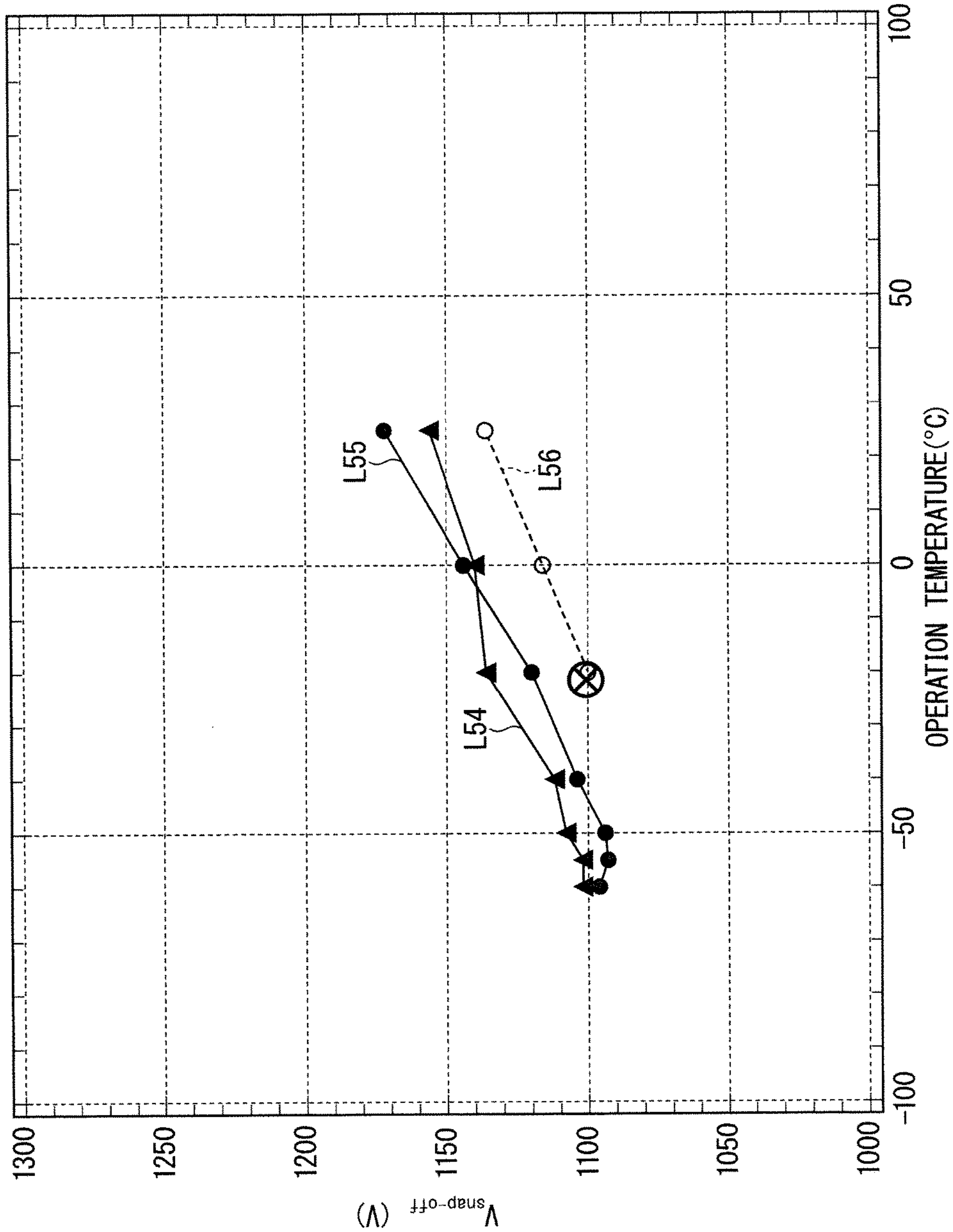
FIG. 52 is a view illustrating an N buffer layer dependence regarding a relationship between $V_{snap-off}$ and an operation temperature in the snappy recovery operation of the RFC diode.

FIGS. 52 to 54 illustrate an N buffer layer 15 dependence in the snappy recovery operation of the RFC diode of withstand voltage 1200V class. The waveform in the snappy recovery operation at the temperature of −20° C. is as illustrated in FIG. 49. FIGS. 52 and 53 illustrate relationships between an operation temperature of $V_{CC}$=1000V and $V_{snap\text{-}off}$ and $Q_{RR}$, respectively. FIG. 54 illustrates a relationship between $Q_{RR}$ and $V_{CC}$ at the temperature of −20° C. In FIGS. 52 to 54, the characteristics of the first structure are plotted with black triangles, the characteristics of the second structure are plotted with black circles, and each plotted point is connected by solid line L54 and L55. The characteristics of the conventional structure 1 are plotted with white circles, and each plotted point is connected by a dotted line L56. A cross mark indicates a point at which the device has been broken.

FIGS. 52 and 53 show that the device is broken at the temperature of −20° C. in the conventional structure 1, however, the operation is normally operated even at a temperature of −60° C. in the first structure and the second structure. When the conventional structure 1 is broken at the temperature of −20° C., the characteristic recovery operation indicating the enormous value of $Q_{RR}$ is performed, and the enormous tail current occurs in the last half of recovery operation as illustrated in FIG. 49.

As illustrated in FIG. 54, $Q_{RR}$ is largely dependent on $V_{CC}$ in the conventional structure 1. That is to say, it is considered that in the conventional structure 1, the PNP transistor area 32 easily operates when $V_{CC}$ is high in the conventional structure 1, and the device is thereby broken. In contrast, $Q_{RR}$ is little dependent on $V_{CC}$ in the first structure and the second structure. That is to say, the first structure and the second structure have an effect of suppressing the operation of the PNP transistor area 32 in a condition where the value of $V_{CC}$ is high. As described above, the first structure and the second structure have a feature that the safe operating temperature in the snappy recovery operation is expanded by the effect of suppressing the operation of the PNP transistor area 32.

Accordingly, FIGS. 53 and 54 indicate that it is one barometer to cause the dependence of $Q_{RR}$ on the operation temperature and $V_{CC}$ to be as small as possible so that the range of the snappy recovery operation temperature in the RFC diode is expanded to an extent of lower temperature and the SOA (Safe Operating Area) in the snappy recovery mode is improved.

Figure 55:
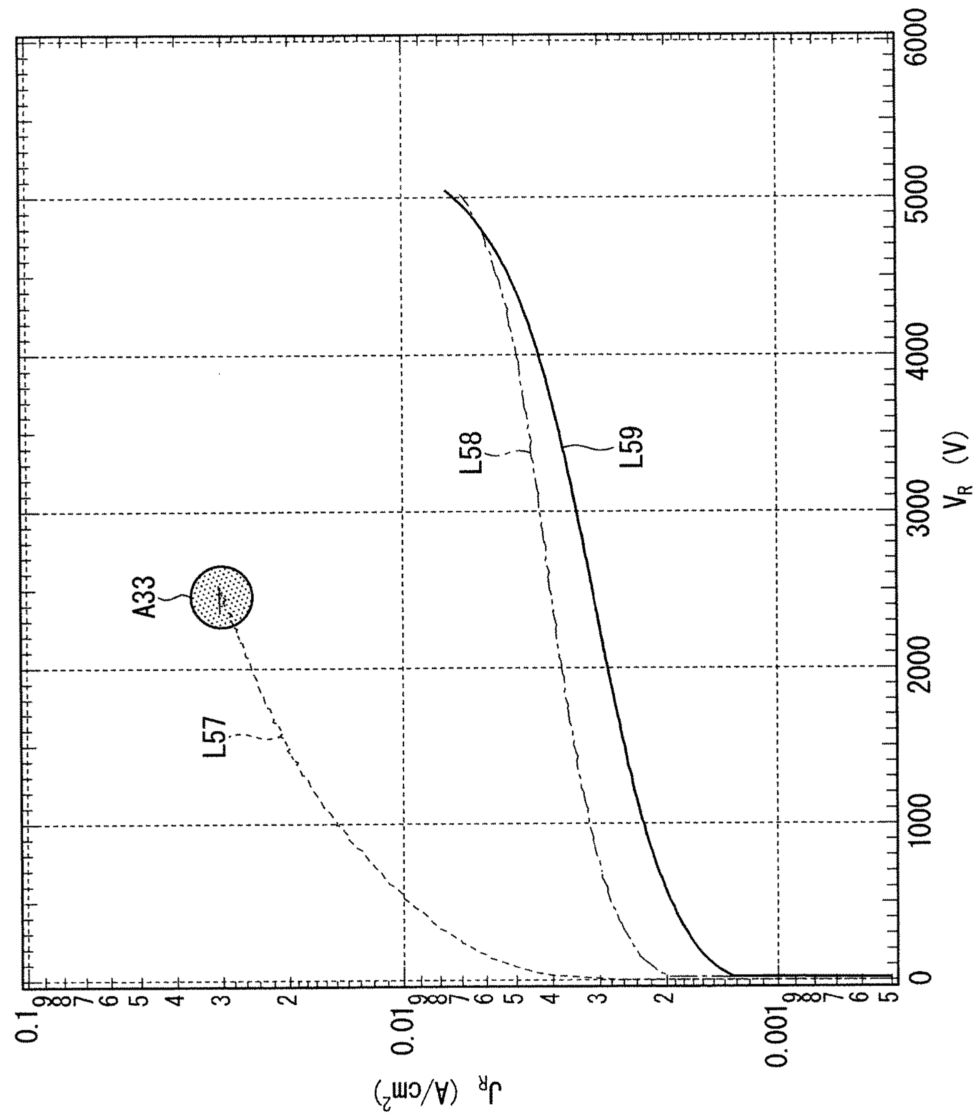
FIG. 55 is a view illustrating a relationship between a leakage current density and a reverse bias voltage in the RFC diode.

FIG. 55 illustrates characteristics of a leakage current density $J_R$-to-reverse bias voltage $V_R$ at a temperature of 175° C. in a RFC diode of withstand voltage 4500V class. In FIG. 55, a horizontal axis indicates the reverse bias voltage $V_R$ (V), and a vertical axis indicates the leakage current density $J_R$ (A/cm$^2$). In FIG. 55, a dotted line L57, an alternate long and short dash line L58, and a solid line L59 indicate characteristics of the conventional structure 1, the conventional structure 2, and the second structure, respectively.

Figure 56:
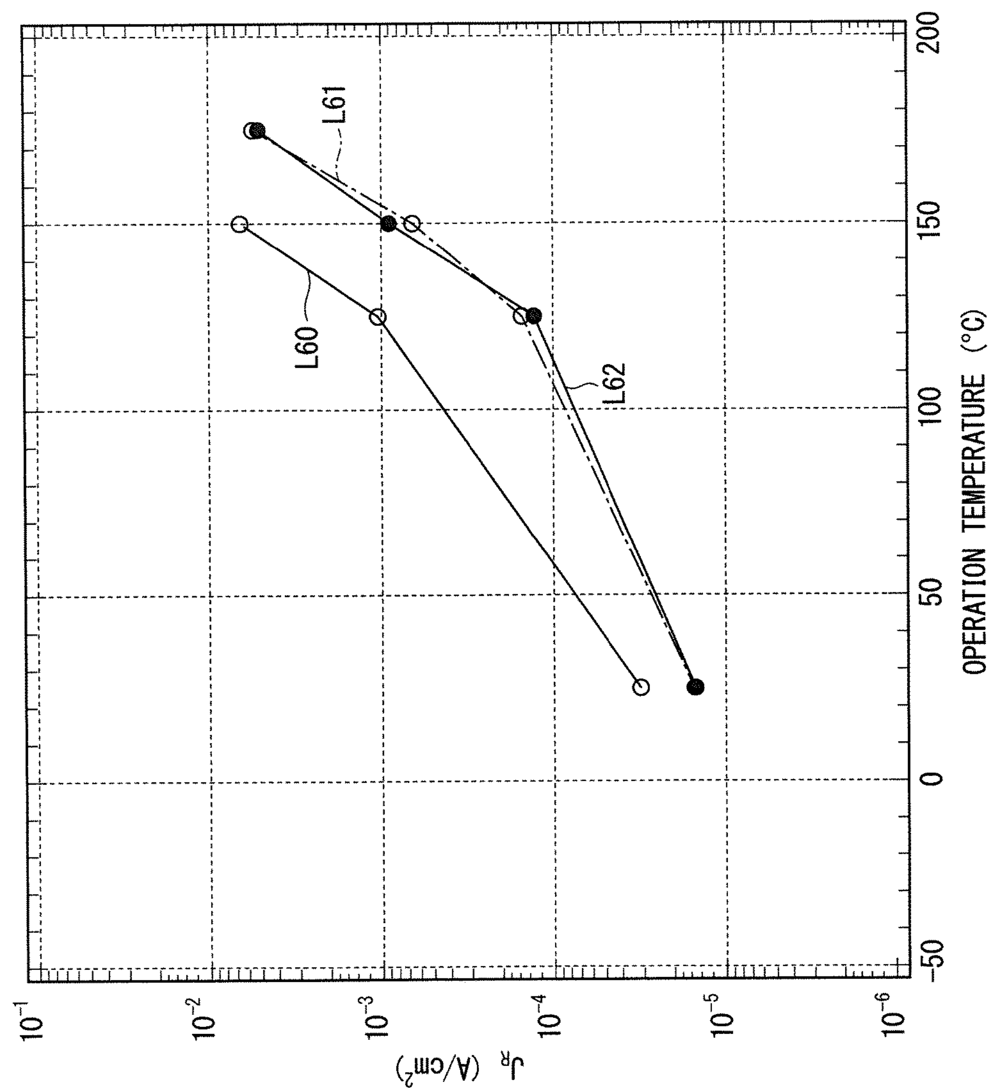
FIG. 56 is a view illustrating a relationship between a leakage current density and an operation temperature in the RFC diode.

FIG. 56 illustrates a relationship between a leakage current density $J_R$ (A/cm$^2$) and an operation temperature (° C.) in a case where a reverse bias voltage $V_R$ is 4500V, and a dotted line L60, an alternate long and short dash line L61, and a solid line L62 indicate characteristics of the conventional structure 1, the conventional structure 2, and the second structure, respectively. $J_R$ in a case where the operation temperature in FIG. 56 is 175° C. coincides with $J_R$ in a case of $V_R$=4500 in FIG. 55.

According to FIG. 55, in the conventional structure 1, the voltage cannot be held due to a heat generation in the device itself when $V_R$ is approximately 2500V, and a thermal runaway indicated in an area A33 occurs. In contrast, in the second structure, an amplification factor $\alpha_{pnp}$ of the PNP transistor area 32 included in the RFC diode decreases and the leakage current at the time of turn-off is reduced, so that the turn-off loss expressed by $V_R \times J_R$ can be reduced, and the amount of heat generation in the chip itself at the time of turn-off can be reduced. Accordingly, the thermal runaway does not occur in the second structure, differing from the conventional structure 1, and the second structure has the voltage holding capacity in the turn-off state even at the temperature of 175° C.

Furthermore, FIG. 56 shows that the leakage current at the time of turn-off is smaller in the second structure than in the conventional structure 1, so that the turn-off loss is reduced. That is to say, the second structure suppresses the amount of heat generation of power semiconductor itself, thereby having an effect of suppressing the heat generation from an aspect of thermal design of the power module including the power semiconductor.

Figure 57:
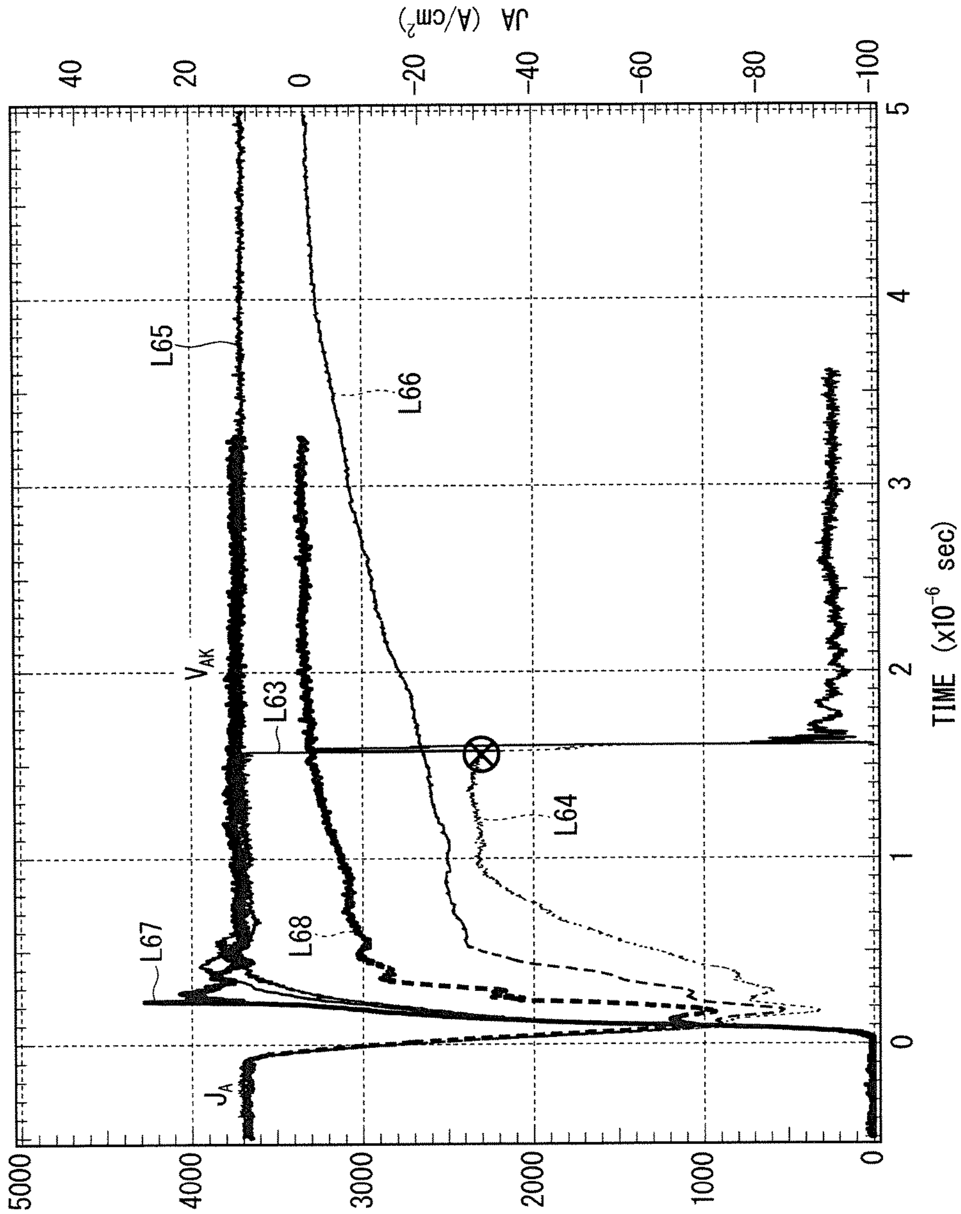
FIG. 57 is a view illustrating an N buffer layer dependence of a snappy recovery waveform in the RFC diode.

FIGS. 57 to 60 illustrate a dependence of the N buffer layer 15 in the snappy recovery operation of the RFC diode of withstand voltage 4500V class. FIG. 57 illustrates a recovery waveform at the temperature of −20° C., and the other switching conditions are $V_{CC}$=3600V, $J_F$=0.1$J_A$, dj/dt=580 A/cm$^2$ µs, dV/dt=32000V/µs, and Ls=2.0 µH. A horizontal axis in FIG. 57 indicates a time (×10$^{-6}$ seconds), and a vertical axis indicates an anode-to-cathode voltage $V_{AK}$ (V) and an anode current density $J_A$ (A/cm$^2$). $V_{AK}$ in the conventional structure 1 is illustrated by a thin solid line L63, and $J_A$ is illustrated by a thin dotted-line L64. $V_{AK}$ in the conventional structure 2 is illustrated by a solid line L65 having a moderate thickness, and $J_A$ is illustrated by a dotted-line L66 having a moderate thickness. $V_{AK}$ in the second structure is illustrated by a thick solid line L67, and $J_A$ is illustrated by a thick dotted-line L68.

FIG. 57 shows that in the conventional structure 1 and the conventional structure 2, the enormous tail current occurs in the last half of recovery operation, and particularly in the conventional structure 1, the device is broken during the recovery operation. In contrast, FIG. 57 shows that in the second structure, the enormous tail current is also suppressed and blocked in the diode of withstand voltage 4500V class in a manner similar to the diode of withstand voltage 1200V class illustrated in FIG. 44.

Figure 58:
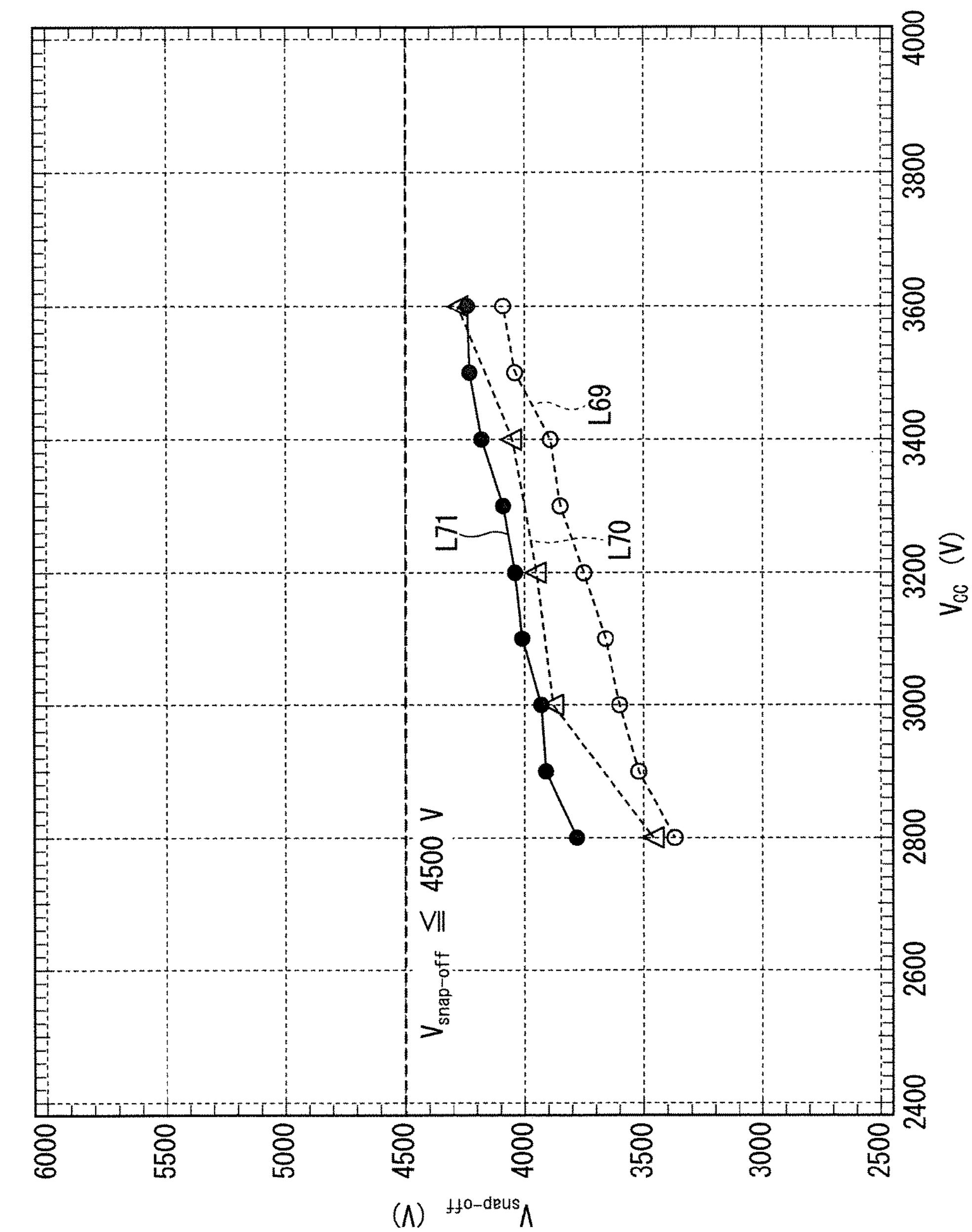
FIG. 58 is a view illustrating an N buffer layer dependence regarding a relationship between $V_{snap\text{-}off}$ and $V_{CC}$ in the snappy recovery operation of the RFC diode.
Figure 59:
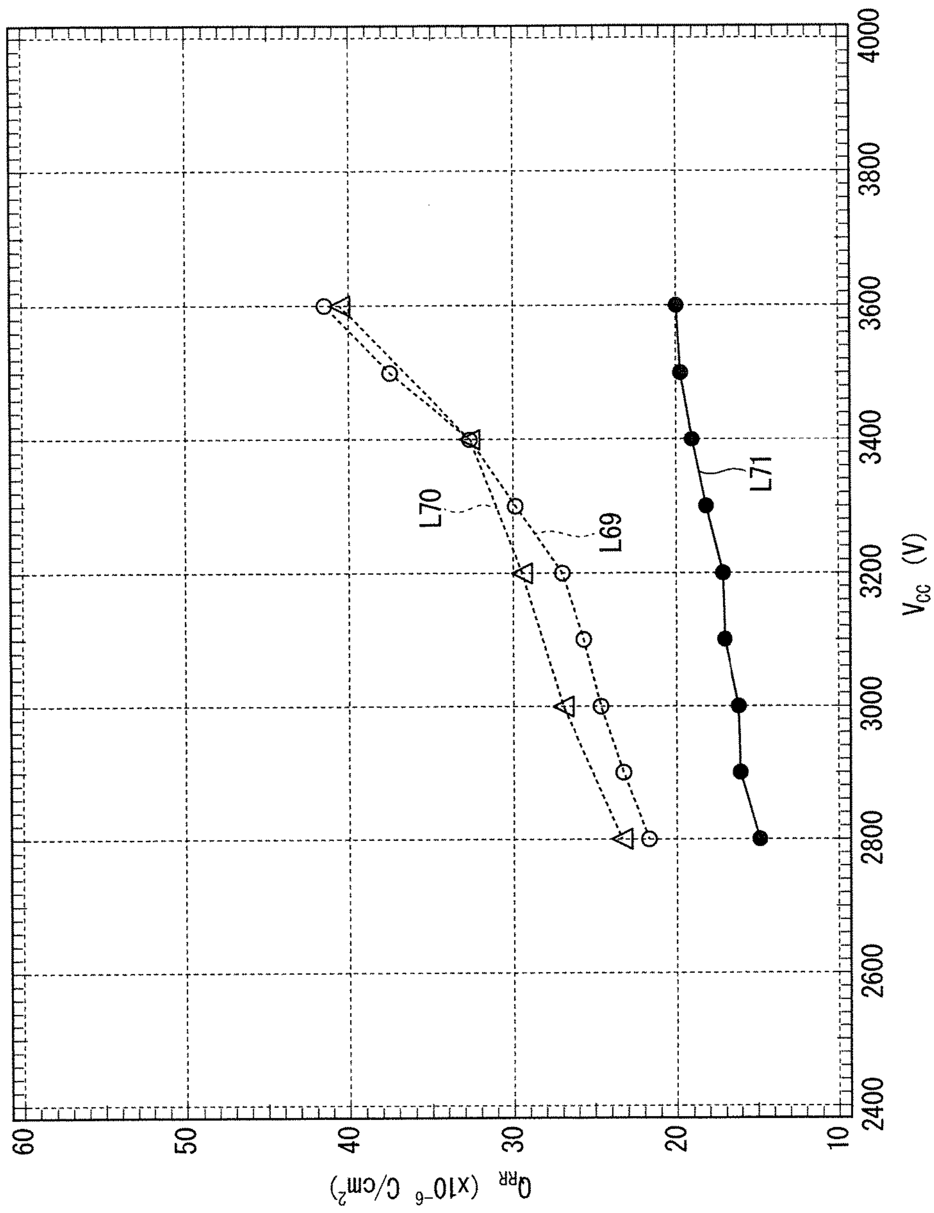
FIG. 59 is a view illustrating an N buffer layer dependence regarding a relationship between $Q_{RR}$ and $V_{CC}$ in the snappy recovery operation of the RFC diode.

FIG. 58 illustrates a relationship between $V_{snap\text{-}off}$ and $V_{CC}$ at the temperature of 25° C. In FIG. 58, a horizontal axis indicates $V_{CC}$(V), and a vertical axis indicates $V_{snap\text{-}off}$(V). FIG. 59 illustrates a relationship between $Q_{RR}$ and $V_{CC}$ at the temperature of 25° C. In FIG. 59, a horizontal axis indicates $V_{CC}$(V), and a vertical axis indicates $Q_{RR}$(×

Figure 60:
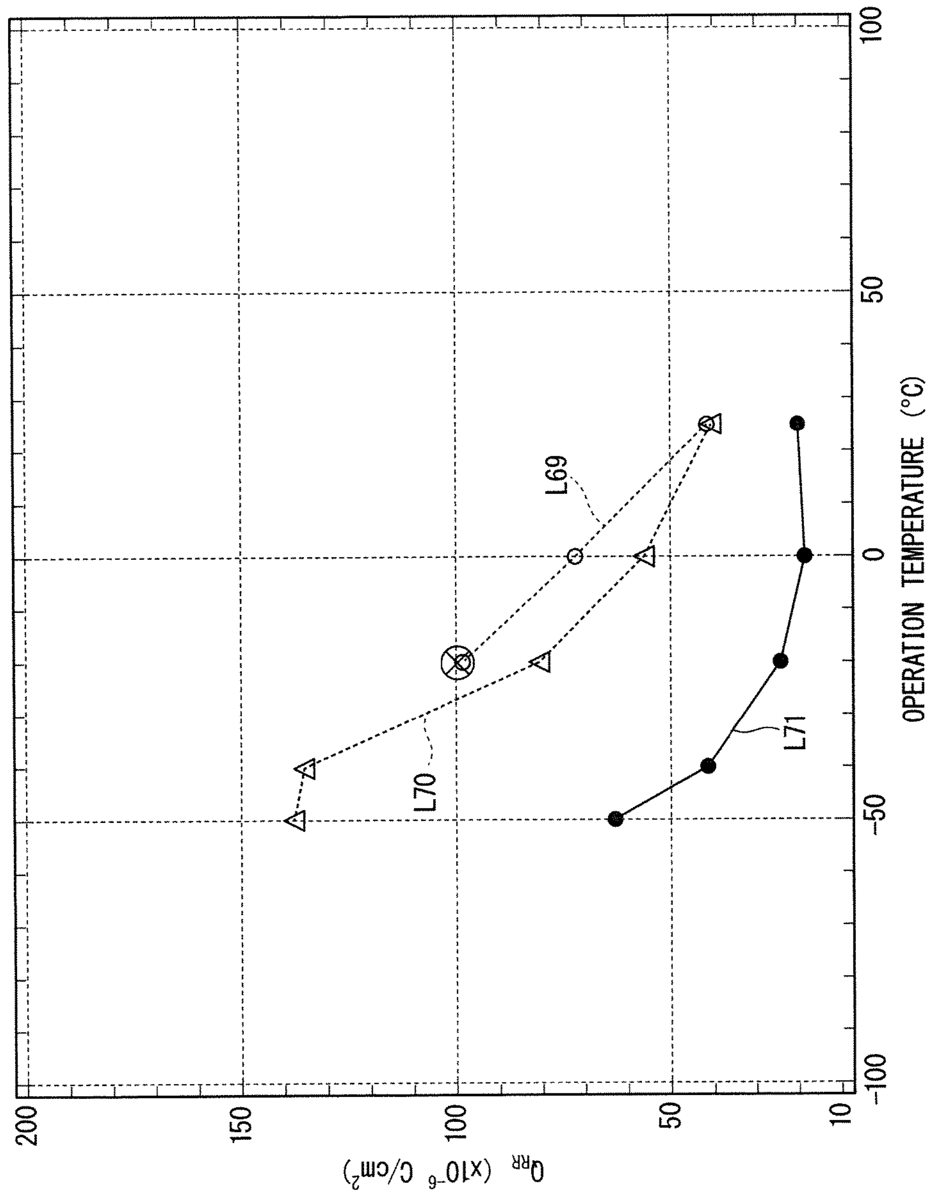
FIG. 60 is a view illustrating an N buffer layer dependence regarding a relationship between $Q_{RR}$ and an operation temperature in the snappy recovery operation of the RFC diode.

$10^{-6}$ C/$cm^2$). FIG. 60 illustrates a relationship between $Q_{RR}$ and an operation temperature in a case of $V_{CC}$=3600V. In FIG. 60, a horizontal axis indicates an operation temperature (° C.), and a vertical axis indicates $Q_{RR}$($\times 10^{-6}$ C/$cm^2$). A cross mark in FIG. 60 indicates a point at which the device has been broken. In FIG. 58 to FIG. 60, white circles and a dotted line L69 indicate the characteristics of the conventional structure 1, white triangles and a dotted line L70 indicate the characteristics of the conventional structure 2, and black circles and a solid line L71 indicate the characteristics of the second structure.

FIGS. 58 and 59 show that although $V_{snap\text{-}off}$ is low, $Q_{RR}$ is largely dependent on $V_{CC}$ in the conventional structures 1 and 2 compared with the second structure. As illustrated in FIG. 60, in the conventional structure 1, $Q_{RR}$ increases with a reduction in operation temperature, and the device is broken at the temperature of −20° C. The dependence of $Q_{RR}$ on the operation temperature and $V_{CC}$ is preferably as small as possible in view of expanding the range of the operation temperature in the snappy recovery operation, including the result of the RFC diode of withstand voltage 1200V class. The first structure and the second structure, which constitute the N buffer layer 15 of the present invention, perform behavior to be targeted.

As described above, the first structure and the second structure of the present invention suppress the operation of the PNP transistor area 32 constituting the RFC diode in the recovery operation while holding the effect of suppressing the snap-off phenomenon at the end of the recovery operation, which is the characteristic of the RFC diode descried above, and the subsequent oscillation phenomenon, whereby achieving the reduction in $Q_{RR}$ to guarantee the balanced operation of the RFC diode. As a result, the safe operating temperature in the snappy recovery operation is expanded, that is to say, the SOA in the snappy recovery mode is expanded to improve the ruggedness.

Embodiment 3

Figure 61:
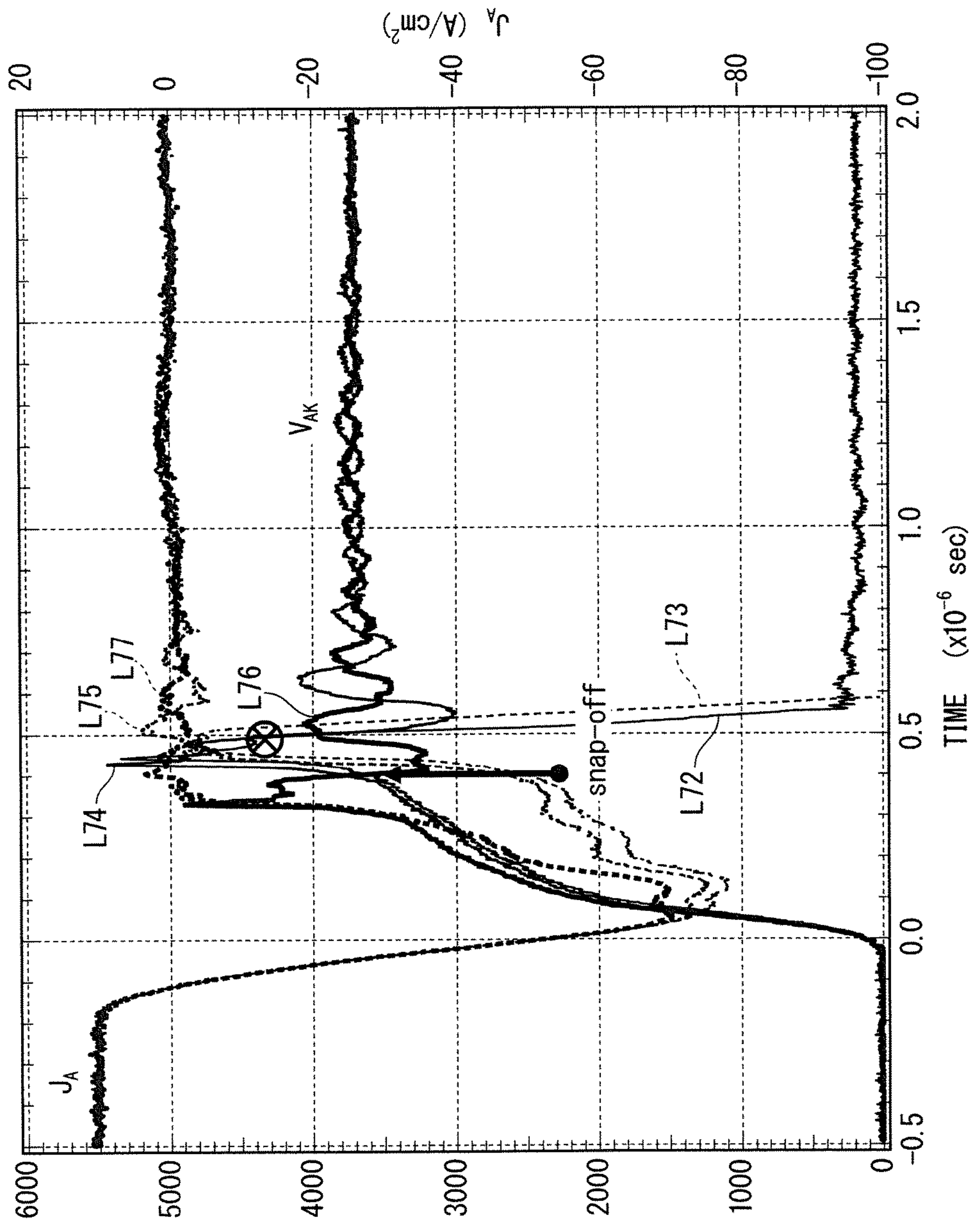
FIG. 61 is a view illustrating a snappy recovery waveform of the PIN diode.
Figure 63:
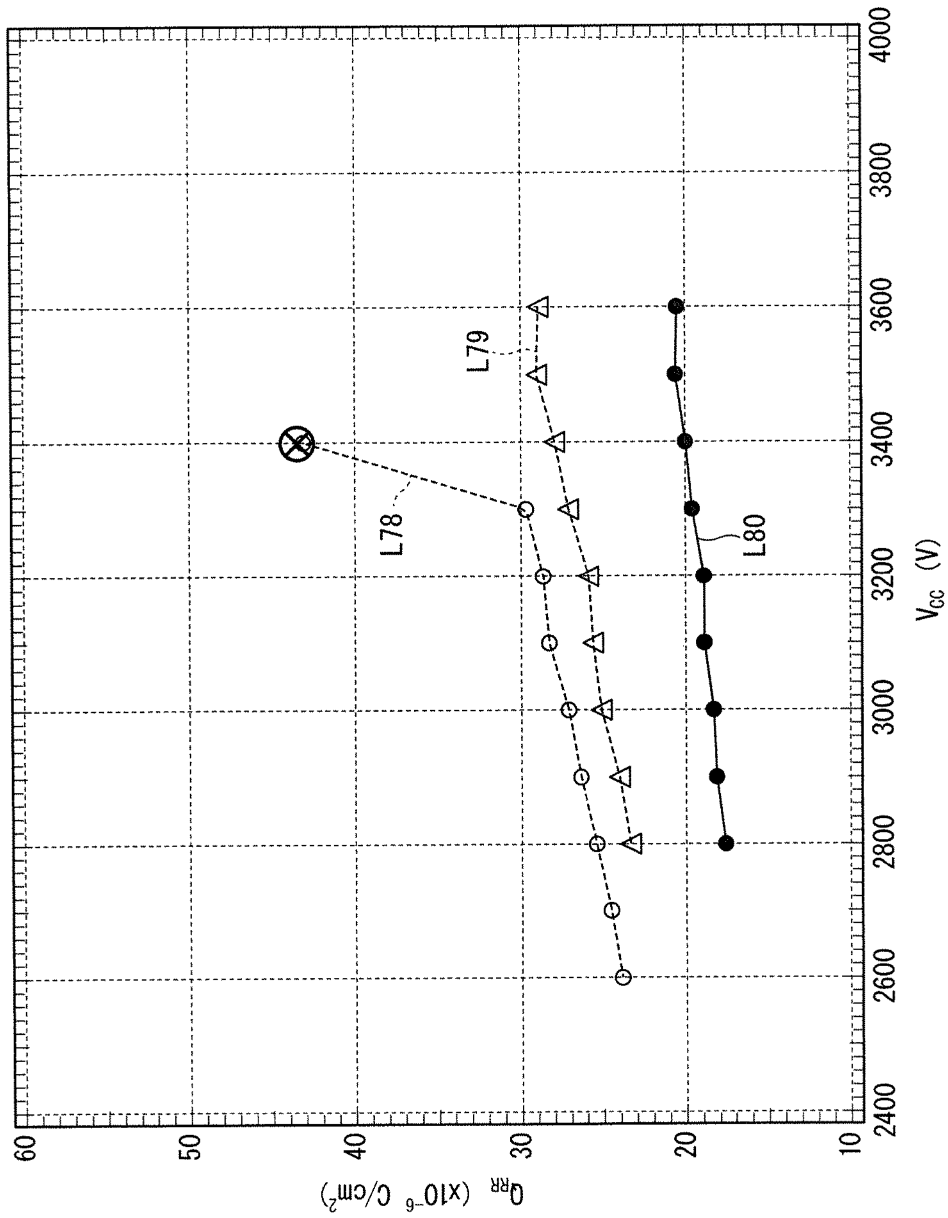
FIG. 63 is a view illustrating a relationship between $Q_{RR}$ and $V_{CC}$ in the PIN diode.

Described in the embodiment 3 is a result of the diode performance at the time of applying the various structure parameters and the conditions a) to e) described in the embodiment 1 to the N buffer layer 15 of the PIN diode illustrated in FIG. 31(FIG. 61 to FIG. 63).

The evaluation device whose diode performance is illustrated in FIG. 61 to FIG. 63 is a PIN diode of withstand voltage 4500V class. FIG. 61 to FIG. 63 also illustrates the diode performance of the conventional structures 1 and 2 for comparison, and the impurity profiles of the conventional structures 1 and 2 are already illustrated in FIG. 33. A cross mark in FIG. 61 to FIG. 63 indicates a point at which the device has been broken.

FIG. 61 illustrates a snappy recovery waveform of the PIN diode at a temperature of 25° C. in the PIN diode of withstand voltage 4500V class. The other switching conditions are $V_{CC}$=3600V, $J_F$=0.1 $J_A$, dj/dt=280 A/$cm^2$ μs, dV/dt=23000V/μs, and Ls=2.0 μH. A horizontal axis in FIG. 61 indicates a time ($\times 10^{-6}$ seconds), and a vertical axis indicates an anode-to-cathode voltage $V_{AK}$ (V) and an anode current density $J_A$ (A/$cm^2$). $V_{AK}$ in the conventional structure 1 is illustrated by a thin solid line L72, and $J_A$ is illustrated by a thin dotted-line L73. $V_{AK}$ in the conventional structure 2 is illustrated by a solid line L74 having a moderate thickness, and $J_A$ is illustrated by a dotted-line L75 having a moderate thickness. $V_{AK}$ in the second structure is illustrated by a thick solid line L76, and $J_A$ is illustrated by a thick dotted-line L77.

Since the remaining carrier plasma layer is easily depleted in the side of the cathode of the N buffer layer 15 in the last half of recovery operation in the PIN diode compared with the RFC diode, the PIN diode has a small effect of suppressing the snap-off phenomenon in the recovery operation. As a result, as illustrated in FIG. 61, the snap-off phenomenon occurs in the conventional structures 1 and 2, and particularly in the structure of the conventional structure 1, the device is broken after the snap-off phenomenon. However, in the PIN diode using the second structure, the extension speed of the depletion layer extending from the main junction in the recovery operation decreases in the second buffer layer 15*b* under the influence of the remaining carrier plasma layer in the vicinity of the junction between the $N^-$ drift layer 14 and the $n^{th}$ sub-buffer layer 15*bn*, so that even when the snap-off phenomenon occurs, $V_{snap\text{-}off}$ is made small compared with the conventional structure. That is to say, as indicated in the area A11' in FIG. 35 and the area A12' in FIG. 37, in the second structure, the carrier plasma layer included in the second buffer layer 15*b* in the ON state still remains in the recovery operation, thereby controlling the electrical field intensity distribution and delaying a snap-off point, and as a result, the breakage of the device can be avoided.

FIG. 62 illustrates a relationship between $V_{snap\text{-}off}$ and $V_{CC}$ at the temperature of 25° C. In FIG. 62, a horizontal axis indicates $V_{CC}$(V), and a vertical axis indicates $V_{snap\text{-}off}$(V). FIG. 63 illustrates a relationship between $Q_{RR}$ and $V_{CC}$ at the temperature of 25° C. In FIG. 63, a horizontal axis indicates $V_{CC}$(V), and a vertical axis indicates $Q_{RR}$($\times 10^{-6}$/$cm^2$). In FIG. 62 and FIG. 63, white circles and a dotted line L78 indicate the characteristics of the conventional structure 1, white triangles and a dotted line L79 indicate the characteristics of the conventional structure 2, and black circles and a solid line L80 indicate the characteristics of the second structure.

FIG. 62 shows that the adoption of the second structure also in the PIN diode avoids the breakage of the device even at the voltage at which the device is broken in the conventional structure, whereby the ruggedness in the snappy recovery operation is improved. FIG. 62 further shows that the N buffer layer 15 having the second structure has the low dependence of $V_{snap\text{-}off}$ on $V_{CC}$ compared with the conventional structures 1 and 2, and is most effective in increasing the ruggedness at the side of $V_{CC}$.

FIG. 63 shows that the second structure has the lower dependence of $Q_{RR}$ on $V_{CC}$ than the conventional structures 1 and 2. Accordingly, the ruggedness of the PIN diode in the snappy recovery operation is improved in the second structure. As described above, the first structure and the second structure of the present invention also have the effect of improving the ruggedness in the PIN diode.

Embodiment 4

Described in the embodiment 4 is a result of the IGBT performance at a time of applying the various structure parameters and the conditions a) to e) described in the embodiment 1 to the N buffer layer 15 of the IGBT having the trench-gate structure illustrated in FIG. 30 (FIG. 64 to FIG. 71).

FIG. 64 to FIG. 71 illustrate the performance of the IGBT of withstand voltage 6500V class. Parameters of each layer except for the N buffer layer 15 of the IGBT are as follows.

In the P base layer 9, the peak impurity concentration is set to $1.0\times10^{16}$ to $1.0\times10^{18}$ $cm^{-3}$, and its depth is set deeper than the $N^+$ emitter layer 7 and shallower than the N layer 11.

In the N layer 11, the peak impurity concentration is set to $1.0\times10^{15}$ to $1.0\times10^{17}$ $cm^{-3}$, and its depth is set deeper than the P base layer 9 by 0.5 to 1.0 μm.

In the $N^+$ emitter layer 7, the peak impurity concentration is set to $1.0\times10^{18}$ to $1.0\times10^{21}$ $cm^{-3}$, and its depth is set to 0.2 to 1.0 μm.

In the $P^+$ layers 8, the surface impurity concentration is set to $1.0\times10^{18}$ to $1.0\times10^{21}$ $cm^{-3}$, and its depth is set equal to or deeper than that of the $N^+$ emitter layer 7.

In the P collector layer 16, the surface impurity concentration is set to $1.0\times10^{16}$ to $1.0\times10^{20}$ $cm^{-3}$, and its depth is set to 0.3 to 0.8 μm.

Figure 64:
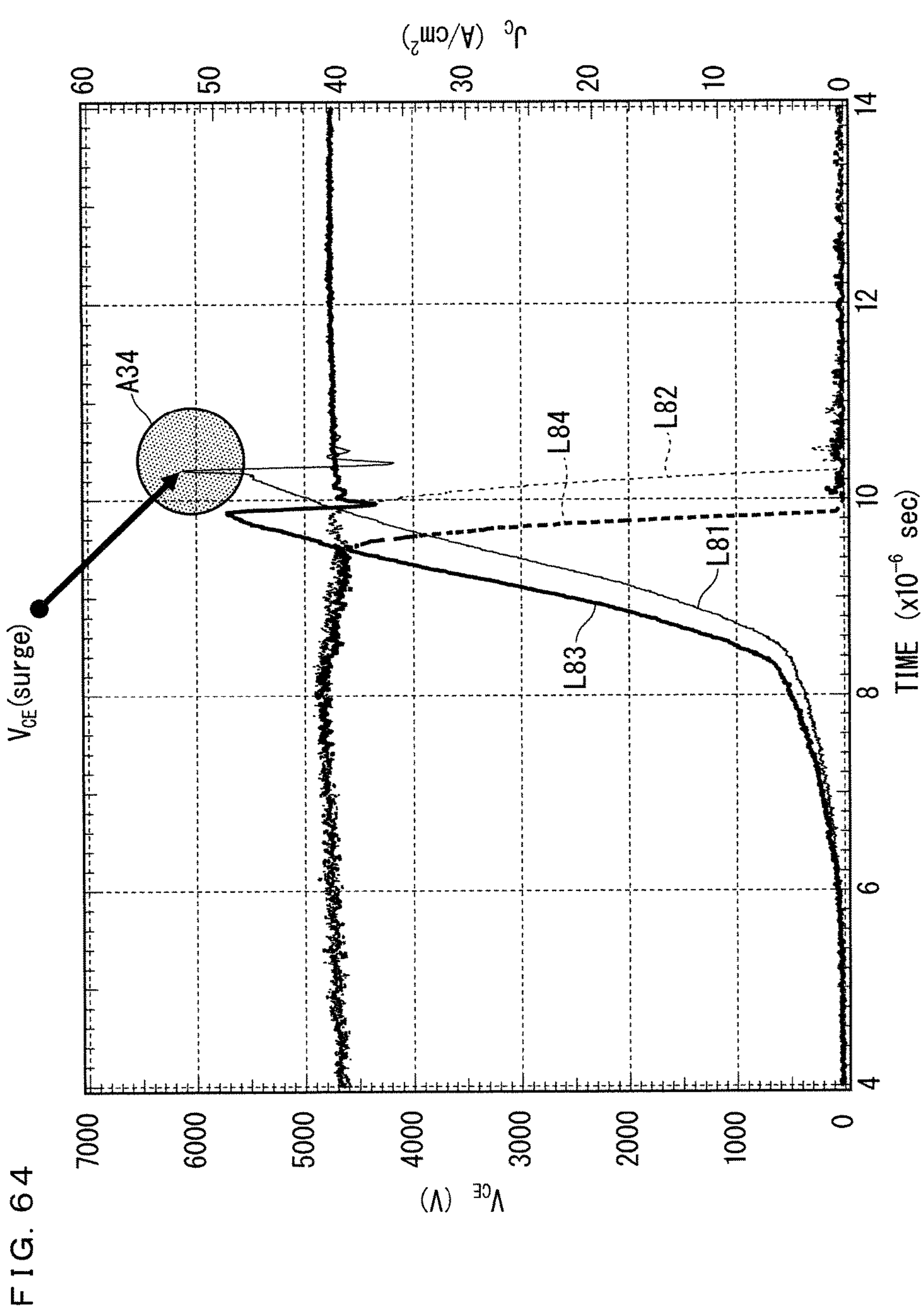
FIG. 64 is a view illustrating a turn-off operation waveform in a state of inductive load in the IGBT.
Figure 65:
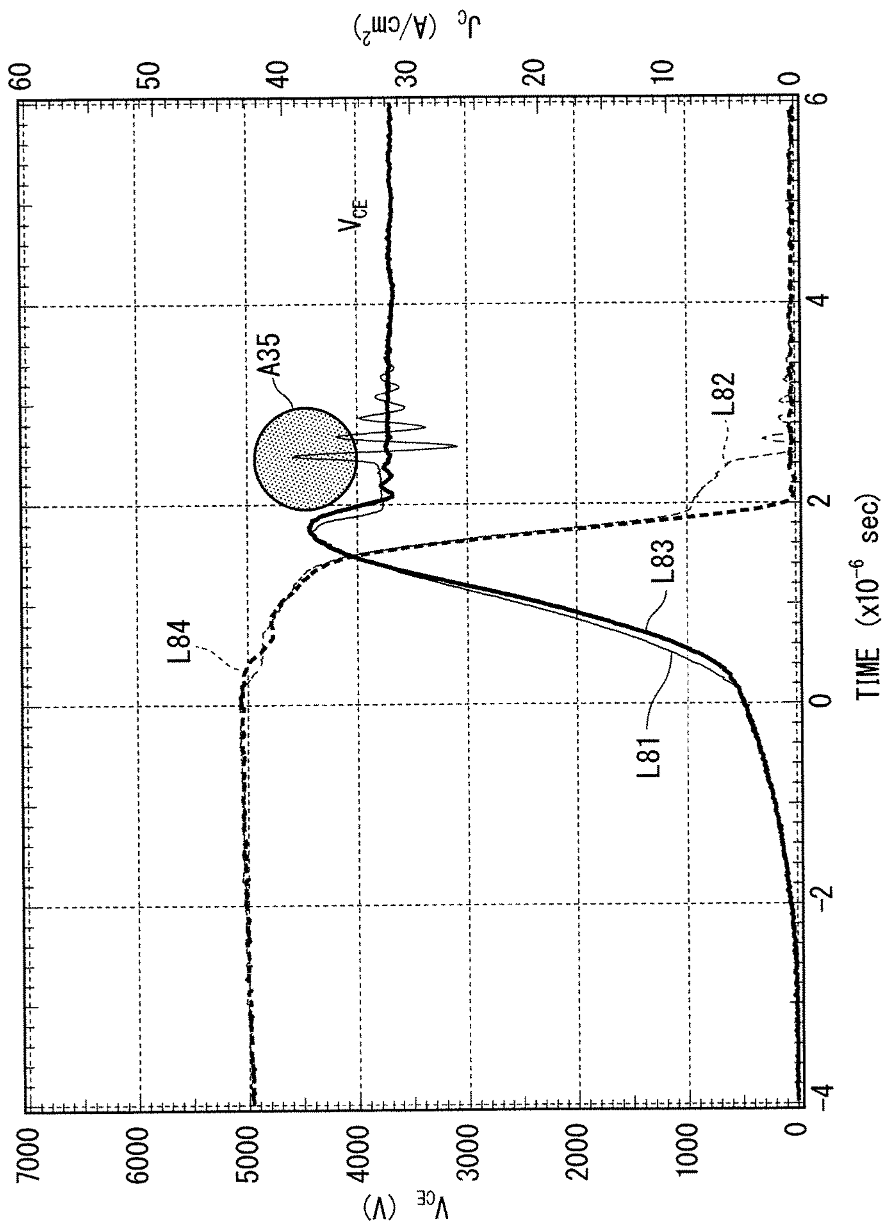
FIG. 65 is a view illustrating a turn-off operation waveform in a state of inductive load in the IGBT.

FIGS. 64 to 66 illustrate a turn-off operation waveform in an inductive load state of the IGBT of withstand voltage 6500V class. FIG. 64 illustrates the turn-off operation under the high $V_{CC}$ condition of $V_{CC}$=4600V, FIG. 65 illustrates the turn-off operation waveform under the high LS condition of LS=5.8 μH, and FIG. 66 illustrates the turn-off operation waveform under the low temperature condition of −60° C. In each of FIG. 64 to FIG. 66, a horizontal axis indicates a time ($\times10^{-6}$ seconds), and a vertical axis indicates a collector-to-emitter voltage $V_{CE}$ (V) and a collector current density $J_C$ (A/$cm^2$). In each of FIG. 64 to FIG. 66, $V_{CE}$ in the conventional structure 1 is illustrated by a thin solid line L81, and $J_C$ is illustrated by a thin dotted-line L82. $V_{CE}$ in the second structure is illustrated by a thick solid line L83, and $J_C$ is illustrated by a thick dotted-line L84.

As indicated in areas A34, 35, and 36 in FIG. 64 to FIG. 66, the snap-off phenomenon occurs in the conventional structure 1. $V_{CE}$ (surge) in FIG. 64 indicates a maximum $V_{CE}$ value at a time of surge phenomenon or the snap-off phenomenon in the turn-off operation. The ON voltages $V_{CE}$ (sat) of the conventional structure 1 and the second structure in the same graph are substantially equal to each other. FIG. 64 to FIG. 66 show that in the second structure, $dj_C/dt$ at the end of the turn-off operation is reduced even under a strict circuit condition for the turn-off operation of the IGBT, and as a result, the snap-off phenomenon is suppressed. In case of a condition in FIG. 65, for example, $dj_C/dt$ at the end of the actual turn-off operation is $3.49\times10^7$ A/$cm^2$ sec in the conventional structure 1, but is smaller in the second structure, that is, $1.40\times10^7$ A/$cm^2$ sec.

Figure 67:
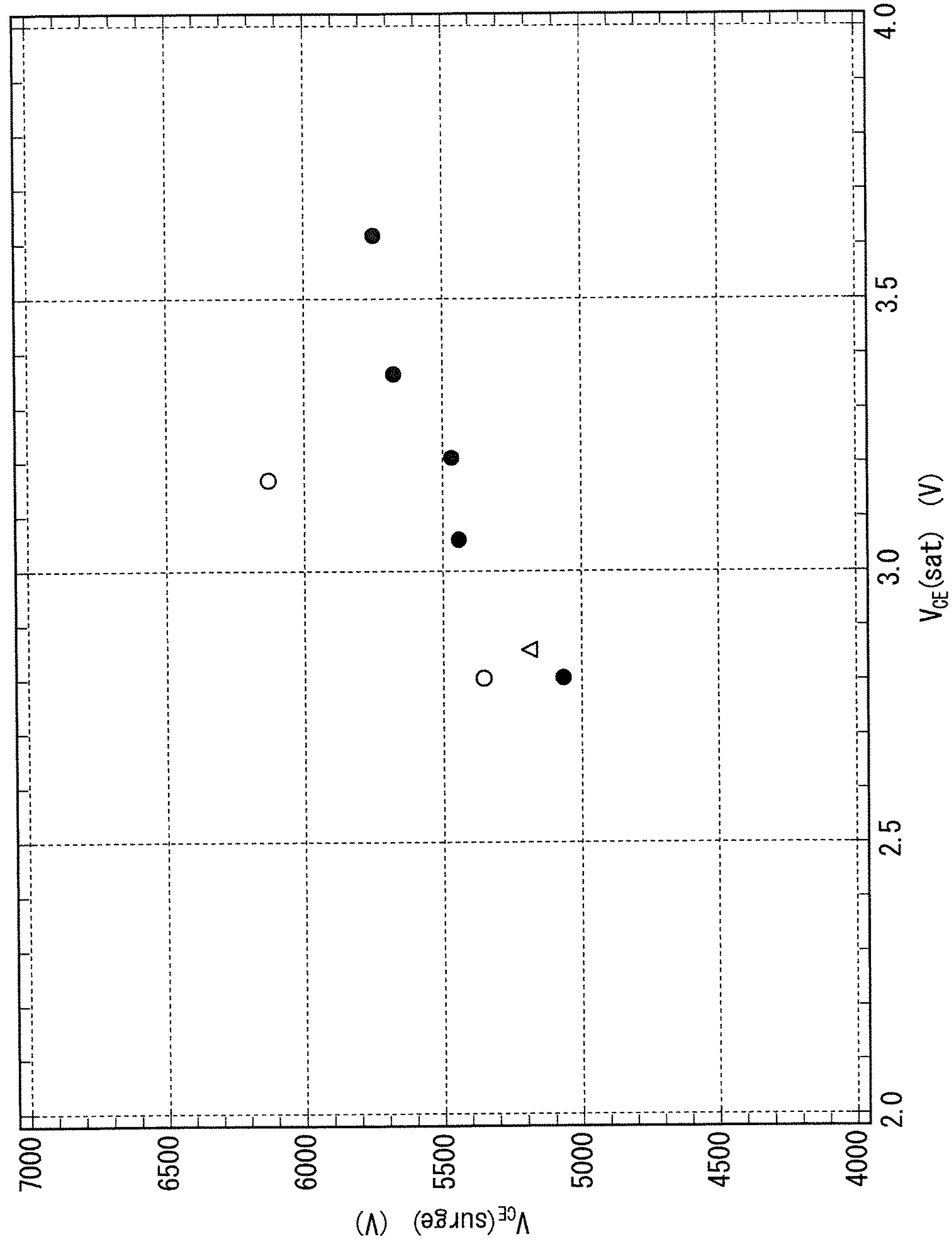
FIG. 67 is a view illustrating a relationship between $V_{CE}$ (surge) and $V_{CE}$ (sat) in the IGBT.

FIG. 67 illustrates a relationship between $V_{CE}$ (surge) and $V_{CE}$ (sat) in the conventional structures 1 and 2 and the second structure. A horizontal axis indicates $V_{CE}$ (sat), and a vertical axis indicates $V_{CE}$ (surge). The other inductive load turn-off switching conditions are $J_C$=41.2 A/$cm^2$, $V_G$=15V, a temperature of 25° C., $V_{CC}$=4600V, and $L_S$=2.8 μH. In FIG. 67, characteristics of the conventional structure 1 are plotted with white circles, characteristics of the conventional structure 2 are plotted with white triangles, and characteristics of the second structure are plotted with black circles.

In FIG. 67, an increase in $V_{CE}$ (sat) in the horizontal axis means a reduction in concentration of the P collector layer 16 in the IGBT of FIG. 30. That is to say, the concentration of the carrier plasma layer at the side of the collector decreases at the time of the turn-off operation of the IGBT in a direction which $V_{CE}$ (sat) in the horizontal axis increases, so that $V_{CE}$ (surge) at the time of turn-off increases, and the snap-off phenomenon thereby easily occurs. According to FIG. 67, there is a tendency in the second structure that the value of $V_{CE}$ (surge) is small in relation to the same value of $V_{CE}$ (sat) compared to the conventional structures 1 and 2. Furthermore, the second structure has the smaller dependence of $V_{CE}$ (surge) on $V_{CE}$ (sat) than the conventional structure 1. That is to say, in the second structure, there is the remaining carrier plasma layer as indicated in an area A12' of FIG. 37 even when the concentration of the carrier plasma layer at the side of the collector decreases in the turn-off operation of the IGBT, so that the effect of suppressing the increase in $V_{CE}$ (surge) and the snap-off phenomenon can be obtained.

Figure 68:
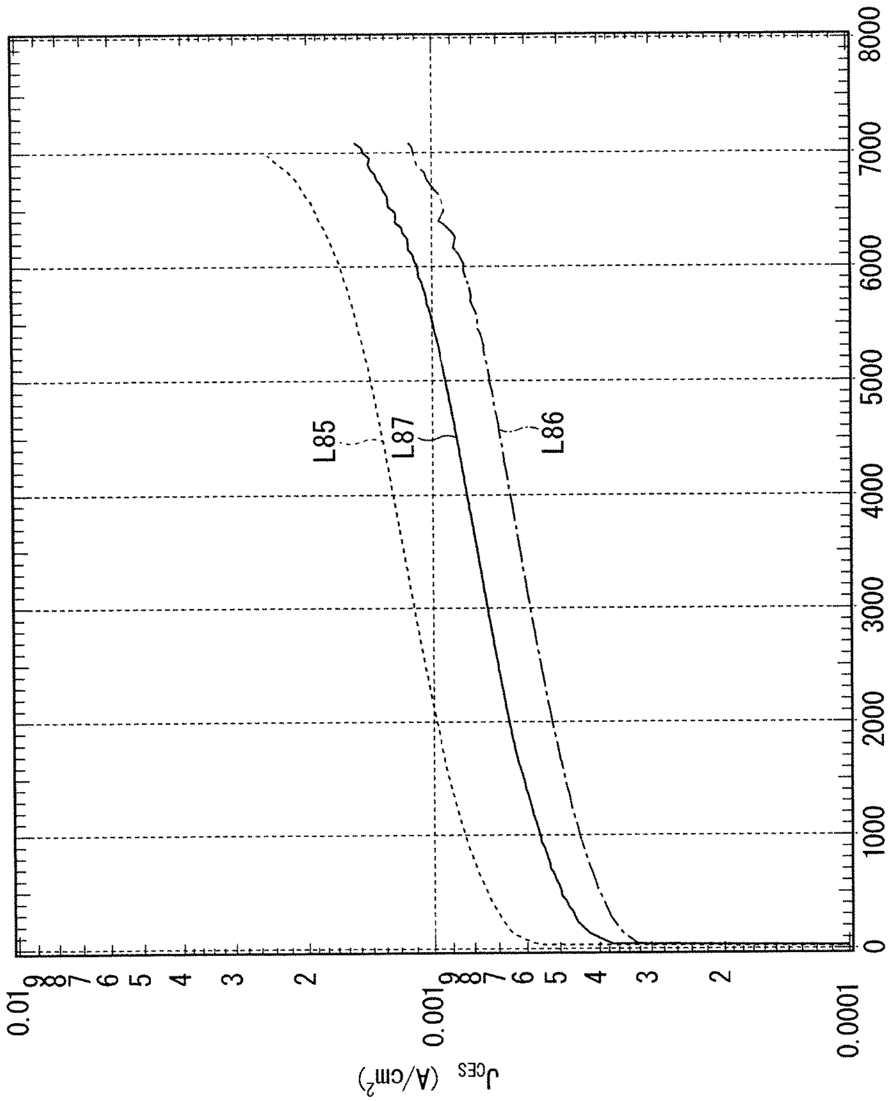
FIG. 68 is a view illustrating a relationship between $J_{CES}$ and $V_{CES}$ in the IGBT.

FIG. 68 illustrates a relationship between a collector-to-emitter leakage current density $J_{CES}$ and a collector-to-emitter voltage $V_{CES}$ at a temperature of 150° C. in the conventional structures 1 and 2 and the second structure. ON voltages of three samples compared in FIG. 68 are substantially equal to each other. In FIG. 68, a horizontal axis indicates $V_{CES}$ (V), and a vertical axis indicates $V_{CES}$ (A/$cm^2$). A dotted line L85, an alternate long and short dash line L86, and a solid line L87 indicate characteristics of the conventional structure 1, the conventional structure 2, and the second structure, respectively.

FIG. 68 shows that in the second structure, the leakage current $J_{CES}$ at the time of turn-off decreases compared with the conventional structure 1. The reason is that the amplification factor αpnp of the PNP transistor included in the IGBT decreases in the second structure. Accordingly, the turn-off loss is reduced in the second structure, and the amount of heat generation in the chip itself at the time of turn-off can be reduced.

Figure 69:
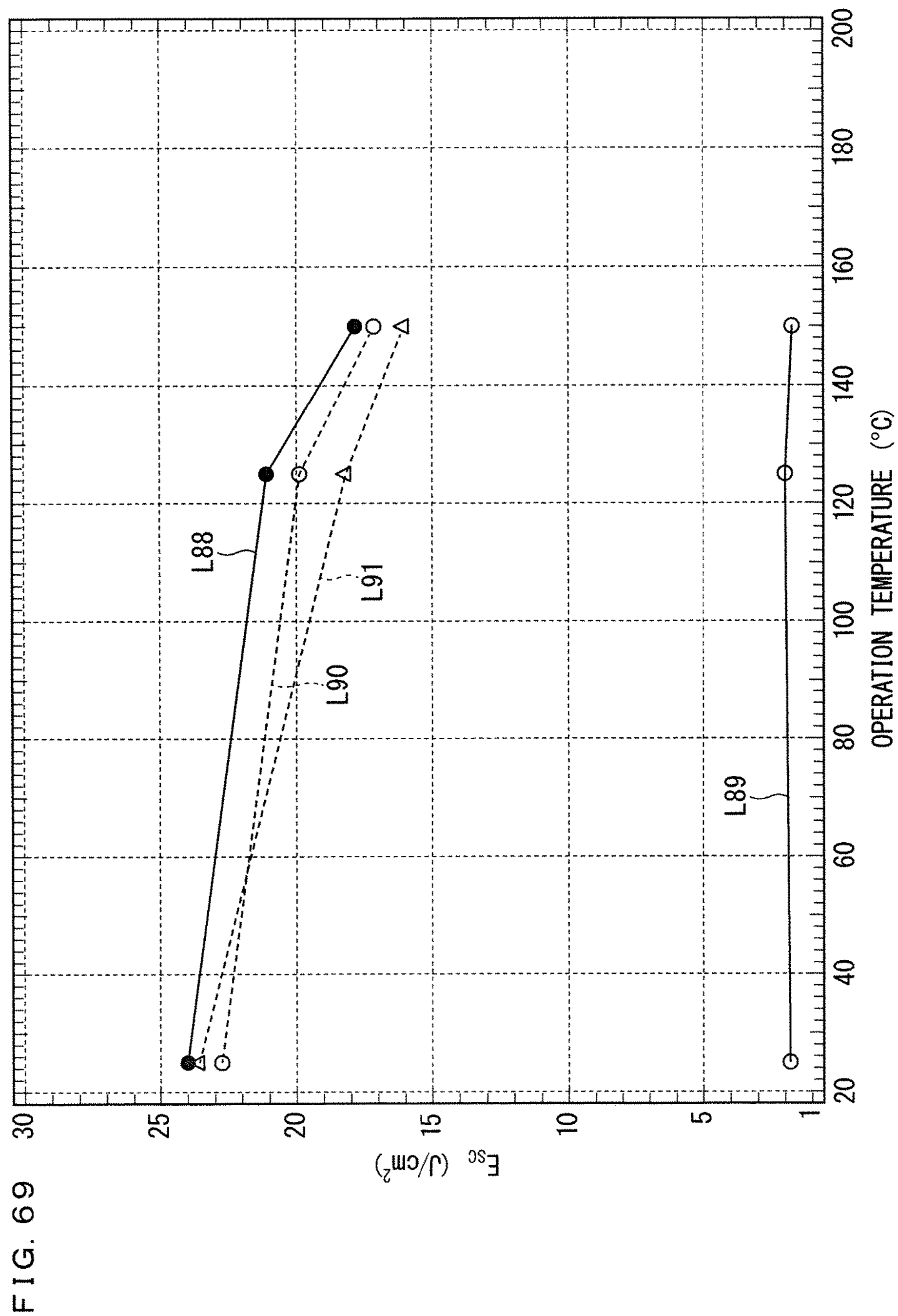
FIG. 69 is a view illustrating a relationship between a short-circuit energy and an operation temperature in a state of no-load short-circuit in the IGBT.

FIG. 69 illustrates a relationship between a short-circuit energy $E_{SC}$ and an operation temperature in a state of no-load short-circuit in the conventional structures 1 and 2 and the second structure. However, with regard to the second structure, indicated are characteristics of two cases of $(C_{b,p})$ max≤$1.0\times10^{15}$ $cm^{-3}$ and $(C_{b,p})$ max>$1.0\times10^{15}$ $cm^{-3}$. The former is plotted with black circles and connected by a solid line L88, and the latter is plotted with white circles and connected by a solid line L89. The characteristics of the conventional structure 1 are plotted by white circles and the white circles are connected by a dotted line L90, and the characteristics of the conventional structure 2 are plotted by white triangles and the white triangles are connected by a dotted line L91.

FIG. 69 shows that the value of $E_{SC}$ is the largest in the case of $(C_{b,p})$ max≤$1.0\times10^{15}$ $cm^{-3}$ in the second structure compared with the conventional structures 1 and 2. However, FIG. 69 also shows that even in the second structure, the blocking capability in the short-circuit state extremely decreases in the case of $(C_{b,p})$ max>$1.0\times10^{15}$ $cm^{-3}$, so that the short-circuit characteristics of the IGBT is not guaranteed. As described above, $(C_{b,p})$ max has an influence on the blocking capability in the short-circuit state in the second structure.

Figure 70:
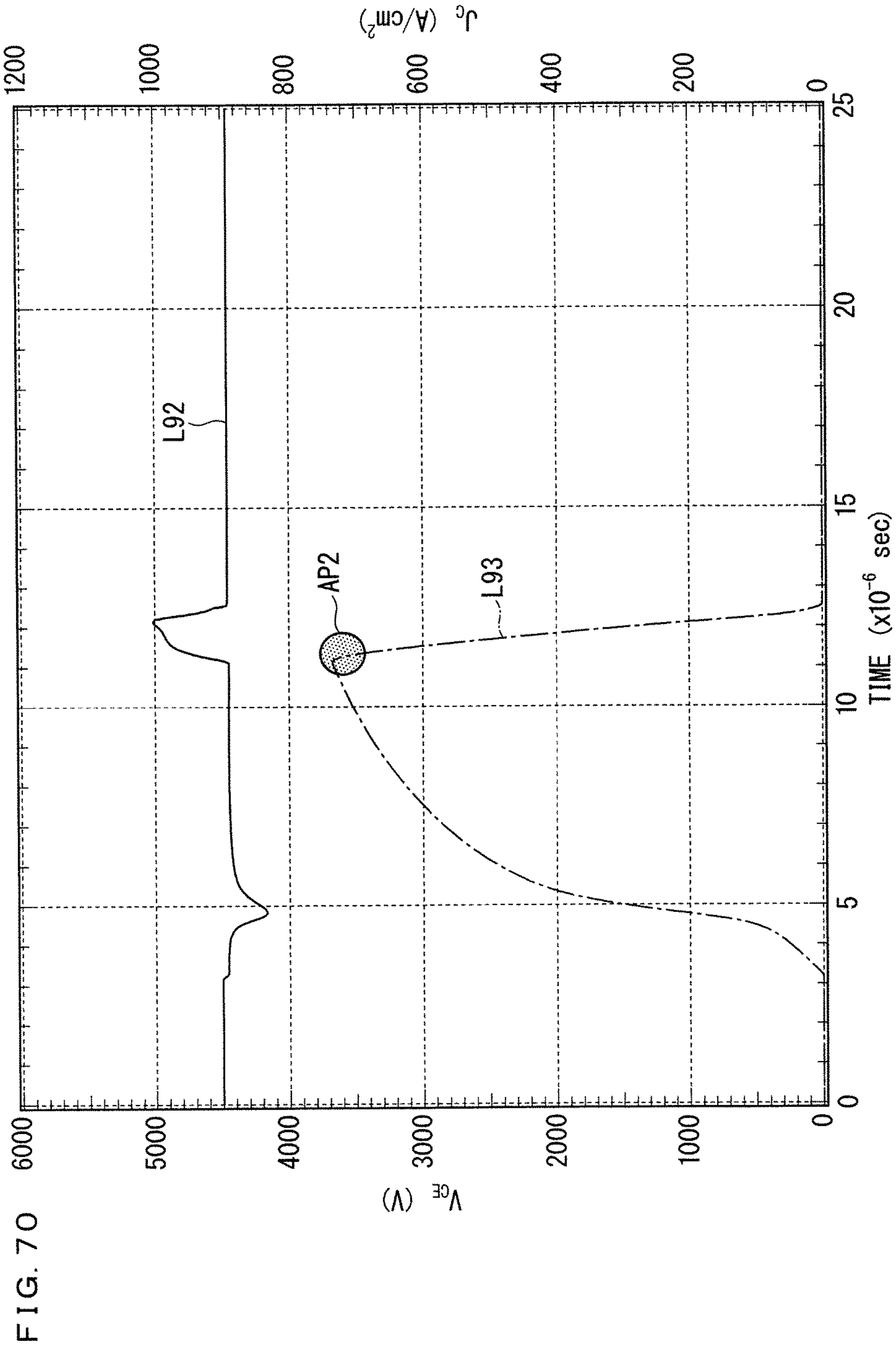
FIG. 70 is a view illustrating a turn-off operation waveform in a state of no-load short-circuit in the IGBT in a simulation.

A mechanism of this influence is clarified from a turn-off operation waveform illustrated in FIG. 70. FIG. 70 illustrates a turn-off operation waveform in a state of no-load short-circuit in an IGBT of withstand voltage 6500V class having the trench-gate structure in a simulation at a temperature of 125° C. In FIG. 70, a horizontal axis indicates a time ($\times10^{-6}$/second), and a vertical axis indicates $V_{CE}$ (V) and $J_C$ (A/$cm^2$). In FIG. 70, a solid line L92 indicates $V_{CE}$, and an alternate long and short dash line L93 indicates $J_C$.

Figure 71:
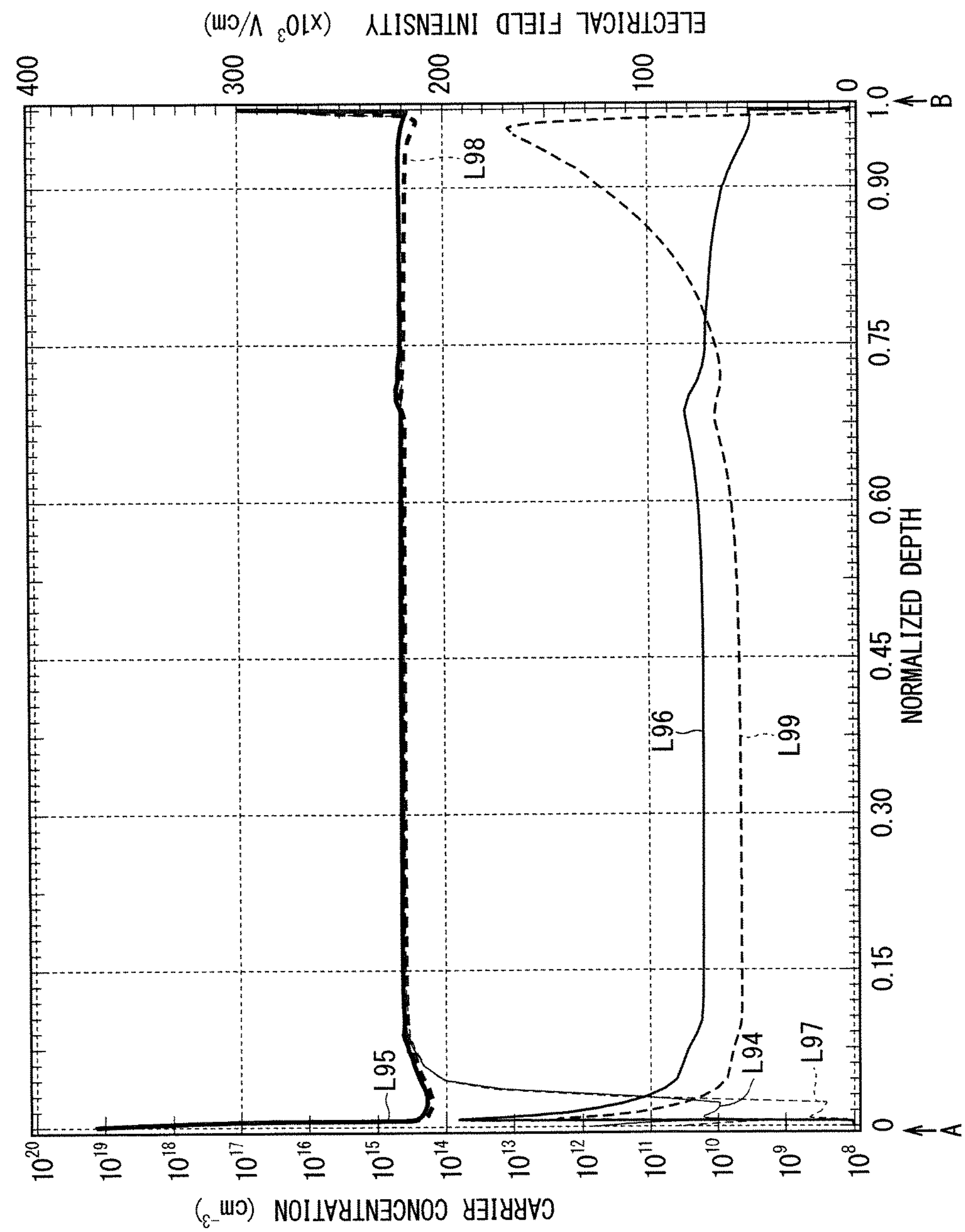
FIG. 71 is a view illustrating a carrier concentration distribution inside of the device in an analysis point AP2 illustrated in FIG. 70.

FIG. 71 illustrates a carrier concentration distribution inside of the device in an analysis point AP2 illustrated in FIG. 70. A horizontal axis in FIG. 71 indicates a normalized depth, and 0 and 1.0 correspond to marks A and B in FIG. 30, respectively. In FIG. 30, the mark A indicates a surface of the MOS transistor part, and the mark B indicates a surface of the P collector layer 16. In FIG. 71, the vertical axis indicates the carrier concentration ($cm^{-3}$) and the electrical field intensity ($\times10^3$V/cm). In FIG. 71, a thin solid line L94 indicates the electron concentration, a thick solid line L95 indicates a hole concentration, and a solid line L96 having a moderate thickness indicates the electrical field intensity, in the case of $(C_{b,p})$ max$\leq1.0\times10^{15}$ $cm^{-3}$, respectively. A thin dotted line L97 indicates the electron concentration, a thick dotted line L98 indicates a hole concentration, and a dotted line L99 having a moderate thickness indicates the electrical field intensity, in the case of $(C_{b,p})$ max$>1.0\times10^{15}$ $cm^{-3}$, respectively.

FIG. 71 shows that in a condition where the maximum peak impurity concentration of the second buffer layer is high, that is, $(C_{b,p})$ max$>1.0\times10^{15}$ $cm^{-3}$, the electrical field intensity inside of the device in the short-circuit state indicates a distinctive distribution that it is not high in the main junction, that is to say, the junction between the P base layer 9 and the $N^-$ drift layer 14 but is high in the junction $(X_{j,a})$ between the first buffer layer 15*a* and the second buffer layer 15*b*, so that the unbalance of the electrical field intensity occurs. This is caused by the reduction in the concentration of the remaining carrier plasma layer in the second buffer layer 15*b*. The reduction in the concentration of the remaining carrier plasma layer in the second buffer layer 15*b* also means that the second buffer layer 15*b* cannot perform the function indicated by the area A12' in FIG. 37.

When the unbalance of the electrical field intensity occurs, an area where heat is generated locally occurs in the vicinity of the junction between the $N^-$ drift layer 14 and the N buffer layer 15 or in the N buffer layer 15, so that the IGBT is broken by heat and the blocking capability in the short-circuit state extremely decreases. That is to say, such an inner state of the device causes the extreme reduction in the blocking capability in the short-circuit state illustrated in FIG. 69.

As described above, the IGBT including the N buffer layer 15 having the feature of the impurity profile illustrated in FIG. 33 achieves the stable withstand voltage characteristics, the reduction in the turn-off loss caused by the low leakage current at the time of turn-off, the improvement in the controllability of the turn-off operation, and the significant improvement in the blocking capability at the time of turn-off in a no-load state. Furthermore, the IGBT including the N buffer layer 15 has a feature that the impurity which forms the n-type diffusion layer is diffused not only in the depth direction but also in the horizontal direction at the time of forming the second buffer layer 15*b* in the N buffer layer 15 of the present invention. As a result, the IGBT including the N buffer layer 15 has the effect that a partial unformation area of the N buffer layer 15 which causes the feature at the time of forming the N buffer layer 15 and the negative influence during the wafer process is not generated, so that the increase in the level of defectiveness of the IGBT and the diode chip is suppressed.

The embodiment 4 describes the example of application of the present invention to the IGBT illustrated in FIG. 30. However, the present invention can be also applied to an IGBT in which the dummy electrode is not included, but all of the gate electrodes 13 are the gate potentials (for example, FIG. 66 in Japanese Patent No. 5908524), an IGBT which does not include the N layer 11 in the diffusion layer between the adjacent gate electrodes 13 (for example, FIG. 1 in Japanese Patent No. 5908524), and an IGBT in which the gate structure of the MOS transistor part has the planar gate structure (for example, FIGS. 79 to 52 in Japanese Patent No. 5908524), thus the similar effect can be obtained.

Embodiment 5

The semiconductor device according to the embodiment 5 has an object of further improving the blocking capability at the time of turn-off in the IGBT and the diode in accordance with the relationship between the constituent elements of the power semiconductor illustrated in FIG. 4 and the characteristic N buffer layer 15 described in the embodiment 1 to the embodiment 4.

FIG. 72 to FIG. 83 are cross-sectional views illustrating a first to twelfth aspects in the semiconductor device according to the embodiment 5. These cross sections correspond to the cross section A1-A1 in FIG. 4. The first, second, ninth, and eleventh aspects are improvements of the IGBT (FIG. 1 and FIG. 30), the third aspect is an improvement of the PIN diode (FIG. 2 and FIG. 31), and the fourth to eighth, tenth, and twelfth aspects are improvements of the RFC diode (FIG. 3 and FIG. 32).

Hereinafter, the same reference numerals as those in FIG. 1 to FIG. 3 and FIG. 30 to FIG. 32 will be assigned to the same structural parts and the description thereof will be omitted as appropriate, and the characteristic portions will be mainly described.

Figure 72:
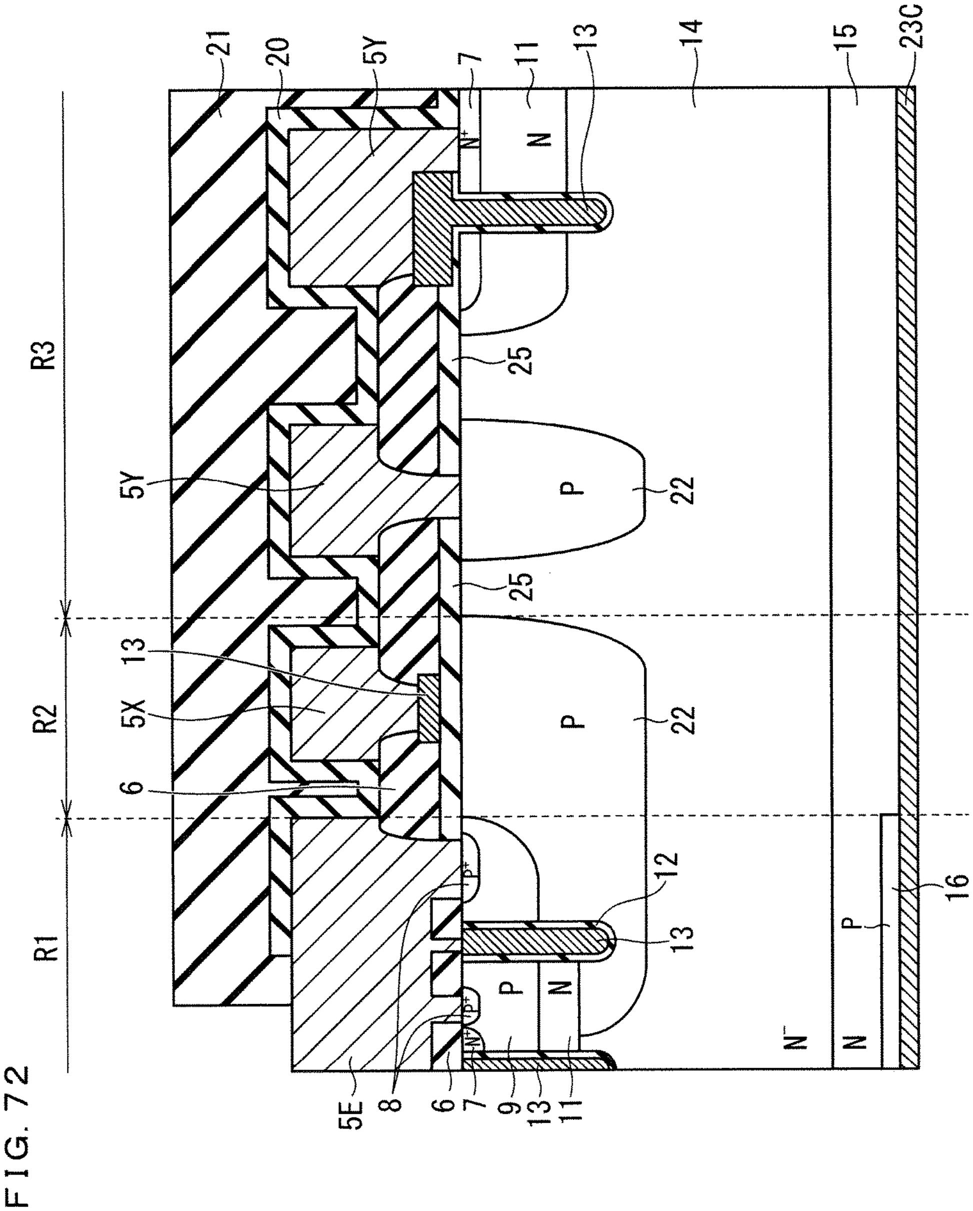
FIG. 72 is a cross-sectional view illustrating a first aspect in a semiconductor device according to an embodiment 5.

The first aspect illustrated in FIG. 72 is characterized by extendedly forming the N buffer layer 15 in the area where the P collector layer 16 is not formed, without forming the P collector layer 16 in the interface area R2 and the edge termination area R3 which are the peripheral areas of the active cell area R1, as compared to the IGBT illustrated in FIG. 1 and FIG. 30. That is to say, in the interface area R2 and the edge termination area R3, the collector electrode 23C is joined to the N buffer layer 15 and provided on the N buffer layer 15.

Figure 73:
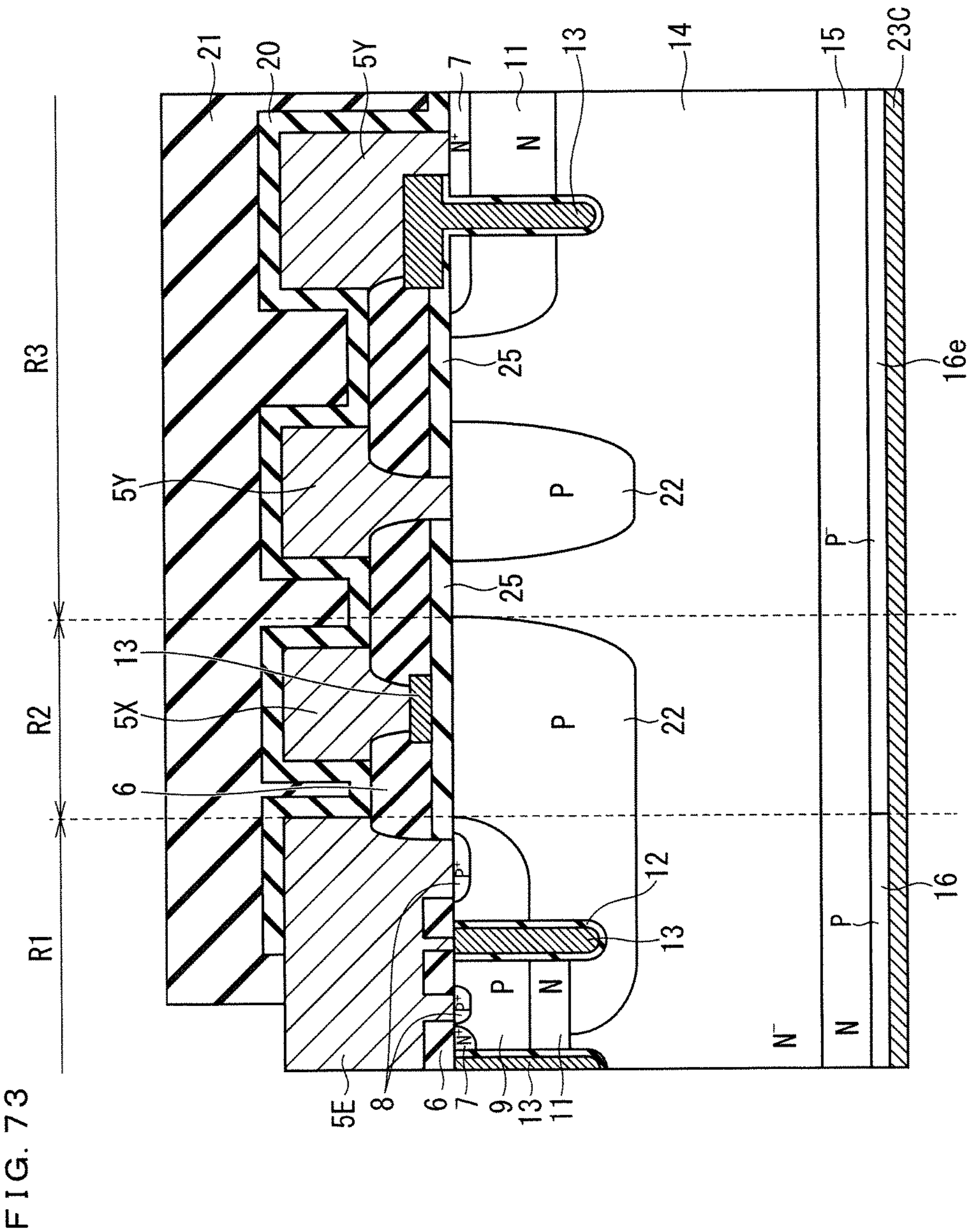
FIG. 73 is a cross-sectional view illustrating a second aspect in the semiconductor device according to the embodiment 5.

The second aspect illustrated in FIG. 73 is characterized by forming the P collector layer 16*e* without forming the P collector layer 16 in the interface area R2 and the edge termination area R3 which are the peripheral areas of the active cell area R1, as compared to the IGBT illustrated in FIG. 1 and FIG. 30. A surface concentration of the P collector layer 16*e* is lower than the concentration of the P collector layer 16.

Figure 74:
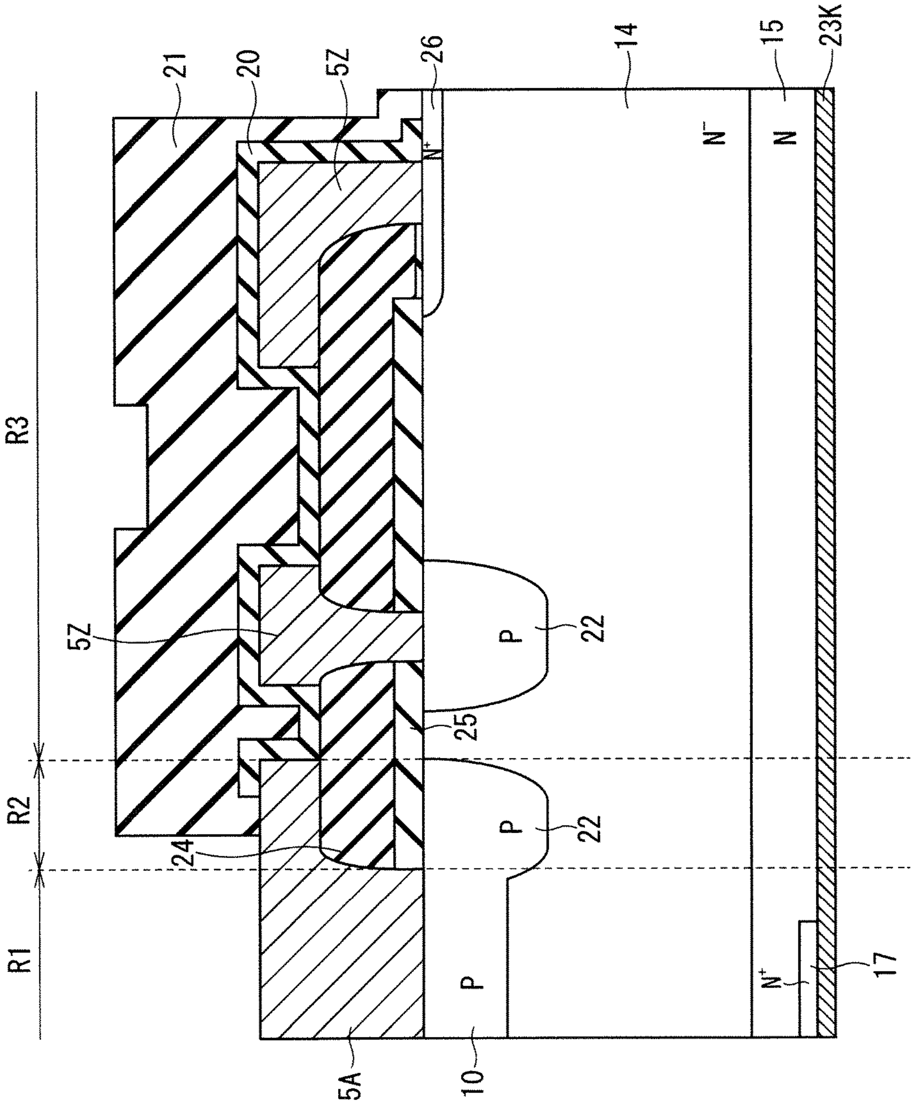
FIG. 74 is a cross-sectional view illustrating a third aspect in the semiconductor device according to the embodiment 5.

The third aspect illustrated in FIG. 74 is characterized by extendedly forming the N buffer layer 15 in the area where the P collector layer 16 is not formed, without forming the $N^+$ cathode layer 17 in the interface area R2 and the edge termination area R3 which are the peripheral areas, as compared to the PIN diode illustrated in FIG. 2 and FIG. 31. That is to say, in the interface area R2 and the edge termination area R3, the cathode electrode 23K is joined to the N buffer layer 15 and provided on the N buffer layer 15.

Figure 75:
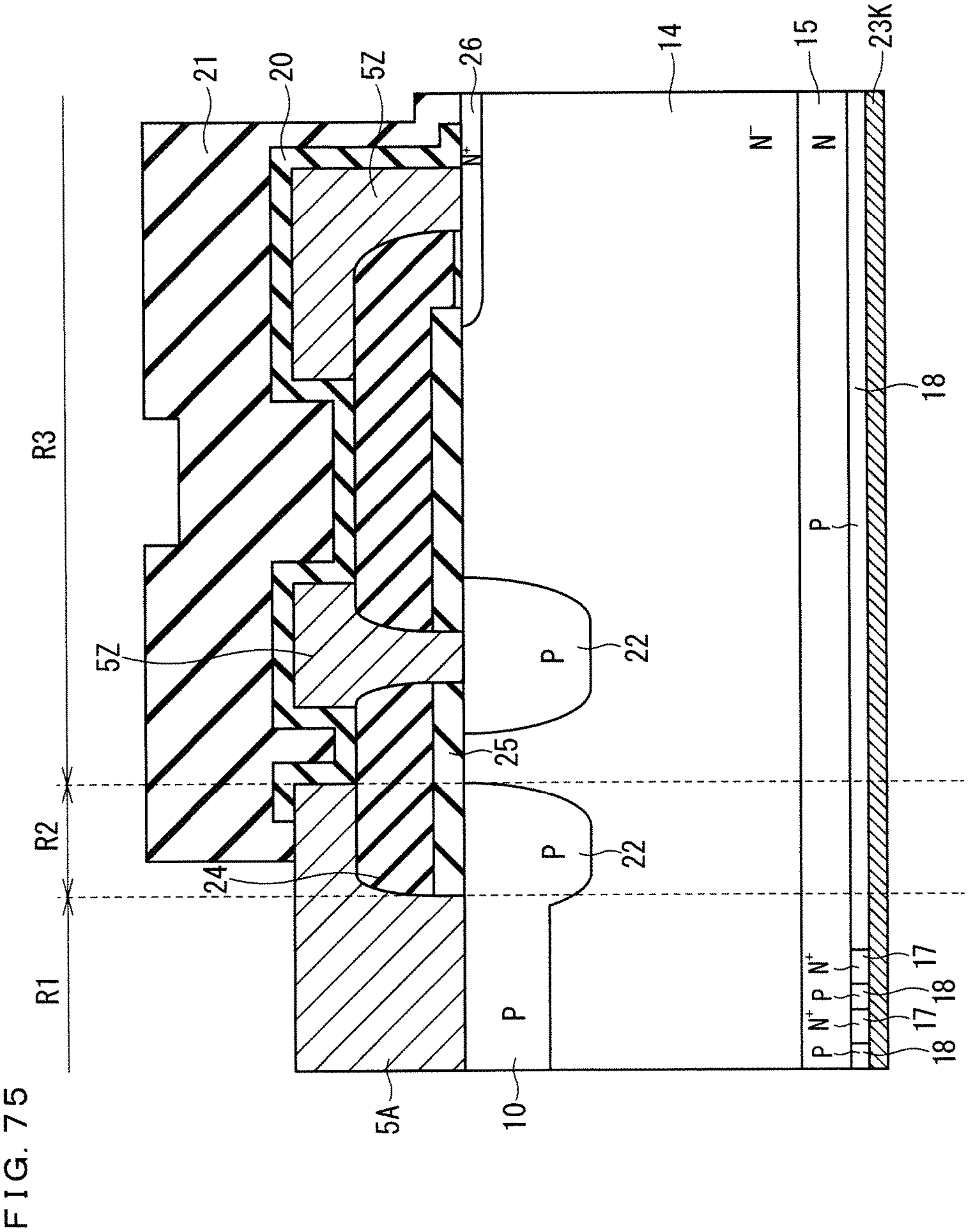
FIG. 75 is a cross-sectional view illustrating a fourth aspect in the semiconductor device according to the embodiment 5.

The fourth aspect illustrated in FIG. 75 is characterized by forming the P cathode layer 18 (a second partial active layer) without forming the $N^+$ cathode layer 17 (a first partial active layer) in the interface area R2 and the edge termination area R3 which are the peripheral areas, as compared to the RFC diode illustrated in FIG. 3 and FIG. 32.

The fifth aspect illustrated in FIG. 76 is characterized by extendedly forming the N buffer layer 15 in the area where the P cathode layer 18 is not formed, without forming the P cathode layer 18 in the interface area R2 and the edge termination area R3 which are the peripheral areas, as compared to the RFC diode illustrated in FIG. 3 and FIG. 32. That is to say, in the interface area R2 and the edge termination area R3, the cathode electrode 23K is joined to the N buffer layer 15 and provided on the N buffer layer 15.

Figure 77:
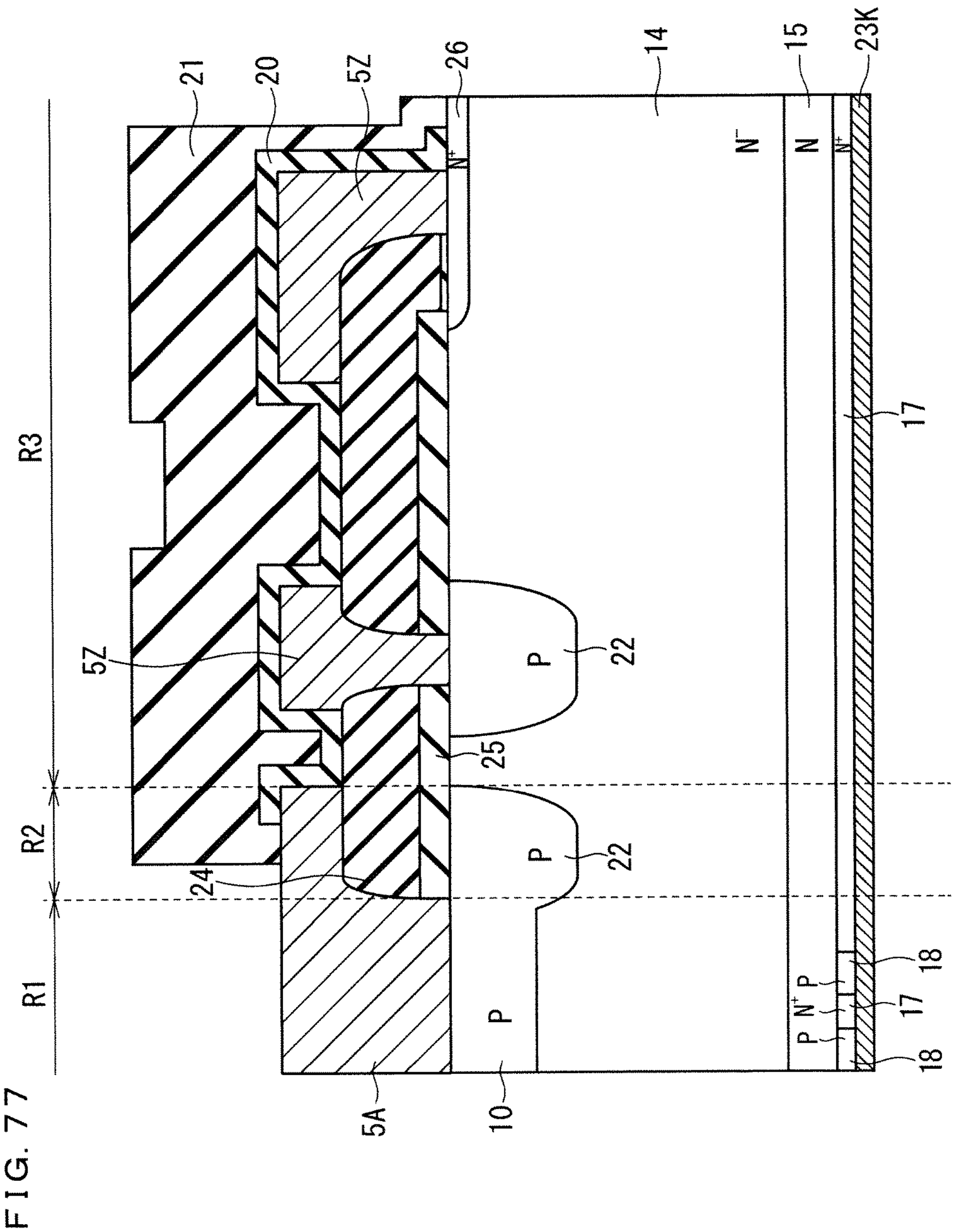
FIG. 77 is a cross-sectional view illustrating a sixth aspect in the semiconductor device according to the embodiment 5.

The sixth aspect illustrated in FIG. 77 is characterized by forming the $N^+$ cathode layer 17 (the first partial active layer) without forming the P cathode layer 18 (the second partial active layer) in the interface area R2 and the edge termination area R3 which are the peripheral areas, as compared to the RFC diode illustrated in FIG. 3 and FIG. 32.

Figure 78:
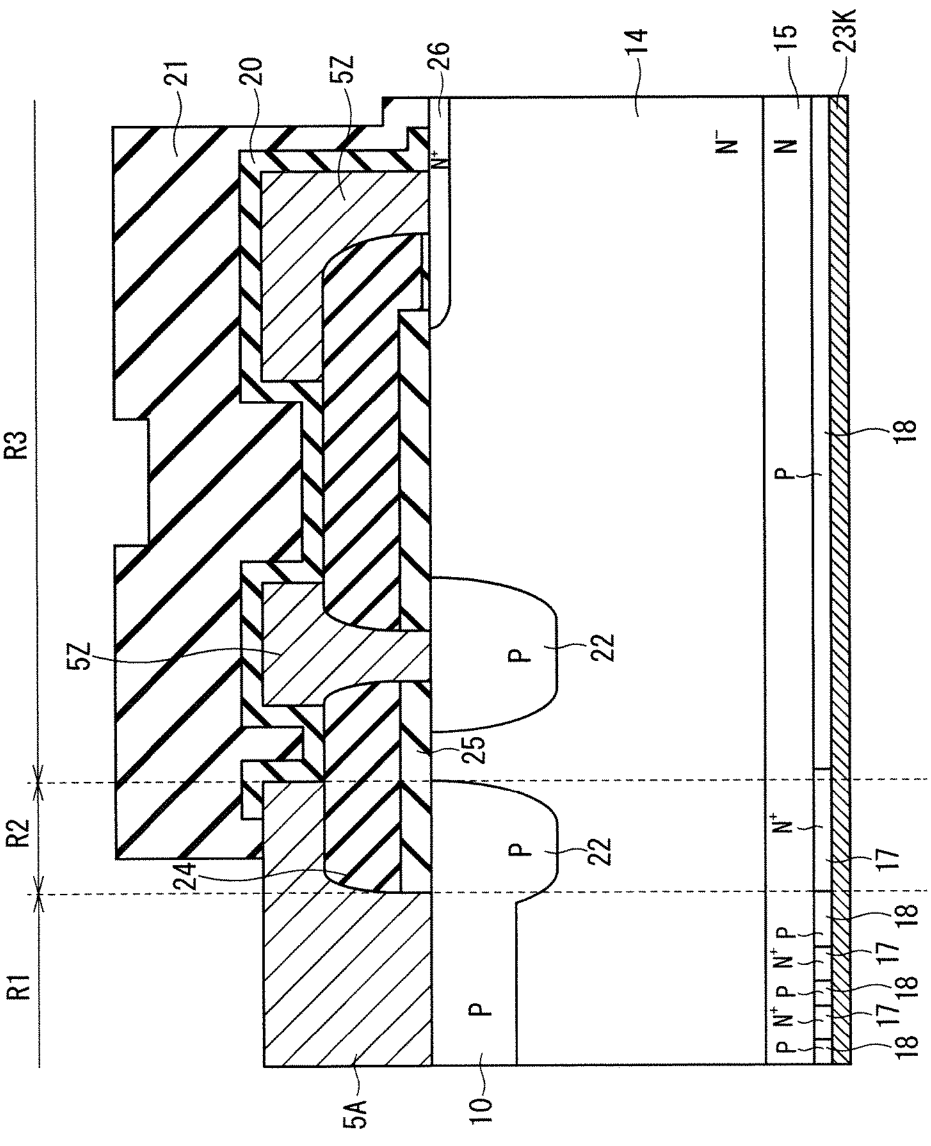
FIG. 78 is a cross-sectional view illustrating a seventh aspect in the semiconductor device according to the embodiment 5.

The seventh aspect illustrated in FIG. 78 is characterized by forming the $N^+$ cathode layer 17 (the first partial active layer) instead of the P cathode layer 18 of the interface area R2 as compared to the RFC diode of the fourth aspect illustrated in FIG. 75.

Figure 79:
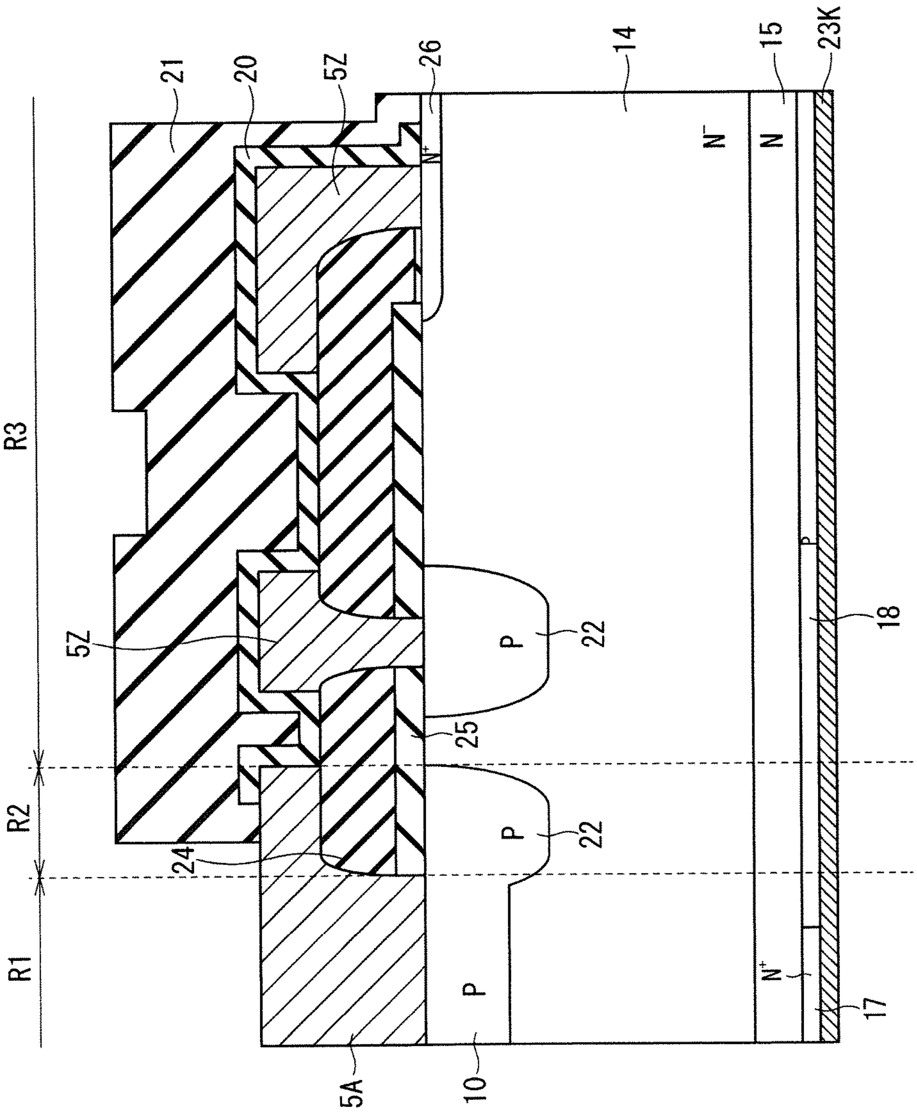
FIG. 79 is a cross-sectional view illustrating an eighth aspect in the semiconductor device according to the embodiment 5.

The eighth aspect illustrated in FIG. 79 is characterized by forming the P cathode layer 18 (the second partial active layer) across the interface area R2 and the edge termination area R3 as compared to the PIN diode illustrated in FIG. 2 and FIG. 31.

Figure 80:
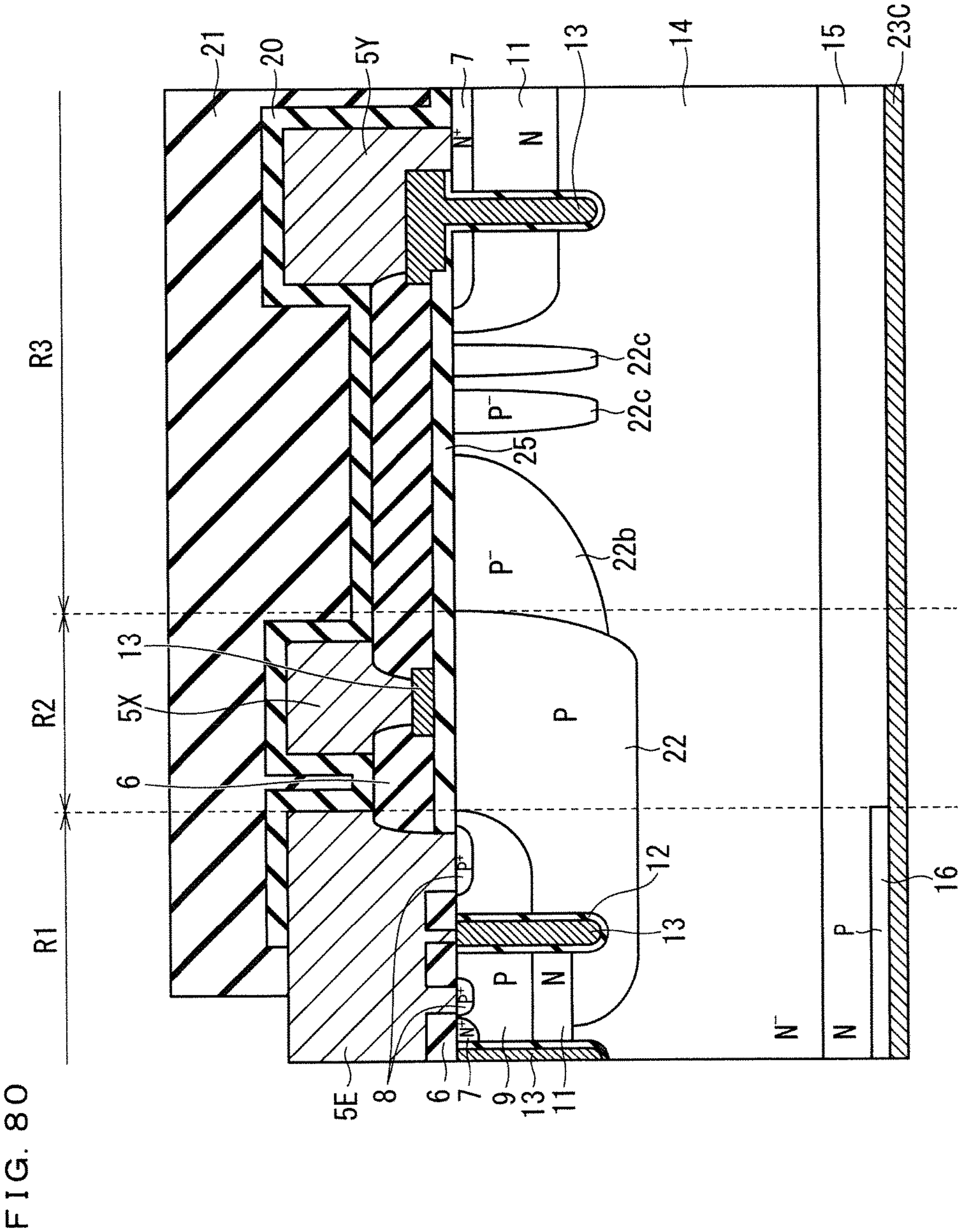
FIG. 80 is a cross-sectional view illustrating a ninth aspect in the semiconductor device according to the embodiment 5.

The ninth aspect illustrated in FIG. 80 is characterized by forming a P area 22*b* connected to the P area 22 and a plurality of P areas 22*c* in a floating state on the side of the first main surface in the $N^-$ drift layer 14 in the edge termination area R3 as compared to the IGBT illustrated in FIG. 72.

Figure 81:
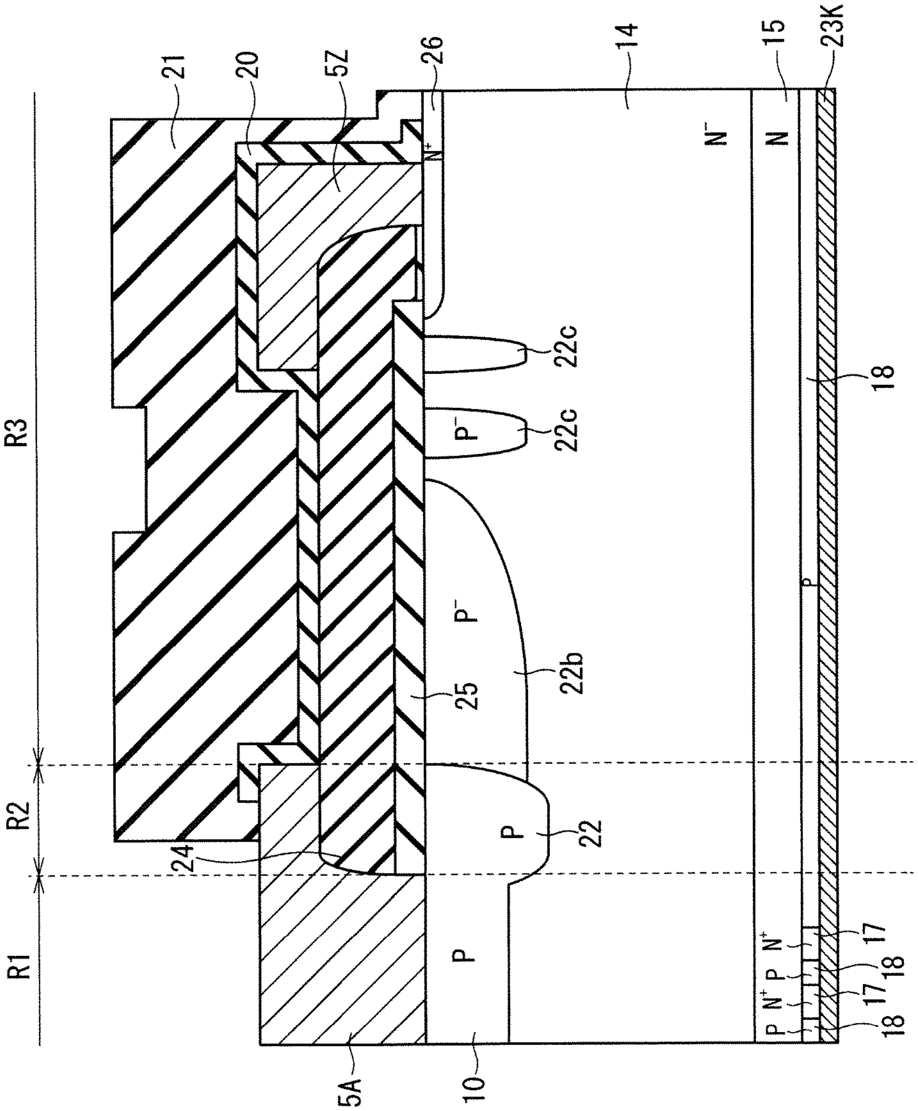
FIG. 81 is a cross-sectional view illustrating a tenth aspect in the semiconductor device according to the embodiment 5.

The tenth aspect illustrated in FIG. 81 is characterized by forming the P area 22*b* connected to the P area 22 and the plurality of P areas 22*c* in the floating state on the side of the first main surface in the $N^-$ drift layer 14 in the edge termination area R3 as compared to the RFC diode illustrated in FIG. 75.

Figure 82:
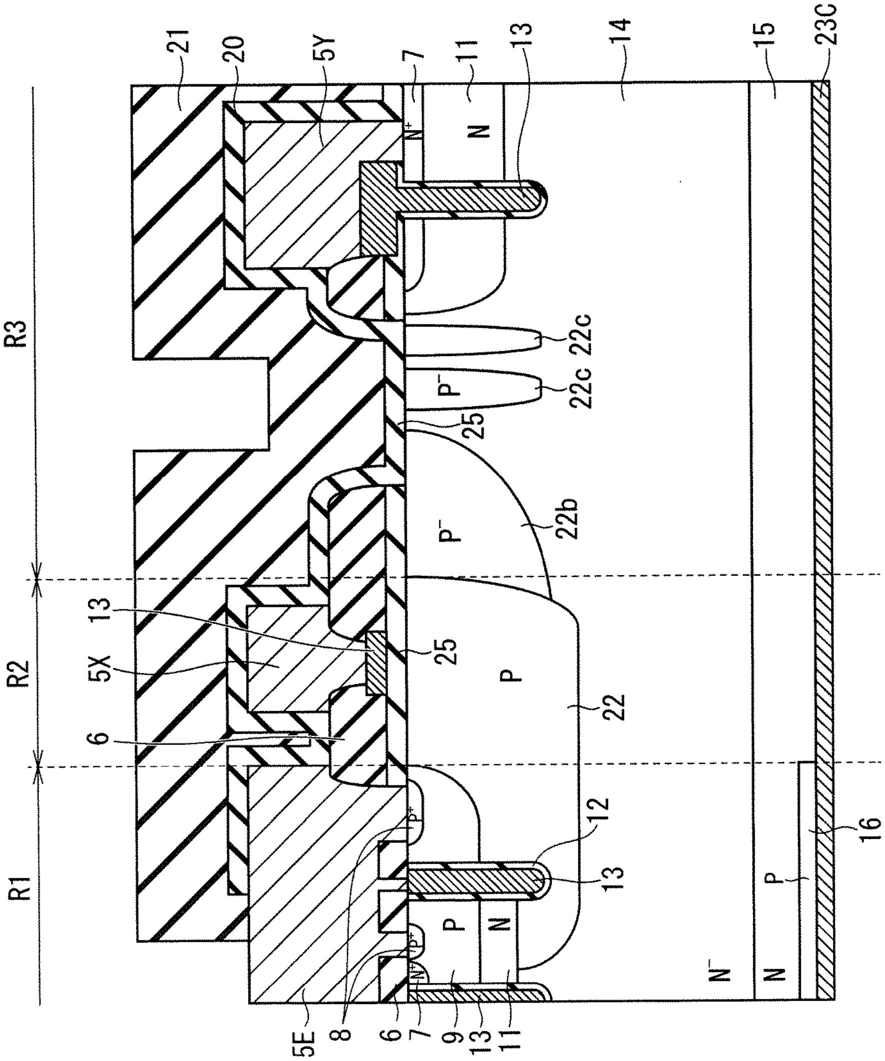
FIG. 82 is a cross-sectional view illustrating an eleventh aspect in the semiconductor device according to the embodiment 5.

The eleventh aspect illustrated in FIG. 82 is characterized by causing the plurality of P areas 22*c*, which is not in the floating state, to be in contact with the passivation film 20 as compared to the IGBT illustrated in FIG. 80.

Figure 83:
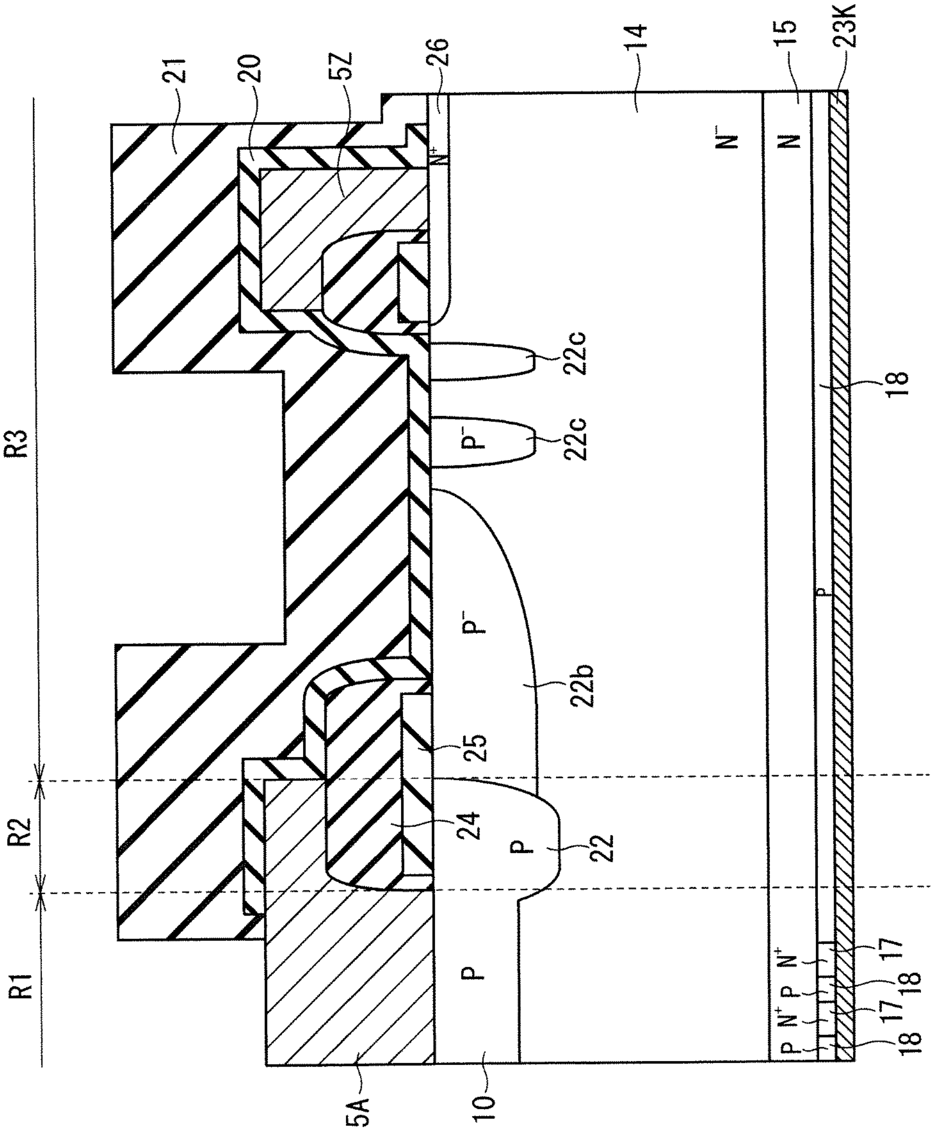
FIG. 83 is a cross-sectional view illustrating a twelfth aspect in the semiconductor device according to the embodiment 5.

The twelfth aspect illustrated in FIG. 83 is characterized by causing the plurality of P areas 22*c*, which is not in the floating state, to be in contact with the passivation film 20 as compared to the RFC diode illustrated in FIG. 81. The feature of the structure of the edge termination area R3 in FIGS. 80 to 83 and the effect thereof are described in International Publication No. 2015/114748 and Japanese Patent Application No. 2015-230229.

As described above, the first to tenth aspects of the embodiment 5 are characterized by changing, in the IGBT, the PIN diode, and the RFC diode, a structure of an area corresponding to the active layer which is in contact with the collector electrode 23C or the cathode electrode 23K in the active cell area R1, the interface area R2, and the edge termination area R3.

Thus, the IGBT, the PIN diode, and the RFC diode according to the first to tenth aspects have a structure for suppressing the carrier implantation from the collector or the cathode in the inter face area R2 and the edge termination area R3 under an ON state.

As a result, the first to tenth aspects in the embodiment 3 has effects of reducing the electrical field intensity of a p-n junction which is the main junction in the interface area R2 in the turn-off operation, suppressing the increase in the local electrical field intensity, and suppressing thermal breakdown (thermal breakdown suppressing effect) caused by a local increase in temperature subject to the current concentration induced by the impact ionization.

A mechanism of this phenomenon and a detail of the effect are described in Japanese Patent No. 5708803, Japanese Patent No. 5701447, and International Publication No. 2015/114747 for the IGBT, and described in Japanese Patent Application Laid-Open No. 2014-241433 for the diode.

Figure 84:
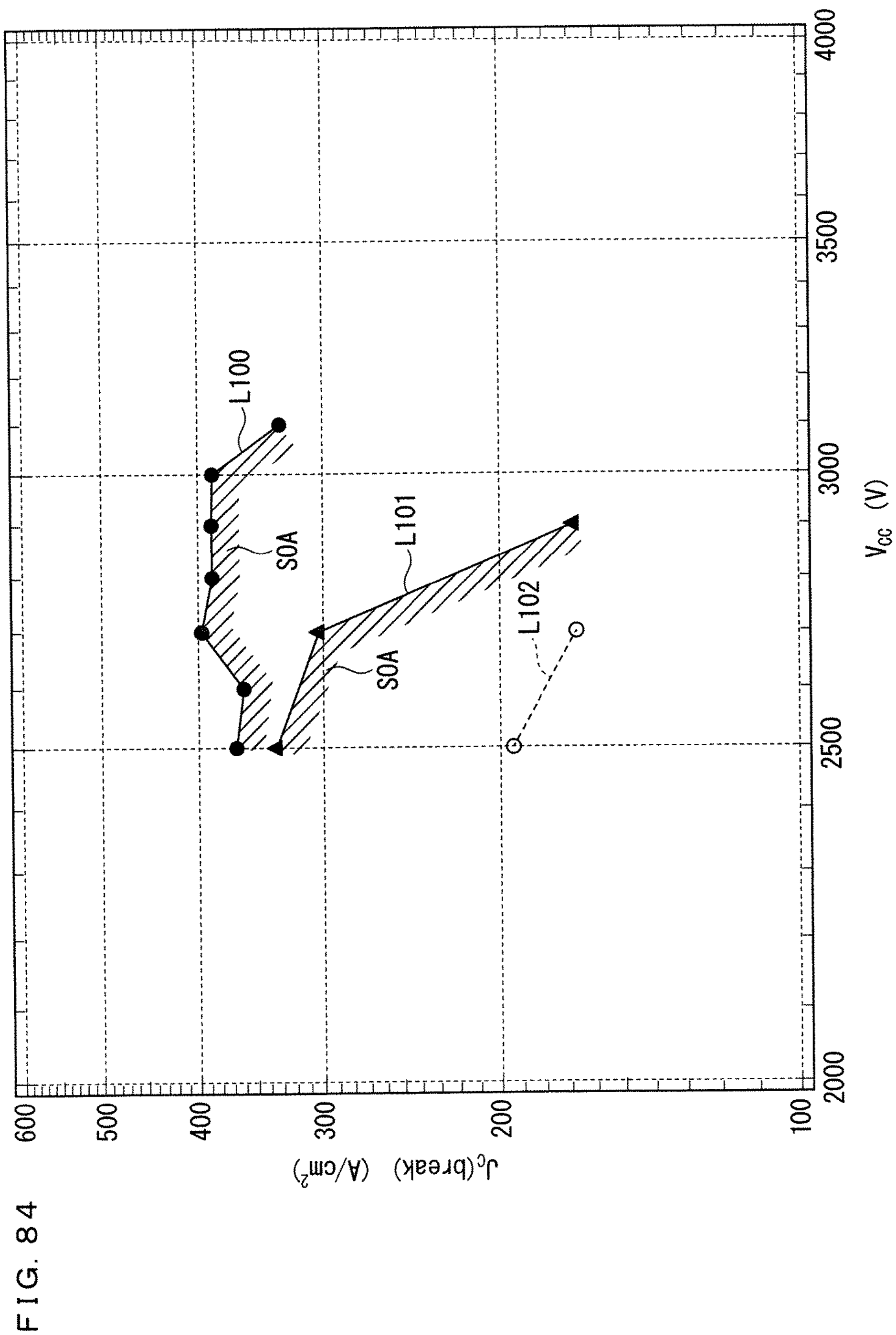
FIG. 84 is a view illustrating a RBSOA of the IGBT of the second aspect in the semiconductor device according to the embodiment 5.

FIG. 84 illustrates a RBSOA (Reverse Bias Safe Operating Area) of the IGBT according to the second aspect illustrated in FIG. 73 in the withstand voltage 3300V class. In FIG. 84, a horizontal axis indicates a power supply voltage $V_{CC}$ (V) and a vertical axis indicates the maximum blocking current density $J_C$ (break) (A/cm$^2$) at the time of turn off. Solid lines L100 and 101 in FIG. 84 indicate characteristics in a case of adopting the N buffer layer 15 (the second structure) of the impurity profile illustrated in FIG. 33, and a dotted line L102 indicates characteristics in a case of adopting the conventional N buffer layer (the conventional structure 1). Black circles and the solid line L100 indicate characteristics of the second structure at a temperature of 150° C., and black triangles and the solid line L101 indicate characteristics of the second structure at a temperature of 175° C. An inner side of graph lines illustrated in FIG. 84 indicates the safety operating area (SOA).

FIG. 84 shows that in a case where the N buffer layer 15 has the second structure in the IGBT of the second aspect, the RBSOA expands to a side where $J_C$ (break) and $V_{CC}$ are higher compared with a case where the N buffer layer 15 has the conventional structure 1. That is to say, the second structure significantly improves the RBSOA of the IGBT.

Figure 85:
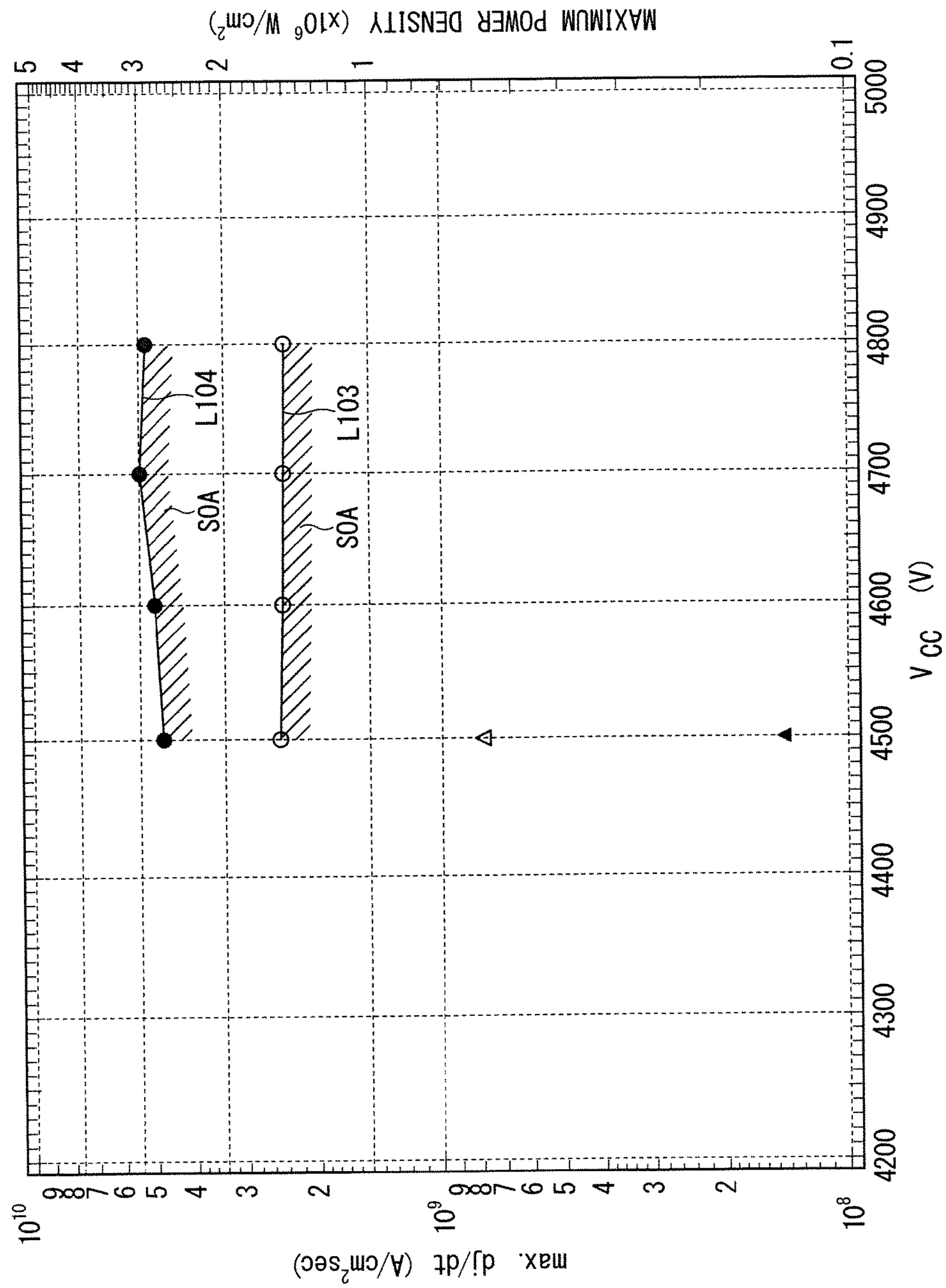
FIG. 85 is a view illustrating a recovery SOA of the RFC diode of the fourth aspect in the semiconductor device according to the embodiment 5.

FIG. 85 illustrates a recovery SOA of the RFC diode of the fourth aspect illustrated in FIG. 75 in the withstand voltage 6500V class. In FIG. 85, a horizontal axis indicates $V_{CC}$ (V), and a vertical axis indicates max. dj/dt, which is a maximum blocking dj/dt, and a maximum power density, in the recovery operation. In characteristics in the case where the N buffer layer 15 has the conventional structure 1, max. dj/dt is plotted with white triangles, and the maximum power density is plotted with black triangles. In characteristics in the case where the N buffer layer 15 has the second structure, max. dj/dt is indicated by white circles and a solid line L103, and the maximum power density is indicated by black circles and a solid line L104.

An inner side of graph lines illustrated in FIG. 85 indicates the SOA. FIG. 85 shows that the RFC diode of the fourth aspect having the N buffer layer 15 having the second structure of the present invention has the recovery SOA expanding to a side where both max. dj/dt and the maximum power density of the recovery SOA are higher compared with the RFC diode having the N buffer layer of the conventional structure 1. That is to say, the second structure significantly improves the recovery SOA of the RFC diode.

FIGS. 84 and 85 show that the first structure or the second structure is adopted to the N buffer layer 15 in the IGBT in the first aspect of the embodiment 3 and the RFC diode in the fourth aspect of the embodiment 3, thereby significantly expanding the SOA at the time of turn-off compared with the conventional structure, and achieving the significant improvement in the blocking capability at the time of turn-off, which is one of the objects of the present invention. The effect similar to that indicated by FIG. 84 and FIG. 85 can be obtained by adopting the first structure or the second structure to the N buffer layer 15 in the IGBT and the diode in the other aspect of the embodiment 3. Moreover, also in the edge termination area R3 illustrated in FIG. 80 to FIG. 83, the vertical structure of contacting the electrode 23 in the edge termination area R3 from the active cell area R1 and the interface area R2 is the same as that of FIG. 72 or FIG. 75, thus, with regard to the SOA at the time of turn-off in the IGBT or the diode, the effect similar to that indicated by FIG. 84 and FIG. 85 can be obtained by applying the first structure or the second structure to the N buffer layer 15.

Embodiment 6

The present embodiment describes a method of stably manufacturing the impurity profile of the N buffer layer 15 in the first structure or the second structure described in the embodiment 1, particularly the impurity profile of the second buffer layer 15*b*.

FIG. 86 illustrates processes A to E considered as steps of manufacturing the IGBT, the PIN diode, and the RFC diode described in the embodiments 1 to 5. Indicated in a first column of a table in FIG. 86 are step of the formation of the protective film on the surface of the wafer, the thickness control of the wafer, the second buffer layer (the introduction of the protons), the second buffer layer (the annealing), the first buffer layer (the introduction of the protons, the annealing), the second buffer layer (the introduction of the protons), the formation of the active layer, the second buffer layer (the introduction of the protons), the second buffer layer (the annealing), the formation of the collector electrode or cathode electrode, and the second buffer layer (the introduction of the protons, the annealing). These are typical steps supposed in the steps illustrated in FIG. 16 and FIG. 17 in the steps of manufacturing the IGBT illustrated in FIG. 5 to FIG. 17 or the steps illustrated in FIG. 25 or FIG. 26 in the steps of manufacturing the diode illustrated in FIG. 18 to FIG. 26, and these steps are performed in order from the upper row to the lower row. A step on which "○" is marked in FIG. 86 is performed at a time of experimentally manufacturing a sample in each of the processes A to E. The term of "the second buffer layer (the introduction of the protons)" indicates the step of introducing the protons for forming the second buffer layer, and the term of "the second buffer layer (the annealing)" indicates the step of activating the protons introduced for forming the second buffer layer by the annealing.

That is to say, in the process A, the formation of the protective film on the surface of the wafer, the thickness control of the wafer, the formation of the first buffer layer (the introduction of the protons (the first ions), the annealing), the formation of the second buffer layer (the introduction of the protons (the second ions)), the formation of the active layer (the P collector layer 16, the $N^+$ cathode layer 17, and the P cathode layer 18), the formation of the second buffer layer (the annealing), and the formation of the back side electrode (the collector electrode or the cathode electrode) are performed in this order.

In the process B, the formation of the protective film on the surface of the wafer, the thickness control of the wafer, the formation of the second buffer layer (the introduction of the protons (the second ions)), the formation of the first buffer layer (the introduction of the protons (the first ions), the annealing), the formation of the active layer (the P collector layer 16, the $N^+$ cathode layer 17, and the P cathode layer 18), the formation of the second buffer layer (the annealing), and the formation of the back side electrode (the collector electrode or the cathode electrode) are performed in this order.

In the process C, the formation of the protective film on the surface of the wafer, the thickness control of the wafer, the formation of the second buffer layer (the introduction of the protons (the second ions)), the formation of the second buffer layer (the annealing), the formation of the first buffer layer (the introduction of the protons (the first ions), the annealing), the formation of the active layer (the P collector layer 16, the $N^+$ cathode layer 17, and the P cathode layer 18), and the formation of the back side electrode (the collector electrode or the cathode electrode) are performed in this order.

In the process D, the formation of the protective film on the surface of the wafer, the thickness control of the wafer, the formation of the first buffer layer (the introduction of the protons (the first ions), the annealing), the formation of the active layer (the P collector layer 16, the $N^+$ cathode layer 17, and the P cathode layer 18), the formation of the second buffer layer (the introduction of the protons (the second ions)), the formation of the second buffer layer (the annealing), and the formation of the back side electrode (the collector electrode or the cathode electrode) are performed in this order.

In the process E, the formation of the protective film on the surface of the wafer, the thickness control of the wafer, the formation of the first buffer layer (the introduction of the protons (the first ions), the annealing), the formation of the active layer (the P collector layer 16, the $N^+$ cathode layer 17, and the P cathode layer 18), the formation of the back side electrode (the collector electrode or the cathode electrode), and the formation of the second buffer layer (the introduction of the protons, the annealing) are performed in this order.

Figure 87:
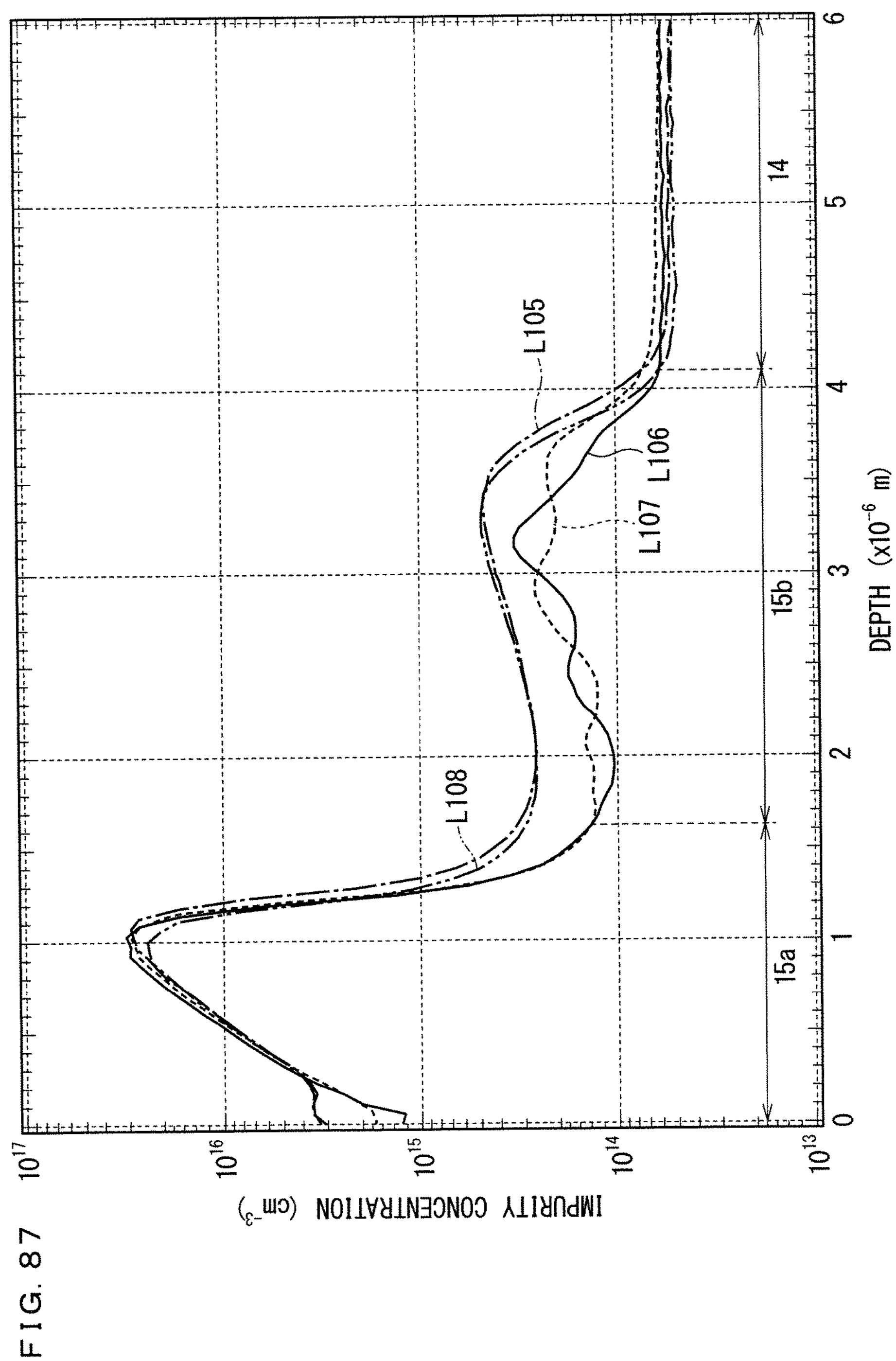
FIG. 87 is a view illustrating an impurity profile of an N buffer layer and an $N^-$ drift layer made in the processes A to D.

FIG. 87 illustrates an impurity profile of the N buffer layer 15 and the $N^-$ drift layer 14 made in the processes A to D. However, the second sub-buffer layers 15*b*2 to the $n^{th}$ sub-buffer layer 15*bn* are not formed in the sample whose impurity profile is indicated in FIG. 87, and only the impurity profile of the first buffer layer 15*a* and the first sub-buffer layer 15*b*1 of the second buffer layer 15*b* is indicated in the N buffer layer 15. In FIG. 87, a horizontal axis indicates a depth ($\times10^{-6}$ m), and a vertical axis indicates a carrier concentration ($cm^{-3}$). In FIG. 87, an alternate long and short dash line L105 indicates characteristics of the process A, a solid line L106 indicates characteristics of the process B, a dotted line L107 indicates characteristics of the process C, and an alternate long and two short dashes line L108 indicates characteristics of the process D. A number provided along the horizontal axis in FIG. 87 indicates the reference numeral of the constituent element of the device.

FIG. 87 shows that in the processes B and C in which the step of introducing the protons into Si is performed prior to the step of forming the first buffer layer 15*a*, the impurity profile of the first sub-buffer layer 15*b*1 becomes unstable, and the impurity concentration of the first sub-buffer layer 15*b*1 decreases. The voids occurring in introducing the protons into Si are combined with the hydrogen atoms and the oxygen atoms, the complex defect is combined with hydrogen, and the density of the complex defect is increased by the annealing, and then, the donor layer of the protons is formed. That is to say, it is considered in the processes B and C that the complex defect formed in introducing the protons into Si is recovered at the time of the annealing in forming the first buffer layer 15*a*, so that the function of the second buffer layer 15*b* serving as the donor is suppressed, and the suppression leads to the reduction in the stability and concentration of the impurity profile of the first sub-buffer layer 15*b*1.

In contrast, in the processes A and D, the step of introducing the protons into Si is performed after the step of forming the first buffer layer 15*a*, thus the phenomenon that the complex defect formed in introducing the protons into Si is recovered, occurring in the processes B and C, does not occur. Accordingly, the function of the second buffer layer 15*b* serving as the donor is enhanced in the annealing step for forming the second buffer layer 15*b*, so that the stable impurity profile and the sufficient impurity concentration can be obtained in the first sub-buffer layer 15*b*1.

FIG. 87 does not illustrate the impurity profile of the N buffer layer 15 and the $N^-$ drift layer 14 in the process E. However, since the process E includes the step of introducing the protons into Si after the step of forming the first buffer layer 15*a* as is the case with the processes A and D, the impurity profile of the first sub-buffer layer 15*b*1 is considered to be substantially the same as that of the processes A and D.

In the process E, the second buffer layer 15*b* is formed after forming the back side electrode. Herein, when the back side electrode is made of a plurality of metals (for example, Al/Mo/Ni/Au, AlSi/Ti/Ni/Au, Ti/Ni/Au), it is also applicable to form the second buffer layer 15*b* after forming a metal constituting a back side metal (for example, A1, AlSi, or Ti) being in contact with the P collector layer 16, $N^+$ cathode layer 17, or the P cathode layer 18, and subsequently form a remaining metal constituting the back side electrode (for example, Mo/Ni/Au, Ti/NI/Au, NI/Au).

Since the N buffer layer 15 formed in the processes B and C has the unstable and low concentration impurity profile in the first sub-buffer layer 15*b*1, it inhibits the achievement of the effect of the present invention and causes the negative influence such as the increase in the variation of the device performance. Accordingly, the protons need to be introduced into Si after forming the first buffer layer 15*a* to obtain the stable impurity concentration profile and the sufficient impurity concentration in each of the sub-buffer layers 15*b*1 to 15*bn* constituting the second buffer layer 15*b* of the N buffer layer 15. This enables the achievement of the effective effect of the N buffer layer 15 of the present invention described in the embodiments 1 to 4. The N buffer layer 15 having the first structure and the second structure of the present invention described in the embodiments 1 to 4 is made by the process A.

Embodiment 7

The semiconductor device according to the aforementioned embodiments 1 to 5 is applied to a power conversion device, in the present embodiment. Although the present invention is not limited to a specific power conversion device, described hereinafter as the embodiment 7 is a case of applying the present invention to a three-phase inverter.

Figure 88:
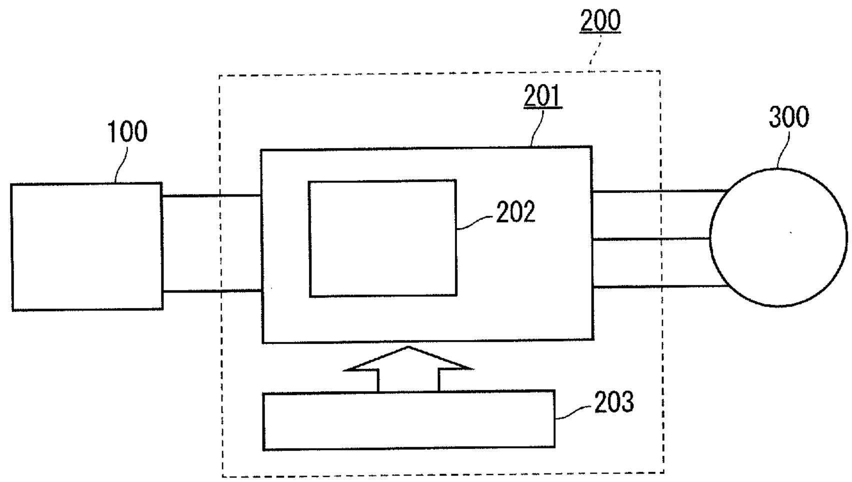
FIG. 88 is a block diagram illustrating a configuration of a power conversion system applying a power conversion device according to the present embodiment.

FIG. 88 is a block diagram illustrating a configuration of a power conversion system applying a power conversion device according to the present embodiment.

The power conversion system illustrated in FIG. 88 is made up of a power source 100, a power conversion device 200, and a load 300. The power source 100, which is a direct current power source, supplies a direct current power to the power conversion device 200. The power source 100 can be made up of various types of components such as a direct current system, a solar battery, or a rechargeable battery, or may be also made up of a rectifying circuit connected to an alternating current system or an AC/DC converter. The power source 100 may be also made up of a DC/DC converter which converts a direct current power being output from the direct current system into a predetermined power.

The power conversion device 200, which is a three-phase inverter connected between the power source 100 and the load 300, converts the direct current power supplied from the power source 100 into the alternating current power to supply the alternating current power to the load 300. As illustrated in FIG. 88, the power conversion device 200 includes a main conversion circuit 201 which converts the direct current power into the alternating current power and outputs the alternating current power and a control circuit 203 which outputs control signals for controlling the main conversion circuit 201 to the main conversion circuit 201.

The load 300 is a three-phase electrical motor driven by the alternating current power supplied from the power conversion device 200. The load 300 is not for specific purpose of use but is the electrical motor mounted on various types of electrical devices, thus it is used as the electrical motor for a hybrid car, an electrical car, a rail vehicle, an elevator, or an air-conditioning equipment, for example.

The power conversion device 200 is described in detail hereinafter. The main conversion circuit 201 includes a switching element and a reflux diode (not shown), and when a switching is performed on the switching element, the direct current power supplied from the power source 100 is converted into the alternating current power and then supplied to the load 300. The main conversion circuit 201 includes various types of specific circuit configurations, and the main conversion circuit 201 according to the present embodiment is a three-phase full-bridge circuit having two levels, and can be made up of six switching elements and six reflux diodes being antiparallel to each switching element. The main conversion circuit 201 is made up of a semiconductor module 202. The semiconductor device according to any one of the aforementioned embodiments 1 to 5 is applied to at least one of each switching element and each reflux diode in the main conversion circuit 201. The two switching elements among the six switching elements are series-connected to each other to constitute upper and lower arms, and each of the upper and lower arms constitutes each phase (U-phase, V-phase, and W-phase) of the full-bridge circuit. An output terminal of each of the upper and lower arms, that is to say, three output terminals of the main conversion circuit 201 are connected to the load 300.

The main conversion circuit 201 includes a drive circuit (not shown) for driving each switching element. The drive circuit may be embedded in the semiconductor module 202 or may also be provided separately from the semiconductor module 202. The drive circuit generates drive signals for driving the switching element of the main conversion circuit 201, and supplies the drive signals to a control electrode of the switching element of the main conversion circuit 201. Specifically, the drive circuit outputs the drive signals for switching the switching element to an ON state and the drive signals for switching the switching element to an OFF state to the control electrode of each switching element in accordance with the control signals from the control circuit 203 described hereinafter. The drive signals are voltage signals (ON signals) equal to or higher than a threshold voltage of the switching element when the switching element is kept in the ON state, and the drive signals are voltage signals (OFF signals) equal to or lower than the threshold voltage of the switching element when the switching element is kept in the OFF state.

The control circuit 203 controls the switching element of the main conversion circuit 201 to supply a desired power to the load 300. Specifically, the control circuit 203 calculates a time when each switching element of the main conversion circuit 201 needs to enter the ON state, based on the power which needs to be supplied to the load 300. For example, the main conversion circuit 201 can be controlled by performing PWN control for modulating an ON time of the switching element in accordance with the voltage which needs to be output. Then, the control circuit 203 outputs a control instruction (control signals) to the drive circuit included in the main conversion circuit 201 so that the drive circuit outputs the ON signals to the switching element which needs to enter the ON state and outputs the OFF signals to the switching element which needs to enter the OFF state at each time. The drive circuit outputs the ON signals or the OFF signals as the drive signals to the control electrode of each switching element in accordance with the control signals.

In the power conversion device according to the present embodiment, the semiconductor device according to the embodiments 1 to 5 is applied as the switching element and the reflux diode of the main conversion circuit 201, thus it is possible to achieve the stable withstand voltage characteristics, the reduction in turn-off loss with reduction in leakage current at the time of turn-off, and improvements in controllability of the turn-off operation and blocking capability at the time of turn-off.

Although the example of applying the present invention to the three-phase inverter having the two levels is described in the present preferred embodiment, the present invention is not limited thereto, but can be applied to the various power conversion devices. Although the power conversion device having the two levels is described in the present embodiment, a power conversion device having three or multiple levels may also applied. The present invention may be applied to a single-phase inverter when the power is supplied to a single-phase load. The present invention can be also applied to a DC/DC converter or an AC/DC converter when the power is supplied to the direct current load, for example.

The power conversion device to which the present invention is applied is not limited to the case where the aforementioned load is the electrical motor, but can be used in, for example, a power source device of an electrical discharging machine, a laser processing machine, an induction heat cooking machine, or a noncontact power supply system, a power conditioner such as a solar power system or a power storage system, or a system of a driving part such as a car, a train, or a high-speed rail.

According to the present invention, the above embodiments can be arbitrarily combined, or each embodiment can be appropriately varied or omitted within the scope of the invention.

While the invention has been shown and described in detail, the foregoing description is in all aspects illustrative and not restrictive. It is therefore understood that numerous modifications and variations can be devised without departing from the scope of the invention.

What is claimed is:

1. A semiconductor device, comprising:

a semiconductor body having a first main surface and a second main surface, and including a drift layer of a first conductivity type as a main constituent element;

a buffer layer of a first conductivity type that is formed adjacent to said drift layer, said buffer layer being closer to the second main surface with respect to said drift layer in said semiconductor body;

an active layer formed on the second main surface of said semiconductor body, and having at least one of a first conductivity type and a second conductivity type;

a first electrode formed on the first main surface of said semiconductor body; and a second electrode formed on said active layer, wherein said buffer layer includes:

a first buffer layer being joined to said active layer and having one peak point of an impurity concentration; and a second buffer layer being joined to said first buffer layer and said drift layer, having at least one peak point of an impurity concentration, and having a maximum impurity concentration lower than that of said first buffer layer, and the maximum impurity concentration of said second buffer layer is higher than the impurity concentration of said drift layer and equal to or lower than $1.0\times10^{15}$ $cm^{-3}$.

2. The semiconductor device according to claim 1, wherein a dose amount of a first conductivity type of said second buffer layer is higher than that of said drift layer and lower than $1.0\times10^{14}$ $cm^{-2}$.

3. The semiconductor device according to claim 1, wherein a ratio of the dose amount of the first conductivity type after activating said second buffer layer to a dose amount of a first conductivity type after activating said buffer layer is equal to or higher than 5% and equal to or lower than 40%.

4. The semiconductor device according to claim 1, wherein a value obtained by dividing the maximum impurity concentration of said second buffer layer by the impurity concentration of said drift layer is equal to or larger than 2 and equal to or smaller than $1.0\times10^{3}$.

5. The semiconductor device according to claim 1, wherein a value obtained by dividing the maximum impurity concentration of said second buffer layer by a peak impurity concentration of said first buffer layer is larger than $2\times10^{-5}$ and equal to or smaller than 0.1.

6. The semiconductor device according to claim 1, wherein an activation rate of said first buffer layer is higher than that of said second buffer layer.

7. The semiconductor device according to claim 1, wherein said second buffer layer has an energy level, which is a recombination center, in a band gap of a semiconductor constituting said second buffer layer.

8. The semiconductor device according to claim 1, wherein said second buffer layer has a laminated structure of a plurality of sub-buffer layers, each of which has a peak point of an impurity concentration, a first sub-buffer layer, which is a sub-buffer layer closest to the second main surface among said plurality of sub-buffer layers, is joined to said first buffer layer, the maximum impurity concentration of said second buffer layer is a maximum value of a peak impurity concentration of said plurality of sub-buffer layers, and a distance between the peak points of the impurity concentrations of said two sub-buffer layers adjacent to each other is equal to each other between at least two pairs of said sub-buffer layers adjacent to each other.

9. The semiconductor device according to claim 8, wherein a distance between all the peak points of the impurity concentrations of said two sub-buffer layers adjacent to each other is equal to each other.

10. The semiconductor device according to claim 9, wherein a distance between the peak points of the impurity concentrations of said first buffer layer and said first sub-buffer layer is smaller than the distance between the peak points of the impurity concentrations of said two sub-buffer layers adjacent to each other.

11. The semiconductor device according to claim 8, wherein the peak impurity concentrations of said plurality of sub-buffer layers decrease in a direction from the second main surface toward the first main surface.

12. The semiconductor device according to claim 8, wherein in said buffer layer, a concentration gradient in a direction from the first main surface to the second main surface increases in said sub-buffer layer located closer to the second main surface among said plurality of sub-buffer layers, and the concentration gradient of said sub-buffer layer located closest to the second main surface is lower than a concentration gradient of said first buffer layer.

13. The semiconductor device according to claim 8, wherein an impurity profile after activating at least said two sub-buffer layers among said plurality of sub-buffer layers has a shape of trailing from the first main surface toward the second main surface.

14. The semiconductor device according to claim 8, wherein in said second buffer layer, an impurity concentration of a junction between said two sub-buffer layers adjacent to each other is higher than the impurity concentration of said drift layer.

15. The semiconductor device according to claim 1, wherein an insulated-gate transistor forming area of a first conductivity type is formed closer to the first main surface in said drift layer, said active layer has a second conductivity type, and said semiconductor device includes:

an element forming area in which an IGBT is formed of said insulated-gate transistor forming area, said buffer layer, said active layer and said first and second electrodes; and a peripheral area provided adjacent to said element forming area to hold a withstand voltage.

16. The semiconductor device according to claim 15, wherein a gate of said insulated-gate transistor forming area includes one or a plurality of trench gates.

17. The semiconductor device according to claim 15, wherein said active layer is formed only in said element forming area, and said second electrode is provided on said buffer layer in said peripheral area.

18. The semiconductor device according to claim 15, wherein said active layer is formed in said element forming area and said peripheral area, and said active layer formed in said peripheral area has an impurity concentration of a second conductivity type lower than that of said active layer formed in said element forming area.

19. The semiconductor device according to claim 15, wherein a plurality of impurity areas of a second conductivity type in a floating state are formed closer to the first main surface in said drift layer in said peripheral area.

20. The semiconductor device according to claim 15, wherein an impurity area of a second conductivity type being in contact with a passivation film is formed closer to the first main surface in said drift layer in said peripheral area.

21. The semiconductor device according to claim 1, wherein a first electrode area of a second conductivity type is formed closer to the first main surface in said drift layer, said active layer has a first conductivity type, an impurity concentration of a first conductivity type is set higher than that of said buffer layer, and said active layer functions as a second electrode area, and said semiconductor device includes:

an element forming area in which a diode is formed of said first electrode area, said buffer layer, said active layer, and said first and second electrodes; and a peripheral area provided adjacent to said element forming area to hold a withstand voltage.

22. The semiconductor device according to claim 21, wherein said active layer is formed only in said element forming area, and said second electrode is provided on said buffer layer in said peripheral area.

23. The semiconductor device according to claim 1, wherein a first electrode area of a second conductivity type is formed closer to the first main surface in said drift layer, said active layer includes a first partial active layer of a first conductivity type and a second partial active layer of said second conductivity type, an impurity concentration of a first conductivity type of said first partial active layer and an impurity concentration of a second conductivity type of said second partial active layer are set higher than an impurity concentration of said buffer layer, and said first partial active layer functions as a second electrode area, and the semiconductor device includes:

an element forming area in which a diode is formed of said first electrode area, said buffer layer, said first and second partial active layers, and said first and second electrodes; and a peripheral area provided adjacent to said element forming area to hold a withstand voltage.

24. The semiconductor device according to claim 23, wherein said active layer is formed only in said element forming area, and said second electrode is provided on said buffer layer in said peripheral area.

25. The semiconductor device according to claim 23, wherein said first partial active layer and said second partial active layer are formed in said element forming area, and said second partial active layer is formed in said peripheral area.

26. The semiconductor device according to claim 23, wherein said first partial active layer and said second partial active layer are formed in said element forming area, and said first partial active layer is formed in said peripheral area.

27. The semiconductor device according to claim 23, wherein said peripheral area includes an edge termination area surrounding said element forming area and an interface area located between said edge termination area and said element forming area, said first partial active layer and said second partial active layer are formed in said element forming area, said first partial active layer is formed in said interface area, and said second partial active layer is formed in said edge termination area.

28. The semiconductor device according to claim 23, wherein a plurality of impurity areas of a second conductivity type in a floating state are formed closer to the first main surface in said drift layer in said peripheral area.

29. The semiconductor device according to claim 23, wherein an impurity area of a second conductivity type being in contact with a passivation film is formed closer to the first main surface in said drift layer in said peripheral area.

30. The semiconductor device according to claim 1, wherein a first electrode area of a second conductivity type is formed closer to the first main surface in said drift layer, said active layer includes a first partial active layer of a first conductivity type and a second partial active layer of a second conductivity type, an impurity concentration of a first conductivity type of said first partial active layer is set higher than that of said buffer layer, and said first partial active layer functions as a second electrode area, the semiconductor device includes:

an element forming area in which a PIN diode is formed of said first electrode area, said buffer layer, said active layer, and said first and second electrodes; and a peripheral area provided adjacent to said element forming area to hold a withstand voltage, said first partial active layer is formed in said element forming area, and said second partial active layer is formed in said peripheral area.

31. A method of manufacturing the semiconductor device according to claim 1, comprising:

(a) implanting a first ion from the second main surface of a semiconductor body;

(b) activating said first ion by annealing to form said first buffer layer;

(c) after performing said (b), implanting a second ion from the second main surface of said semiconductor body; and (d) activating said second ion by annealing to form said second buffer layer.

32. The method of manufacturing the semiconductor device according to claim 31, further comprising (c1) forming an active layer on the second main surface of said semiconductor body between said (c) and said (d).

33. The method of manufacturing the semiconductor device according to claim 31, further comprising (b1) forming an active layer on the second main surface of said semiconductor body between said (b) and said (c).

34. The method of manufacturing the semiconductor device according to claim 31, further comprising (b2) forming a second electrode on said active layer between said (b1) and said (c).

35. The method of manufacturing the semiconductor device according to claim 31, further comprising (b3) forming some of layers of a second electrode formed in multiple layers on said active layer between said (b1) and said (c) and (e) forming a remaining layer of said second electrode after said (d).

36. A power conversion device, comprising:

a main conversion circuit including the semiconductor device according to claim 1, and converting and outputting an electrical power being input to said main conversion circuit; and a control circuit outputting control signals for controlling said main conversion circuit to said main conversion circuit.

37. A semiconductor device, comprising:

a semiconductor body having a first main surface and a second main surface, and including a drift layer of a first conductivity type as a main constituent element;

a buffer layer of a first conductivity type that is formed adjacent to said drift layer, said buffer layer being closer to the second main surface with respect to said drift layer in said semiconductor body;

an active layer formed on the second main surface of said semiconductor body, and having at least one of a first conductivity type and a second conductivity type;

a first electrode formed on the first main surface of said semiconductor body; and a second electrode formed on said active layer, wherein said buffer layer comprises:

a first buffer layer being joined to said active layer and having one peak point of an impurity concentration; and a second buffer layer being joined to said first buffer layer and said drift layer and having a maximum impurity concentration lower than that of said first buffer layer, and said second buffer layer has an energy level, which is a recombination center, in a band gap of a semiconductor constituting said second buffer layer.

* * * * *